US009429840B2

(12) United States Patent
Yamamoto et al.

(10) Patent No.: US 9,429,840 B2
(45) Date of Patent: Aug. 30, 2016

(54) PATTERN FORMING METHOD, COMPOSITION USED THEREIN, METHOD FOR MANUFACTURING ELECTRONIC DEVICE, AND ELECTRONIC DEVICE

(71) Applicant: FUJIFILM Corporation, Tokyo (JP)

(72) Inventors: Kei Yamamoto, Haibara-gun (JP); Ryosuke Ueba, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/568,235

(22) Filed: Dec. 12, 2014

(65) Prior Publication Data

US 2015/0118627 A1 Apr. 30, 2015

Related U.S. Application Data

(63) Continuation of application No. PCT/JP2013/066770, filed on Jun. 12, 2013.

(60) Provisional application No. 61/658,630, filed on Jun. 12, 2012.

(30) Foreign Application Priority Data

Jun. 12, 2012 (JP) ................................ 2012-133229

(51) Int. Cl.

| | |
|---|---|
| ***G03F 7/26*** | (2006.01) |
| ***G03F 7/00*** | (2006.01) |
| ***G03F 7/039*** | (2006.01) |
| ***G03F 7/32*** | (2006.01) |
| ***G03F 7/40*** | (2006.01) |

(52) U.S. Cl.

CPC ............ *G03F 7/0035* (2013.01); *G03F 7/0397* (2013.01); *G03F 7/325* (2013.01); *G03F 7/405* (2013.01)

(58) Field of Classification Search

CPC ................ G03F 7/26; G03F 7/32; G03F 7/40

See application file for complete search history.

(56) References Cited

U.S. PATENT DOCUMENTS

| | | | | |
|---|---|---|---|---|
| 8,975,010 | B2 * | 3/2015 | Takeshita | ...................... 430/330 |
| 2007/0259287 | A1 | 11/2007 | Sakakibara et al. | |
| 2010/0178608 | A1 | 7/2010 | Sakakibara et al. | |
| 2010/0239984 | A1 | 9/2010 | Tsubaki | |
| 2011/0250543 | A1 | 10/2011 | Tsubaki | |
| 2013/0122425 | A1 | 5/2013 | Yoshida et al. | |

FOREIGN PATENT DOCUMENTS

| | | | |
|---|---|---|---|
| JP | 2004361629 | A | 12/2004 |
| JP | 2008292975 | A | 12/2008 |
| JP | 2008310314 | A | 12/2008 |
| JP | 2013117701 | A | 6/2013 |
| JP | 2013117710 | A | 6/2013 |
| KR | 10-2013-0048166 | A | 5/2013 |
| WO | 2005116776 | A1 | 12/2005 |
| WO | 2008149701 | A1 | 12/2008 |

OTHER PUBLICATIONS

ISR (PCT/ISA/210); issued Jul. 16, 2013, in related International Application No. PCT/JP2013/066770.

Written Opinion (PCT/ISA/237); issued Jul. 16, 2013, in related International Application No. PCT/JP2013/066770.

Office Action dated Aug. 18, 2015 from the Japanese Patent Office in corresponding Japanese Application No. 2012-133229.

Office Action issued Feb. 9, 2016, issued by the Japanese Patent Office in counterpart Japanese Patent Application No. 2012-133229.

Office Action dated Apr. 21, 2016, issued by the Korean Intellectual Property Office in counterpart Korean Application No. 10-2014-7034990.

* cited by examiner

*Primary Examiner* — Kathleen Duda

(74) *Attorney, Agent, or Firm* — Sughrue Mion, PLLC

(57) ABSTRACT

A pattern forming method includes: (i) a step of forming a first film by using an actinic ray-sensitive or radiation-sensitive resin composition (I), (ii) a step of exposing the first film, (iii) a step of developing the exposed first film by using an organic solvent-containing developer to form a negative pattern, (iv) a step of forming a second film on the negative pattern by using a specific composition (II), (v) a step of increasing polarity of the specific compound present in the second film, and (vi) a step of removing a specific area of the second film by using the organic solvent-containing remover.

17 Claims, 1 Drawing Sheet

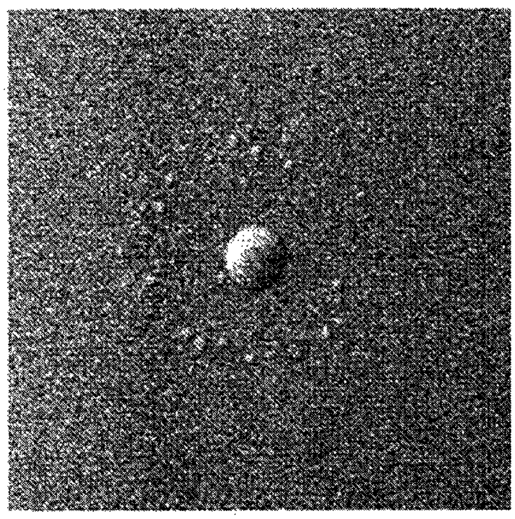

PATTERN FORMING METHOD, COMPOSITION USED THEREIN, METHOD FOR MANUFACTURING ELECTRONIC DEVICE, AND ELECTRONIC DEVICE

CROSS REFERENCE TO RELATED APPLICATION

This is a continuation of International Application No. PCT/JP2013/066770 filed on Jun. 12, 2013, and claims priority from Japanese Patent Application No. 2012-133229 filed on Jun. 12, 2012, and U.S. Provisional Application No. 61/658,630 filed on Jun. 12, 2012, the entire disclosures of which are incorporated therein by reference.

TECHNICAL FIELD

The present invention relates to a pattern forming method, a composition used therein, a method for manufacturing an electronic device, and an electronic device. In more detail, the invention relates to a pattern forming method suitable for uses in the process of producing a semiconductor such as IC, or the production of a liquid crystal device or a circuit board such as thermal head and the like, and other lithographic processes including a photo-fabrication process, a composition used in such a method, a method for manufacturing an electronic device, and an electronic device. More specifically, the invention is concerned with a pattern forming method suitable for use in an exposure process using ArF exposure equipment or immersion-type ArF projective exposure equipment which has a light source emitting far-ultraviolet light with a wavelength of 300 nm or less, a composition used in such a method, a method for manufacturing an electronic device, and an electronic device.

BACKGROUND ART

With the advent of resists for KrF excimer laser light (248 nm), an image forming method utilizing the so-called chemical amplification has been adopted for the purpose of making compensation for sensitivity reduction caused by light absorption under image formation using the resists. To illustrate by a positive image forming method utilizing chemical amplification, the positive image forming method is a method in which light exposure is performed and thereby decomposition of an acid generator is induced in exposed areas to generate an acid, then baking after the exposure (or PEB: Post Exposure Bake) is performed and thereby alkali-insoluble groups are converted into alkali-soluble groups with the aid of the generated acid as a reaction catalyst, and further alkali development is performed and thereby the exposed areas are removed. At present, the positive image forming method utilizing such a chemical amplification mechanism is in the mainstream, and it has also been known that the method was used for forming e.g. contact holes (see WO 2008/149701, JP-A-2004-361629 (the term "JP-A" as used herein means an unexamined published Japanese patent application)).

Although the positive image forming method can form a good-quality pattern of isolated lines or dots, isolated spaces (a pattern of trenches) or a pattern of fine holes formed by using the positive image forming method tends to suffer degradation in pattern profile.

Still finer patterning has been required in recent years, and quite recently a technique of forming negative images through the resolution of a resist film made from a chemical amplification negative resist composition by the use of an organic developer (see e.g. JP-A-2008-292975) has also been known in addition to the technique of forming positive images through the use of chemical amplification positive resist compositions currently in vogue.

With respect to the technique of forming negative images through imagewise resolution of a resist film by the use of an organic developer, there has been known a technique in which a resist film containing an acid generator capable of generating an acid is resolved imagewise with an organic developer to form a pattern, then the resulting resist film is coated with a material for forming a crosslinked layer (also referred to as a crosslinked-layer forming material) to become insoluble in a developer through reaction in the presence of an acid, the acid in the resist pattern is made to diffuse to the crosslinked-layer forming material via an additional treatment process such as a heating process, and thereby a layer insoluble in a developer is formed at the interface between the crosslinked-layer forming material and the pattern, and dimensions of the resist pattern is enlarged to result in effective reduction of trench dimensions or hole dimensions. And it has been reported that such a technique allowed formation of a pattern of trenches or holes whose dimensions were effectively made finer without leaving scum (see JP-A-2008-310314).

SUMMARY OF INVENTION

However, recent years have seen increasingly growing needs for finer trench patterns and finer contact holes. In response to these needs, though it has been tried to form in resist films trench patterns or hole patterns having ultrafine widths or hole diameters of, say, 40 nm or less in particular, such patterns of excellent quality were difficult to obtain by merely using the previous methods as mentioned above.

To be more specific, though formation of trench patterns or hole patterns of ultrafine widths or hole diameters has been tried, so long as the previous methods have been used therein, not only patterns of ultrafine widths or hole diameters have been difficult to form but also there has been a tendency to produce blob defects (residues supposed to be derived from resist components and developer components and ranging in size from several tens of nm to several μm).

The invention has been made in view of these problems, and objects of the invention are to provide a pattern forming method by which a pattern of trenches or a pattern of holes having ultrafine widths or hole diameters of, say, 40 nm or less can be formed in a state of sufficient reduction in occurrence of blob defects, a composition used in this method, a method for manufacturing an electronic device, and an electronic device.

The following are exemplary constitutions of the invention, and these constitutions are solutions to the problems having been tackled.

[1] A pattern forming method, comprising:

(i) a step of forming a first film by using an actinic ray-sensitive or radiation-sensitive resin composition (I) containing (A) a resin capable of increasing polarity by an action of an acid to decrease solubility in an organic solvent-containing developer, and (B) a compound capable of generating an acid upon irradiation with an actinic ray or radiation, (ii) a step of exposing the first film, (iii) a step of developing the exposed first film by using an organic solvent-containing developer to form a negative pattern, (iv) a step of forming a second film on the negative pattern by using a composition (II) containing (A') a compound capable of increasing polarity by an action of an acid to decrease solubility in an organic solvent-containing remover, (v) a step of increasing polarity of the compound (A') present in the second film by an action of an acid generated from the compound (B) present in the negative pattern formed in the step (iii), and (vi) a step of removing an area of the second film, in which the area is an area in which the compound (A') has not yet undergone reaction with the acid generated from the compound (B), by using the organic solvent-containing remover.

[2] The pattern forming method as described in [1], wherein the compound (A') is a resin capable of increasing polarity by an action of an acid to decrease solubility in an organic solvent-containing remover.

[3] The pattern forming method as described in [2], wherein the resin as the compound (A') is the same resin as the resin (A).

[4] The pattern forming method as described in any one of [1] to [3], wherein the composition (II) is substantially free of any compound selected from the group consisting of (N) a basic compound or an ammonium salt compound, capable of lowering basicity upon irradiation with an actinic ray or radiation and (N') a basic compound different from the compound (N).

[5] The pattern forming method as described in any one of [1] to [4], wherein the composition (II) is substantially free of a compound capable of generating an acid upon irradiation with an actinic ray or radiation.

[6] The pattern forming method as described in any one of [1] to [5], wherein the composition (II) contains a compound capable of decomposing by an action of an acid to produce an acid.

[7] The pattern forming method as described in any one of [1] to [6], further comprising:

a step of heating between the step (iii) and the step (iv).

[8] The pattern forming method as described in any one of [1] to [7], further comprising:

a step of exposing the second film between the step (iv) and the step (v).

[9] The pattern forming method as described in any one of [1] to [8], wherein the step (v) is a step of heating the negative pattern.

[10] The pattern forming method as described in any one of [1] to [9], wherein each of the developer used in the step (iii) and the remover used in the step (vi) is at least one kind of an organic solvent selected from the group consisting of a ketone-based solvent, an ester-based solvent, an alcohol-based solvent, an amide-based solvent and an ether-based solvent.

[11] The pattern forming method as described in any one of claims 1 to 10, further comprising:

a step of cleaning by using an organic solvent-containing rinsing solution at least either between the step (iii) and the step (iv), or after the step (vi).

[12] A composition, which contains (A') a compound capable of increasing polarity by an action of an acid to decrease solubility in an organic solvent-containing remover and is usable in the step (iv) of the pattern forming method as described in any one of [1] to [11].

[13] A method for manufacturing an electronic device, comprising the pattern forming method as described in any one of [1] to [11].

[14] An electronic device manufactured by the manufacturing method of an electronic device as described in [13].

It is preferable that the invention further includes the following constitutions.

[15] The pattern forming method as described in any one of [1] to [11], wherein the exposure in the step (ii) is ArF exposure.

[16] The pattern forming method as described in any one of [1] to [11] or in [15], wherein the exposure in the step (ii) is immersion exposure.

According to the invention, it becomes possible to provide a pattern forming method which allows formation of a pattern of trenches or holes having ultrafine widths or hole diameters of, say, 40 nm or less in a state of sufficient reduction in occurrence of blob defects, a composition used therein, a method for manufacturing an electronic device, and an electronic device.

BRIEF DESCRIPTION OF THE DRAWING

FIG. 1 is a view showing a result of observation on electron micrograph of blob defect.

DESCRIPTION OF EMBODIMENTS

A Mode for carrying out the invention is described below in detail.

In the present specification, when a group (an atomic group) is written without an adjunct "substituted" or "unsubstituted", the group includes both a group having no substituent and a group having a substituent. For example, the wording "an alkyl group" includes not only an alkyl group having no substituent (an unsubstituted alkyl group) but also an alkyl group having a substituent (a substituted alkyl group).

The term "actinic ray" or "radiation" as used in the present specification is intended to include e.g. a bright-line spectrum of a mercury lamp, a far ultraviolet ray, typified by excimer laser, an extreme ultraviolet ray (EUV light), an X-ray, an electron beam (EB) and the like. On the other hand, the term "light" in the invention means an actinic ray or radiation.

In addition, the term "exposure" as used in the present specification includes, unless otherwise specified, not only exposure to a mercury lamp, a far ultraviolet ray, typified by excimer laser, an extreme ultraviolet ray, an X-ray, an EUV light and the like but also drawing with corpuscular radiation such as an electron beam or an ion beam.

A pattern forming method according to the invention includes:

(i) a step of forming a first film by using an actinic ray-sensitive or radiation-sensitive resin composition (I) containing (A) a resin capable of increasing polarity by an action of an acid to decrease solubility in an organic solvent-containing developer, and (B) a compound capable of generating an acid upon irradiation with an actinic ray or radiation, (ii) a step of exposing the first film, (iii) a step of developing the exposed first film by using an organic solvent-containing developer to form a negative pattern, (iv) a step of forming a second film on the negative pattern by using a composition (II) containing (A') a compound capable of increasing polarity by an action of an acid to decrease solubility in an organic solvent-containing developer, (v) a step of increasing polarity of the compound (A') present in the second film by an action of an acid generated from the compound (B) present in the negative pattern formed in the step (iii), and (vi) a step of removing an area of the second film, in which the area is an area in which the compound (A') has not yet undergone reaction with the acid generated from the compound (B), by using an organic solvent-containing remover.

Although the reason remains uncertain why the pattern forming method as specified above allows formation of a pattern of trenches or holes having ultrafine widths or hole diameters of, say, 40 nm or below in a state of sufficient reduction in occurrence of blob defect, it is presumed as follows.

In the case of having tried to form fine-hole patterns by using positive image forming methods, the patterns formed have been apt to undergo profile degradation. On the whole, even trench patterns or hole patterns having fine widths or hole diameters of, say, 60 nm or less have been difficult to form. This is because, in the case of forming such fine patterns by the use of positive image forming methods, exposed portions are areas in which such trenches or holes are to be formed, and it is therefore almost impossible from an optical viewpoint to perform exposures of ultrafine areas and thereby effect imagewise resolution.

On the other hand, according to the invention, the negative image forming method using an organic developer is carried out as described in the steps (i) to (iii), and the exposed portions therefore correspond to areas other than areas in which trenches or holes are to be formed. Thus it becomes possible to form a trench pattern or a hole pattern having a fine width or hole diameter of, say, 60 nm or below.

By further undergoing the steps (iv) to (vi), dimensions of e.g. the trench pattern or the hole pattern are enlarged to result in an effective reduction of trench dimensions or hole dimensions. More specifically, the invention makes it possible to enlarge pattern dimensions by inducing reaction for increasing polarity of the compound (A') present in proximity of the resist pattern in the film formed on the resist pattern by the use of the composition (H) containing the compound (A') capable of increasing polarity by an action of an acid to result in a reduction of solubility in an organic solvent-containing remover, and thereafter removing unreacted areas of the film by the use of the organic solvent-containing remover.

According to this method, occurrence of blob defect can be reduced to a sufficient extent in contrast to e.g. a case in which a crosslinkable film of the type which undergoes reaction in the presence of an acid and becomes insoluble in water or an aqueous alkali solution is formed on a resist pattern, then the acid is made to diffuse from the resist pattern into the crosslinkable film, and thereafter unreacted areas of the crosslinkable film are removed with water or an aqueous alkali solution. This is because the contact angle of an organic solvent-containing remover with respect to the film is lower than the contact angle of water or an aqueous alkali solution with respect to the film, and hence it can be thought that removal of residual components insoluble in a developer by the use of an organic solvent-containing remover tends to be performed with higher reliability, compared with the case of using water or an aqueous alkali solution for the removal.

In addition, the reaction capable of producing insoluble matter in water or an aqueous alkali solution through the progress of crosslinking in the presence of an acid is difficult to control. For example, even if it is tried to enlarge dimensions of a trench pattern or a hole pattern so as to leave the intended trench dimensions or hole dimensions, a sufficient reduction in trench dimensions or hole dimensions will be rather difficult to attain on account of e.g. insufficiency of the crosslinking reaction.

On the other hand, the reaction in the invention, reaction which can induce an increase in polarity of the compound (A') by the action of the acid to result in a reduction of solubility in the organic solvent-containing remover, is similar in reaction mechanism to the reaction capable of inducing an increase in polarity of the resin (A) to result in a reduction of solubility in the organic solvent-containing developer, and hence it is feasible to control the problem of "being insufficient in acid diffusion", problem which tends to occur in the case of diffusing the acid into the crosslinkable layer. Thus, according to the invention, not only the acid generated from the compound (B) in the resist pattern is easy to diffuse into the second film but also acid-diffusion control is easy, and hence the intended expansion in dimensions of a trench pattern or a hole pattern can be thought to be feasible. As a result, formation of a pattern of trenches or holes having ultrafine widths or hole diameters of, say, 40 nm or less is thought to become feasible.

<Pattern Forming Method>

The present pattern forming method is illustrated below in detail.

The present pattern forming method includes:

(i) a step of forming a first film by using an actinic ray-sensitive or radiation-sensitive resin composition (I) containing (A) a resin capable of increasing polarity by an action of an acid to decrease solubility in an organic solvent-containing developer, and (B) a compound capable of generating an acid upon irradiation with an actinic ray or radiation, (ii) a step of exposing the first film, (iii) a step of developing the exposed first film by using an organic solvent-containing developer to form a negative pattern, (iv) a step of forming a second film on the negative pattern by using a composition (II) containing (A') a compound capable of increasing polarity by an action of an acid to decrease solubility in an organic solvent-containing developer, (v) a step of increasing polarity of the compound (A') present in the second film by an action of an acid generated from the compound (B) present in the negative pattern formed in the step (iii), and (vi) a step of removing an area of the second film, in which the area is an area in which the compound (A') has not yet undergone reaction with the acid generated from the compound (B), by using an organic solvent-containing remover.

In the present pattern forming method, the step (i), the step (ii) and the step (iii) can be performed in accordance with a commonly known method.

In the step (i), a method for forming the first film by using an actinic ray-sensitive or radiation-sensitive resin composition (I) can be carried out typically by coating a substrate with a film of the actinic ray-sensitive or radiation-sensitive resin composition (I). Examples of a coating method usable therein include hitherto known spin coating, spray coating, roller coating and immersion coating methods. Of these coating methods, a spin coating method is preferably used for coating with the actinic ray-sensitive or radiation-sensitive resin composition (I).

The substrate on which the first film is formed has no particular restrictions, and examples of a substrate usable herein include inorganic substrates, such as silicon, SiN, $SiO_2$ and SiN, and coated type inorganic substrates, such as SOG, which are substrates generally used in e.g. processes of fabricating semiconductors such as ICs, processes of manufacturing circuit boards for LCD panels, thermal heads and the like, and other lithographic processes including a photofabrication process. Further, an undercoating such as an antireflective coating may be formed between the first film and a substrate when required. The undercoating can be chosen as appropriate from organic antireflective coating, inorganic antireflective coating or others. Materials for such undercoatings are available from Brewer Science Incorporated, NISSAN CHEMICAL INDUSTRIES, LTD., and so on. Examples of an undercoating suitable for use in a development process using an organic solvent-containing developer include the undercoating disclosed e.g. in WO 2012/039337A.

It is also preferable that the present pattern forming method includes a prebake (PB) step between the step (i) and the step (ii).

In addition, it is also preferable that the present pattern forming method include a post exposure bake (PEB) step between the step (ii) and the step (iii).

As for the heating temperature, it is appropriate that both PB and PEB steps be carried out at temperatures ranging from 70° C. to 130° C., preferably from 80° C. to 120° C.

The baking time is preferably from 30 seconds to 300 seconds, far preferably from 30 seconds to 180 seconds, further preferably from 30 seconds to 90 seconds.

The heating can be carried out using a device installed in a generally-used exposing-and-developing machine, or it may also be carried out using a hot plate or the like.

The bake allows acceleration of the reaction in exposed portions to result in improvements in sensitivity and pattern profile.

At least either prebake or post exposure bake may include twice or more heating steps.

In the step (ii), there is no particular restriction on the wavelength of a light source used in exposure equipment. Examples of light usable therein include infrared light, a visible light, an ultraviolet light, a far-ultraviolet light, an extreme ultraviolet light, an X-ray and an electron beam. Among them, a far-ultraviolet light with wavelengths of 250 nm or shorter, preferably 220 nm or shorter, particularly preferably 1 nm to 200 nm, with specific examples including KrF excimer laser (248 nm), ArF excimer laser (193 nm) and $F_2$ excimer laser (157 nm), X-ray, EUV (13 nm) and electron beam are preferable to the others. Of these, KrF excimer laser, ArF excimer laser, EUV or electron beams are preferred over the others, and ArF excimer laser is far preferred.

The step (ii) may include twice or more exposure operations.

Alternatively, an immersion exposure method can be adopted in the step (ii).

The immersion exposure method is a technique for heightening resolving power, or a technique of performing exposure in a state that space between a projection lens and a sample is filled with a high refractive-index liquid (hereafter referred to as "an immersion liquid" too).

As mentioned above, this "immersion effect" can be described as follows. Symbolizing the wavelength of exposure light in the air as $\lambda_0$, the refractive index of an immersion liquid relative to air as n and the convergence half-angle of a ray of light as θ, and taking $NA_0$ as sing θ, resolution and depth of focus in the immersion case can be given by the following expressions. Herein, $k_1$ and $k_2$ are coefficients pertaining to the process.

$$(\text{Resolution})=k_1\cdot(\lambda_0/n)/NA_0$$

$$(\text{Depth of focus})=\pm k_2\cdot(\lambda_0/n)/NA_0^2$$

That is, the immersion effect is equivalent to use of an exposure wavelength of 1/n. In other words, when one of two projection optical systems having the same NA adopts the immersion exposure method, the system can have n-times depth of focus. This method is effective for all pattern profiles, and can further be combined with super-resolution techniques under study at present, such as a phase-shift method and a modified illumination method.

In the case of performing immersion exposure, a step of washing the first film surface with an aqueous chemical solution may be carried out (1) after forming the first film on a substrate, and that before the exposure step, and/or (2) after exposing the first film through the medium of an immersion liquid, and that before the step of heating the first film.

The immersion liquid is preferably a liquid which is transparent to light of exposure wavelength and has a minimum temperature coefficient of refractive index so as to minimize deformation of optical images projected on the first film. When the exposure light source used is an ArF excimer laser (wavelength: 193 nm), water is preferably used as an immersion liquid in terms of easy availability and easiness of handling in addition to the above viewpoints.

When water is used, an additive (liquid) capable of lowering surface tension of water and enhancing surface activity of water may be added in a very small proportion. The additive is preferably one which causes no dissolution of the resist layer on a wafer and exerts only a negligible influence upon an optical coat formed at the bottom of a lens element.

Such an additive is preferably, for example, an aliphatic alcohol having a refractive index nearly equal to that of water, and specific examples thereof include methyl alcohol, ethyl alcohol and isopropyl alcohol. Addition of alcohol having a refractive index nearly equal to that of water has an advantage that, even when the alcohol component in water vaporizes to result in a concentration change, the change in refractive index of the liquid in its entirety can be minimized On the other hand, water admixed with a substance opaque to 193-nm light and impurities having refractive indexes differing greatly from water's refractive index causes a distortion in optical images projected on a resist, and distilled water is therefore suitable as the water to be used. Alternatively, pure water obtained by filtering water through an ion exchange filter or the like may be used.

It is preferable that water used as the immersion liquid has an electric resistance of 18.3 MΩcm or higher and a TOC (total organic carbon) concentration of 20 ppb or lower and has undergone a deaeration treatment.

In addition, it is possible to enhance the performance of lithography by heightening a refractive index of the immersion liquid. From such a viewpoint, an additive capable of heightening the refractive index may be added to water, or heavy water ($D_2O$) may be used in place of water.

When the first film formed from the actinic ray-sensitive or radiation-sensitive resin composition (I) for use in the invention is exposed to light through the medium of an immersion liquid, a hydrophobic resin (D) as described hereinafter can further be added as required. By adding the hydrophobic resin (D), the receding contact angle on the surface is improved. The receding contact angle of the first film is preferably from 60° to 90°, far preferably 70° or above.

In the immersion exposure step, an immersion liquid is required to be moving on a wafer while following the movement of an exposure head which is scanning the wafer at a high speed and forming an exposure pattern, and therefore a contact angle of the immersion liquid with respect to a resist film (first film) in a dynamic state becomes important. Thus the resist is required to have the capability of allowing the immersion liquid to follow the high-speed scan of an exposure head without liquid droplets remaining thereon.

Between the first film formed from the actinic ray-sensitive or radiation-sensitive resin composition (I) for use in the invention and an immersion liquid, a film slightly soluble in the immersion liquid (hereinafter referred to as "a topcoat", too) may be provided for the purpose of not bringing the first film into a direct contact with the immersion liquid. Functions required of the topcoat include suitability for application to the top portion of the resist, transparency to radiation, notably radiation having a wavelength of 193 nm, and slight solubility in the immersion liquid. It is appropriate that the topcoat be not mixable with the resist and further be uniformly applicable to the top portion of the resist.

From the viewpoint of transparency at a wavelength of 193 nm, the topcoat is preferably made from an aromatic-free polymer.

Examples of such a polymer include a hydrocarbon polymer, an acrylic acid ester polymer, a polymethacrylic acid, a polyacrylic acid, a polyvinyl ether, a silicon-containing polymer and a fluorine-containing polymer. The hydrophobic resin (D) is also suitable for use in forming the topcoat. When impurities are eluded from the topcoat with the immersion liquid, an optical lens is polluted with them, and it is therefore preferable that the polymer present in the topcoat is lower in content of the monomer component remaining therein.

On the occasion of stripping off the topcoat, a developer may be used, or a parting agent may be used separately. As the parting agent, a solvent causing slight infiltration into the first film is suitable. On a point of the possibility of performing the stripping-off step simultaneously with the first film-developing step, it is advantageous to strip off the topcoat with an alkali developer. From a viewpoint of stripping with an alkali developer, it is appropriate that the topcoat be acidic. However, from a viewpoint of not intermixing with the first film, the topcoat may be neutral, or it may be alkaline.

As to the refractive index, it is preferable that there is no or little difference between the topcoat and the immersion liquid. In such a case, it becomes possible to enhance resolution. When an ArF excimer laser (wavelength: 193 nm) is used as the exposure light source, water is preferably used as the immersion liquid, and it is therefore preferable that the topcoat used in ArF immersion exposure has a refractive index close to water's refractive index (1.44). In addition, the topcoat is preferably a thin film in terms of transparency and refractive index.

It is appropriate that the topcoat be not intermixed with not only the first film but also the immersion liquid. From this point of view, when the immersion liquid is water, a solvent used for the topcoat is preferably a medium which is slightly soluble in the solvent incorporated in the composition for use in the invention, and that insoluble in water. On the other hand, when the immersion liquid is an organic solvent, the topcoat may be soluble in water, or it may be insoluble in water.

In the step namely the step of forming a negative pattern by developing the first film with an organic solvent-containing developer, a polar solvent or a hydrocarbon solvent, such as a ketone-based solvent, an ester-based solvent, an alcohol-based solvent, an amide-based solvent or an ether-based solvent, can be used as the organic solvent-containing developer (hereinafter referred to as "organic developer", too).

Examples of the ketone-based solvent can include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetylacetone, acetonylacetone, ionone, diacetonyl alcohol, acetyl carbinol, acetophenone, methyl naphthyl ketone, isophorone and propylene carbonate.

Examples of the ester-based solvent can include methyl acetate, butyl acetate, ethyl acetate, isobutyl acetate, pentyl acetate, isopentyl acetate, amyl acetate, cyclohexyl acetate, isobutyl isobutyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

Examples of the alcohol-based solvent can include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-pentyl alcohol, n-octyl alcohol and n-decanol, a glycol-based solvent such as ethylene glycol, diethylene glycol and triethylene glycol, and a glycol ether-based solvent such as ethylene glycol monomethyl ether, propylene glycol monomethyl ether, ethylene glycol monoethyl ether, diethylene glycol monomethyl ether, triethylene glycol monoethyl ether and methoxymethylbutanol.

Examples of the ether-based solvent include dioxane, tetrahydrofuran, phenetole and dibutyl ether in addition to the glycol ether-based solvent recited above.

Examples of the amide-based solvent include N-methyl-2-pyrrolidone, N,N-dimethylacetamine, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

Any two or more of the solvents as recited above may be used as a mixture, or each of the solvents as recited above may be used as a mixture with a solvent other than the above-recited ones or water. However, in order to fully achieve the effects of the invention, it is appropriate that the water content of the developer in its entirety be lower than 10 mass %, and it is preferable that the developer contains substantially no water.

In other words, the amount of the organic solvent used in the organic developer is preferably from 90 mass % to 100 mass %, more preferably from 95 mass % to 100 mass %, based on the total amount of the developer. (In this specification, mass ratio is equal to weight ratio.)

In particular, the organic developer is preferably a developer containing at least one organic solvent selected from the group consisting of a ketone-based solvent, an ester-based solvent, an alcohol-based solvent, an amide-based solvent and an ether-based solvent.

The vapor pressure of an organic developer at 20° C. is preferably 5 kPa or less, more preferably 3 kPa or less, particularly preferably 2 kPa or less. By adjusting an organic developer to have a vapor pressure of 5 kPa or less, vaporization of the organic developer on a substrate or in a developing cup can be retarded, and in-plane temperature consistency of a wafer can be enhanced. As a result, the wafer can have improved in-plane dimensional uniformity.

Examples of an organic developer having a vapor pressure of 5 kPa or less include a ketone-based solvent, such as 1-octanone, 2-octanone, 1-nonanone, 2-nonanone, 2-heptanone (methyl amyl ketone), 4-heptanone, 2-hexanone, diisobutyl ketone, cyclohexanone, methylcyclohexanone, phenyl acetone and methyl isobutyl ketone; an ester-based solvent, such as butyl acetate, pentyl acetate, isopentyl acetate, amyl acetate, cyclohexyl acetate, isobutyl isobutyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, butyl formate, propyl formate, ethyl lactate, butyl lactate and propyl lactate; an alcohol-based solvent, such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent, such as ethylene glycol, diethylene glycol and triethylene glycol; a glycol ether-based solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent, such as tetrahydrofuran, phenetole and dibutyl ether; amide solvents, such as N-methyl-2-pyrrolidone, N,N-dimethylacetamide and N,N-dimethylformamide; an aromatic hydrocarbon-based solvent, such as toluene and xylene; and an aliphatic hydrocarbon-based solvent, such as octane and decane.

Examples of an organic developer having its vapor pressure in a preferred range of 2 kPa or less include a ketone-based solvent, such as 1-octanone, 2-octanone, 1-nonanone, 2-nonanone, 4-heptanone, 2-hexanone, diisobutyl ketone, cyclohexanone, methylcyclohexanone and phenyl acetone; an ester-based solvent, such as butyl acetate, amyl acetate, cyclohexyl acetate, isobutyl isobutyrate, propylene glycol monomethyl ether acetate, ethylene glycol monoethyl ether acetate, diethylene glycol monobutyl ether acetate, diethylene glycol monoethyl ether acetate, ethyl-3-ethoxyproprionate, 3-methoxybutyl acetate, 3-methyl-3-methoxybutyl acetate, ethyl lactate, butyl lactate and propyl lactate; an alcohol-based solvent, such as n-butyl alcohol, sec-butyl alcohol, tert-butyl alcohol, isobutyl alcohol, n-hexyl alcohol, n-heptyl alcohol, n-octyl alcohol and n-decanol; a glycol-based solvent, such as ethylene glycol, diethylene glycol and triethylene glycol; a glycol ether-based solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethylbutanol; an ether-based solvent, such as phenetole and dibutyl ether; an amide-based solvent, such as N-methyl-2-pyrrolidone, N,N-dimethylacetamide and N,N-dimethylformamide; an aromatic hydrocarbon-based solvent, such xylene; and an aliphatic hydrocarbon-based solvent, such as octane and decane.

In the organic developer, a surfactant can be added in an appropriate amount, if desired.

There is no particular restriction as to the surfactant usable therein. For instance, an ionic or nonionic fluorine- and/or silicon-containing surfactant can be used. Examples of such a fluorine- and/or silicon-containing surfactant include the surfactants as disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, U.S. Pat. No. 5,405,720 specification, U.S. Pat. No. 5,360,692 specification, U.S. Pat. No. 5,529,881 specification, U.S. Pat. No. 5,296,330 specification, U.S. Pat. No. 5,436,098 specification, U.S. Pat. No. 5,576,143 specification, U.S. Pat. No. 5,294,511 specification and U.S. Pat. No. 5,824,451 specification. And nonionic surfactants are preferable to other surfactants. There is no particular restriction as to the nonionic surfactants, but the use of a fluorine-containing surfactant or a silicon-containing surfactant is far preferred.

The amount of the surfactant used is usually from 0.001 mass % to 5 mass %, preferably from 0.005 mass % to 2 mass %, more preferably 0.01 mass % to 5 mass %, based on the total amount of the developer.

In addition, the present pattern forming method may further contain a step of performing development by using an alkali developer between the step (ii) and the step (iii), or between the step (iii) and the step (iv).

When the present pattern forming method further contains a step of performing development with an alkali developer, those usable as the alkali developer are an alkaline aqueous solution, including inorganic alkalis such as sodium hydroxide, potassium hydroxide, sodium carbonate, sodium silicate, sodium metasilicate and ammonia water, primary amines such as ethyl amine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide and tetraethylammonium hydroxide, and cyclic amines such as pyrrole and piperidine.

After being admixed with an alcohol and a surfactant each in appropriate amounts, such an alkaline aqueous solution can be used, too. Examples of the surfactant can include those recited above.

The alkali concentration in an alkali developer is usually from 0.1 mass % to 20 mass %.

The pH of an alkali developer is usually from 10.0 to 15.0.

It is particularly preferable that a 2.38 mass % aqueous solution of tetramethylammonium hydroxide is used as the alkali developer.

As a developing method, it is possible to apply e.g. a method of dipping a substrate in a bath filled with a developer for a given time (a dip method), a method of mounding a developer on the surface of a substrate by dint of surface tension and allowing the resulting mound of the developer to stand still for a given time, thereby performing the development (a paddle method), a method of spraying a developer on the surface of a substrate (a spray method), or a method of continuing to discharge a developer from a developer-discharge nozzle onto a substrate spinning at a constant speed as the nozzle scans the substrate surface at a constant speed (a dynamic dispense method).

When the various developing methods as mentioned above include a step of discharging a developer from a developing nozzle mounted in a developing apparatus onto a resist film, the discharge pressure of the developer under discharging (the per-unit-area flow velocity of the developer under discharging) is preferably 2 $mL/sec/mm^2$ or less, more preferably 1.5 $mL/sec/mm^2$ or less, further preferably 1 $mL/sec/mm^2$ or less. Although the flow velocity has no specified lower limit, considering throughput, the flow velocity is preferably 0.2 $mL/sec/mm^2$ or more.

By adjusting the discharge pressure of the developer under discharging to be in the foregoing range, pattern defects derived from resist residues left after development can be reduced significantly.

Although details of a mechanism of this effect are uncertain, it is considered that, by adjusting the discharge pressure to fall within the foregoing range, the pressure the developer applies to the resist film becomes low; as a result, accidental shaving or collapsing of the resist film and the resist pattern can be inhibited.

Additionally, the discharge pressure ($mL/sec/mm^2$) of the developer is a value measured at the exit of a developing nozzle mounted in a developing apparatus.

Examples of a method for adjusting the discharge pressure of a developer can include a method of controlling the discharge pressure by means of a pump or the like and a method of adjusting the discharge pressure through the control of supply from a pressure tank.

After the step of developing with a developer containing an organic solvent, a step of stopping the development while replacing the solvent with another solvent may further be carried out.

The present pattern forming method preferably includes a step of cleaning with an organic solvent-containing rinsing solution (a rinsing step) between the step (iii) and the step (iv), namely after the step of developing by using an organic solvent-containing developer.

As to the rinsing solution used in the rinsing step carried out after the step of developing by using an organic solvent-containing developer, there are no particular restrictions so long as it causes no dissolution of the resist pattern, and commonly-used organic solvent-containing solutions are usable. And what is preferably used as the rinsing solution is a rinsing solution containing at least one organic solvent selected from the group consisting of a hydrocarbon-based solvent, a ketone-based solvent, an ester-based solvent, an alcohol-based solvent, an amide-based solvent and an ether-based solvent.

Examples of the hydrocarbon-based solvent, the ketone-based solvent, the ester-based solvent, the alcohol-based solvent, the amide-based solvent and the ether-based solvent include the same ones as those recited in the description of the organic solvent-containing developer.

After the step of developing by using an organic solvent-containing developer, it is preferred to carry out the rinsing step using a rinsing solution containing at least one organic solvent selected from the group consisting of a ketone-based solvent, an ester-based solvent, an alcohol-based solvent and an amide-based solvent, it is far preferred to carry out the rinsing step using a rinsing solution containing at least one organic solvent selected from the group consisting of the alcohol-based solvent and the ester-based solvent, it is especially preferred to carry out the rinsing step using a rinsing solution containing a monohydric alcohol, and it is extremely preferred to carry out the rinsing step using a monohydric alcohol having 5 or more carbon atoms.

The monohydric alcohol usable in the rinsing step is a linear, branched or cyclic monohydric alcohol, and specific examples thereof include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. Examples of a monohydric alcohol having 5 or more carbon atoms which is particularly suitable for use include 1-hexanol, 2-hexanol, 4-methyl-2-pentanol, 1-pentanol and 3-methyl-1-butanol and the like.

Any two or more of those ingredients may be mixed together, or each of these ingredients may be used as a mixture with an organic solvent other than those recited above.

The percentage water content in the rinsing solution is preferably 10 mass % or less, more preferably 5 mass % or less, particularly preferably 3 mass % or less. By adjusting the percentage of water content to fall in the range of 10 mass % or less, good development characteristics can be achieved.

The vapor pressure of a rinsing solution used after the developing step using an organic solvent-containing developer is, at 20° C., preferably from 0.05 kPa to 5 kPa, more preferably from 0.1 kPa to 5 kPa, most preferably from 0.12 kPa to 3 kPa. By adjusting the vapor pressure of a rinsing solution to fall within the range of 0.05 kPa to 5 kPa, in-plane temperature consistency of a wafer can be enhanced, and further swelling traceable to infiltration of the rinsing solution can be prevented; as a result, the wafer can have improved in-plane dimensional uniformity.

Even in a case where it further has the developing step using an alkali developer, the present pattern forming method preferably includes the cleaning step using a rinsing solution (rinsing step). The rinsing solution used therein is purified water, or it can also be purified water to which a surfactant is added in an appropriate amount.

A method for cleaning treatment in the rinsing step is not limited to particular one, and thereto it is possible to apply e.g. a method of continuing to discharge a rinsing solution onto a substrate spinning at a constant speed (a spin coating method), a method of dipping a substrate in a bath filled with a rinsing solution for a given time (a dip method), a method of spraying a rinsing solution on the surface of a substrate (a spray method) or so on. Of these methods, the spin coating method is preferred to the others, and it is preferable that, after the cleaning treatment according to the spin coating method, the rinsing solution is removed from the substrate by rotating the substrate at a rotational speed of 2,000 rpm to 4,000 rpm. In addition, it is also preferable that the present pattern forming method includes a heating step after the rinsing step (Post Bake). The developer and the rinsing solution remaining between patterns and in the inside of the pattern can be removed by the bake. The heating step after the rinsing step is carried out at a temperature ranging usually from 40° C. to 160° C., preferably from 70° C. to 95° C., for a time ranging usually from 10 seconds to 3 minutes, preferably from 30 seconds to 90 seconds.

It is possible to carry out supercritical fluid treatment in order to remove the developer or the rinsing solution remaining on the pattern after the development processing and the rinsing treatment.

Further, a heating step may be carried out between the step (iii) and the step (iv) hereafter described in detail. This heating step brings a tendency to allow a negative pattern formed in the step (iii) to have improved resistance to a solvent, and even when a coating of solution including the composition (II) is put on the negative pattern in the subsequent step (iv), the negative pattern can resist damage. This heating step is generally carried out at a temperature on the order of 80° C. to 240° C. for a time on the order of 30 seconds to 120 second.

In the step (iv), by the use of the composition (II) containing (A') a compound capable of increasing polarity by an action of an acid to decrease solubility in an organic solvent-containing remover, a second film is formed on the negative pattern formed in the foregoing manner.

For example, to the pattern formed on a substrate, a coating of the composition (II) is applied to form a second film by using one of previously known methods, such as a spin coating method. In this case, heating may be carried out on an as needed basis at a temperature on the order of, say, 80° C. to 110° C. for a time on the order of, say, 60 seconds to 120 seconds.

Between the step (iv) and the step (v) hereafter described in detail, a step of exposing the second film may be carried out. As the method for exposure in this step, the technique found in the above description of the exposure method usable in the step (ii) can be adopted as they are, but open-frame exposure without using a mask (overall exposure) is generally adopted.

By this exposure, an acid can further be generated from the compound (B) present in the negative pattern, and from the interface between the negative pattern and the second film formed thereon, the acid can be made to diffuse into the second film to a sufficient degree. As a result, the reaction for increasing the polarity of the compound (A') in the second film can be induced with more certainty, and a trench dimension or a hole dimension can be reduced to a sufficient degree. Thus there develops a tendency to allow certain formation of a trench pattern or a hole pattern, having ultrafine width or hole diameter of, say, 40 nm or less.

Then the step (v) of increasing the polarity of the compound (A') present in the second film by an action of an acid generated from the compound (B) present in the negative pattern formed in the step (iii) is carried out.

In the step (v), the acid generated from the compound (B) present in the negative pattern diffuses into the coating from the interface between the negative pattern and the coating, and by the action of this acid there occurs reaction allowing an increase in polarity of the compound (A') in the coating.

The step (v) has no particular restrictions so long as it allows an increase in the polarity of the compound (A') present in the second film by the action of the acid generated from the compound (B) present in the negative pattern formed in the step (iii), but it is preferably a step of heating the negative pattern formed in the step (iii) (also a step of heating the coating as the second film in a substantial sense).

By carrying out this heating step, the acid generated from the compound (B) is made to diffuse from the interface between the negative pattern and the coating into the coating with certainty; as a result, the reaction allowing an increase in polarity of the compound (A') present in proximity of the pattern progresses in the coating with more certainty.

This heating step is generally carried out at a temperature on the order of 80° C. to 170° C. for a time on the order of 30 seconds to 120 seconds.

Subsequently to the step (v), the step (vi) is carried out wherein an area of the second film, in which the area is an area in which the compound (A') has not yet undergone reaction with the acid generated from the compound (B), is removed by using an organic solvent-containing remover.

A method applicable to such a removal processing is similar to the method used for the development processing in the step (iii). The removing time is chosen from a range e.g. of the order of 30 seconds to 120 seconds.

The Examples and preferred examples of a remover usable in the removal processing include the same ones as recited above in relation to the organic developer in the step (iii).

After the step (vi), it is preferable that the present pattern forming method further includes a step of cleaning with an organic solvent-containing rinsing solution (a rinsing step).

The rinsing solution used in the rinsing step has no particular restrictions so long as the pattern is not dissolved therein, and a solution containing a general organic solvent is usable. Examples of such a solution include those recited above as the rinsing solution in the description of the rinsing step which can be carried out between the step (iii) and the step (iv).

A method for cleaning treatment in the rinsing step is not limited to particular one, and thereto it is possible to apply e.g. a method of continuing to discharge a rinsing solution onto a substrate spinning at a constant speed (a spin coating method), a method of dipping a substrate in a bath filled with a rinsing solution for a given time (a dip method), a method of spraying a rinsing solution on the surface of a substrate (a spray method) or so on. Of these methods, the spin coating method is preferred over the others, and it is preferable that, after the cleaning treatment according to the spin coating method, the rinsing solution is removed from the substrate by rotating the substrate at a rotational speed of 2,000 rpm to 4,000 rpm.

<Actinic Ray-Sensitive or Radiation-Sensitive Resin Composition (1)>

The actinic ray-sensitive or radiation-sensitive resin composition (I) used in the present pattern forming method is illustrated below.

The actinic ray-sensitive or radiation-sensitive resin composition (I) is a typical resist composition, and that a negative resist composition (namely a resist composition to be developed with an organic solvent). In addition, the actinic ray-sensitive or radiation-sensitive resin composition (I) is a typical chemical amplification resist composition.

[1] (A) Resin Capable of Increasing Polarity by the Action of an Acid to Decrease Solubility in an Organic Solvent-Containing Developer One example of (A) a resin which is incorporated in the actinic ray-sensitive or radiation sensitive resin composition (I) and can increase polarity to decrease solubility in an organic solvent-containing developer can be a resin having a group capable of decomposing by an action of an acid to produce a polar group (hereinafter referred to as "acid-decomposable group", too) in either its main chain or side chain thereof, or both of its main chain or side chain (hereinafter such a resin is referred to as "an acid-decomposable resin" or "a resin (A)", too).

The acid-decomposable group preferably has a structure that its polar group is protected with a group capable of decomposing and leaving by the action of an acid.

The polar group has no particular restrictions so long as it becomes slightly soluble or insoluble in an organic solvent-containing developer, and examples thereof include a phenolic hydroxyl group, an acidic group (a group capable of dissociating in a 2.38 mass % aqueous solution of tetramethylammonium hydroxide which has been conventionally used as the developer for a resist) such as a carboxyl group, a fluorinated alcohol group (preferably a hexafluoroisopropanol group), a sulfonic acid group, a sulfonamide group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl) imido group, a bis(alkylsulfonyl)methylene group, a bis (alkylsulfonyl)imido group and a tris(alkylcarbonyl)methylene group, and an alcoholic hydroxyl group.

In addition, the alcoholic hydroxyl group is a hydroxyl group bonded to a hydrocarbon group and indicates a hydroxyl group except for a hydroxyl group directly bonded on an aromatic ring (phenolic hydroxyl group), and an aliphatic alcohol substituted with an electron-withdrawing group such as fluorine atom at the α-position (for example, a fluorinated alcohol group (e.g., hexafluoroisopropanol)) is excluded from the hydroxyl group. The alcoholic hydroxyl group is preferably a hydroxyl group having a pKa of 12 to 20.

Preferred examples of the polar group include a carboxyl group, a fluorinated alcohol group (preferably a hexafluoroisopropanol group) and a sulfonic acid group.

The group preferred as the acid-decomposable group is a group where a hydrogen atom of the group above is substituted for by a group capable of leaving by the action of an acid.

Examples of the group capable of leaving by the action of an acid include —$C(R_{36})(R_{37})(R_{38})$, —$C(R_{36})(R_{37})(OR_{39})$ and —$C(R_{01})(R_{02})(OR_{39})$.

In the above formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring.

Each of $R_{01}$ and $R_{02}$ independently represents a hydrogen atom, an alkyl group, a cycloalkyl group, an aryl group, an aralkyl group or an alkenyl group.

The alkyl group of $R_{36}$ to $R_{39}$, $R_{01}$ and $R_{02}$ is preferably an alkyl group having a carbon number of 1 to 8, and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be monocyclic or polycyclic. The monocyclic cycloalkyl group is preferably a cycloalkyl group having a carbon number of 3 to 8, and examples thereof include a cyclopropyl group, a cyclobutyl group, a cyclopentyl group, a cyclohexyl group and cyclooctyl group. The polycyclic cycloalkyl group is preferably a cycloalkyl group having a carbon number of 6 to 20, and examples thereof include an adamantyl group, a norbornyl group, an isobomyl group, a camphamyl group, a dicyclopentyl group, an α-pinenyl group, a tricyclodecanyl group, a tetracyclododecyl group and an androstanyl group. Incidentally, at least one carbon atom in the cycloalkyl group may be substituted with a heteroatom such as an oxygen atom.

The aryl group of $R_{36}$ to $R_{39}$, $R_{01}$ and $R_{02}$ is preferably an aryl group having a carbon number of 6 to 10, and examples thereof include a phenyl group, a naphthyl group and an anthryl group.

The aralkyl group of $R_{36}$ to $R_{39}$, $R_{01}$ and $R_{02}$ is preferably an aralkyl group having a carbon number of 7 to 12, and examples thereof include a benzyl group, a phenethyl group, and a naphthylmethyl group.

The alkenyl group of $R_{36}$ to $R_{39}$, $R_{01}$ and $R_{02}$ is preferably an alkenyl group having a carbon number of 2 to 8, and examples thereof include a vinyl group, an allyl group, a butenyl group, and a cyclohexenyl group.

The ring formed by combining $R_{36}$ and $R_{37}$ is preferably a cycloalkyl group (monocyclic or polycyclic). The cycloalkyl group is preferably a monocyclic cycloalkyl group such as a cyclopentyl group and a cyclohexyl group, or a polycyclic cycloalkyl group such as a norbornyl group, a tetracyclodecanyl group, a tetracyclododecanyl or an adamantyl group. Of these groups, a monocyclic cycloalkyl group having a carbon number of 5 or 6 is preferable to the others, and a monocyclic cycloalkyl group having a carbon number of 5 is especially preferred.

The acid-decomposable group is preferably a cumyl ester group, an enol ester group, an acetal ester group, a tertiary alkyl ester group or the like, more preferably a tertiary alkyl ester group.

It is preferable that the resin (A) contains a repeating unit having an acid-decomposable group.

The resin (A) preferably contains a repeating unit represented by the following formula (I) as the repeating unit having an acid-decomposable group.

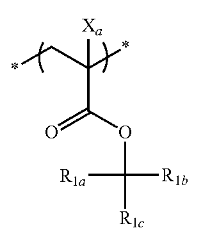

(I)

In the above formula (I), $X_a$ represents a hydrogen atom, an alkyl group, a cyano group or a halogen atom.

Each of $R_{1a}$, $R_{1b}$ and $R_{1c}$ independently represents an alkyl group or a cycloalkyl group.

Any two of $R_{1a}$, $R_{1b}$ and $R_{1c}$ may combine together to form a ring structure.

The alkyl group of $X_a$ may have a substituent, and examples of the substituent include a hydroxyl group and a halogen atom (preferably a fluorine atom).

The alkyl group of $X_a$ is preferably an alkyl group having a carbon number of 1 to 4, and examples thereof include a methyl group, an ethyl group, a propyl group, a hydroxymethyl group or a trifluoromethyl group. Of these groups, a methyl group is preferable to the others.

$X_a$ is preferably a hydrogen atom or a methyl group.

The alkyl group of $R_{1a}$, $R_{1b}$ and $R_{1c}$ is preferably an alkyl group having a carbon number of 1 to 4, such as a methyl group, an ethyl group, an n-propyl group, an isopropyl group, an n-butyl group, an isobutyl group and a t-butyl group.

The cycloalkyl group of $R_{1a}$, $R_{1b}$ and $R_{1c}$ is preferably a monocyclic cycloalkyl group, such as a cyclopentyl group or a cyclohexyl group, or a polycyclic cycloalkyl group, such as a norbornyl group, a tetracyclodecanyl group, a tetracyclododecanyl group or an adamantyl group.

The ring structure which any two of $R_{1a}$, $R_{1b}$ and $R_{1c}$ combine to form is preferably a monocyclic cycloalkane ring, such as a cyclopentyl ring or a cyclohexyl ring, or a polycyclic cycloalkyl ring, such as a norbornane ring, a tetracyclodecane ring, a tetracyclododecane ring or an adamantane ring. Of these rings, a monocyclic cycloalkane ring having a carbon number of 5 or 6 is particularly preferable.

It is preferable that each of $R_{1a}$, $R_{1b}$ and $R_{1c}$ independently represents an alkyl group, preferably a linear or branched alkyl group having a carbon number of 1 to 4.

Each of the groups recited above may further have a substituent. Examples of the substituent include a halogen atom, an alkoxy group (having a carbon number of 1 to 4), a carboxyl group and an alkoxycarbonyl group (having a carbon number of 2 to 6). The carbon number is preferably is 8 or less.

Specific examples of the repeating unit represented by formula (I) are illustrated below, but these examples should not be construed as limiting the scope of the invention.

In the specific examples, Rx represents a hydrogen atom, $CH_3$, $CF_3$ or $CH_2OH$. Each of Rxa and Rxb independently represents an alkyl group having a carbon number of 1 to 4. Z represents a substituent. When a plurality of Zs are present, each Z may be the same as or different from every other Z. p represents 0 or a positive integer. Specific examples and preferred examples of Z are the same as specific examples and preferred examples of the substituent which each group such as $R_{1a}$ to $R_{1c}$ may have.

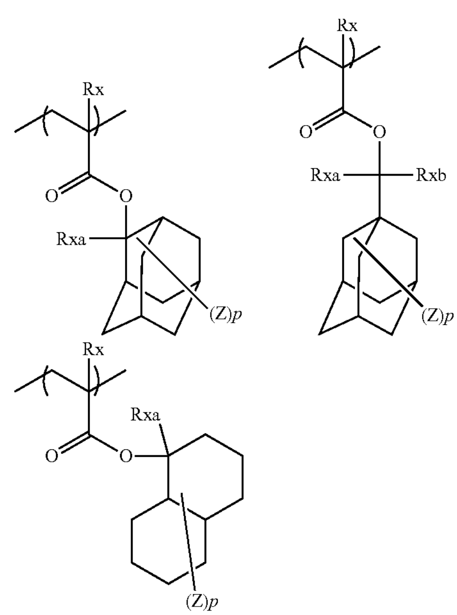

-continued
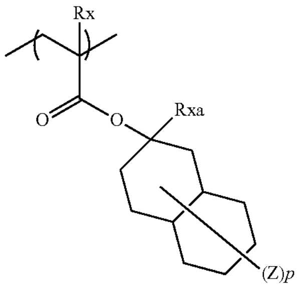
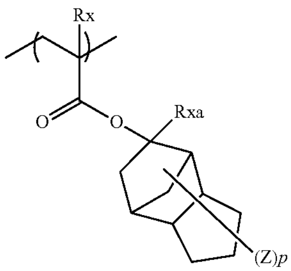
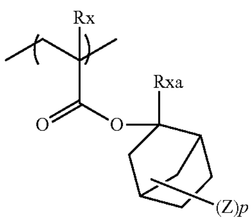
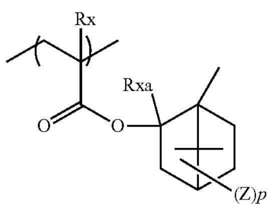
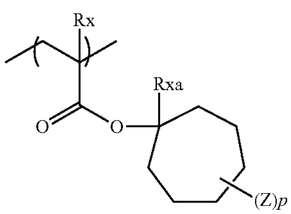
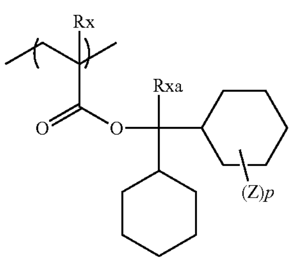
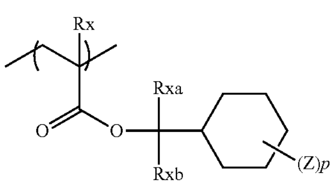
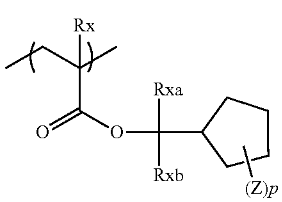
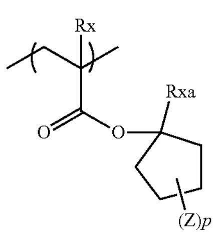
-continued
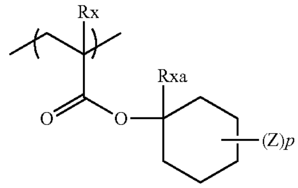
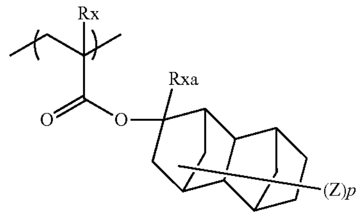
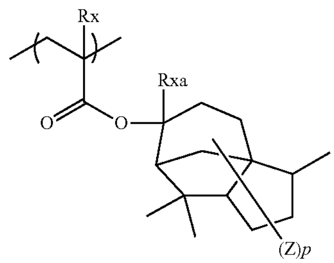
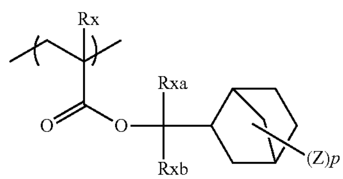
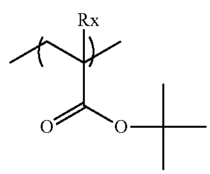
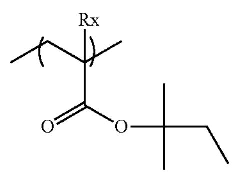
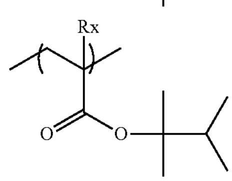
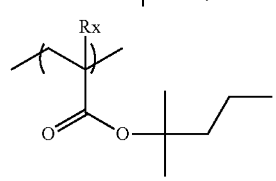
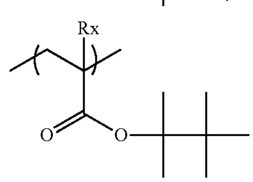
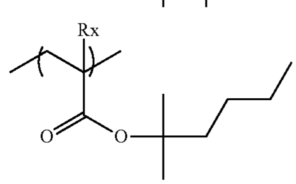
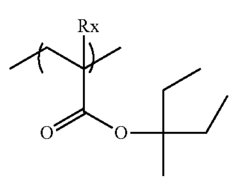
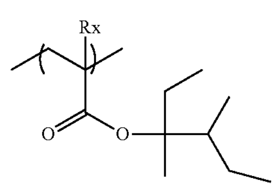

-continued

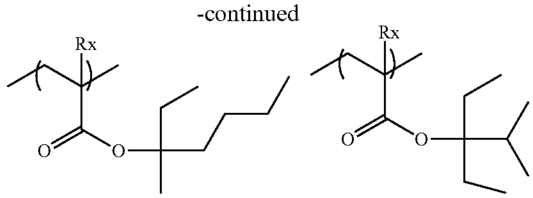

The repeating unit represented by formula (I) may be used alone, or any two or more thereof may be used in combination.

It is also preferable that the resin (A) contains a repeating unit represented by the following formula (AI).

(AI)

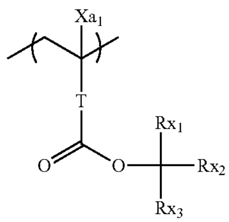

In formula (AI), $Xa_1$ represents a hydrogen atom, an alkyl group, a cyano group or a halogen atom.

T represents a divalent linking group.

Each of $Rx_1$ to $Rx_3$ independently represents an alkyl group or a cycloalkyl group.

Any two of $Rx_1$ to $Rx_3$ may combine to form a ring structure.

Examples of the divalent linking group represented by T include an alkylene group, a —COO-Rt- group, a —O-Rt- group and a phenylene group. Herein, Rt represents an alkylene group or a cycloalkylene group.

Among those groups, T is preferably a —COO-Rt- group. Rt is preferably an alkylene group having a carbon number of 1 to 5, more preferably —$CH_2$— group, —$(CH_2)_2$— group or —$(CH_2)_3$— group.

Examples and preferred examples of the alkyl group of $Xa_1$ are similar to examples and preferred examples of the alkyl group of Xa in formula (I).

Examples and preferred examples of the alkyl group or the cycloalkyl group of $Rx_1$ to $Rx_3$ are similar to examples and preferred examples of the alkyl group or the cycloalkyl group of $R_{1a}$ to $R_{1c}$ in formula (I).

Examples and preferred examples of the ring structure formed by combining any two of $Rx_1$ to $Rx_3$ are similar to examples and preferred examples of the ring structure formed by combining any two of $R_{1a}$ to $R_{1c}$ in formula (I).

Each of the groups recited above may have a substituent, and examples of the substituent include an alkyl group (containing a carbon number of 1 to 4), a cycloalkyl group (containing carbon number of 3 to 8), a halogen atom, an alkoxy group (containing a carbon number of 1 to 4), a carboxyl group and an alkoxycarbonyl group (containing a carbon number of 2 to 6), and the carbon number is preferably 8 or less. Of these groups, the substituent containing no a hetero atom, such as an oxygen atom, a nitrogen atom and a sulfur atom, is preferable to the others from the viewpoint of more enhancing the contrast of dissolution in an organic solvent-containing solvent between before and after acid decomposition (more specifically, it is preferable that the substituent is not hydroxyl-substituted alkyl group or the like), the substituent whose individual constituent atoms are hydrogen atoms and carbon atoms are more preferred, and a linear or branched alkyl group and a cycloalkyl group are especially suitable as the substituent.

Specific examples of the repeating unit represented by formula (AI) are illustrated below, but these examples should not be construed as limiting the scope of the invention.

In the specific examples, $X_{a1}$ represents a hydrogen atom, $CH_3$, $CF_3$ or $CH_2OH$. Z represents a substituent, and when a plurality of Zs are present, each Z may be the same as or different from every other Z. p represents a 0 or a positive integer. Examples and preferred examples of Z are similar to examples and preferred examples of the substituents each group such as $Rx_1$ to $Rx_3$ and the like may have.

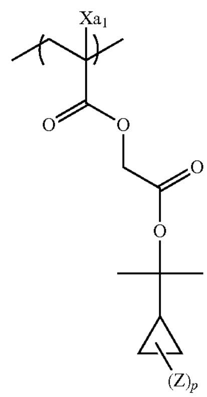

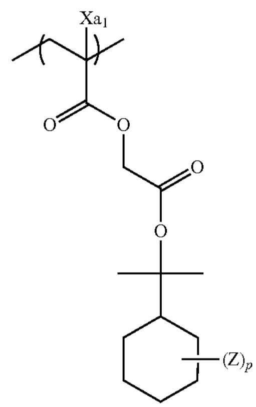

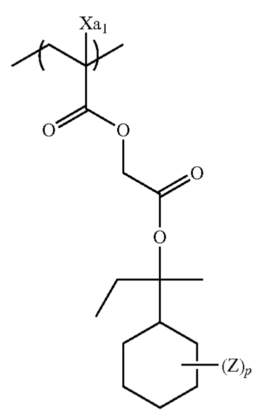

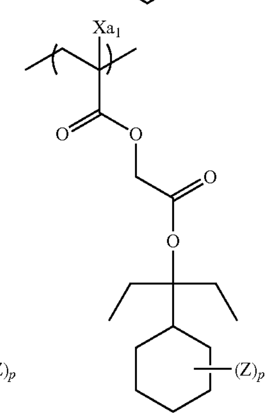

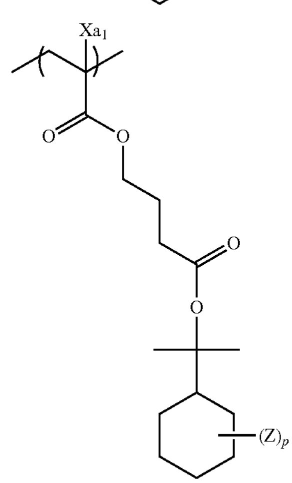

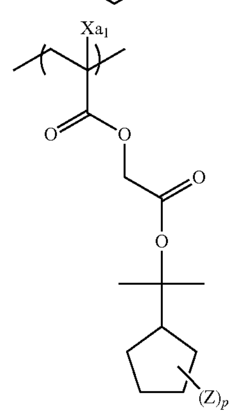

-continued
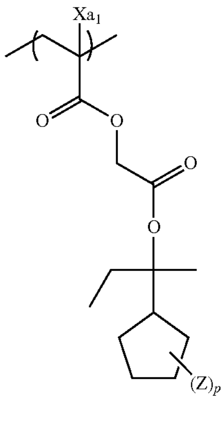
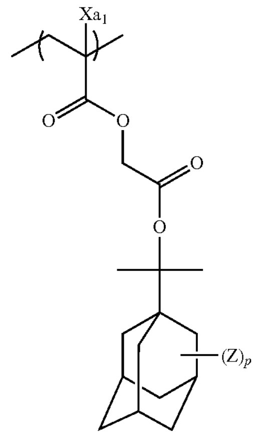
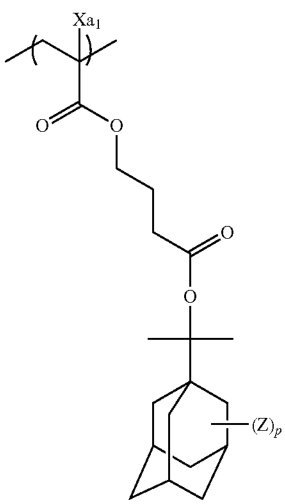
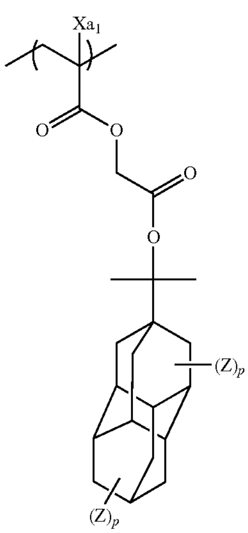
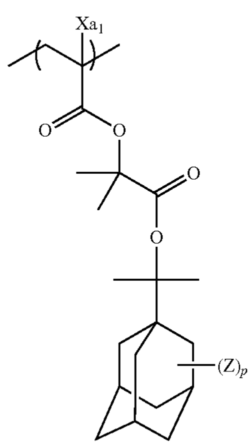
-continued
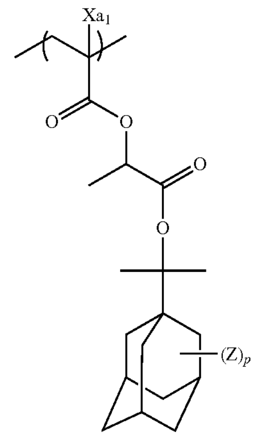
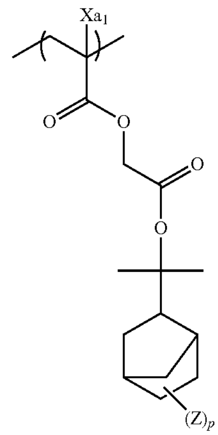
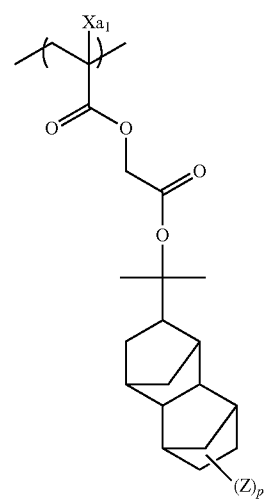
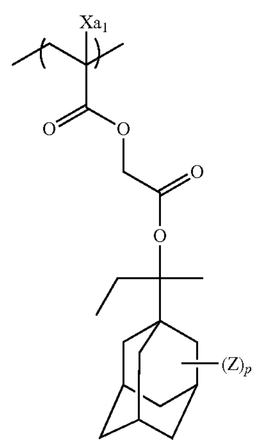
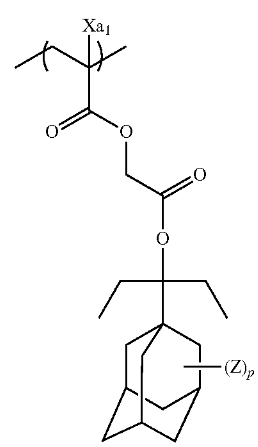
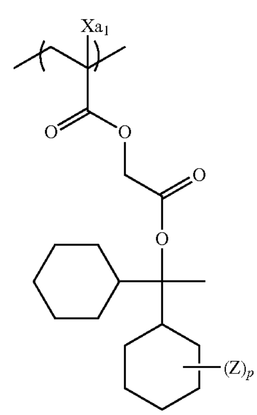

-continued
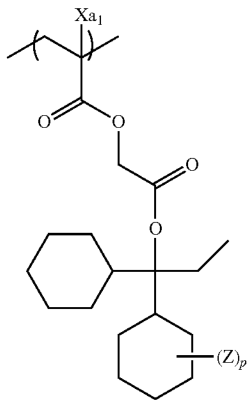
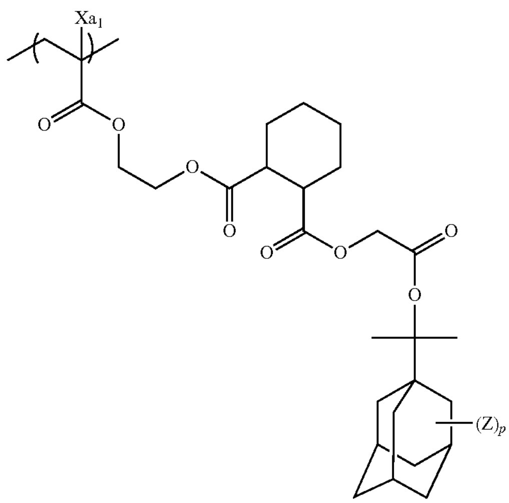
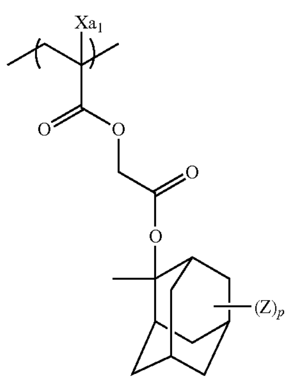
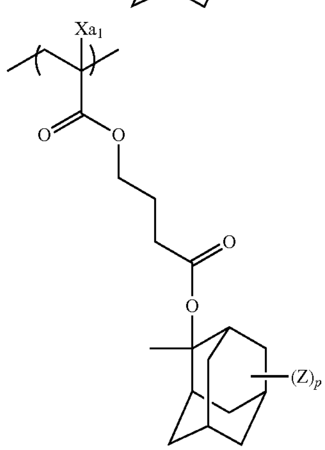
-continued
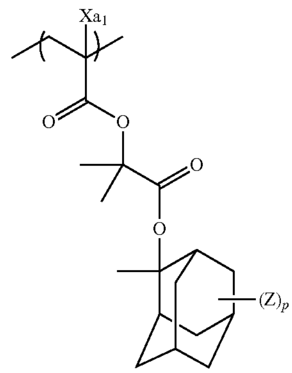
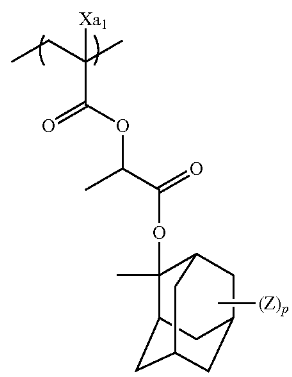
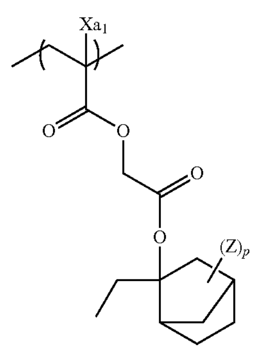
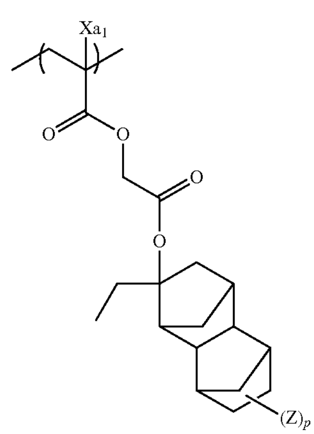

-continued

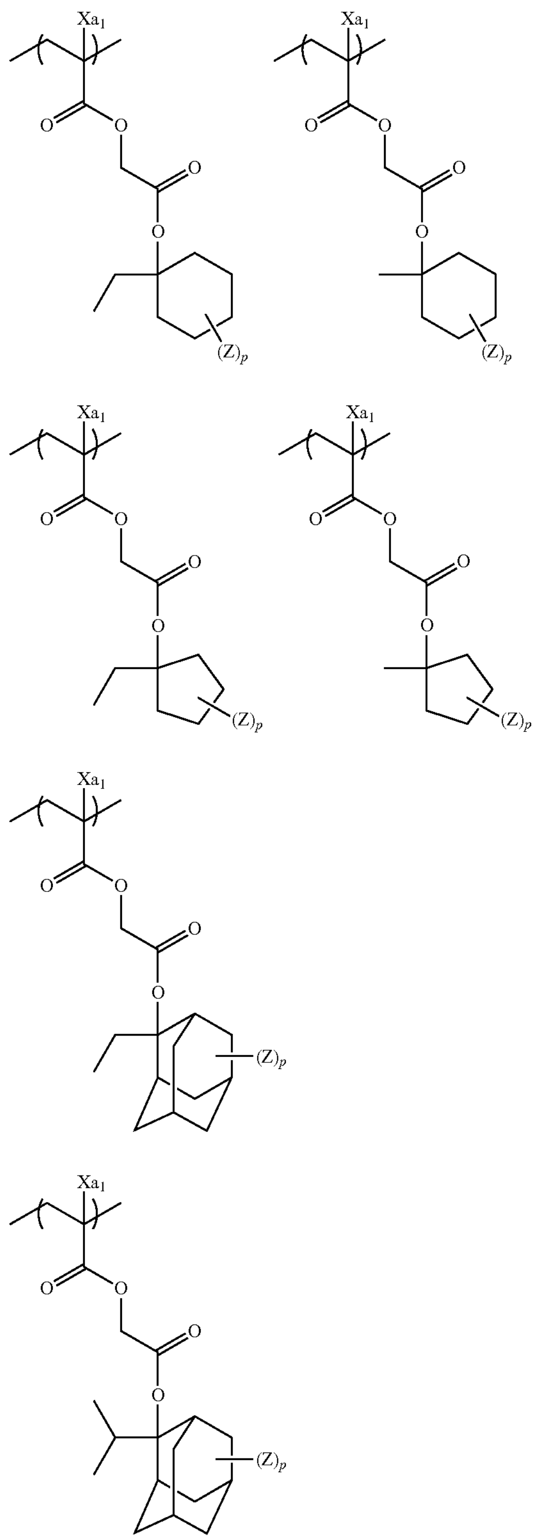

In addition, it is also preferable that the resin (A) contains a repeating unit represented by the following formula (IV) as the acid-decomposable repeating unit.

(IV)

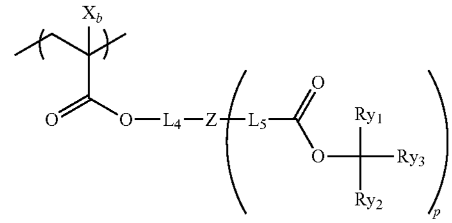

In formula (IV), Xb represents a hydrogen atom, an alkyl group, a cyano group or a halogen atom.

Each of $Ry_1$ to $Ry_3$ independently represents an alkyl group or a cycloalkyl group. Any two of $Ry_1$ to $Ry_3$ may combine to form a ring.

Z represents a (p+1)-valent linking group having a polycyclic hydrocarbon structure which may have a hetero atom as a ring member thereof. And Z preferably includes no ester linkage in constituent atoms of the polycyclic ring (or equivalently, Z preferably contains no lactone ring as a constituent ring of the polycyclic ring).

Each of $L_4$ and $L_5$ independently represents a single bond or a divalent linking group.

p represents an integer of 1 to 3.

When p is 2 or 3, each of a plurality of $L_5$s, each of a plurality of $Ry_1$s, each of a plurality of $Ry_2$s and each of a plurality of $Ry_3$s may be the same as or different from every other $L_5$, $Ry_1$, $Ry_2$ and $Ry_3$, respectively.

The alkyl group of Xb may have a substituent, and examples of the substituent include a hydroxyl group and a halogen atom (preferably a fluorine atom).

The alkyl group of Xb is preferably an alkyl group having a carbon number of 1 to 4, and examples thereof include a methyl group, an ethyl group, a propyl group, a hydroxymethyl group and a trifluoromethyl group. Of these groups, a methyl group is preferred over the others.

Xb is preferably a hydrogen atom or a methyl group.

Examples and preferred examples of the alkyl group or the cycloalkyl group of $Ry_1$ to $Ry_3$ are similar to examples and preferred examples of the alkyl group or the cycloalkyl group of $R_{1a}$ to $R_{1c}$ in formula (I).

Examples and preferred examples of the ring structure formed by combining any two of $Ry_1$ to $Ry_3$ are similar to examples and preferred examples of the ring structure formed by combining any two of $R_{1a}$ to $R_{1c}$ in formula (I).

It is preferable that each of $Ry_1$ to $Ry_3$ independently represents an alkyl group, preferably a linear or branched alkyl group having a carbon number of 1 to 4. Moreover, the total carbon number in the linear or branched alkyl group as $Ry_1$ to $Ry_3$ is preferably 5 or less.

Each of $Ry_1$ to $Ry_3$ may further have a substituent, and examples of the substituent include the same ones as included in examples of the substituent each of $Rx_1$ to $Rx_3$ in formula (AI) may further have.

The linking group having a polycyclic hydrocarbon structure of Z includes a ring-assembly hydrocarbon ring group and a crosslinked cyclic hydrocarbon ring, and more specifically, it can be a group formed by removing (p+1) arbitrary hydrogen atoms from a ring-assembly hydrocarbon ring group or a group formed by removing (p+1) arbitrary hydrogen atoms from a crosslinked cyclic hydrocarbon ring.

Examples of the ring-assembly hydrocarbon ring group include a bicyclohexane ring group and a perhydronaphthalene ring group. Examples of the crosslinked cyclic hydrocarbon ring include bicyclic hydrocarbon ring group, such as a pinane ring group, a bornane ring group, a norpinane ring group, a norbornane ring group and a bicyclooctane ring group (e.g. a bicyclo[2.2.2]octane ring group, a bicyclo [3.2.1]octane ring group); a tricyclic hydrocarbon ring group, such as a homobledane ring group, an adamantane ring group, a tricyclo[5.2.1.$0^{2,6}$]decane ring group and a tricyclo[4.3.1.$1^{2,5}$]undecane ring group; and a tetracyclic hydrocarbon ring group, such as a tetracyclo[4.4.0.$1^{2,5}$.$1^{7,10}$]dodecane ring group and perhydro-1,4-methano-5,8-methanonaphthalene ring group. And the crosslinked cyclic hydrocarbon ring group also includes a condensed cyclic hydrocarbon ring group, such as a condensed ring group formed by fusing a plurality of 5- to 8-membered cycloalkane ring groups together. Examples of thereof include a perhydronaphthalene (decalin) ring group, a perhydroanthracene ring group, a perhydrophenanthrene ring group, a perhydroacenaphthene ring group, a perhydrofluorenone ring group, a perhydroindene ring group and a perhydrophenalene ring group.

Preferred examples of the crosslinked cyclic hydrocarbon ring group include a norbornane ring group, an adamantane ring group, a bicyclooctane ring group and a tricyclo [5.2.1.$0^{2,6}$]decane ring group. Of these crosslinked cyclic hydrocarbon ring groups, a norbornane ring group and an adamantane ring group are more preferred.

The linking group having a polycyclic hydrocarbon structure, the group represented by Z, may have a substituent. Examples of the substituent which Z may have include a substituent such as an alkyl group, a hydroxyl group, a cyano group, a keto group (an alkylcarbonyl group), an acyloxy group, —COOR, —CON(R)$_2$, —SO$_2$R, —SO$_3$R and —SO$_2$NR$_2$. Herein, R represents a hydrogen atom, an alkyl group, a cycloalkyl group or an aryl group.

The alkyl group, the alkylcarbonyl group, the acyloxy group, —COOR, —CON(R)$_2$, —SO$_2$R, —SO$_3$R and —SO$_2$NR$_2$ as the substituent which Z may have may further have a substituent. Examples of such a substituent include a halogen atom (preferably a fluorine atom).

In the linking group having a polycyclic hydrocarbon structure represented by Z, the carbon constituting the polycyclic ring (the carbon atom contributing to ring formation) may be carbonyl carbon. In addition, the polycyclic ring may contain, as mentioned above, a hetero atom like an oxygen atom or a sulfur atom as a ring member. However, as mentioned above, Z contains no ester linkage as an atomic group constituting the polycyclic ring.

Examples of a linking group represented by $L_4$ and $L_5$ include —COO—, —OCO—, —CONH—, —NHCO—, —CO—, —O—, —S—, —SO—, —SO$_2$—, an alkylene group (preferably having a carbon number of 1 to 6), a cycloalkylene group (preferably having a carbon number of 3 to 10), an alkenylene group (preferably having a carbon number of 2 to 6), and a linking groups formed by combining a plurality of these groups recited above. The total number of a carbon number in the linking group is preferably 12 or less.

$L_4$ is preferably a single bond, an alkylene group, —COO—, —OCO—, —CONH—, —NHCO—, -alkylene group-COO—, -alkylene group-OCO—, -alkylene group-CONH—, -alkylene group-NHCO—, —CO—, —O—, —SO$_2$—, or -alkylene group-O—. Among them, a single bond, an alkylene group, -alkylene group-COO— or -alkylene group-O— are mope preferred as $L_4$.

$L_5$ is preferably a single bond, an alkylene group, —COO—, —OCO—, —CONH—, —NHCO—, —COO-alkylene group-, —OCO-alkylene group-, —CONH-alkylene group-, —NHCO-alkylene group-, —CO—, —O—, —SO$_2$—, —O-alkylene group- or —O-cycloalkylene group-. Among them, a single bond, an alkylene group, —COO-alkylene group-, —O-alkylene group- or —O-cycloalkylene group- is more preferred as $L_5$.

In the descriptions above, the bond "-", at the left end means to be bonded to the ester bond on the main chain side in $L_4$, and bonded to Z in $L_5$. On the other hand, the bond, "-", at the right end means to be bonded to Z in $L_4$, and bonded to the ester bond connected to the group represented by $(Ry_1)(Ry_2)(Ry_3)C$— in $L_5$.

Incidentally, $L_4$ and $L_5$ may be bonded to the same atom constituting the polycyclic ring in Z.

p is preferably 1 or 2, more preferably 1.

Specific examples of the repeating unit represented by formula (IV) are illustrated below, but these examples should not be construed as limiting the scope of the invention. In the following specific examples, Xa represents a hydrogen atom, an alkyl group, a cyano group or a halogen atom.

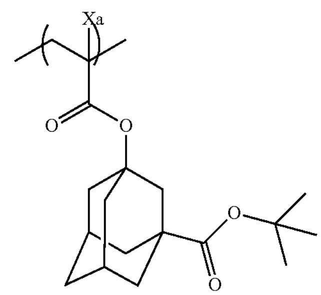

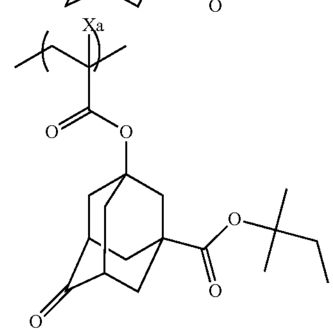

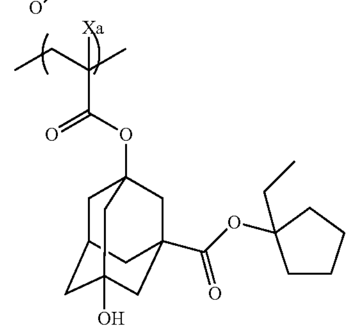

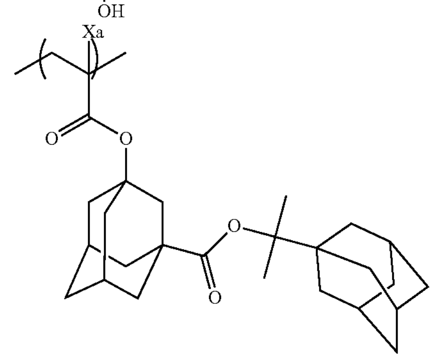

-continued
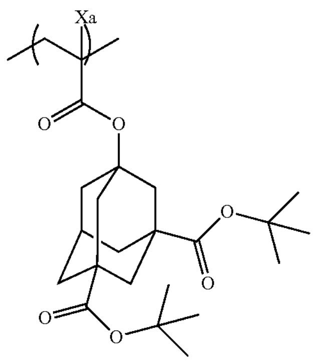
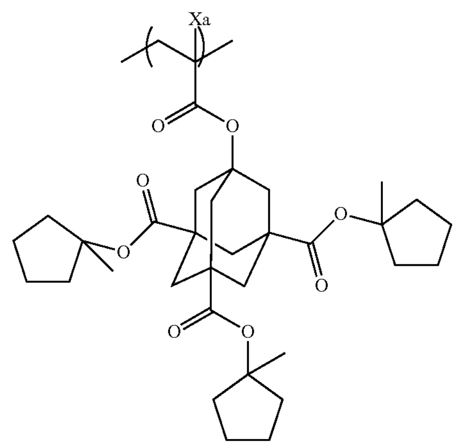
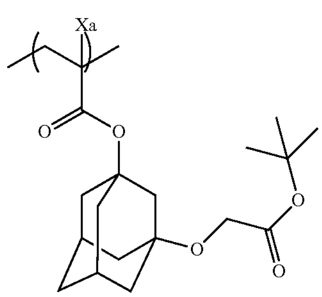
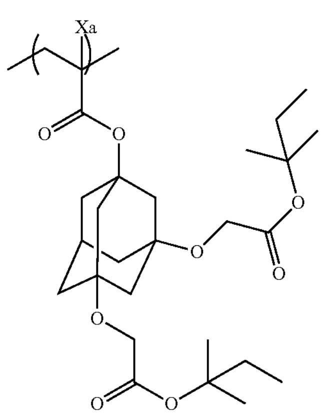
-continued
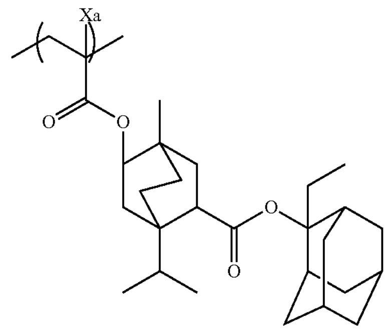
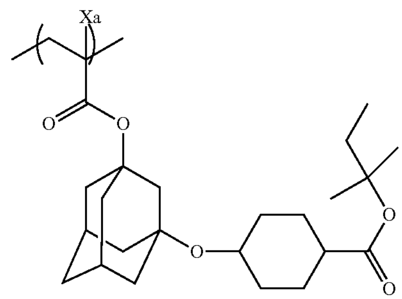
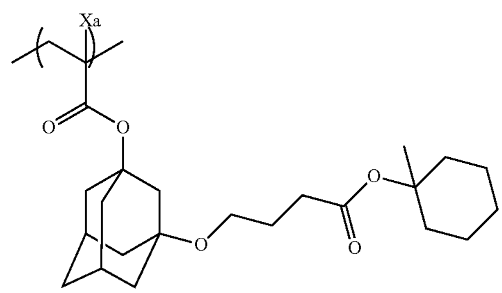
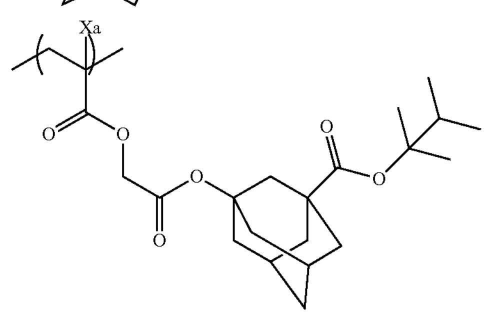
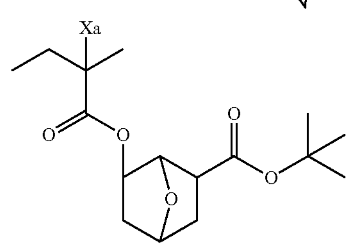
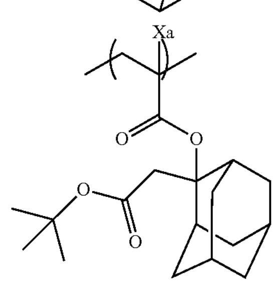

-continued
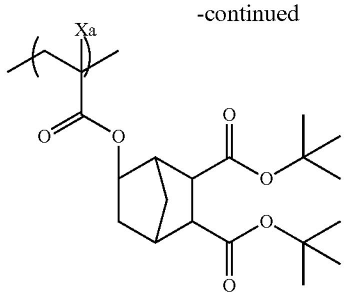
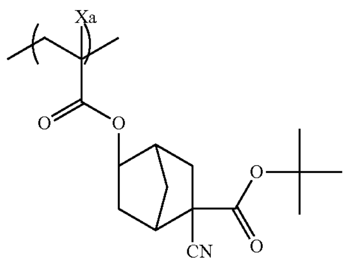
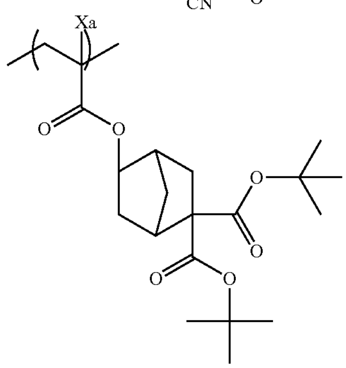
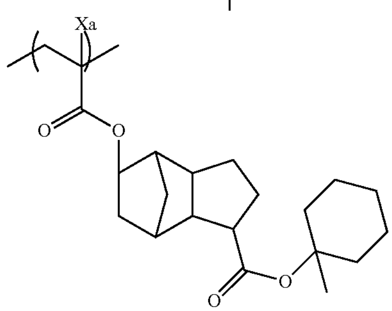
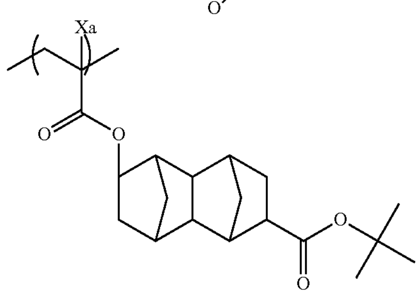
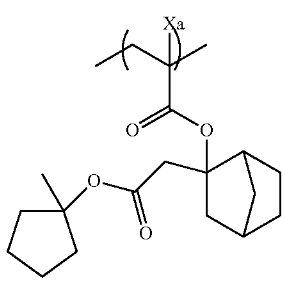
-continued
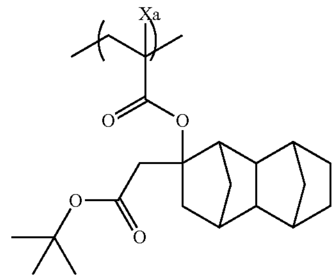
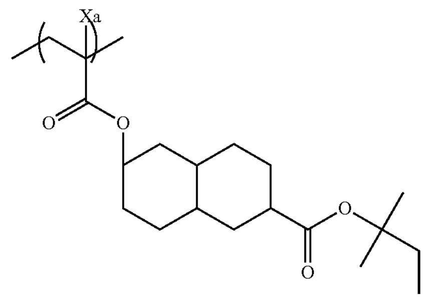
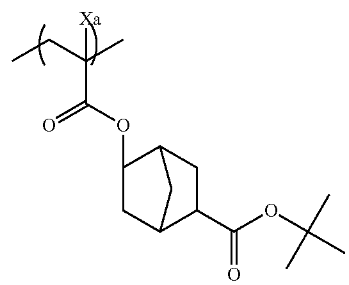
As the repeating unit having an acid-decomposable group, the resin (A) may also contain a repeating unit capable of decomposing by the action of an acid to produce an alcoholic hydroxyl group. Examples of such a repeating unit are illustrated below.
In the following examples, $Xa_1$ represents a hydrogen atom, $CH_3$, $CF_3$ or $CH_2OH$.
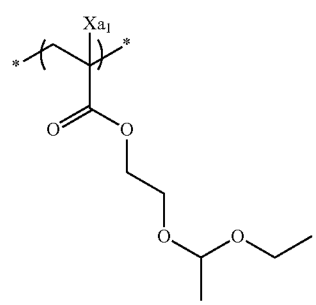
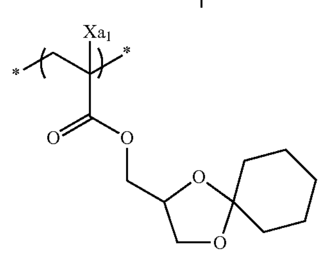

-continued
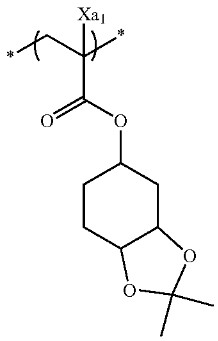
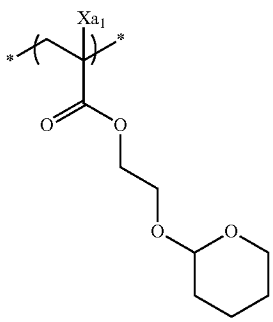
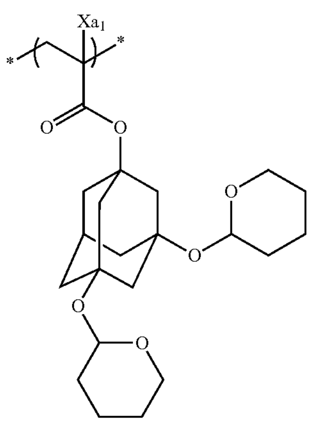
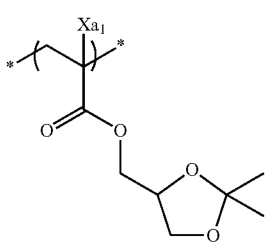
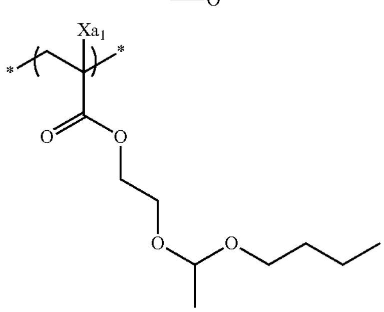
-continued
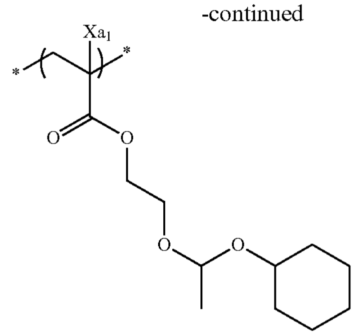
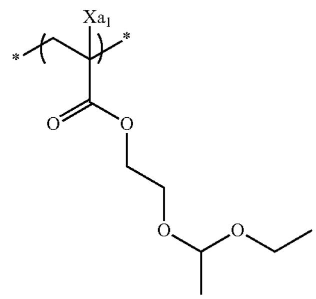
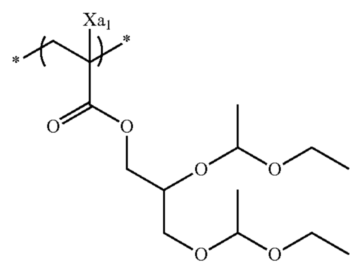
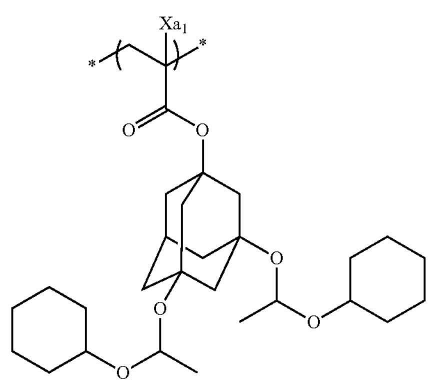
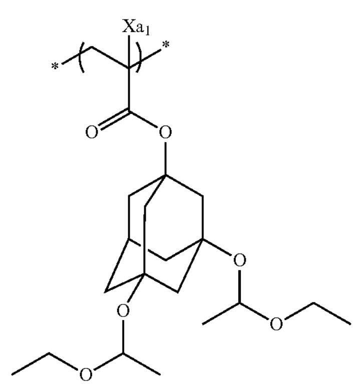

-continued

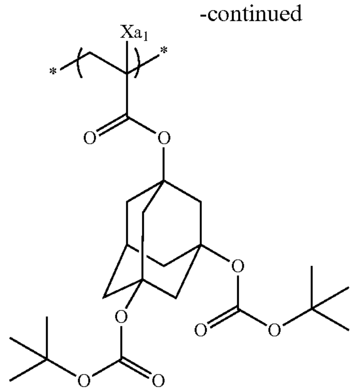

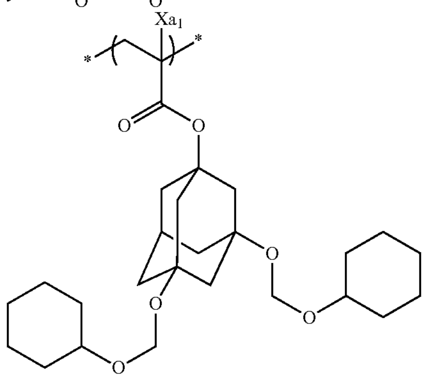

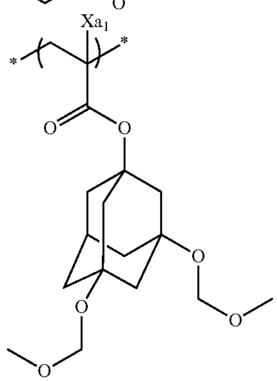

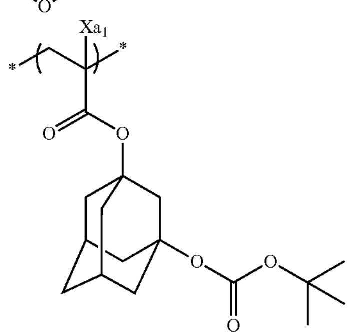

The repeating unit having an acid-decomposable group may be used alone, or any two or more of them may be used in combination.

In the resin (A), the content of the repeating unit having an acid-decomposable group (when a plurality of the repeating units having an acid-decomposable group are present, the total content thereof) is preferably 15 mol % or more, more preferably 20 mol % or more, further preferably 25 mol % or more, particularly preferably 50 mol % or more, based on all the repeating units of the resin (A). By adjusting the content to be 50 mol % or more, local uniformity in pattern dimension can be made more excellent.

In addition, the content of the repeating unit having an acid-decomposable group is preferably 80 mol % or less, more preferably 70 mol % or less, further preferably 65 mol % or less, based on all the repeating units of the resin (A).

The resin (A) may further contain a repeating unit having a lactone structure or a sultone structure.

The lactone structure or the sulfone structure, though any structure can be used as long as it has a lactone structure or a sultone structure, is preferably a 5- to 7-membered lactone structure or a 5- to 7-membered sultone structure, more preferably a structure formed by fusing a 5- to 7-membered lactone structure and another ring structure together in the shape of a bicyclo structure or a Spiro structure, or a structure formed by fusing a 5- to 7-membered sultone structure and another ring structure together in the shape of a bicyclo structure or a spiro structure. It is more preferable that the resin (A) contains a repeating unit having a lactone structure represented by any of the following formulae (LC1-1) to (LC1-21) or a sultone structure represented by any of the following formulae (SL1-1) to (SL1-3). Additionally, the lactone structure or the sultone structure may be bound directly to the main chain. Preferred lactone structures are (LC1-1), (LC1-4), (LC1-5), (LC1-6), (LC1-13), (LC1-14) and (LC1-17), and the particularly preferred one is (LC1-4). By using a lactone structure as specified above, LER and development defect can be reduced.

LC1-1

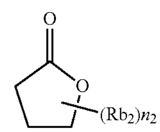

LC1-2

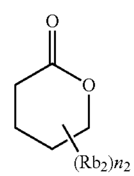

LC1-3

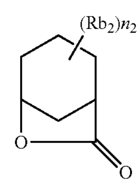

LC1-4

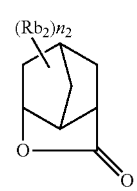

LC1-5

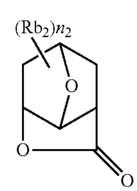

-continued
LC1-6
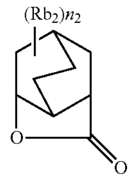
LC1-7
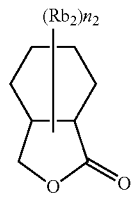
LC1-8
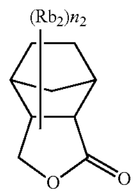
LC1-9
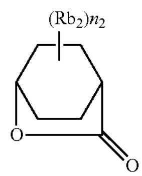
LC1-10
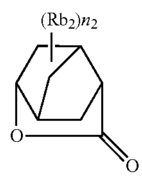
LC1-11
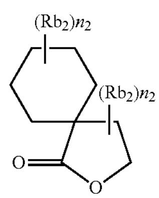
LC1-12
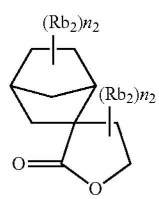
LC1-13
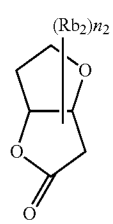
-continued
LC1-14
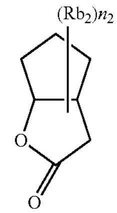
LC1-15
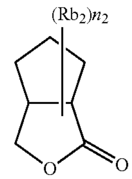
LC1-16
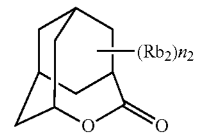
LC1-17
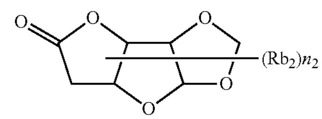
LC1-18
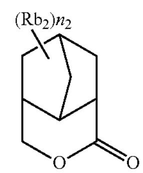
LC1-19
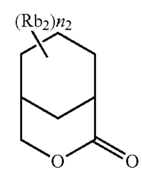
LC1-20
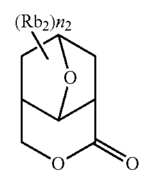
LC1-21
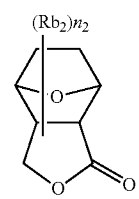
SL1-1
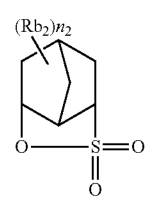

-continued

SL1-2

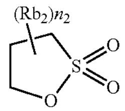

SL1-3

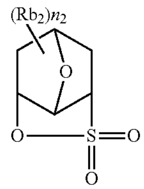

The lactone structure part or the sultone structure part may or may not have a substituent ($Rb_2$). Examples of a preferred substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 2 to 8, a carboxyl group, a halogen atom, a hydroxyl group, a cyano group and an acid-decomposable group. Of these groups, an alkyl group having a carbon number of 1 to 4 and a cyano group and an acid-decomposable group are preferred over the others. $n_2$ represents an integer of 0 to 4. When n is $n_2$ or more, each substituent ($Rb_2$) may be the same as or different from every other substituent ($Rb_2$). And any two of the substituents ($Rb_2$s) may combine with each other to form a ring.

As to the repeating unit having a lactone structure or a sultone structure, optical isomers are generally present, and any of them may be used. In other words, one optical isomer may be used by itself, or a plurality of optical isomers may be used as a mixture. When one optical isomer is mainly used, the optical purity (ee) thereof is preferably 90% or more, more preferably 95% or more.

The repeating unit having a lactone structure or a sultone structure is preferably a repeating unit represented by the following formula (III).

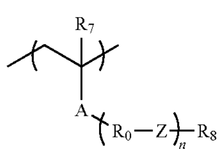

(III)

In formula (III), A represents an ester bond (a group represented by —COO—) or an amide bond (a group represented by —CONH—); when a plurality of $R_0$s are present, each of them independently represents an alkylene group, a cycloalkylene group or a combination of these groups; and when a plurality of Zs are present, each of them independently represents a single bond, an ether bond, an ester bond, an amide bond, a urethane bond.

(a group represented by

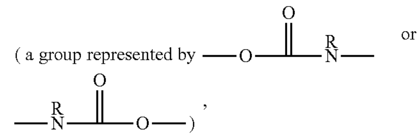

or an urea bond (a group represented by

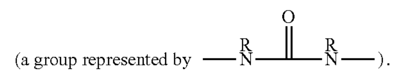

Herein, each R independently represents a hydrogen atom, an alkyl group, a cycloalkyl group or an aryl group.

$R_8$ represents a univalent organic group having a lactone structure or a sultone structure.

n is the number of repetitions of a structure represented by —$R_0$—Z—, and represents an integer of 0 to 5. n is preferably 0 or 1, far preferably 0. When n is 0, —$R_0$—Z— is absent, and it becomes a single bond.

$R_7$ represents a hydrogen atom, a halogen atom or an alkyl group.

The alkylene or cycloalkylene group of $R_0$ may have a substituent.

Z is preferably an ether bond or an ester bond, particularly preferably an ester bond.

The alkyl group of $R_7$ is preferably an alkyl group having a carbon number of 1 to 4, more preferably a methyl group or an ethyl group, particularly preferably a methyl group.

Each of the alkylene group or cycloalkylene group of $R_0$ and the alkyl group of $R_7$ may have substituted. Examples of such a substituent include a halogen atom such as a fluorine atom, a chlorine atom and a bromine atom, a mercapto group, a hydroxyl group, an alkoxy group such as a methoxy group, an ethoxy group, an isopropoxy group, a t-butoxy group and a benzyloxy group, and an acyloxy group such as an acetyloxy group and a propionyloxy group.

$R_7$ is preferably a hydrogen atom, a methyl group, a trifluoromethyl group or a hydroxymethyl group.

The linear alkylene group suitable as $R_0$ is preferably a linear alkylene group having a carbon number of 1 to 10, more preferably a linear alkylene group having a carbon number of 1 to 5, and the examples thereof include a methylene group, an ethylene group and a propylene group. The cycloalkylene group suitable as $R_0$ is a cycloalkylene group having a carbon number of 3 to 20, and the examples thereof include a cyclohexylene group, a cyclopentylene group, a norbornylene group and an adamantylene group. In order to produce the effects of the invention, $R_0$ is preferably a linear alkylene group, especially a methylene group.

$R_8$, a univalent organic group with a lactone structure or a sultone structure, has no particular restrictions so long as it contains a lactone structure or a sultone structure. Examples of such structures include the lactone structures represented by formulae (LC1-1) to (LC1-21) and the sulfone structures represented by formulae (SL1-1) to (SL1-3). Among these structures, the structure represented by formula (LC1-4) is preferred. In addition, $n_2$ in each of (LC1-1) to (LC1-21) is preferably 2 or less.

And $R_8$ is preferably a univalent organic group having an unsubstituted lactone or sultone structure, or a univalent organic group having a lactone or sultone structure having a methyl group, a cyano group or an alkoxycarbonyl group as a substituent, more preferably a univalent organic group having a lactone structure having a cyano group as a substituent, namely a univalent organic group with a cyanolactone structure.

Examples of the repeating unit having a group having a lactone structure or a sultone structure are illustrated below, but these examples should not be construed as limiting the scope of the invention.

(In the following formulae, each Rx represents H, $CH_3$, $CH_2OH$ or $CF_3$.)

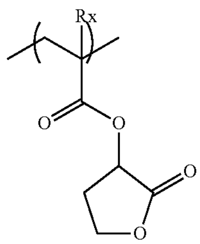
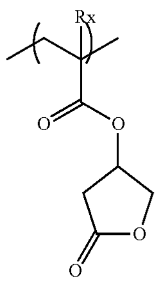
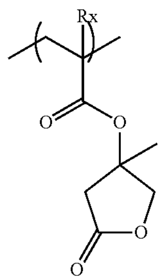
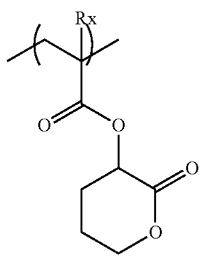
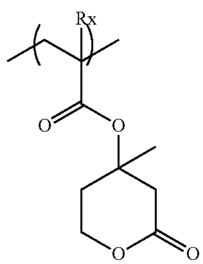
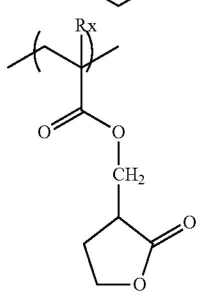
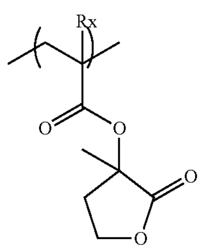
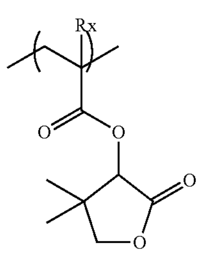
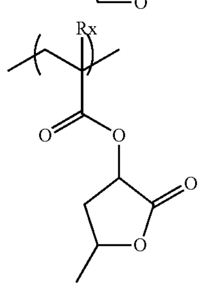
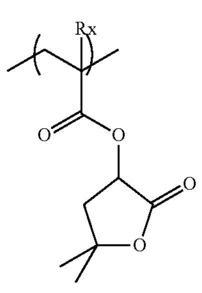
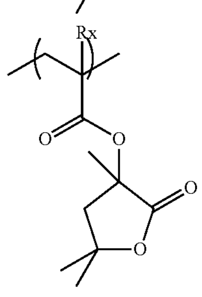

-continued

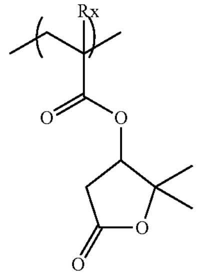
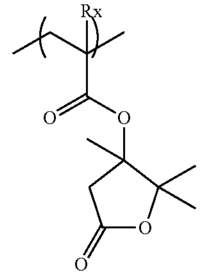
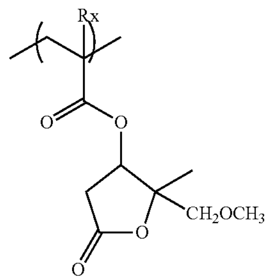
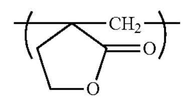
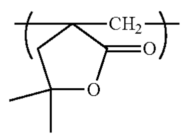

(In the following formulae, each Rx represents H, $CH_3$, $CH_2OH$ or $CF_3$.)

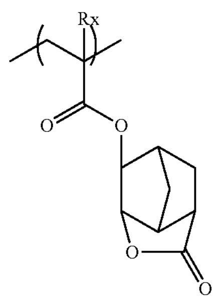
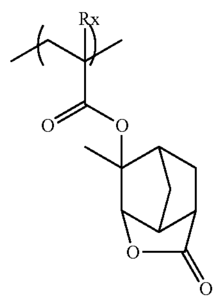
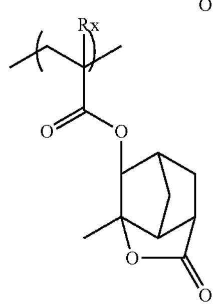
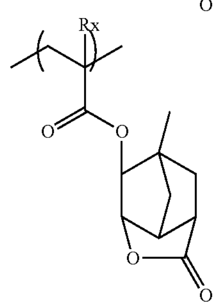
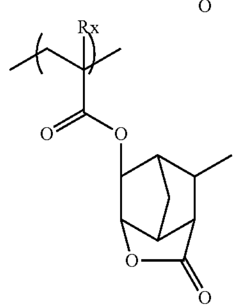
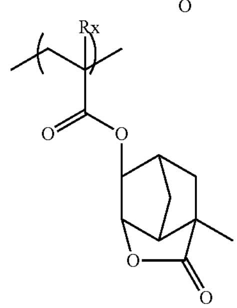

-continued
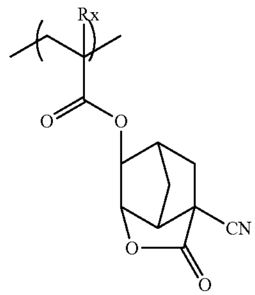
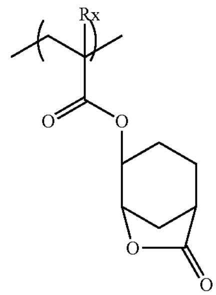
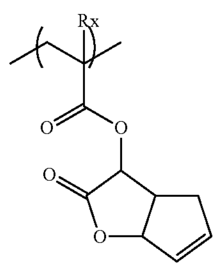
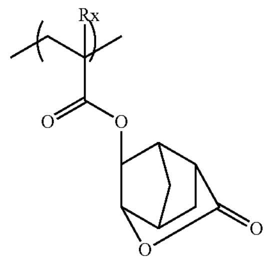
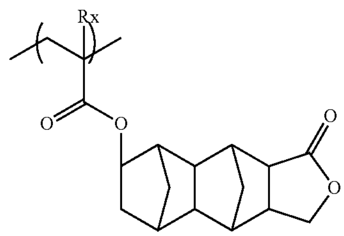
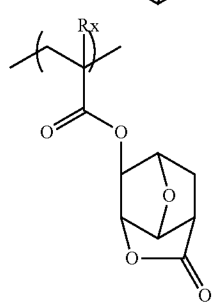
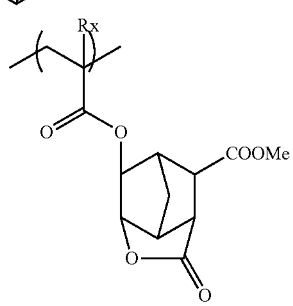
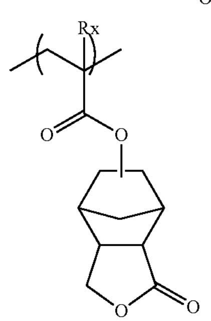
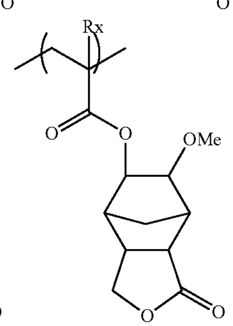
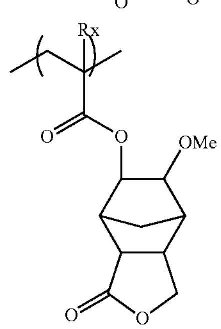
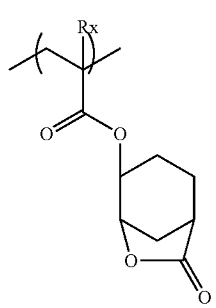
-continued
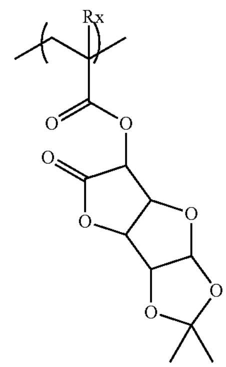
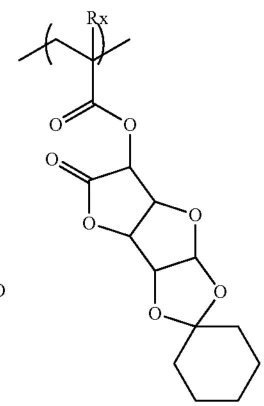
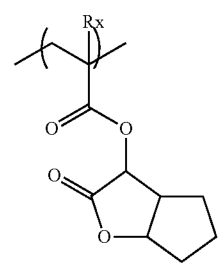
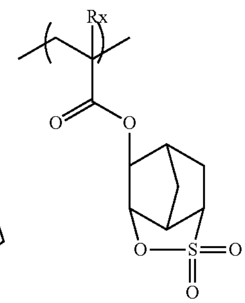
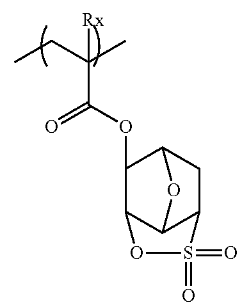
(In the following formulae, each Rx represents H, $CH_3$, $CH_2OH$ or $CF_3$.)
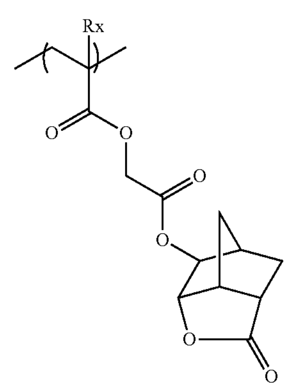

-continued
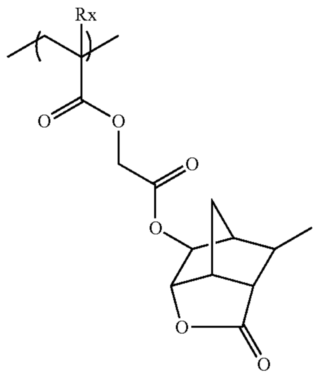
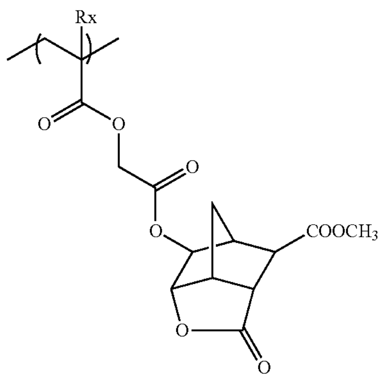
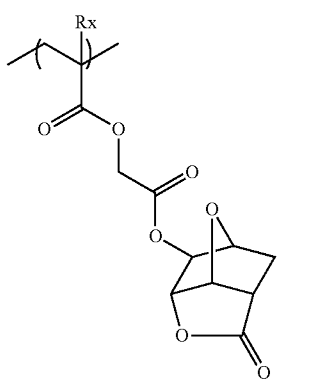
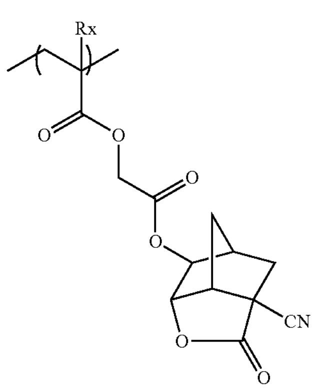
-continued
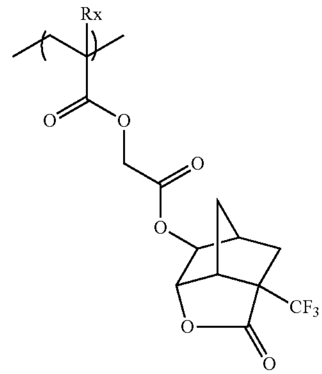
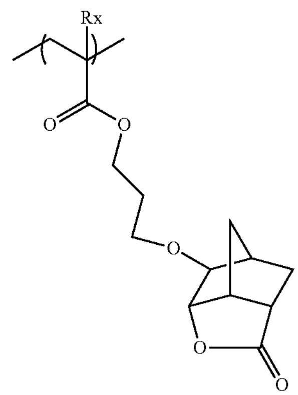
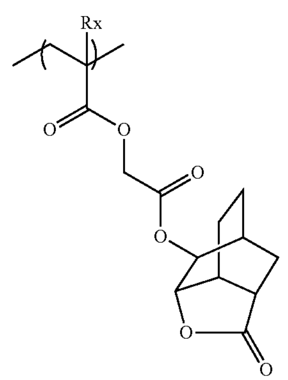
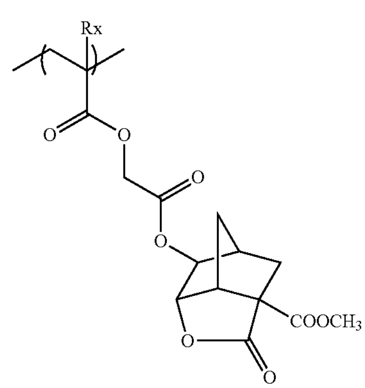

-continued

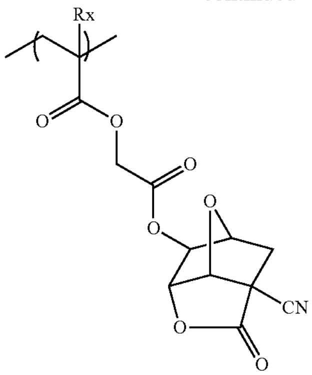

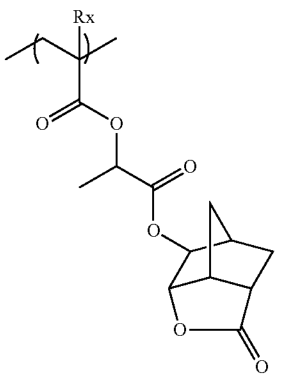

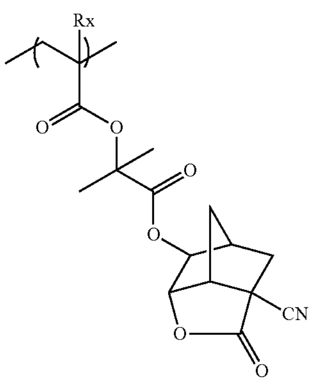

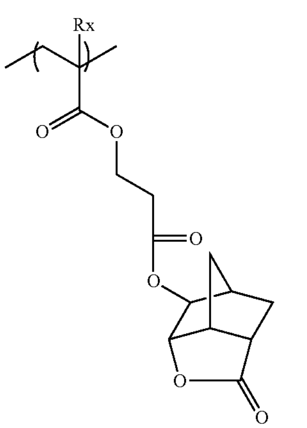

-continued

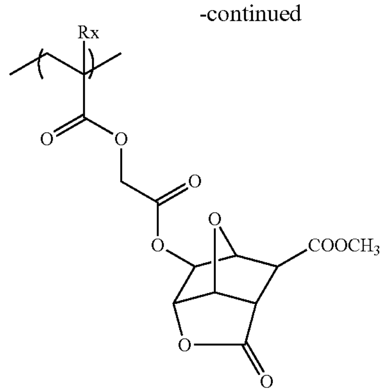

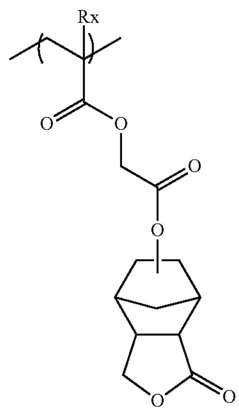

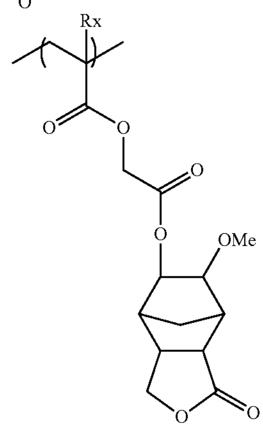

In order to enhance the effects of the invention, it is also possible to use two or more kinds of lactone structure- or sultone structure-containing repeating units in combination.

When the resin (A) contains a repeating unit having a lactone structure or a sultone structure, the content of the repeating unit having a lactone structure or a sultone structure is preferably from 5 mol % to 60 mol %, more preferably from 5 mol % to 55 mol %, further preferably from 10 mol % to 50 mol %, based on the total content of all repeating units of the resin (A).

In addition, the resin (A) may also contain a repeating unit having a cyclic carbonate structure.

The repeating unit having a cyclic carbonate structure is preferably a repeating unit represented by the following formula (A-1).

(A-1)

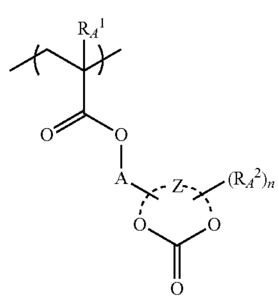

In formula (A-1), $R_A^1$ represents a hydrogen atom or an alkyl group.

When n is an integer of 2 or more, each of $R_A^2$s independently represents a substituent.

A represents a single bond or a divalent linking group.

Z represents an atomic group for forming a monocyclic or polycyclic structure together with the group represented by —O—C(═O)—O—.

n represents an integer of 0 or more.

The formula (A-1) is illustrated below in detail.

The alkyl group represented by $R_A^1$ may have a substituent such as a fluorine atom. The $R_A^1$ preferably represents a hydrogen atom, a methyl group or a trifluoromethyl group, more preferably a methyl group.

The substituent represented by $R_A^2$ is e.g. an alkyl group, a cycloalkyl group, a hydroxyl group, an alkoxy group, an amino group or an alkoxycarbonylamino group. Of these groups, an alkyl group having a carbon number of 1 to 5 is preferable, and the examples thereof include a linear alkyl group having a carbon number of 1 to 5, such as a methyl group, an ethyl group, a propyl group or a butyl group, and a branched alkyl group having a carbon number of 3 to 5, such as an isopropyl group, an isobutyl group or a t-butyl group. The alkyl group may have a substituent such as a hydroxyl group.

n is an integer of 0 or more which stands for the number of the substituent. For instance, n is preferably from 0 to 4, more preferably 0.

Examples of the divalent linking group represented by A include an alkylene group, a cycloalkylene group, an ester bond, an amide bond, an ether bond, a urethane bond, a urea bond and combinations of any two or more thereof. The alkylene group is preferably an alkylene group having a carbon number of 1 to 10, more preferably an alkylene group having a carbon number of 1 to 5, and the examples thereof include a methylene group, an ethylene group and a propylene group.

In an embodiment of the invention, it is preferred that A is a single bond or an alkylene group.

The monocyclic ring containing —O—C(═O)—O—, represented by Z, is e.g. a 5- to 7-membered ring wherein in the cyclic carbonate represented by the following formula (a) $n_A$ is 2, 3 or 4, preferably a 5-membered or 6-membered ring (wherein $n_A$ is 2 or 3), more preferably a 5-membered ring (wherein $n_A$ is 2).

The polycyclic ring containing —O—C(═O)—O—, represented by Z, has e.g. a condensed-ring or spiro-ring structure which a cyclic carbonate ester represented by formula (a) forms together with one or more than one different ring structure. The "different ring structure" capable of forming the condensed- or spiro-ring structure may be an alicyclic hydrocarbon group, or it may be an aromatic hydrocarbon group, or it may a hetero ring.

(a)

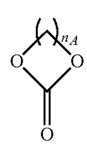

The monomers corresponding to the repeating unit represented by formula (A-1) can be synthesized using previously known methods as described e.g. in *Tetrahedron Letters*, Vol. 27, No. 32, p. 3741 (1986) and *Organic Letters*, Vol. 4, No. 15, p. 2561 (2002).

Into the resin (A), one kind among the repeating units represented by formula (A-1) may be incorporated by itself, or two or more kinds among the repeating units represented by formula (A-1) may be incorporated in combination. In the resin (A), the content of a repeating unit having a cyclic carbonate structure (preferably the content of a repeating unit represented by formula (A-1)) is preferably from 3 mol % to 80 mol %, more preferably from 3 mol % to 60 mol %, particularly preferably from 3 mol % to 30 mol %, extremely preferably from 10 mol % to 15 mol %, based on the total content of all repeating units constituting the resin (A). By adjusting the content to fall within such a range, the resist obtained can obtain improvements in developability, low deficiency, low LWR, low dependence of PEB on temperature, profile and so on.

Examples of the repeating unit represented by formula (A-1), namely the repeating units (A-1a) to (A-1w), are illustrated below, but these examples should not be construed as limiting the scope of the invention.

Additionally, $R_A^1$ in the following examples has the same meaning as in formula (A-1).

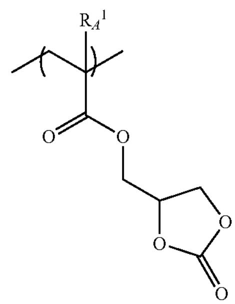

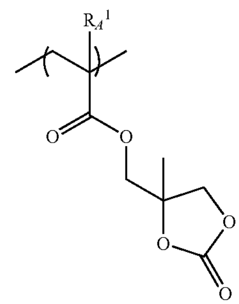

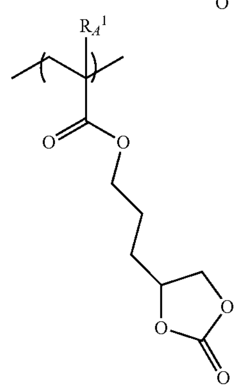

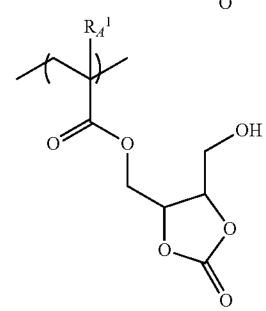

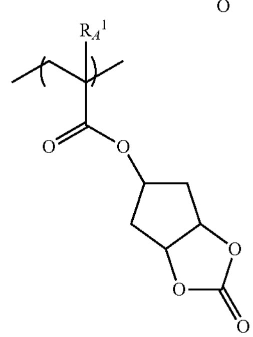

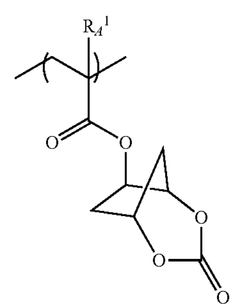

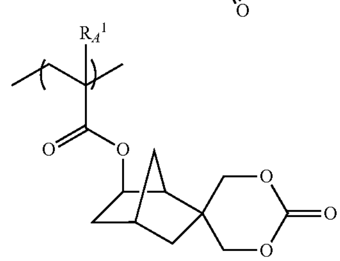

-continued

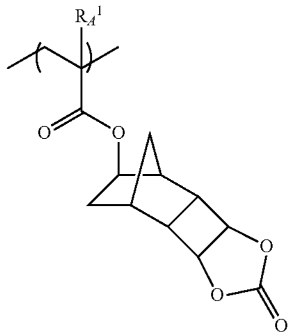

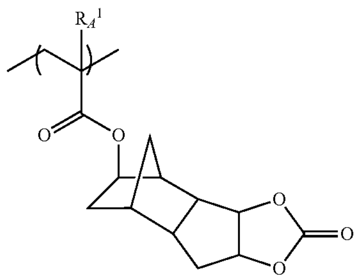

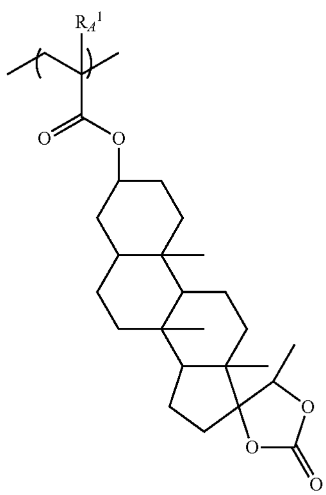

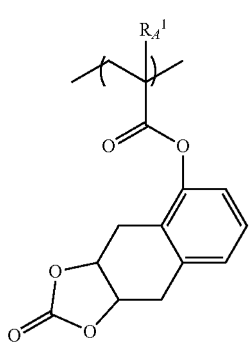

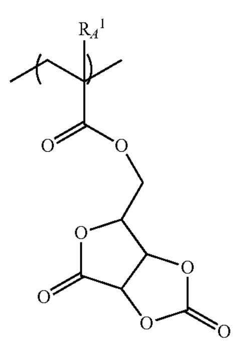

-continued

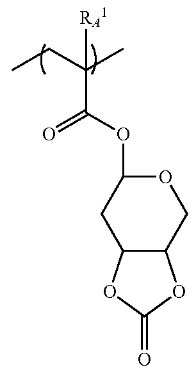

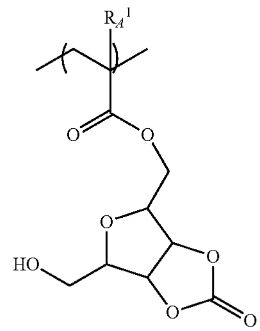

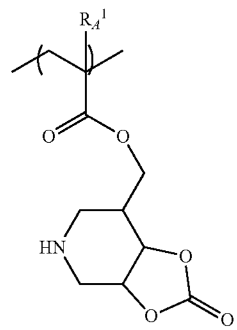

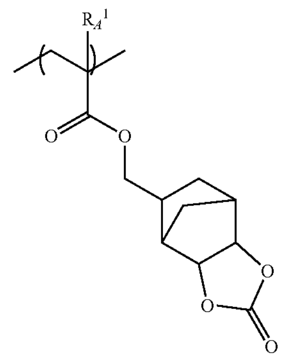

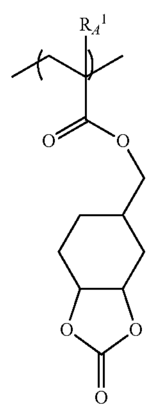

When the resin (A) contains a repeating unit having a cyclic carbonate structure, the content of the repeating unit having a cyclic carbonate structure is preferably from 5 mol % to 60 mol %, far preferably from 5 mol % to 55 mol %, further preferably from 10 mol % to 50 mol %, based on the total content of all repeating units in the resin (A).

The resin (A) may further contain a repeating unit having a hydroxyl group or a cyano group. By containing such a repeating unit, the resin (A) can get improvements in adhesiveness to substrates and affinity for developers. And it is preferable that the repeating unit having a hydroxyl group or a cyano group is a repeating unit having an alicyclic hydrocarbon structure substituted with a hydroxyl group or a cyano group and has no acid-decomposable group.

In addition, it is preferable that the repeating unit having an alicyclic hydrocarbon structure substituted with a hydroxyl group or a cyano group is different from the repeating unit having an acid-decomposable group (In other words, it is preferable that the repeating unit is a repeating unit stable to an acid).

The alicyclic hydrocarbon structure in the alicyclic hydrocarbon structure substituted with a hydroxyl group or a cyano group is preferably an adamantyl group, a diamantyl group or a norbornyl group.

Among the repeating unit, a repeating unit represented by any of the following formulae (AIIa), (AIIb) and (AIIc) can be exemplified.

(AIIa)

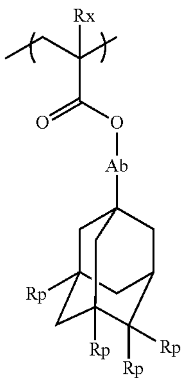

(AIIb)

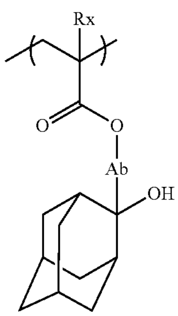

(AIIc)

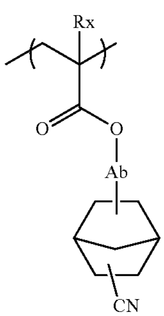

In the above formula, Rx represents a hydrogen atom, a methyl group, a hydroxymethyl group or a trifluoromethyl group.

Ab represents a single bond or a divalent linking group. Examples of the divalent linking group represented by Ab include an alkylene group, a cycloalkylene group, an ester bond, an amide bond, an ether bond, a urethane bond, a urea bond or combinations of two or more of the above. The alkylene group is preferably an alkylene group having a carbon number of 1 to 10, more preferably an alkylene group having a carbon number of 1 to 5, such as a methylene group, an ethylene group or a propylene group.

In an embodiment of the invention, Ab is preferably a single bond or an alkylene group.

Rp represents a hydrogen atom, a hydroxyl group or a hydroxyalkyl group. Among a plurality of Rp, each Rp may be the same as or different from every other Rp, but at least one of a plurality of Rps represents a hydroxyl group or a hydroxyalkyl group.

The resin (A) may or may not contain a repeating unit having a hydroxyl group or a cyano group, but when the repeating unit having a hydroxyl group or a cyano group is incorporated in the resin (A), the content thereof is preferably from 1 mol % to 40 mol %, more preferably from 3 mol % to 30 mol %, further preferably from 5 mol % to 25 mol %, based on the total content of all repeating units in the resin (A).

Examples of the repeating unit having a hydroxyl group or a cyano group are illustrated below, but these examples should not be construed as limiting the scope of the invention.

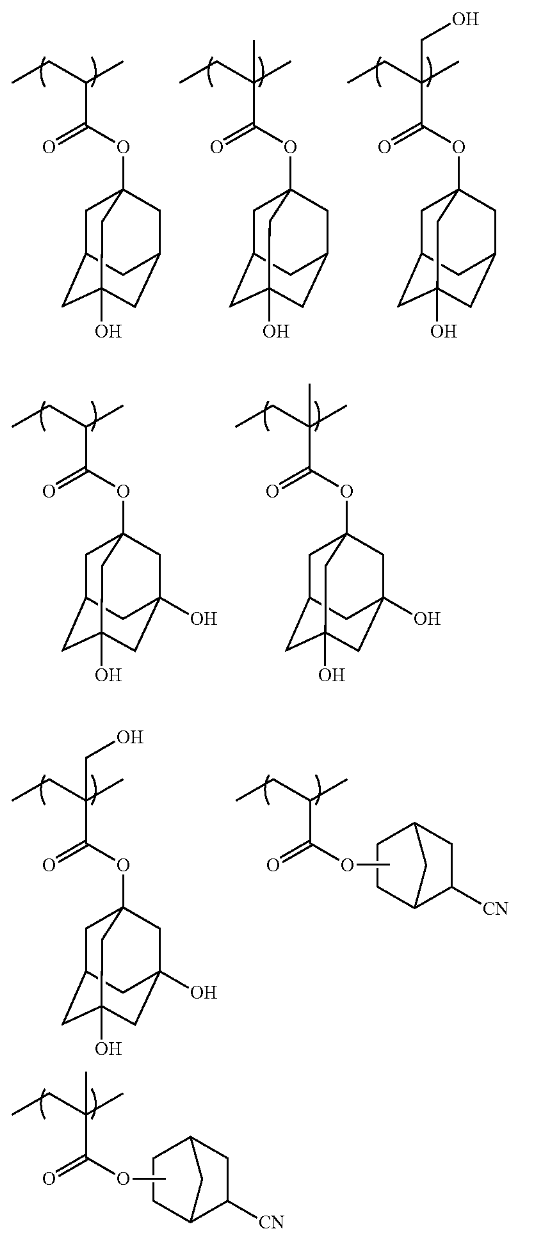

-continued

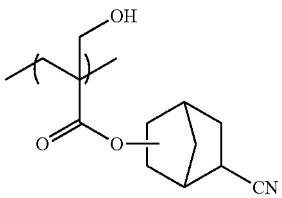

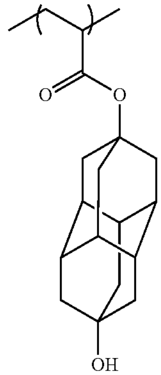

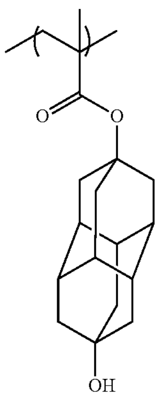

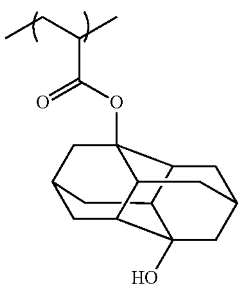

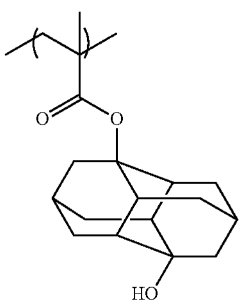

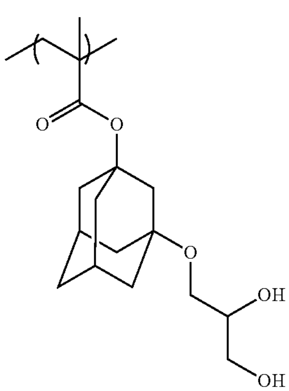

-continued

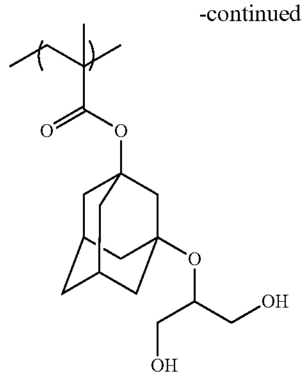

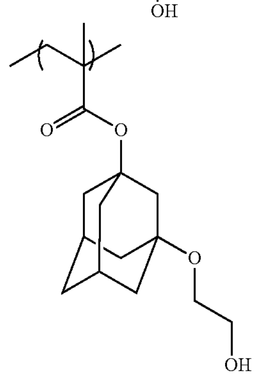

In addition to the above, the monomers disclosed in WO 2011/122336 specification, paragraphs from [0011], or the repeating units corresponding thereto can also be used as appropriate.

The resin (A) may contain a repeating unit having an acid group. Examples of the acid group include a carboxyl group, a sulfonamide group, a sulfonylimide group, a bissulfonylimide group, a naphthol structure and an aliphatic alcohol group substituted with an electron-withdrawing group at the α-position (e.g. a hexafluoroisopropanol group), and it is preferred to contain a repeating unit having a carboxyl group. By virtue of containing a repeating unit having an acid group, the resolution increases in the usage of forming contact holes. As for the repeating unit having an acid group, all of a repeating unit where an acid group directly bonded to the main chain of the resin, such as a repeating unit by an acrylic acid or a methacrylic acid, a repeating unit where an acid group is bonded to the main chain of the resin through a linking group, and a repeating unit where an acid group is introduced into the polymer chain terminal by using an acid group-containing polymerization initiator or chain transfer agent at the polymerization, are preferred. The linking group may have a monocyclic or polycyclic cyclohydrocarbon structure. In particular, a repeating unit by acrylic acid or a methacrylic acid is preferred.

The resin (A) may or may not contain a repeating unit having an acid group. When the repeating unit having an acid group is incorporated in the resin (A), the content thereof is preferably 25 mol % or less, far preferably 20 mol % or less, based on the total content of all repeating units in the resin (A). And when the repeating unit having an acid group is incorporated in the resin (A), the content thereof is generally 1 mol % or more.

Examples of the repeating unit having an acid group are illustrated below, but these examples should not be construed as limiting the scope of the invention.

In each example, Rx represents H, $CH_3$, $CH_2OH$ or $CF_3$.

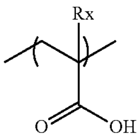
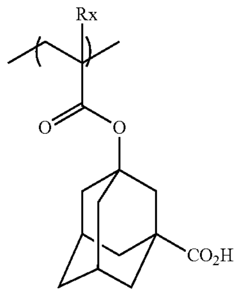
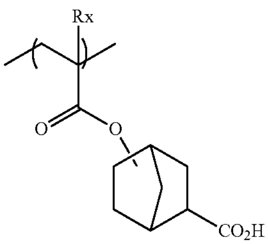
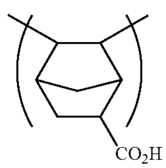
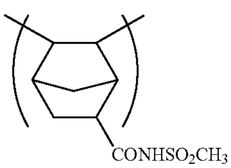
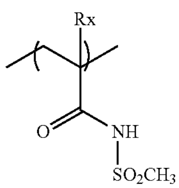
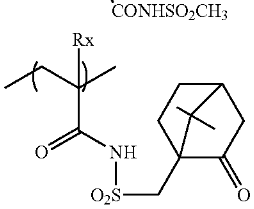
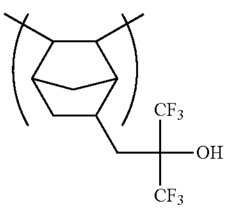
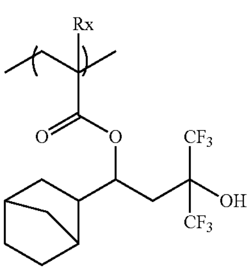
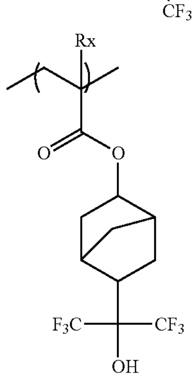
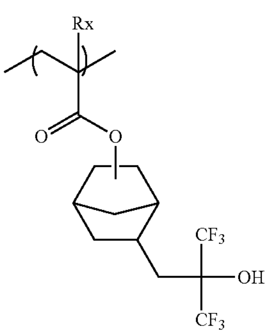

-continued

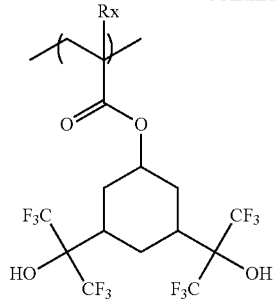
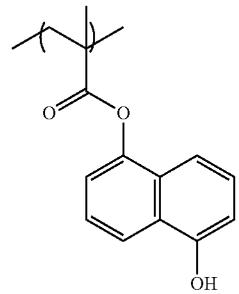
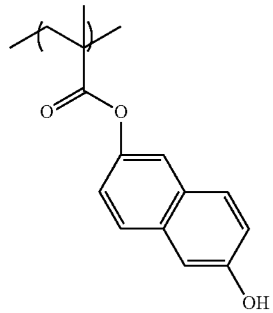

The resin (A) for use in the invention can further contain a repeating unit having an alicyclic hydrocarbon structure free from a polar group (e.g. the acid group as recited above, a hydroxyl group, a cyano group) and not exhibiting acid decomposability. By containing such a repeating unit, it becomes possible not only to reduce elution of a low molecular component from the resist film into an immersion liquid at the immersion exposure but also to appropriately adjust the solubility of the resin at the development using an organic solvent-containing developer. Such a repeating unit may be a repeating unit represented by the following formula (IV).

(IV)

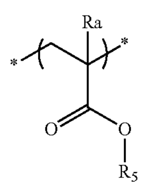

In formula (IV), $R_5$ represents a hydrocarbon group having at least one cyclic structure and having no polar group.

Ra represents a hydrogen atom, an alkyl group or a —$CH_2$—O—$Ra_2$ group. Herein, $Ra_2$ represents a hydrogen atom, an alkyl group or an acyl group. Ra is preferably a hydrogen atom, a methyl group, a hydroxymethyl group or a trifluoromethyl group, particularly preferably a hydrogen atom or a methyl group.

The cyclic structure contained in $R_5$ includes a monocyclic hydrocarbon group and a polycyclic hydrocarbon group. Examples of the monocyclic hydrocarbon group include a cycloalkyl groups having a carbon number of 3 to 12, such as a cyclopentyl group, a cyclohexyl group a cycloheptyl group and a cyclooctyl group, and a cycloalkenyl group having a carbon number of 3 to 12, such as a cyclohexenyl group. Among these groups, the monocyclic hydrocarbon group is preferably a monocyclic hydrocarbon group having a carbon number of 3 to 7, more preferably a cyclopentyl group or a cyclohexyl group.

In the polycyclic hydrocarbon group, a ring-assembly hydrocarbon group and a crosslinked cyclic hydrocarbon group are included. Examples of the ring-assembly hydrocarbon group include a bicyclohexyl group and a perhydronaphthalenyl group, and examples of the crosslinked cyclic hydrocarbon ring include a bicyclic hydrocarbon ring, such as pinane ring, bornane ring, norpinane ring, norbornane ring and a bicyclooctane ring (e.g. a bicyclo[2.2.2.]octane ring, a bicyclo[3.2.1]octane ring); a tricyclic hydrocarbon ring, such as homobledane ring, adamantine ring, tricyclo[5.2.1.$0^{2,6}$]decane ring and tricyclo[4.3.1.$1^{2,5}$]undecane ring; and a tetracyclic hydrocarbon ring, such as tetracyclo[4.4.0.$1^{2,5}$.$1^{7,10}$]dodecane ring and perhydro-1,4-methano-5,8-methanonaphthalene ring. And the crosslinked cyclic hydrocarbon ring also includes a condensed cyclic hydrocarbon ring, and more specifically, a condensed ring formed by fusing a plurality of 5- to 8-membered cycloalkane ring, such as perhydronaphthalene (decalin) ring, perhydroanthracene ring, perhydrophenanthrene ring, perhydroacenaphthene ring, perhydrofluorenone ring, perhydroindene ring and perhydrophenalene ring.

Preferred examples of the crosslinked cyclic hydrocarbon ring include a norbornyl group, an adamantyl group, a bicyclooctanyl group and a tricyclo[5.2.1.$0^{2,6}$]decanyl group. And these crosslinked cyclic hydrocarbon rings, a norbornyl group and an adamantyl group are more preferred.

Such an alicyclic hydrocarbon group may have a substituent. Preferred examples of the substituent include a halogen atom, an alkyl group, a hydroxyl group with a hydrogen atom being substituted for, and an amino group with a hydrogen atom being substituted for. The halogen atom is preferably a bromine atom, a chlorine atom or a fluorine atom, and the alkyl group is preferably a methyl group, an ethyl group, an n-butyl group or a t-butyl group. The alkyl group may further have a substituent, and examples of the substituent which may be further substituted on the alkyl group include a halogen atom, an alkyl group, a hydroxyl group with a hydrogen atom being substituted for, and an amino group with a hydrogen atom being substituted for.

Examples of the substituent for the hydrogen atom include an alkyl group, a cycloalkyl group, an aralkyl group, a substituted methyl group, a substituted ethyl group, an alkoxycarbonyl group and an aralkyloxycarbonyl group. Suitable examples of the alkyl group include an alkyl group having a carbon number of 1 to 4, suitable examples of the substituted methyl group include a methoxymethyl group, a methoxythiomethyl group, a benzyloxymethyl group, t-butoxymethyl group and 2-methoxyethoxymethyl group, suitable examples of the substituted ethyl group include a 1-ethoxyethyl group and a 1-methyl-1-methoxyethyl group, suitable examples of the acyl group include an aliphatic acyl group having a carbon number of 1 to 6, such as formyl group, acetyl group, propionyl group, butyryl group, isobutyryl group, valeryl group and pivaloyl group, and examples of the alkoxycarbonyl group include an alkoxycarbonyl group having a carbon number of 1 to 4.

The resin (A) may or may not contain a repeating unit having an alicyclic hydrocarbon structure free from a polar group and not exhibiting acid decomposability, and when such a repeating unit is incorporated in the resin (A), the content thereof is preferably from 1 mol % to 50 mol %, far preferably from 10 mol % to 50 mol %, based on the total content of all repeating units in the resin (A).

Specific examples of the repeating unit having an alicyclic hydrocarbon structure free from a polar group and not exhibiting acid decomposability are illustrated below, but these examples should not be construed as limiting the scope of the invention. In the following formulae, Ra represents H, $CH_3$, $CH_2OH$ or $CF_3$.

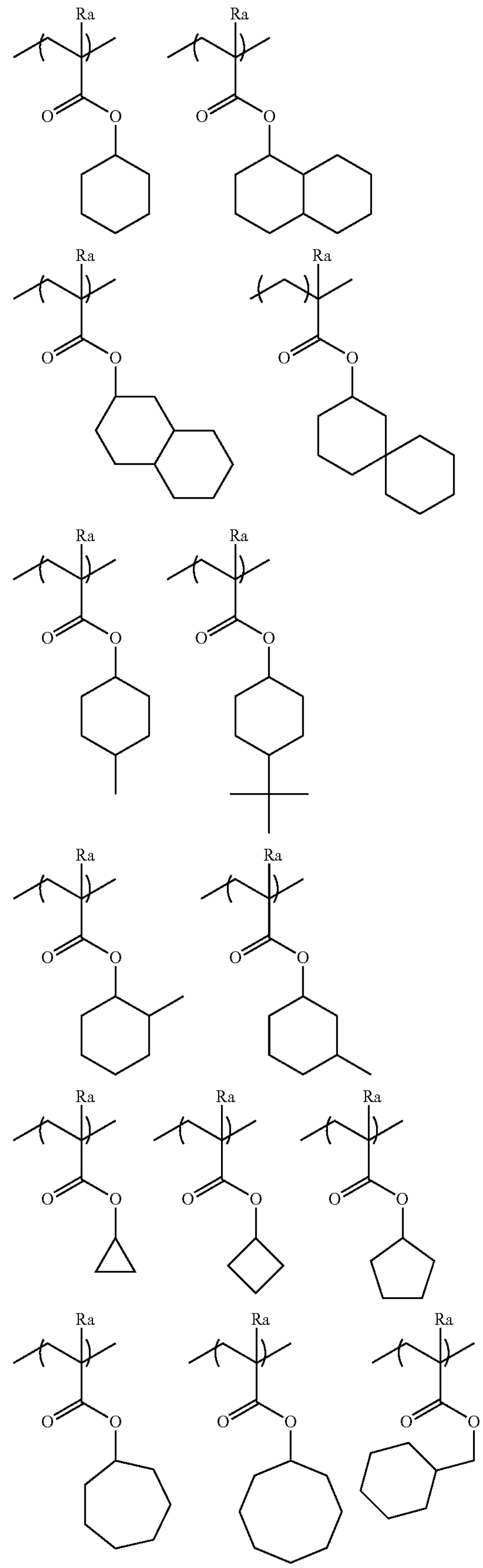

-continued

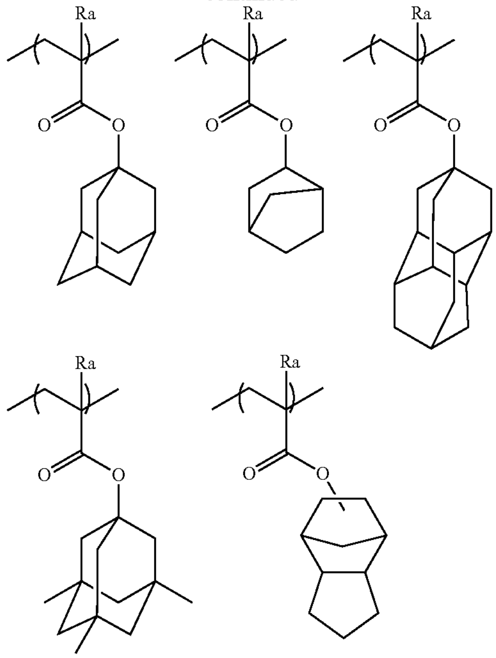

In addition to the repeating structural units mentioned above, the resin (A) for use in the invention can contain a variety of repeating structural units for the purpose of adjusting dry etching resistance, suitability for a standard developer, adhesion to a substrate and a resist profile, and moreover characteristics generally required of the actinic ray- or radiation-sensitive resin composition (I), such as resolution, thermal resistance and sensitivity.

Examples of such repeating structural units include repeating structural units corresponding to the monomers recited below, but these examples should not be construed as limiting the scope of the invention.

Such monomers allow fine adjustments to performance capabilities required of the resin used in the composition relating to the invention, notably (1) solubility for coating solvent, (2) film-forming property (glass transition point), (3) alkali developability, (4) reduction in film thickness (selection of hydrophilic, hydrophobic or alkali-soluble group), (5) adherence of unexposed area to substrate, (6) dry-etching resistance, and so on.

Examples of the monomer include a compound having one addition-polymerizable unsaturated bond selected from acrylic acid esters, methacrylic acid esters, acrylamides, methacrylamides, allyl compounds, vinyl ethers or vinyl esters.

Other than these compounds, an addition-polymerizable unsaturated compound copolymerizable with the monomers corresponding to the above-described various repeating structural units may be copolymerized.

In the resin (A) for use in the present composition, the molar ratio of each repeating structural unit content is set as appropriate in order to adjust dry etching resistance, suitability for a standard developer, adhesion to a substrate and a resist profile of the actinic ray- or radiation-sensitive resin composition (I), and moreover characteristics generally required of the actinic ray- or radiation-sensitive resin composition (I), such as resolution, thermal resistance and sensitivity.

The form of the resin (A) for use in the present invention may be any of random-type, block-type, comb-type and star-type form. The resin (A) can be synthesized, for example, by radical, cationic or anionic polymerization of unsaturated monomers corresponding to respective structures. It is also possible to obtain the target resin by polymerizing unsaturated monomers corresponding to precursors of respective structures, and then by carrying out a polymer reaction.

In the case where the composition of the present invention is used for ArF exposure, in view of transparency to ArF light, the resin (A) for use in the composition of the present invention preferably has substantially no aromatic rings (specifically, the proportion of an aromatic group-containing repeating unit in the resin is preferably 5 mol % or less, more preferably 3 mol % or less, and ideally 0 mol %, that is, the resin does not have an aromatic group). The resin (A) preferably has a monocyclic or polycyclic aliphatic hydrocarbon structure.

When the composition of the present invention contains a resin (D) mentioned hereinafter, the resin (A) preferably contains no fluorine atom and no silicon atom in terms of compatibility with the resin (D).

The resin (A) for use in the composition of the present invention is preferably a resin where all repeating units are composed of a (meth)acrylate-based repeating unit. In this case, all repeating units may be a methacrylate-based repeating unit, all repeating units may be an acrylate-based repeating unit, or all repeating units may be composed of a methacrylate-based repeating unit and an acrylate-based repeating unit, but the acrylate-based repeating unit preferably accounts for 50 mol % or less based on all repeating units.

In the case of irradiating the composition of the present invention with KrF excimer laser light, electron beam, X-ray or high-energy beam at a wavelength of 50 mu or less (e.g., EUV), the resin (A) preferably further contains a hydroxystyrene-based repeating unit. It is more preferred to contain a hydroxystyrene-based repeating unit, a hydroxystyrene-based repeating unit protected by an acid-decomposable group, and an acid-decomposable repeating unit such as tertiary alkyl (meth)acrylate.

Preferred examples of the hydroxystyrene-based repeating unit having an acid-decomposable group include repeating units composed of a tert-butoxycarbonyloxystyrene, a 1-alkoxyethoxystyrene and a tertiary alkyl (meth)acrylate. Repeating units composed of a 2-alkyl-2-adamantyl (meth)acrylate and a dialkyl(1-adamantyl)methyl (meth)acrylate are more preferred.

The resin (A) for use in the present invention can be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include ethers such as tetrahydrofuran, 1,4-dioxane, diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the photosensitive composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction solution is poured in a solvent, and the desired polymer is collected by a powder, solid or other recovery method. The concentration at the reaction is from 5 to 50 mass %, preferably from 10 to 30 mass %, and the reaction temperature is usually from 10 to 150° C., preferably from 30 to 120° C., more preferably from 60 to 100° C.

After the completion of reaction, the reaction solution is allowed to cool to room temperature and purified. The purification may be performed by a normal method, for example, a liquid-liquid extraction method of applying water washing or combining it with an appropriate solvent to remove residual monomers or oligomer components; a purification method in a solution state, such as ultrafiltration of extracting and removing only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration.

For example, the resin is precipitated as a solid by contacting the reaction solution with a solvent in which the resin is sparingly soluble or insoluble (poor solvent) and which is in a volumetric amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent which can be used may be appropriately selected from a hydrocarbon, a halogenated hydrocarbon, a nitro compound, an ether, a ketone, an ester, a carbonate, an alcohol, a carboxylic acid, water, a mixed solvent containing such a solvent, and the like, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into consideration the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into consideration the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method comprising, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volumetric amount of less than 10 times (preferably 5 times or less) the resin solution A, to precipitate a resin solid (step d), and separating the precipitated resin (step e).

Also, in order to prevent the resin from undergoing aggregation after the preparation of the composition, as described, for example, in JP-A-2009-037108, a step of dissolving the synthesized resin in a solvent to make a solution and heating the solution at approximately from 30 to 90° C. for approximately from 30 minutes to 4 hours may be added.

The weight-average molecular weight of the resin (A) for use in the invention is preferably 7,000 or more as mentioned above, preferably from 7,000 to 200,000, more preferably from 7,000 to 50,000, further preferably from 7,000 to 40,000, particularly preferably from 7,000 to 30,000, as measured by GPC method and calculated in terms of polystyrene. When the weight-average molecular weight is lower than 7,000, the solubility in organic developer becomes too high and it causes apprehension that it may fail to form precise patterns.

The polydispersity (molecular-weight distribution) of the resin used is generally from 1.0 to 3.0, preferably from 1.0 to 2.6, more preferably from 1.0 to 2.0, particularly preferably from 1.4 to 2.0. The narrower the molecular-weight distribution of the resin, the more excellent resolution and resist profile are achieved, and what's more, the smoother side wall of a resist pattern and the more excellent roughness are obtained.

In the actinic ray-sensitive or radiation-sensitive resin composition (I) for use in the present invention, the blending ratio of the resin (A) in the entire composition is preferably from 30 mass % to 99 mass %, more preferably 60 mass % to 95 mass %, based on the total solid content.

As for the resin (A) used in the present invention, one kind may be used or a plurality of kinds may be used in combination.

[2] (B) Compound Capable of Generating an Acid Upon Irradiation with an Actinic Ray or Radiation The composition for use in the present invention further contains (B) a compound capable of generating an acid upon irradiation with an actinic ray or radiation (hereinafter, sometimes referred to as "acid generator"). The compound (B) capable of generating an acid upon irradiation with an actinic ray or radiation is preferably a compound capable of generating an organic acid upon irradiation with an actinic ray or radiation.

The acid generator which can be used may be appropriately selected from a photo-initiator for cationic photopolymerization, a photo-initiator for radical photopolymerization, a photo-decoloring agent for dyes, a photo-discoloring agent, a known compound capable of generating an acid upon irradiation with an actinic ray or radiation, which is used for microresist or the like, and a mixture thereof.

Examples thereof include a diazonium salt, a phosphonium salt, a sulfonium salt, an iodonium salt, imidosulfonate, oxime sulfonate, diazodisulfone, disulfone, and o-nitrobenzyl sulfonate.

Out of the acid generators, preferred compounds include compounds represented by the following formulae (ZI), (ZII) and (ZIII):

(ZI)

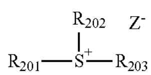

(ZII)

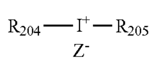

(ZIII)

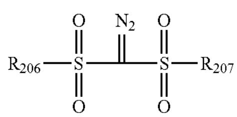

In formula (ZI), each of $R_{201}$, $R_{202}$ and $R_{203}$ independently represents an organic group.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain therein an oxygen atom, a sulfur atom, an ester bond, an amide bond or a carbonyl group. Examples of the group formed by combining two members out of $R_{201}$ to $R_{203}$ include an alkylene group (e.g., butylene group, pentylene group).

$Z^-$ represents a non-nucleophilic anion.

Examples of the non-nucleophilic anion as $Z^-$ include a sulfonate anion, a carboxylate anion, a sulfonylimide anion, a bis(alkylsulfonyl)imide anion and a tris(alkylsulfonyl) methyl anion.

The non-nucleophilic anion is an anion having an extremely low ability of causing a nucleophilic reaction and this anion can suppress the decomposition with aging due to intramolecular nucleophilic reaction. Thanks to this anion, the aging stability of the resist composition is enhanced.

Examples of the sulfonate anion include an aliphatic sulfonate anion, an aromatic sulfonate anion, and a camphorsulfonate anion.

Examples of the carboxylate anion include an aliphatic carboxylate anion, an aromatic carboxylate anion, and an aralkylcarboxylate anion.

The aliphatic moiety in the aliphatic sulfonate anion and aliphatic carboxylate may be an alkyl group or a cycloalkyl group but is preferably an alkyl group having a carbon number of 1 to 30 or a cycloalkyl group having a carbon number of 3 to 30, and examples thereof include a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group, and a bornyl group.

The aromatic group in the aromatic sulfonate anion and aromatic carboxylate anion is preferably an aryl group having a carbon number of 6 to 14, and examples thereof include a phenyl group, a tolyl group, and a naphthyl group.

The alkyl group, cycloalkyl group and aryl group in the aliphatic sulfonate anion and aromatic sulfonate anion may have a substituent. Examples of the substituent on the alkyl group, cycloalkyl group and aryl group in the aliphatic sulfonate anion and aromatic sulfonate anion include a nitro group, a halogen atom (e.g., fluorine atom, chlorine atom, bromine atom, iodine atom), a carboxyl group, a hydroxyl group, an amino group, a cyano group, an alkoxy group (preferably having a carbon number of 1 to 15), a cycloalkyl group (preferably having a carbon number of 3 to 15), an aryl group (preferably having a carbon number of 6 to 14), an alkoxycarbonyl group (preferably having a carbon number of 2 to 7), an acyl group (preferably having a carbon number of 2 to 12), an alkoxycarbonyloxy group (preferably having a carbon number of 2 to 7), an alkylthio group (preferably having a carbon number of 1 to 15), an alkylsulfonyl group (preferably having a carbon number of 1 to 15), an alkyliminosulfonyl group (preferably having a carbon number of 1 to 15), an aryloxysulfonyl group (preferably having a carbon number of 6 to 20), an alkylaryloxysulfonyl group (preferably having a carbon number of 7 to 20), a cycloalkylaryloxysulfonyl group (preferably having a carbon number of 10 to 20), an alkyloxyalkyloxy group (preferably having a carbon number of 5 to 20), and a cycloalkylalkyloxyalkyloxy group (preferably having a carbon number of 8 to 20). The aryl group and ring structure in each group may further have, as the substituent, an alkyl group (preferably having a carbon number of 1 to 15) or a cycloalkyl group (preferably having a carbon number of 3 to 15).

The aralkyl group in the aralkylcarboxylate anion is preferably an aralkyl group having a carbon number of 7 to 12, and examples thereof include a benzyl group, a phenethyl group, a naphthylmethyl group, a naphthylethyl group, and a naphthylbutyl group.

The alkyl group, cycloalkyl group, aryl group and aralkyl group in the aliphatic carboxylate anion, aromatic carboxylate anion and aralkylcarboxylate anion may have a substituent. Examples of the substituent include the same halogen atom, alkyl group, cycloalkyl group, alkoxy group and alkylthio group as those in the aromatic sulfonate anion.

Examples of the sulfonylimide anion include saccharin anion.

The alkyl group in the bis(alkylsulfonyl)imide anion and tris(alkylsulfonyl)methide anion is preferably an alkyl group having a carbon number of 1 to 5, and examples thereof include a methyl group, an ethyl group, a propyl group, an isopropyl group, an n-butyl group, an isobutyl group, a sec-butyl group, a pentyl group, and a neopentyl group.

Two alkyl groups in the bis(alkylsulfonyl)imide anion may be bonded each other to constitute an alkylene group (preferably having a carbon number of 2 to 4) and to form a ring together with an imide group and two sulfonyl groups. Examples of the substituent which such an alkyl group and an alkylene group formed by bonding two alkyl groups in the bis(alkylsulfonyl)imide anion each other may have include a halogen atom, a halogen atom-substituted alkyl group, an alkoxy group, an alkylthio group, an alkyloxysulfonyl group, an aryloxysulfonyl group, and a cycloalkylaryloxysulfonyl group, with a fluorine atom-substituted alkyl group being preferred.

Other examples of the non-nucleophilic anion include fluorinated phosphorus (e.g., $PF_6^-$), fluorinated boron (e.g., $BF_4^-$), and fluorinated antimony (e.g., $SbF_6^-$).

The non-nucleophilic anion of $Z^-$ is preferably an aliphatic sulfonate anion substituted with a fluorine atom at least at the α-position of sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom. The non-nucleophilic anion is more preferably a perfluoroaliphatic sulfonate anion having a carbon number of 4 to 8 or a benzenesulfonate anion having a fluorine atom, still more preferably nonafluorobutanesulfonate anion, perfluorooctanesulfonate anion, pentafluorobenzenesulfonate anion or 3,5-bis(trifluoromethyl) benzenesulfonate anion.

The acid generator is preferably a compound capable of generating an acid represented by the following formula (V) or (VI) upon irradiation with an actinic ray or radiation. The compound capable of generating an acid represented by the following formula (V) or (VI) has a cyclic organic group, so that the resolution and roughness performance can be more improved.

The non-nucleophilic anion described above can be an anion capable of generating an organic acid represented by the following formula (V) or (VI):

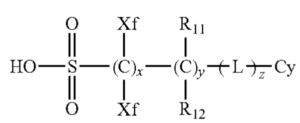

(V)

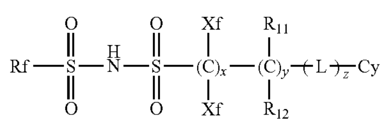

(VI)

In the formulae, each Xf independently represents a fluorine atom or an alkyl group substituted with at least one fluorine atom.

Each of $R_{11}$ and $R_{12}$ independently represents a hydrogen atom, a fluorine atom or an alkyl group.

Each L independently represents a divalent linking group.

Cy represents a cyclic organic group.

Rf represents a fluorine atom-containing group.

x represents an integer of 1 to 20.

y represents an integer of 0 to 10.

z represents an integer of 0 to 10.

Xf represents a fluorine atom or an alkyl group substituted with at least one fluorine atom. The carbon number of the alkyl group is preferably from 1 to 10, more preferably from 1 to 4. Also, the alkyl group substituted with at least one fluorine atom is preferably a perfluoroalkyl group.

Xf is preferably a fluorine atom or a perfluoroalkyl group having a carbon number of 1 to 4. More specifically, Xf is preferably a fluorine atom, $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$, more preferably a fluorine atom or $CF_3$, and it is still more preferred that both Xf are a fluorine atom.

Each of $R_{11}$ and $R_{12}$ independently represents a hydrogen atom, a fluorine atom or an alkyl group. The alkyl group may have a substituent (preferably fluorine atom) and is preferably an alkyl group having a carbon number of 1 to 4, more preferably a perfluoroalkyl group having a carbon number of 1 to 4. Specific examples of the alkyl group having a substituent of $R_{11}$ and $R_{12}$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ and $CH_2CH_2C_4F_9$, with $CF_3$ being preferred.

L represents a divalent linking group. Examples of the divalent linking group include —COO—, —OCO—, —CONH—, —NHCO—, —CO—, —O—, —S—, —SO—, —$SO_2$—, an alkylene group (preferably having a carbon number of 1 to 6), a cycloalkylene group (preferably having a carbon number of 3 to 10), an alkenylene group (preferably having a carbon number of 2 to 6), and a divalent linking group formed by combining a plurality of these members. Among these, —COO—, —OCO—, —CONH—, —NHCO—, —CO—, —O—, —$SO_2$—, —COO-alkylene group-, —OCO-alkylene group-, —CONH-alkylene group- and —NHCO-alkylene group- are preferred, and —COO—, —OCO—, —CONH—, —$SO_2$—, —COO-alkylene group- and —OCO-alkylene group- are more preferred, Cy represents a cyclic organic group. Examples of the cyclic organic group include an alicyclic group, an aryl group, and a heterocyclic group The alicyclic group may be monocyclic or polycyclic. The monocyclic alicyclic group includes, for example, a monocyclic cycloalkyl group such as cyclopentyl group, cylohexyl group and cyclooctyl group. The polycyclic alicyclic group includes, for example, a polycyclic cycloalkyl group such as norbornyl group, tricyclodecanyl group, tetracyclodecanyl group, tetracyclododecanyl group, adamantyl group. Above all, an alicyclic group having a bulky structure with a carbon number of 7 or more, such as norbornyl group, tricyclodecanyl group, tetracyclodecanyl group, tetracyclododecanyl group and adamantyl group, is preferred from the standpoint of restraining diffusion in film during a PEB (post-exposure baking) step and improving MEEF (Mask Error Enhancement Factor).

The aryl group may be monocyclic or polycyclic. Examples of the aryl group include a phenyl group, a naphthyl group, a phenanthryl group, and an anthryl group. Among these, a naphthyl group is preferred because of its relatively low light absorbance at 193 nm The heterocyclic group may be monocyclic or polycyclic, but with a polycyclic heterocyclic group, diffusion of an acid can be more restrained. The heterocyclic group may have aromaticity or may not have aromaticity. Examples of the heterocyclic ring having aromaticity include a furan ring, a thiophene ring, a benzofuran ring, a benzothiophene ring, a dibenzofuran ring, a dibenzothiophene ring, and a pyridine ring. Examples of the heterocyclic ring not having aromaticity include a tetrahydropyran ring, a lactone ring or a sultone ring, and a decahydroisoquinoline ring. The heterocyclic ring in the heterocyclic group is preferably a furan ring, a thiophene ring, a pyridine ring or a decahydroisoquinoline ring. Examples of the lactone ring or the sultone ring include lactone structures or sultone exemplified in the resin (A) above.

The above-described cyclic organic group may have a substituent, and examples of the substituent include an alkyl group (may be linear or branched, preferably having a carbon number of 1 to 12), a cycloalkyl group (may be monocyclic, polycyclic or spirocyclic, preferably having a carbon number of 3 to 20), an aryl group (preferably having a carbon number of 6 to 14), a hydroxyl group, an alkoxy group, an ester group, an amido group, a urethane group, a ureido group, a thioether group, a sulfonamido group and a sulfonic acid ester group. Incidentally, the carbon constituting the cyclic organic group (the carbon contributing to ring formation) may be a carbonyl carbon.

x is preferably from 1 to 8, more preferably from 1 to 4, still more preferably 1. y is preferably from 0 to 4, more preferably 0. z is preferably from 0 to 8, more preferably from 0 to 4.

Examples of the fluorine atom-containing group represented by Rf include an alkyl group having at least one fluorine atom, a cycloalkyl group having at least one fluorine atom, and an aryl group having at least one fluorine atom.

These alkyl group, cycloalkyl group and aryl group may be substituted with a fluorine atom or may be substituted with another fluorine atom-containing substituent. In the case where Rf is a cycloalkyl group having at least one fluorine atom or an aryl group having at least one fluorine atom, examples of the another fluorine-containing substituent include an alkyl group substituted with at least one fluorine atom.

Also, these alkyl group, cycloalkyl group and aryl group may be further substituted with a fluorine atom-free substituent. Examples of this substituent include those not containing a fluorine atom out of those described above for Cy.

Examples of the alkyl group having at least one fluorine atom represented by Rf are the same as those described above as the alkyl group substituted with at least one fluorine atom represented by Xf. Examples of the cycloalkyl group having at least one fluorine atom represented by Rf include a perfluorocyclopentyl group and a perfluorocyclohexyl group. Examples of the aryl group having at least one fluorine atom represented by Rf include a perfluorophenyl group.

Further, it is also preferable that the non-nucleophilic anion is an anion represented by any of the following formulae (B-1) to (B-3).

First, the anion represented by the following formula (B-1) is illustrated.

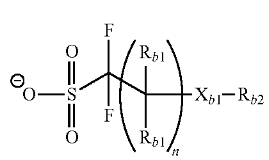

(B-1)

In formula (B-1), each $R_{b1}$ independently represents a hydrogen atom, a fluorine atom or a trifluoromethyl ($CF_3$) group.

n represents an integer of 1 to 4.

n is preferably an integer of 1 to 3, more preferably 1 or 2.

$X_{b1}$ represents a single bond, an ether bond, an ester bond (—OCO— or —COO—) or a sulfonic acid ester bond (—$OSO_2$— or —$SO_3$—).

$X_{b1}$ is preferably an ester bond (—OCO— or —COO—) or a sulfonic acid ester bond (—$OSO_2$— or —$SO_3$—).

$R_{b2}$ represents a substituent having a carbon number of 6 or more.

The substituent having a carbon number of 6 or more as for $R_{b2}$ is preferably a bulky group, and examples thereof include an alkyl group, an alicyclic group, an aryl group, and a heterocyclic group each having a carbon number of 6 or more.

As to the $R_{b2}$, the alkyl group having a carbon number of 6 or more may be linear or branched, and a linear or branched alkyl group having a carbon number of 6 to 20 is preferable, and examples thereof include a linear or branched hexyl group, a linear or branched heptyl group and a linear or branched octyl group. From the viewpoint of bulkiness, a branched alkyl group is preferred.

The alicyclic group having a carbon number of 6 or more in regard to $R_{b2}$ may be monocyclic or polycyclic. Examples of the monocyclic aliphatic group include a monocyclic cycloalkyl group, such as a cyclohexyl group and a cyclooctyl group. Examples of the polycyclic alicyclic group include a polycyclic cycloalkyl group, such as a norbornyl group, a tricyclodecanyl group, a tetracyclodecanyl group, a tetracyclododecanyl group and an adamantyl group. Among these, an alicyclic group having a bulky structure with a carbon number of 7 or more, such as a norbornyl group, a tricyclodecanyl group, a tetracyclodecanyl group, a tetracyclododecanyl group and an adamantyl group, is preferred from the standpoint of inhibiting in-film diffusion from occurring during a PEB (Post Exposure Bake) step and improving MEEF (Mask Error Enhancement Factor).

The aryl group having a carbon number of 6 or more for $R_{b2}$ may be monocyclic or polycyclic. Examples of the aryl group include a phenyl group, a naphthyl group, a phenanthryl group and an anthryl group. Of these groups, a napthyl group relatively low in light absorbance at 193 nm is preferable.

The heterocyclic group having a carbon number of 6 or more in regard to $R_{b2}$ may be monocyclic or polycyclic. However, with a polycyclic heterocyclic group, diffusion of an acid can be more suppressed. In addition, the heterocyclic group may have aromaticity or may not have aromaticity. Examples of the heterocyclic ring having aromaticity include a benzofuran ring, a benzothiophene ring, a dibenzofuran ring and a dibenzothiophene ring. Examples of the heterocyclic ring having no aromaticity include a tetrahydropyran ring, a lactone ring and a decahydroisoquinoline ring. As to the heterocyclic ring in the heterocyclic group, a benzofuran ring or a decahydroisoquinoline ring is particularly suitable. And examples of the lactone ring include the lactone structure recited in the foregoing illustration of the resin (A).

The substituent having a carbon number of 6 or more for $R_{b2}$ may further have a substituent. Examples of the further substituent include an alkyl group (which may be either linear or branched and preferably has a carbon number of 1 to 12), a cycloalkyl group (which may be monocyclic, polycyclic and spirocyclic and preferably has a carbon number of 3 to 20), an aryl group (which preferably has a carbon number of 6 to 14), a hydroxyl group, an alkoxy group, an ester group, an amido group, a urethane group, a ureido group, a thioether group, a sulfonamido group and a sulfonic acid ester group. Incidentally, the carbon atom constituting the alicyclic group, the aryl group or the heterocyclic group as recited above (the carbon contributing to ring formation) may be a carbonyl carbon.

Examples of the anion represented by formula (B-1) are illustrated below, but these examples should not be construed as limiting the scope of the invention.

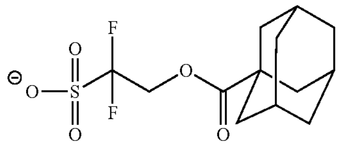

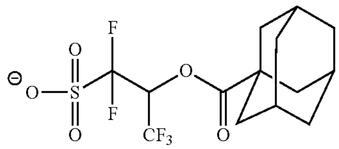

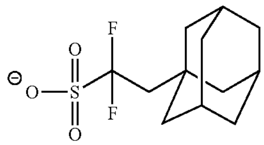

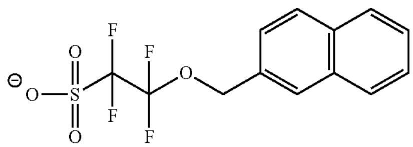

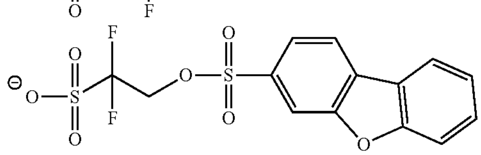

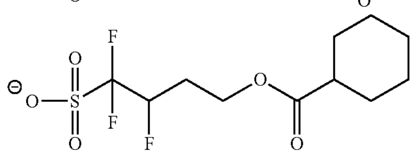

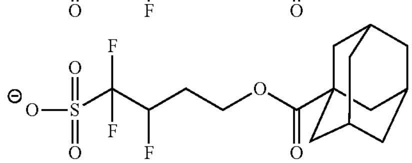

Next, the anion represented by the following formula (B-2) is illustrated.

(B-2)

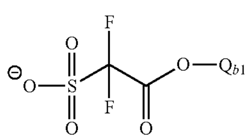

In formula (B-2), $Q_{b1}$ represents a group having a lactone structure, a group having a sultone structure or a group having a cyclic carbonate structure.

Examples of the lactone structure or the sultone structure as for $Q_{b1}$ include the same lactone structures or the sultone structures as in the repeating units having lactone structures or sultone structures recited in the foregoing illustration of the resin (A). More specifically, such examples include the lactone structures represented by any of formulae (LC1-1) to (LC1-17) or the sultone structures represented by any of formulae (SL1-1) to (SL1-3).

The lactone or sultone structure as recited above may be in a state of binding directly to the oxygen atom in the ester group in formula (B-2) or in a state of binding to the oxygen atom in the ester group in formula (B-2) through an alkylene group (e.g. a methylene group, an ethylene group). In this case, the group having the lactone or sultone structure can be referred to as an alkyl group having the lactone or sultone structure as a substituent thereof.

The cyclic carbonate structure as for $Q_{b1}$ is preferably a 5- to 7-membered cyclic carbonate structure, and examples thereof include 1,3-dioxorane-2-one and 1,3-dioxane-2-one.

The cyclic carbonate structure as recited above may be in a state of binding directly to the oxygen atom in the ester group in formula (B-2) or in a state of binding to the oxygen atom in the ester group in formula (B-2) through an alkylene group (e.g. a methylene group, an ethylene group). In this case, the group having the cyclic carbonate structure can be referred to as an alkyl group having the cyclic carbonate structure as a substituent thereof.

Examples of the anion represented by formula (B-2) are illustrated below, but these examples should not be construed as limiting the scope of the invention.

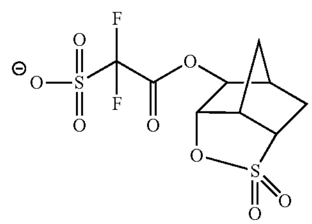

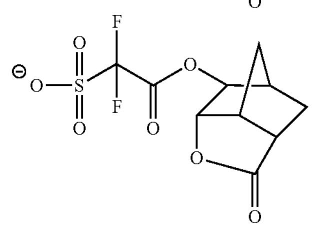

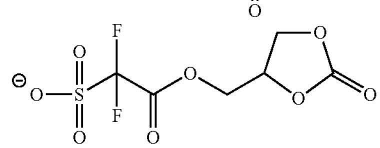

Then, the anion represented by the following formula (B-3) is illustrated.

(B-3)

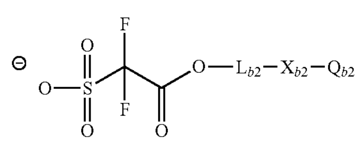

In formula (B-3), $L_{b2}$ represents an alkylene group having a carbon number of 1 to 6, and examples thereof include a methylene group, an ethylene group, a propylene group or a butylene group, preferably an alkylene group having a carbon number of 1 to 4.

$X_{b2}$ represents an ether bond or an ester bond (—OCO— or —COO—).

$Q_{b2}$ represents an alicyclic group or a group containing an aromatic ring.

The alicyclic group as for $Q_{b2}$ may be monocyclic or polycyclic. Examples of the monocyclic alicyclic group include a monocyclic cycloalkyl group, such as a cyclopentyl group, a cyclohexyl group and a cyclooctyl group. Examples of the polycyclic alicyclic group include a polycyclic cycloalkyl group, such as a norbornyl group, a tricyclodecanyl group, a tetracyclodecanyl group, a tetracyclododecanyl group and an adamantyl group. Of such groups, an alicyclic group having a bulky structure with a carbon number of 7 or more, such as a norbornyl group a tricyclodecanyl group, a tetracyclodecanyl group, a tetracyclodecanyl group and an adamantyl group, are preferred.

The aromatic ring in the group containing an aromatic ring as for $Q_{b2}$ is preferably an aromatic ring having a carbon number of 6 to 20, and examples thereof include a benzene ring, a naphthalene ring, a phenanthrene ring and an anthracene ring. Of such rings, a benzene ring and a naphthalene ring are preferred. The aromatic ring may be substituted with at least one fluorine atom, and examples of such an aromatic ring which is substituted with at least one fluorine atom is a perfluorophenyl group.

The aromatic ring may be in a state of binding directly to $X_{b2}$, or it may be in a state of binding to $X_{b2}$ through an alkylene group (e.g. a methylene group, an ethylene group). In this case, the group containing the aromatic ring as recited above can be referred to as the alkyl group having the aromatic ring as a substituent.

Examples of the anion structure represented by formula (B-3) are illustrated below, but these examples should not be construed as limiting the scope of the invention.

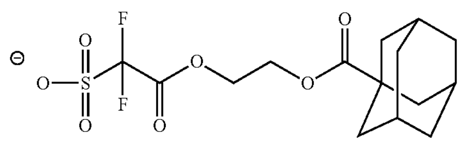

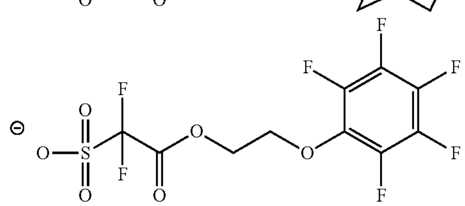

Examples of the organic group represented by $R_{201}$, $R_{202}$ and $R_{203}$ include corresponding groups in the later-described compounds (ZI-1), (ZI-2), (ZI-3) and (ZI-4).

The compound may be a compound having a plurality of structures represented by formula (ZI). For example, the compound may be a compound having a structure where at least one of $R_{201}$ to $R_{203}$ in a compound represented by formula (ZI) is bonded to at least one of $R_{201}$ to $R_{203}$ in another compound represented by formula (ZI) through a single bond or a linking group.

Compounds (ZI-1), (ZI-2), (ZI-3) and (ZI-4) described below are more preferred as the component (ZI).

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, all of $R_{201}$ to $R_{203}$ may be an aryl group or a part of $R_{201}$ to $R_{203}$ may be an aryl group, with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

The aryl group in the arylsulfonium compound is preferably a phenyl group or a naphthyl group, more preferably a phenyl group. The aryl group may be an aryl group having a heterocyclic structure containing an oxygen atom, a nitrogen atom, a sulfur atom or the like. Examples of the heterocyclic structure include a pyrrole residue, a furan residue, a thiophene residue, an indole residue, a benzofuran residue, and a benzothiophene residue. In the case where the arylsulfonium compound has two or more aryl groups, these two or more aryl groups may be the same or different.

The alkyl or cycloalkyl group which is contained, if desired, in the arylsulfonium compound is preferably a linear or branched alkyl group having a carbon number of 1 to 15 or a cycloalkyl group having a carbon number of 3 to 15, and examples thereof include a methyl group, an ethyl group, a propyl group, an n-butyl group, a sec-butyl group, a tert-butyl group, a cyclopropyl group, a cyclobutyl group, and a cyclohexyl group.

The aryl group, alkyl group and cycloalkyl group of $R_{201}$ to $R_{203}$ may have, as the substituent, an alkyl group (for example, having a carbon number of 1 to 15), a cycloalkyl group (for example, having a carbon number of 3 to 15), an aryl group (for example, having a carbon number of 6 to 14), an alkoxy group (for example, having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4, or an alkoxy group having a carbon number of 1 to 4. The substituent may be substituted on any one of three members $R_{201}$ to $R_{203}$ or may be substituted on all of these three members. In the case where $R_{201}$ to $R_{203}$ are an aryl group, the substituent is preferably substituted on the p-position of the aryl group.

The compound (ZI-2) is described below.

The compound (ZI-2) is a compound where each of $R_{201}$ to $R_{203}$ in formula (ZI) independently represents an aromatic ring-free organic group. The aromatic ring as used herein encompasses an aromatic ring containing a heteroatom.

The aromatic ring-free organic group as $R_{201}$ to $R_{203}$ has a carbon number of generally from 1 to 30, preferably from 1 to 20.

Each of $R_{201}$ to $R_{203}$ is independently preferably an alkyl group, a cycloalkyl group, an allyl group or a vinyl group, more preferably a linear or branched 2-oxoalkyl group, a 2-oxocycloalkyl group or an alkoxycarbonylmethyl group, still more preferably a linear or branched 2-oxoalkyl group.

The alkyl group and cycloalkyl group of $R_{201}$ to $R_{203}$ are preferably a linear or branched alkyl group having a carbon number of 1 to 10 (e.g., methyl group, ethyl group, propyl group, butyl group, pentyl group) and a cycloalkyl group having a carbon number of 3 to 10 (e.g., cyclopentyl group, cyclohexyl group, norbornyl group). The alkyl group is more preferably a 2-oxoalkyl group or an alkoxycarbonylmethyl group. The cycloalkyl group is more preferably a 2-oxocycloalkyl group.

The 2-oxoalkyl group may be either linear or branched and is preferably a group having >C═O at the 2-position of the above-described alkyl group.

The 2-oxocycloalkyl group is preferably a group having >C═O at the 2-position of the above-described cycloalkyl group.

The alkoxy group in the alkoxycarbonylmethyl group is preferably an alkoxy group having a carbon number of 1 to 5 (e.g., methoxy group, ethoxy group, propoxy group, butoxy group, pentoxy group).

$R_{201}$ to $R_{203}$ may be further substituted with a halogen atom, an alkoxy group (for example, having a carbon number of 1 to 5), a hydroxyl group, a cyano group or a nitro group.

The compound (ZI-3) is described below.

The compound (ZI-3) is a compound represented by the following formula (ZI-3), and this is a compound having a phenacylsulfonium salt structure.

(ZI-3)

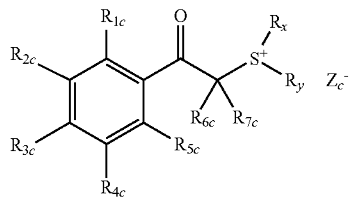

In formula (ZI-3), each of $R_{1c}$ to $R_{5c}$ independently represents a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Each of $R_{6c}$ and $R_{7c}$ independently represents a hydrogen atom, an alkyl group, a cycloalkyl group, a halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more members out of $R_{1c}$ to $R_{5c}$, a pair of $R_{5c}$ and $R_{6c}$, a pair of $R_{6c}$ and $R_{7c}$, a pair of $R_{5c}$ and $R_x$, or a pair of $R_x$ and $R_y$ may combine together to form a ring structure. This ring structure may contain an oxygen atom, a sulfur atom, a ketone group, an ester bond or an amide bond.

The ring structure above includes an aromatic or non-aromatic hydrocarbon ring, an aromatic or non-aromatic heterocyclic ring, and a polycyclic condensed ring formed by combining two or more of these rings. The ring structure includes a 3- to 10-membered ring and is preferably a 4- to 8-membered ring, more preferably a 5- or 6-membered ring.

Examples of the group formed by combining any two or more members of $R_{1c}$ to $R_{5c}$, a pair of $R_{6c}$ and $R_{7c}$, or a pair of $R_x$ and $R_y$ include a butylene group and a pentylene group.

The group formed by combining a pair of $R_{5c}$ and $R_{6c}$ or a pair of $R_{5c}$ and $R_x$ is preferably a single bond or an alkylene group, and examples of the alkylene group include a methylene group and an ethylene group.

$Zc^-$ represents a non-nucleophilic anion, and examples thereof are the same as those of the non-nucleophilic anion of $Z^-$ in formula (ZI).

The alkyl group as $R_{1c}$ to $R_{7c}$ may be either linear or branched and is, for example, an alkyl group having a carbon number of 1 to 20, preferably a linear or branched alkyl group having a carbon number of 1 to 12 (such as methyl group, ethyl group, linear or branched propyl group, linear or branched butyl group, or linear or branched pentyl group). The cycloalkyl group includes, for example, a cycloalkyl group having a carbon number of 3 to 10 (e.g., cyclopentyl group, cyclohexyl group).

The aryl group as $R_{1c}$ to $R_{5c}$ is preferably an aryl group having a carbon number of 5 to 15, and examples thereof include a phenyl group and a naphthyl group.

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (such as methoxy group, ethoxy group, linear or branched propoxy group, linear or branched butoxy group, or linear or branched pentoxy group), or a cyclic alkoxy group having a carbon number of 3 to 10 (such as cyclopentyloxy group or cyclohexyloxy group).

Specific examples of the alkoxy group in the alkoxycarbonyl group as $R_{1c}$ to $R_{5c}$ are the same as specific examples of the alkoxy group of $R_{1c}$ to $R_{5c}$.

Specific examples of the alkyl group in the alkylcarbonyloxy group and alkylthio group as $R_{1c}$ to $R_{5c}$ are the same as specific examples of the alkyl group of $R_{1c}$ to $R_{5c}$.

Specific examples of the cycloalkyl group in the cycloalkylcarbonyloxy group as $R_{1c}$ to $R_{5c}$ are the same as specific examples of the cycloalkyl group of $R_{1c}$ to $R_{5c}$.

Specific examples of the aryl group in the aryloxy group and arylthio group as $R_{10}$ to $R_{5c}$ are the same as specific examples of the aryl group of $R_{1c}$ to $R_{5c}$.

A compound where any one of $R_{1c}$ to $R_{5c}$ is a linear or branched alkyl group, a cycloalkyl group, or a linear, branched or cyclic alkoxy group is preferred, and a compound where the sum of carbon numbers of $R_{1c}$ to $R_{5c}$ is from 2 to 15 is more preferred. Thanks to such a compound, the solvent solubility is more enhanced and production of particles during storage can be suppressed.

The ring structure which may be formed by combining any two or more members of $R_{1c}$ to $R_{5c}$ with each other is preferably a 5- or 6-membered ring, more preferably a 6-membered ring (e.g., phenyl ring).

The ring structure which may be formed by combining $R_{5c}$ and $R_{6c}$ with each other includes a 4-membered or higher membered ring (preferably a 5- or 6-membered ring) formed together with the carbonyl carbon atom and carbon atom in formula (I) by combining $R_{5c}$ and $R_{6c}$ with each other to constitute a single bond or an alkylene group (such as methylene group or ethylene group).

The aryl group as $R_{6c}$ and $R_{7c}$ is preferably an aryl group having a carbon number of 5 to 15, and examples thereof include a phenyl group and a naphthyl group.

An embodiment where both of $R_{6c}$ and $R_{7c}$ are an alkyl group is preferred, an embodiment where each of $R_{6c}$ and $R_{7c}$ is a linear or branched alkyl group having a carbon number of 1 to 4 is more preferred, and an embodiment where both are a methyl group is still more preferred.

In the case where $R_{6c}$ and $R_{7c}$ are combined to form a ring, the group formed by combining $R_{6c}$ and $R_{7c}$ is preferably an alkylene group having a carbon number of 2 to 10, and examples thereof include an ethylene group, a propylene group, a butylene group, a pentylene group, and a hexylene group. Also, the ring formed by combining $R_{6c}$ and $R_{7c}$ may contain a heteroatom such as oxygen atom in the ring.

Examples of the alkyl group and cycloalkyl group as $R_x$ and $R_y$ are the same as those of the alkyl group and cycloalkyl group in $R_{1c}$ to $R_{7c}$.

Examples of the 2-oxoalkyl group and 2-oxocycloalkyl group as $R_x$ and $R_y$ include a group having >C═O at the 2-position of the alkyl group or cycloalkyl group as $R_{1c}$ to $R_{7c}$.

Examples of the alkoxy group in the alkoxycarbonylalkyl group as $R_x$ and $R_y$ are the same as those of the alkoxy group in $R_{1c}$ to $R_{5c}$. The alkyl group is, for example, an alkyl group having a carbon number of 1 to 12, preferably a linear alkyl group having a carbon number of 1 to 5 (such as methyl group or ethyl group).

The allyl group as $R_x$ and $R_y$ is not particularly limited but is preferably an unsubstituted allyl group or an allyl group substituted with a monocyclic or polycyclic cycloalkyl group (preferably a cycloalkyl group having a carbon number of 3 to 10).

The vinyl group as $R_x$ and $R_y$ is not particularly limited but is preferably an unsubstituted vinyl group or a vinyl group substituted with a monocyclic or polycyclic cycloalkyl group (preferably a cycloalkyl group having a carbon number of 3 to 10).

The ring structure which may be formed by combining $R_{5c}$ and $R_x$ with each other includes a 5-membered or higher membered ring (preferably a 5-membered ring) formed together with the sulfur atom and carbonyl carbon atom in formula (I) by combining $R_{5c}$ and $R_x$ with each other to constitute a single bond or an alkylene group (such as methylene group or ethylene group).

The ring structure which may be formed by combining $R_x$ and $R_y$ with each other includes a 5- or 6-membered ring, preferably a 5-membered ring (that is, tetrahydrothiophene ring), formed by divalent $R_x$, and $R_y$ (for example, a methylene group, an ethylene group or a propylene group) together with the sulfur atom in formula (ZI-3).

Each of $R_x$ and $R_y$ is preferably an alkyl or cycloalkyl group having a carbon number of 4 or more, more preferably 6 or more, still more preferably 8 or more.

Each of $R_{1c}$ to $R_{7c}$, $R_x$ and $R_y$ may further have a substituent, and examples of such a substituent include a halogen atom (e.g., fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, and an aryloxycarbonyloxy group.

In formula (ZI-3), it is more preferred that each of $R_{1c}$, $R_{2c}$, $R_{4c}$ and $R_{5c}$ independently represents a hydrogen atom and $R_{3c}$ represents a group except for a hydrogen atom, that is, represents an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group or an arylthio group.

Examples of the cation in the compound (ZI-2) or (ZI-3) for use in the present invention are described as follows.

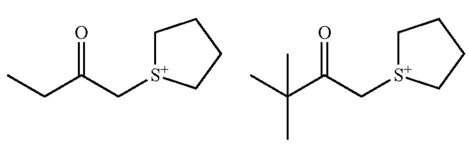

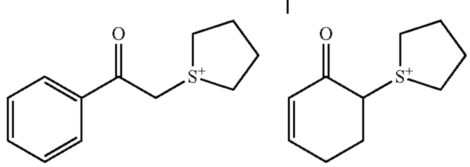

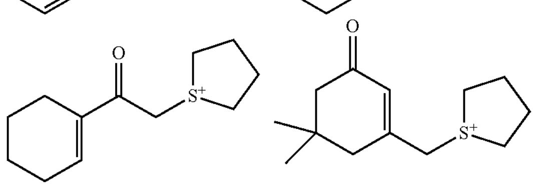

-continued

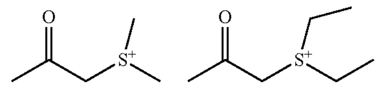

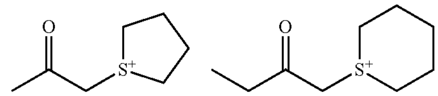

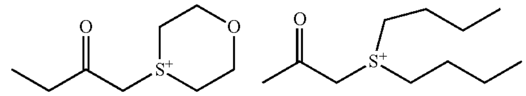

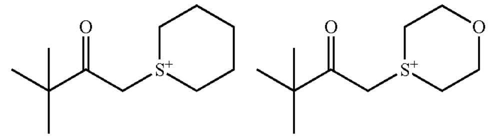

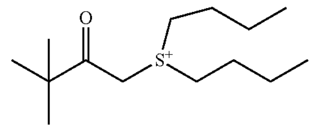

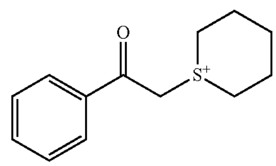

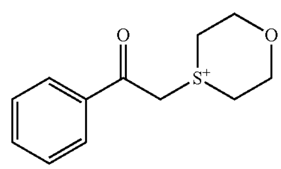

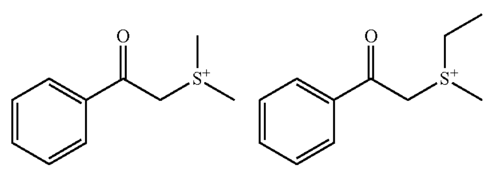

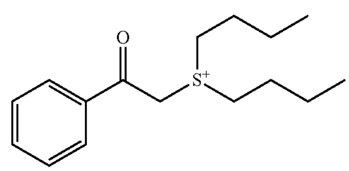

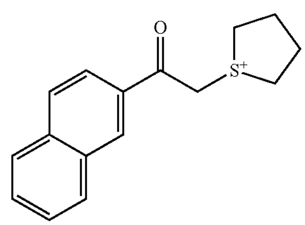

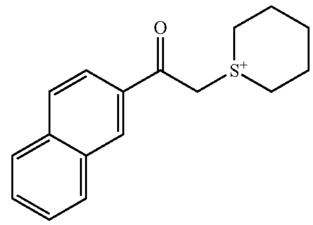

-continued
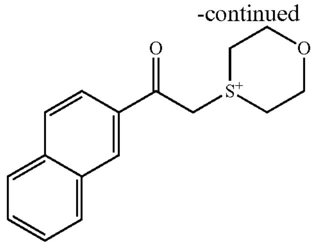
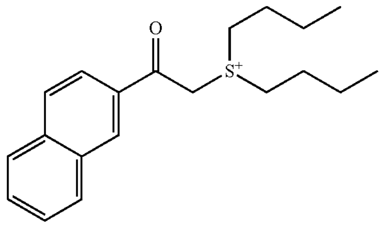
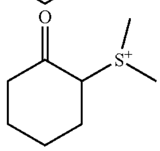
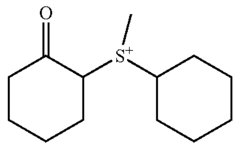
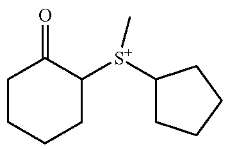
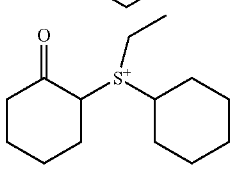
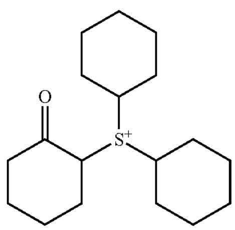
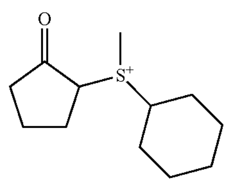
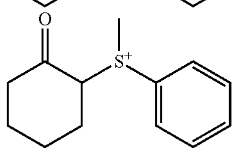
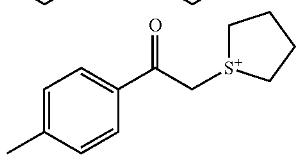
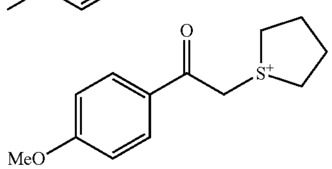
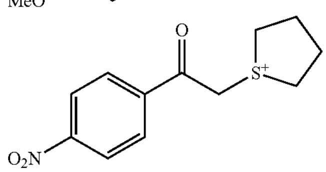
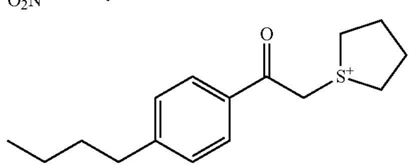
-continued
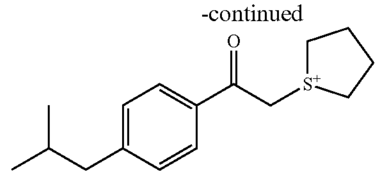
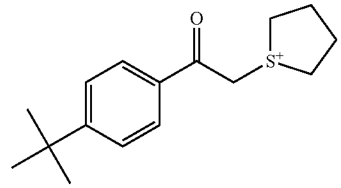
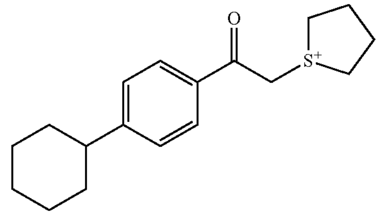
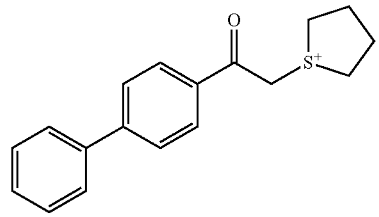
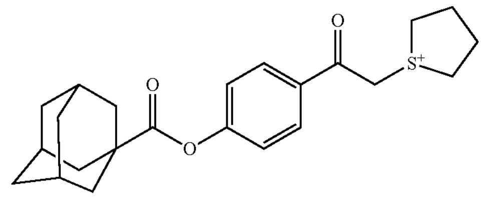
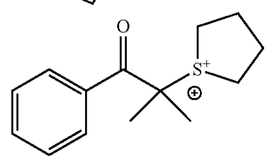
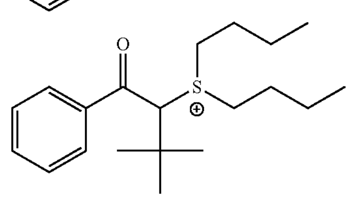
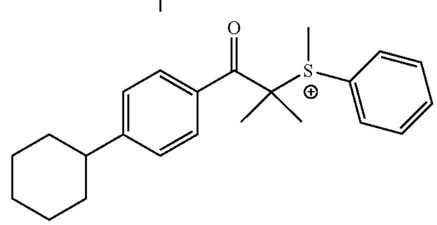
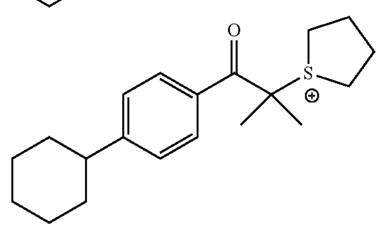

-continued
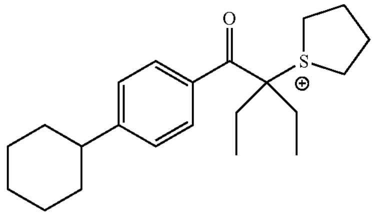
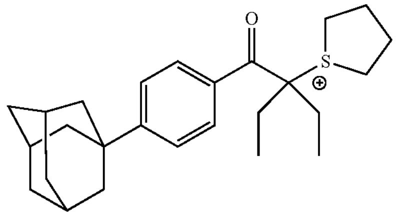
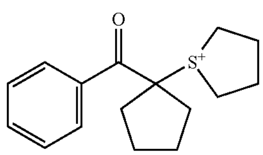
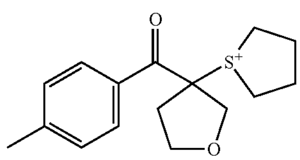
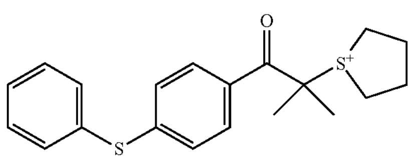
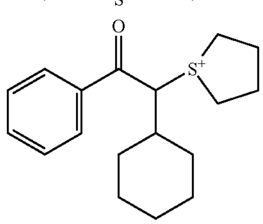
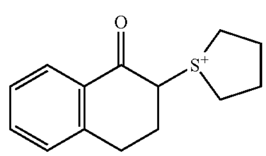
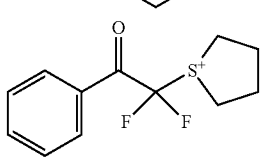
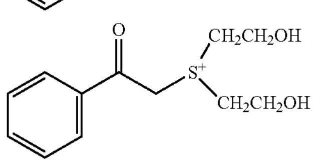
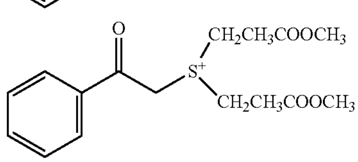
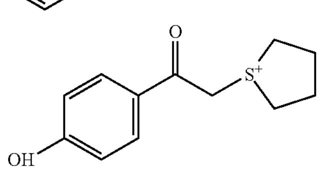
-continued
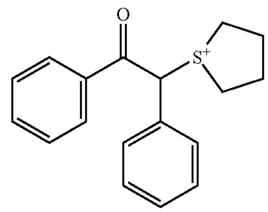
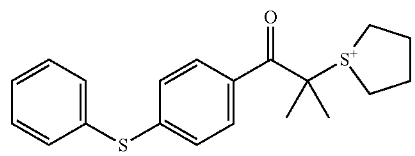
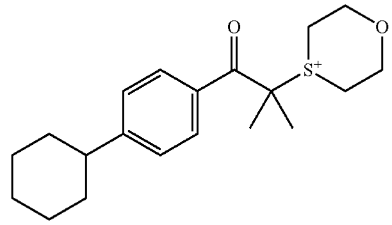
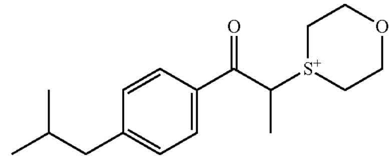
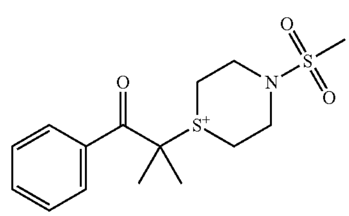
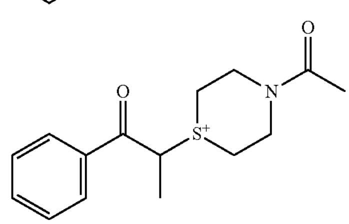
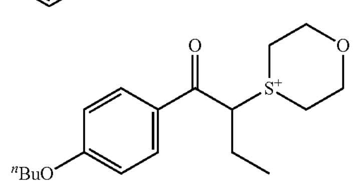
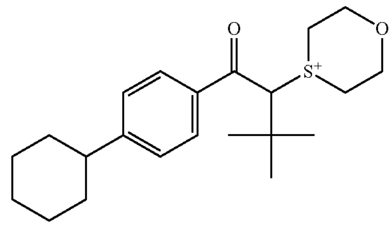

-continued

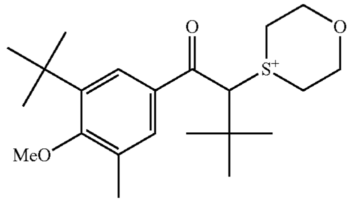

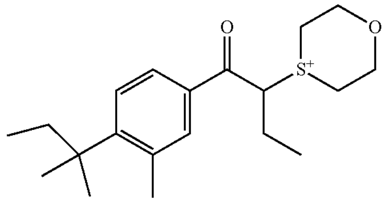

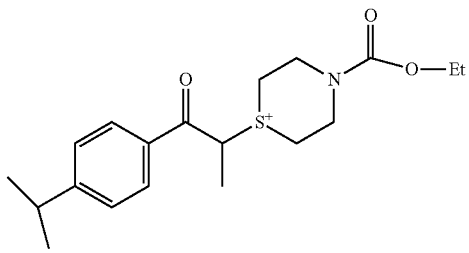

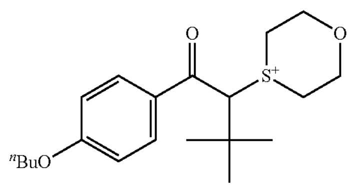

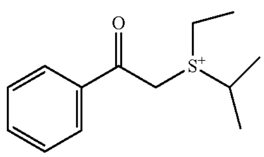

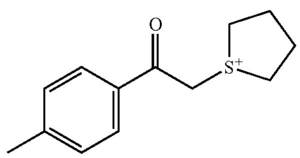

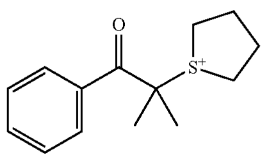

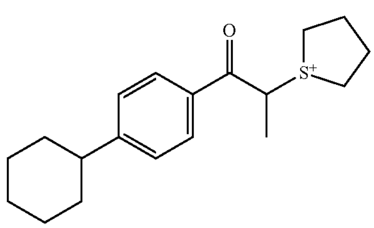

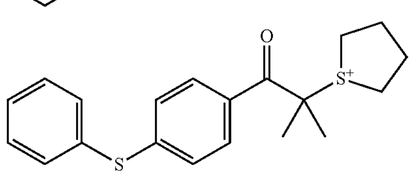

-continued

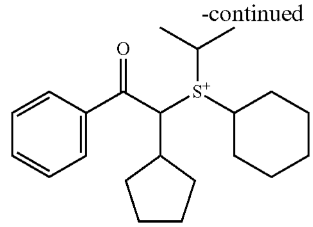

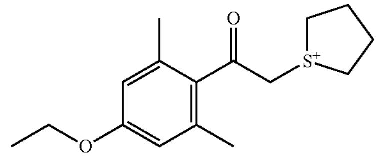

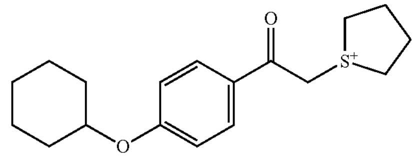

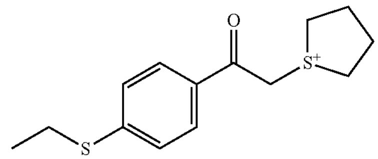

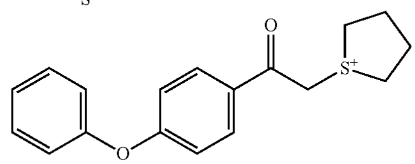

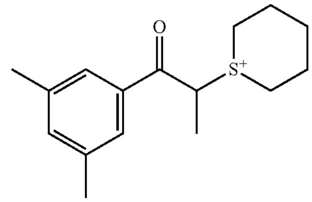

The compound (ZI-4) is described below.

The compound (ZI-4) is represented by the following formula (ZI-4):

(ZI-4)

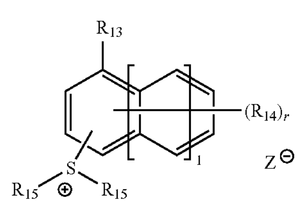

In formula (ZI-4), $R_{13}$ represents a hydrogen atom, a fluorine atom, a hydroxyl group, an alkyl group, a cycloalkyl group, an alkoxy group, an alkoxycarbonyl group or a group having a cycloalkyl group. These groups may have a substituent.

$R_{14}$ represents, when a plurality of $R_{14}$s are present, each independently represents, a hydroxyl group, an alkyl group, a cycloalkyl group, an alkoxy group, an alkoxycarbonyl group, an alkylcarbonyl group, an alkylsulfonyl group, a cycloalkylsulfonyl group, or a group having a cycloalkyl group. These groups may have a substituent.

Each $R_{15}$ independently represents an alkyl group, a cycloalkyl group or a naphthyl group. Two $R_{15}$s may combine with each other to form a ring. These groups may have a substituent.

l represents an integer of 0 to 2.

r represents an integer of 0 to 8.

$Z^-$ represents a non-nucleophilic anion, and examples thereof are the same as those of the nucleophilic anion of $Z^-$ in formula (ZI).

In formula (ZI-4), the alkyl group of $R_{13}$, $R_{14}$ and $R_{15}$ is a linear or branched alkyl group preferably having a carbon number of 1 to 10, and preferred examples thereof include a methyl group, an ethyl group, an n-butyl group, and a tert-butyl group.

The cycloalkyl group of $R_{13}$, $R_{14}$ and $R_{15}$ includes a monocyclic or polycyclic cycloalkyl group (preferably a cycloalkyl group having a carbon number of 3 to 20) and among others, is preferably cyclopropyl, cyclopentyl, cyclohexyl, cycloheptyl or cyclooctyl.

The alkoxy group of $R_{13}$ and $R_{14}$ is a linear or branched alkoxy group preferably having a carbon number of 1 to 10, and preferred examples thereof include a methoxy group, an ethoxy group, an n-propoxy group, and an n-butoxy group.

The alkoxycarbonyl group of $R_{13}$ and $R_{14}$ is a linear or branched alkoxycarbonyl group preferably having a carbon number of 2 to 11, and preferred examples thereof include a methoxycarbonyl group, an ethoxycarbonyl group, and an n-butoxycarbonyl group.

The group having a cycloalkyl group of $R_{13}$ and $R_{14}$ includes a monocyclic or polycyclic cycloalkyl group (preferably a cycloalkyl group having a carbon number of 3 to 20), and examples thereof include a monocyclic or polycyclic cycloalkyloxy group and an alkoxy group having a monocyclic or polycyclic cycloalkyl group. These groups may further have a substituent.

The monocyclic or polycyclic cycloalkyloxy group of $R_{13}$ and $R_{14}$ preferably has a total carbon number of 7 or more, more preferably a total carbon number of 7 to 15, and preferably has a monocyclic cycloalkyl group. The monocyclic cycloalkyloxy group having a total carbon number of 7 or more indicates a monocyclic cycloalkyloxy group where a cycloalkyloxy group such as cyclopropyloxy group, cyclobutyloxy group, cyclopentyloxy group, cyclohexyloxy group, cycloheptyloxy group, cyclooctyloxy group and cyclododecanyloxy group arbitrarily has a substituent such as alkyl group (e.g., methyl group, ethyl group, propyl group, butyl group, pentyl group, hexyl group, heptyl group, octyl group, dodecyl group, 2-ethylhexyl group, isopropyl group, sec-butyl group, tert-butyl group, isoamyl group), hydroxyl group, halogen atom (e.g., fluorine, chlorine, bromine, iodine), nitro group, cyano group, amido group, sulfonamido group, alkoxy group (e.g., methoxy group, ethoxy group, hydroxyethoxy group, propoxy group, hydroxypropoxy group, butoxy group), alkoxycarbonyl group (e.g., methoxycarbonyl group, ethoxycarbonyl group), acyl group (e.g., formyl group, acetyl group, benzoyl group), acyloxy group (e.g., acetoxy group, butyryloxy group) and carboxy group and where the total carbon number inclusive of the carbon number of an arbitrary substituent on the cycloalkyl group is 7 or more.

Examples of the polycyclic cycloalkyloxy group having a total carbon number of 7 or more include a norbomyloxy group, a tricyclodecanyloxy group, a tetracyclodecanyloxy group, and an adamantyloxy group.

The alkoxy group having a monocyclic or polycyclic cycloalkyl group of $R_{13}$ and $R_{14}$ preferably has a total carbon number of 7 or more, more preferably a total carbon number of 7 to 15, and is preferably an alkoxy group having a monocyclic cycloalkyl group. The alkoxy group having a total carbon number of 7 or more and having a monocyclic cycloalkyl group indicates an alkoxy group where the above-described monocyclic cycloalkyl group which may have a substituent is substituted on an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, tert-butoxy and isoamyloxy and where the total carbon number inclusive of the carbon number of the substituent is 7 or more. Examples thereof include a cyclohexylmethoxy group, a cyclopentylethoxy group, and a cyclohexylethoxy group, with a cyclohexylmethoxy group being preferred.

Examples of the alkoxy group having a total carbon number of 7 or more and having a polycyclic cycloalkyl group include a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, and an adamantylethoxy group, with a norbornylmethoxy group and a norbornylethoxy group being preferred.

Specific examples of the alkyl group in the alkylcarbonyl group of $R_{14}$ are the same as those of the alkyl group of $R_{13}$ to $R_{15}$.

The alkylsulfonyl group and cycloalkylsulfonyl group of $R_{14}$ are a linear, branched or cyclic alkylsulfonyl group preferably having a carbon number of 1 to 10, and preferred examples thereof include a methanesulfonyl group, an ethanesulfonyl group, an n-propanesulfonyl group, an n-butanesulfonyl group, a cyclopentanesulfonyl group, and a cyclohexanesulfonyl group.

Examples of the substituent which may be substituted on each of the groups above include a halogen atom (e.g., fluorine atom), a hydroxyl group, a carboxyl group, a cyano group, a nitro group, an alkoxy group, an alkoxyalkyl group, an alkoxycarbonyl group, and an alkoxycarbonyloxy group.

Examples of the alkoxy group include a linear, branched or cyclic alkoxy group having a carbon number of 1 to 20, such as methoxy group, ethoxy group, n-propoxy group, i-propoxy group, n-butoxy group, 2-methylpropoxy group, 1-methylpropoxy group, tert-butoxy group, cyclopentyloxy group and cyclohexyloxy group.

Examples of the alkoxyalkyl group include a linear, branched or cyclic alkoxyalkyl group having a carbon number of 2 to 21, such as methoxymethyl group, ethoxymethyl group, 1-methoxyethyl group, 2-methoxyethyl group, 1-ethoxyethyl group and 2-ethoxyethyl group.

Examples of the alkoxycarbonyl group include a linear, branched or cyclic alkoxycarbonyl group having a carbon number of 2 to 21, such as methoxycarbonyl group, ethoxycarbonyl group, n-propoxycarbonyl group, i-propoxycarbonyl group, n-butoxycarbonyl group, 2-methylpropoxycarbonyl group, 1-methylpropoxycarbonyl group, tert-butoxycarbonyl group, cyclopentyloxycarbonyl group and cyclohexyloxycarbonyl group.

Examples of the alkoxycarbonyloxy group include a linear, branched or cyclic alkoxycarbonyloxy group having a carbon number of 2 to 21, such as methoxycarbonyloxy group, ethoxycarbonyloxy group, n-propoxycarbonyloxy group, i-propoxycarbonyloxy group, n-butoxycarbonyloxy group, tert-butoxycarbonyloxy group, cyclopentyloxycarbonyloxy group and cyclohexyloxycarbonyloxy group.

The ring structure which may be formed by combining two $R_{15}$s with each other includes a 5- or 6-membered ring, preferably a 5-membered ring (that is, tetrahydrothiophene ring), formed by two $R_{15}$s together with the sulfur atom in formula (ZI-4) and may be fused with an aryl group or a cycloalkyl group. The divalent $R_{15}$ may have a substituent, and examples of the substituent include a hydroxyl group, a carboxyl group, a cyano group, a nitro group, an alkyl group, a cycloalkyl group, an alkoxy group, an alkoxyalkyl group, an alkoxycarbonyl group, and an alkoxycarbonyloxy group. As for the substituent on the ring structure, a plurality of substituents may be present, and they may combine with each other to form a ring (an aromatic or non-aromatic hydrocarbon ring, an aromatic or non-aromatic heterocyclic ring, or a polycyclic condensed ring formed by combining two or more of these rings).

In formula (ZI-4), $R_{15}$ is preferably, for example, a methyl group, an ethyl group, a naphthyl group, or a divalent group capable of forming a tetrahydrothiophene ring structure together with the sulfur atom when two $R_{15}$s are combined.

The substituent which $R_{13}$ and $R_{14}$ may have is preferably a hydroxyl group, an alkoxy group, an alkoxycarbonyl group, or a halogen atom (particularly fluorine atom).

l is preferably 0 or 1, more preferably 1.

r is preferably from 0 to 2.

Examples of the cation in the compound represented by formula (ZI-4) for use in the present invention are described as follows.

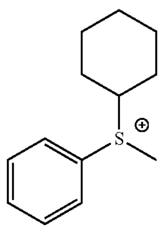
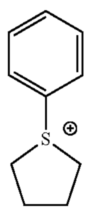
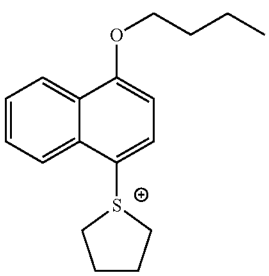
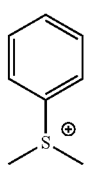
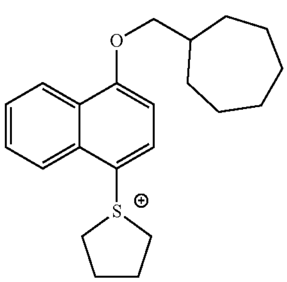
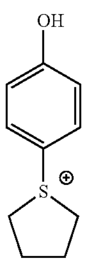
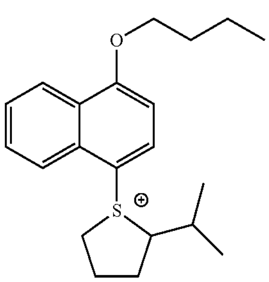
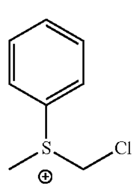
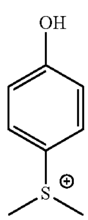

-continued

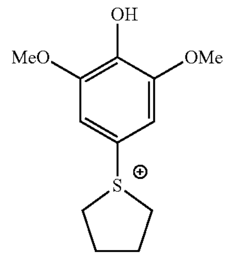
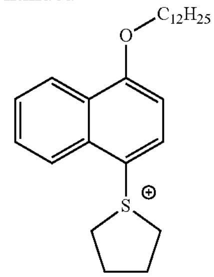
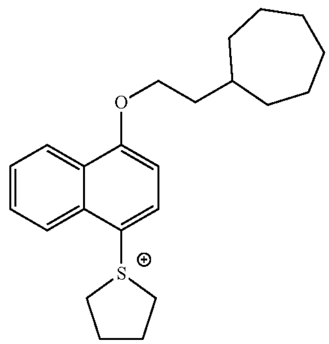
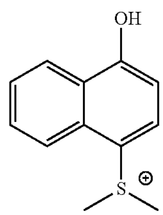
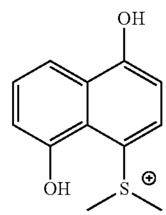
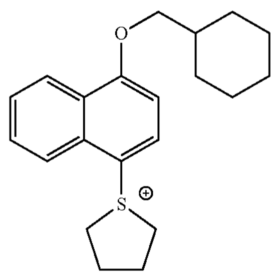
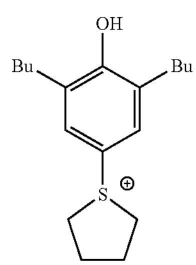
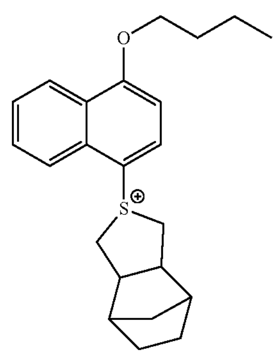
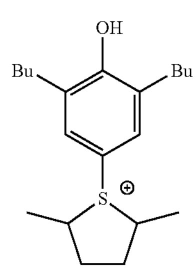
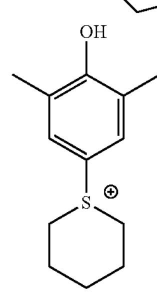
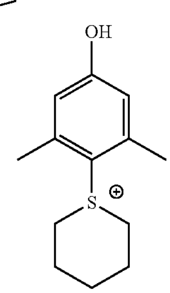

-continued
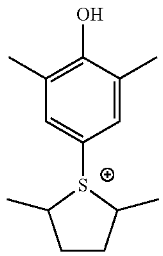
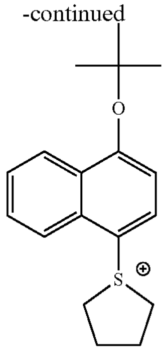
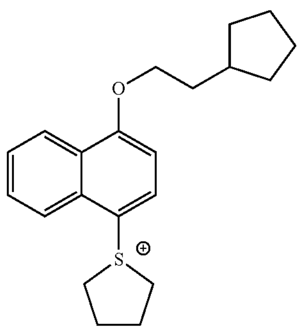
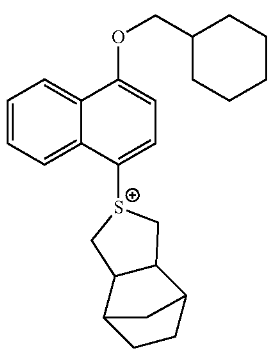
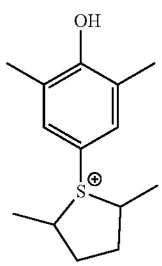
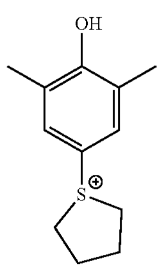
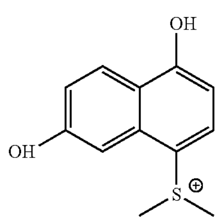
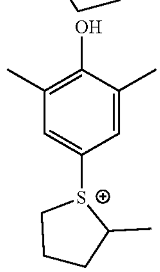
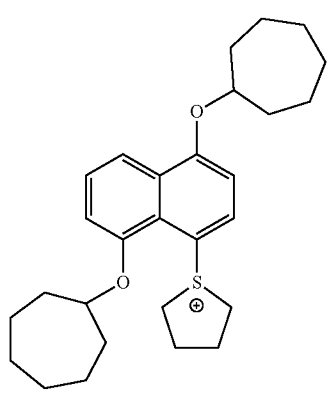
-continued
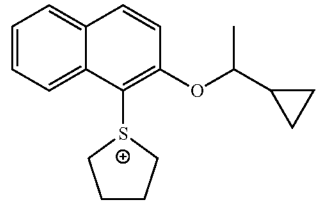
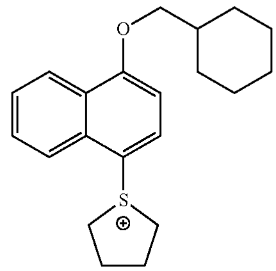
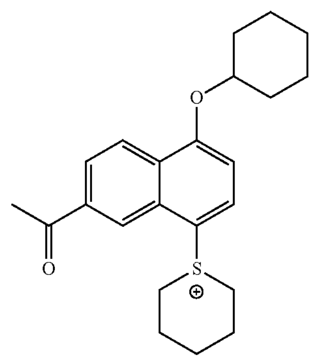
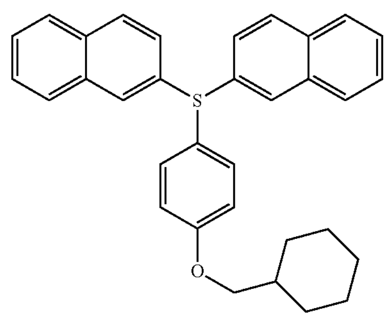
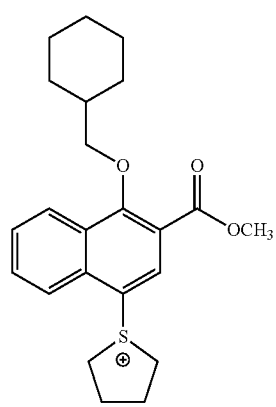
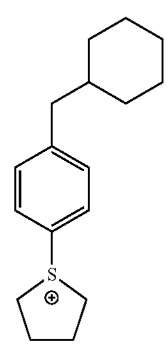

-continued
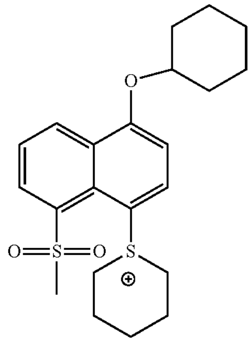
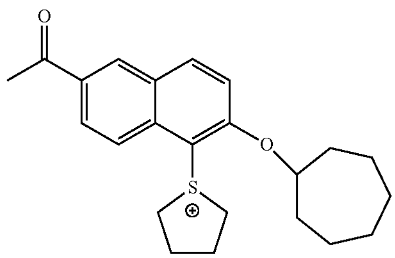
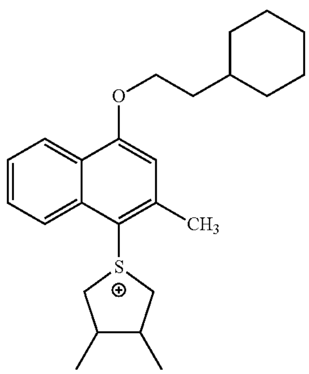
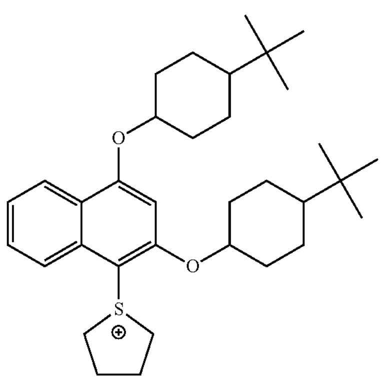
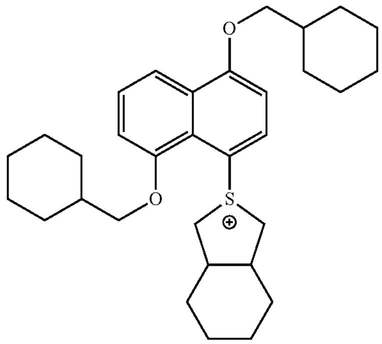
-continued
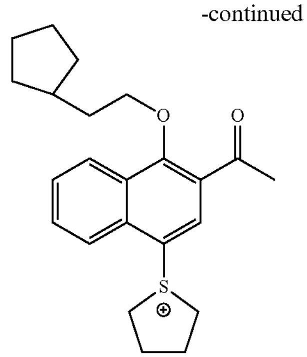
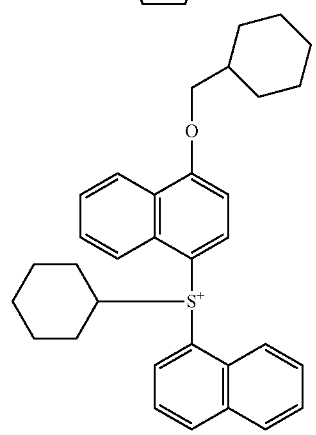
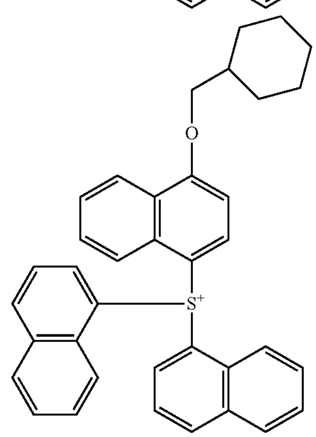
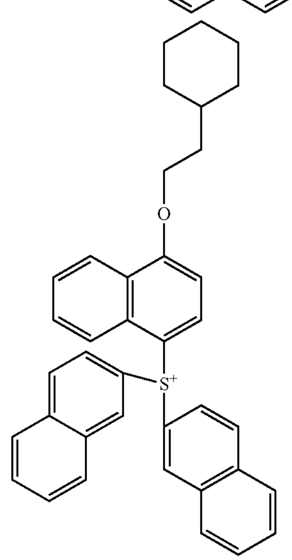
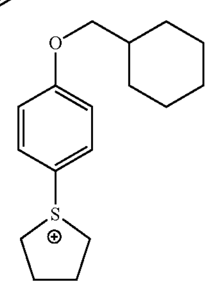

-continued

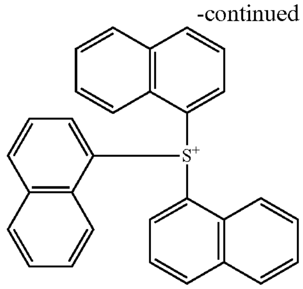

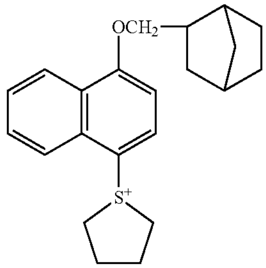

Formulae (ZII) and (ZIII) are described below.

In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group. The aryl group of $R_{204}$ to $R_{207}$ may be an aryl group having a heterocyclic structure containing an oxygen atom, a nitrogen atom, a sulfur atom or the like. Examples of the framework of the aryl group having a heterocyclic structure include pyrrole, furan, thiophene, indole, benzofuran, and benzothiophene.

The alkyl group and cycloalkyl group in $R_{204}$ to $R_{207}$ are preferably a linear or branched alkyl group having a carbon number of 1 to 10 (e.g., methyl group, ethyl group, propyl group, butyl group, pentyl group) and a cycloalkyl group having a carbon number of 3 to 10 (e.g., cyclopentyl group, cyclohexyl group, norbornyl group).

The aryl group, alkyl group and cycloalkyl group of $R_{204}$ to $R_{207}$ may have a substituent. Examples of the substituent which the aryl group, alkyl group and cycloalkyl group of $R_{204}$ to $R_{207}$ may have include an alkyl group (for example, having a carbon number of 1 to 15), a cycloalkyl group (for example, having a carbon number of 3 to 15), an aryl group (for example, having a carbon number of 6 to 15), an alkoxy group (for example, having a carbon number of 1 to 15), a halogen atom, a hydroxyl group, and a phenylthio group.

$Z^-$ represents a non-nucleophilic anion, and examples thereof are the same as those of the non-nucleophilic anion of $Z^-$ in formula (ZI).

Other examples of the acid generator include compounds represented by the following formulae (ZIV), (ZV) and (ZVI):

(ZIV)

$$Ar_3—SO_2—SO_2—Ar_4$$

(ZV)

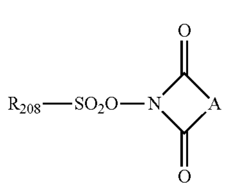

-continued (ZVI)

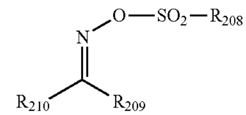

In formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

Specific examples of the aryl group of $Ar_3$, $Ar_4$, $R_{208}$, $R_{209}$ and $R_{210}$ are the same as specific examples of the aryl group of $R_{201}$, $R_{202}$ and $R_{203}$ in formula (ZI-1).

Specific examples of the alkyl group and cycloalkyl group of $R_{208}$, $R_{209}$ and $R_{210}$ are the same as specific examples of the alkyl group and cycloalkyl group of $R_{201}$, $R_{202}$ and $R_{203}$ in formula (ZI-2).

The alkylene group of A includes an alkylene group having a carbon number of 1 to 12 (e.g., methylene group, ethylene group, propylene group, isopropylene group, butylenes group, isobutylene group); the alkenylene group of A includes an alkenylene group having a carbon number of 2 to 12 (e.g., ethenylene group, propenylene group, butenylene group); and the arylene group of A includes an arylene group having a carbon number of 6 to 10 (e.g., phenylene group, tolylene group, naphthylene group).

Among the acid generators, more preferred are the compounds represented by formulae (ZI) to (ZIII).

Also, the acid generator is preferably a compound that generates an acid having one sulfonic acid group or imide group, more preferably a compound that generates a monovalent perfluoroalkanesulfonic acid, a compound that generates an aromatic sulfonic acid substituted with a monovalent fluorine atom or a fluorine atom-containing group, or a compound that generates an imide acid substituted with a monovalent fluorine atom or a fluorine atom-containing group, still more preferably a sulfonium salt of fluoro-substituted alkanesulfonic acid, fluorine-substituted benzenesulfonic acid, fluorine-substituted imide acid or fluorine-substituted methide acid. In particular, the acid generator which can be used is preferably a compound that generates a fluoro-substituted alkanesulfonic acid, a fluoro-substituted benzenesulfonic acid or a fluoro-substituted imide acid, where pKa of the acid generated is −1 or less, and in this case, the sensitivity is enhanced.

Out of the acid generators, particularly preferred examples are illustrated below.

(z1)

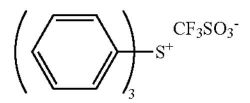

(z2)

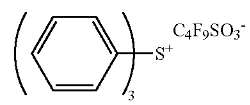

(z3)

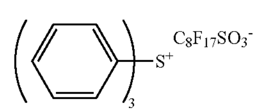

-continued
(z4)
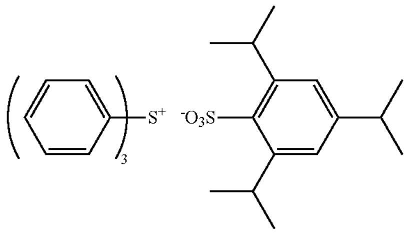
(z5)
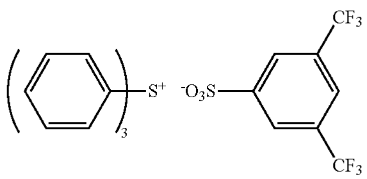
(z6)
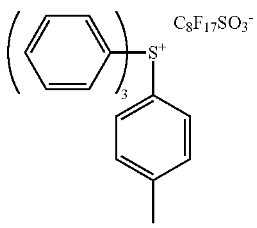
(z7)
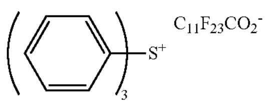
(z8)
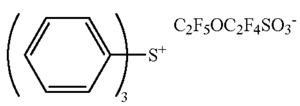
(z9)
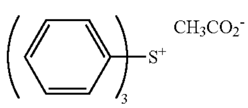
(z10)
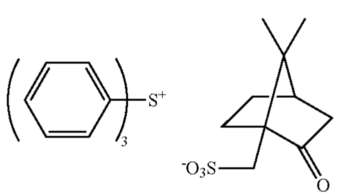
(z11)
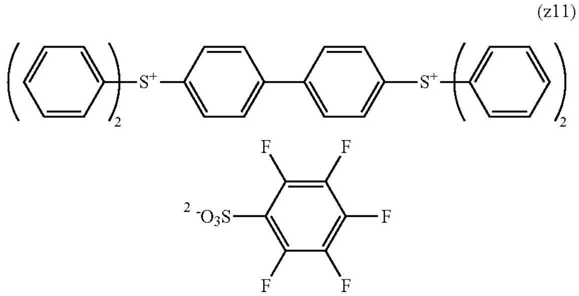
(z12)
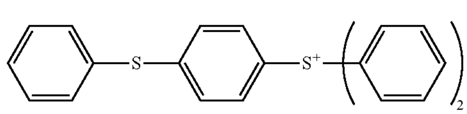
-continued
(z13)
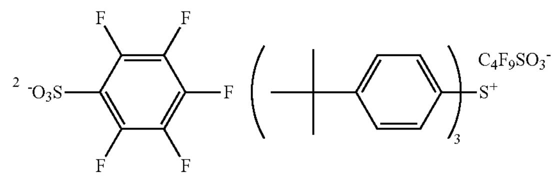
(z14)
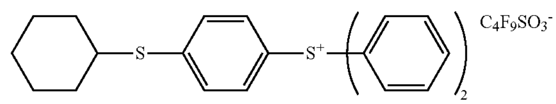
(z15)
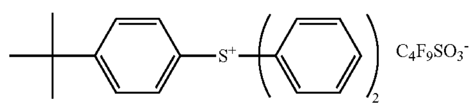
(z16)
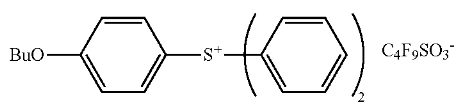
(z17)
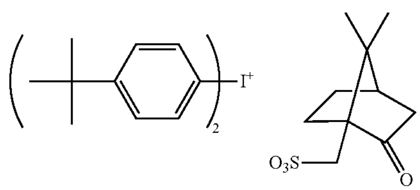
(z18)
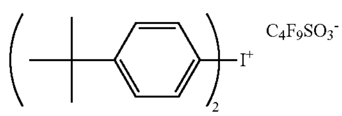
(z19)
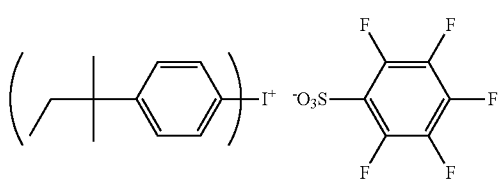
(z20)
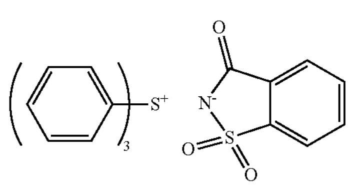
(z21)
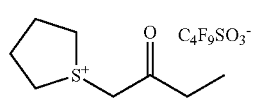
(z22)
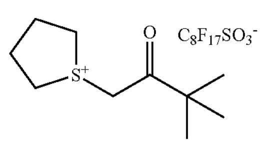

-continued
(z23)
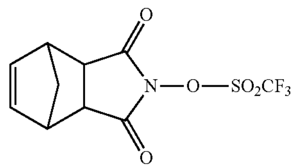
(z24)
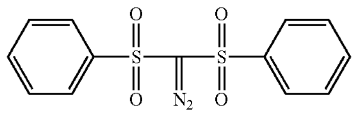
(z25)
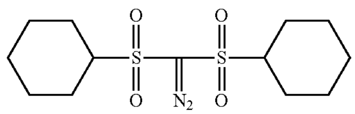
(z26)
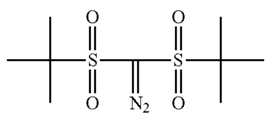
(z27)
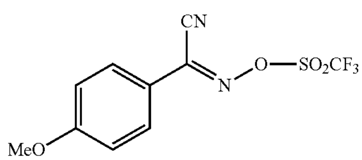
(z28)
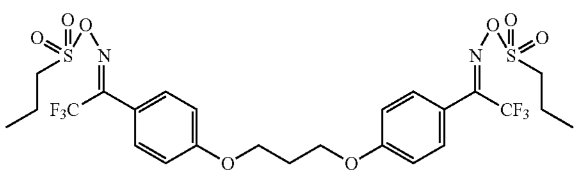
(z29)
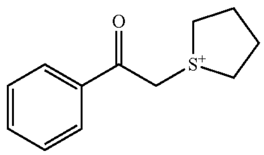
(z30)
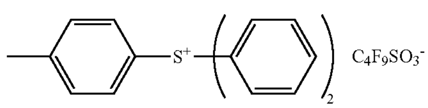
(z31)
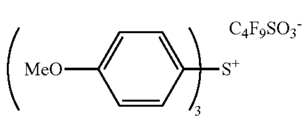
(z32)
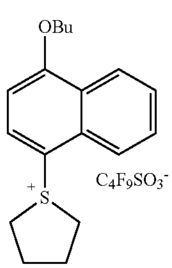
-continued
(z33)
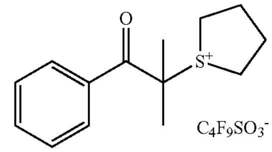
(z34)
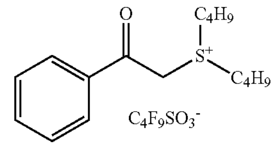
(z35)
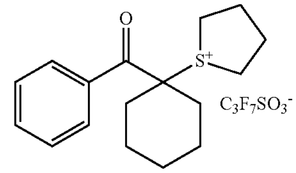
(z36)
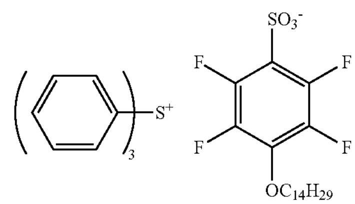
(z37)
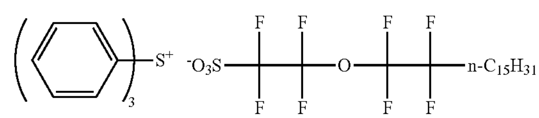
(z38)
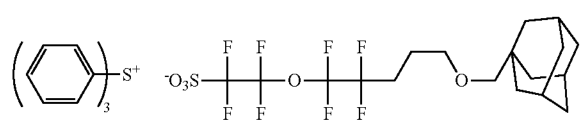
(z39)
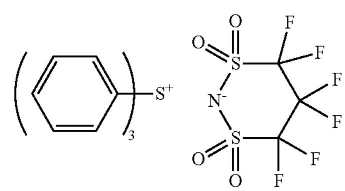
(z40)
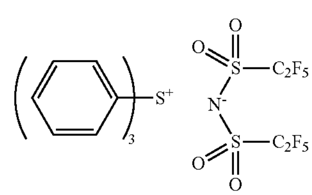
(z41)
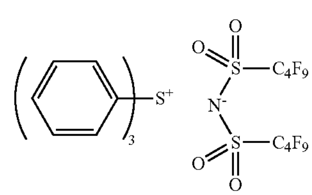

-continued
(z42)
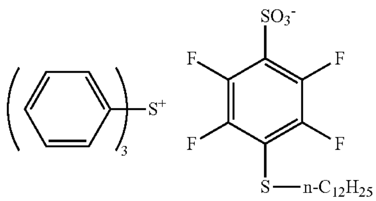
(z43)
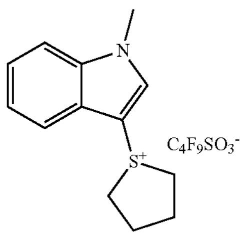
(z44)
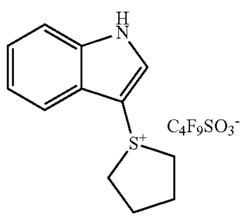
(z45)
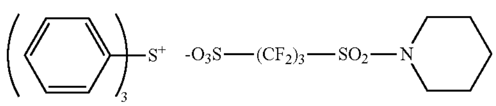
(z46)
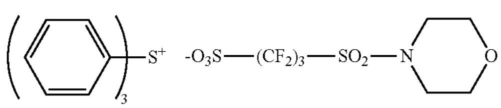
(z47)
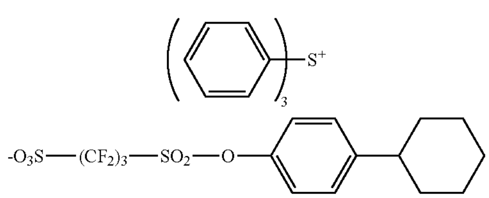
(z48)
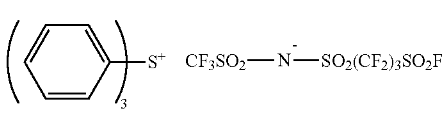
(z49)
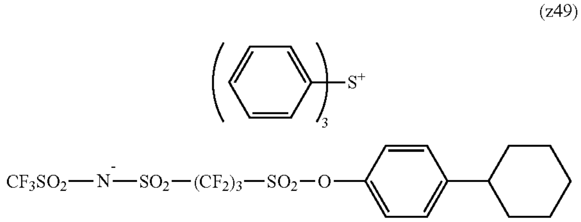
-continued
(z50)
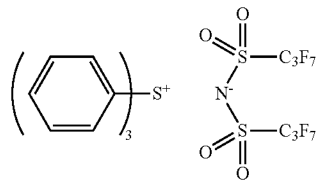
(z51)
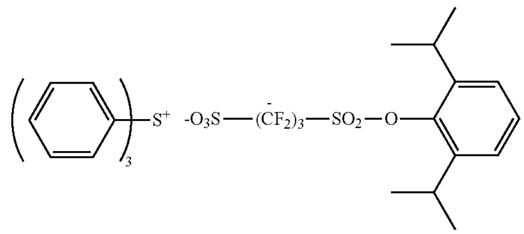
(z52)
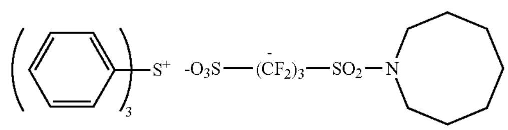
(z53)
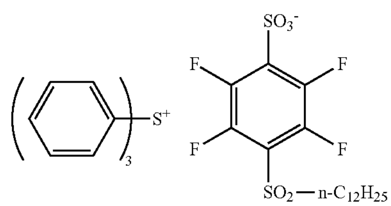
(z54)
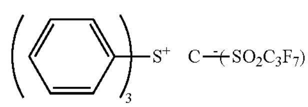
(z55)
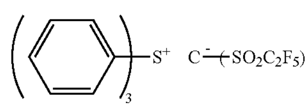
(z56)
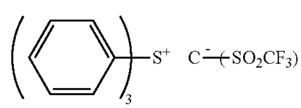
(z57)
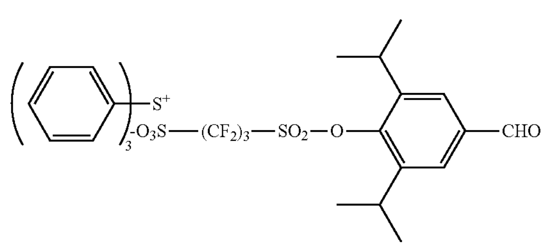
(z58)
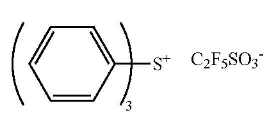
(z59)
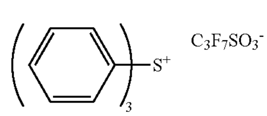

-continued
(z60)
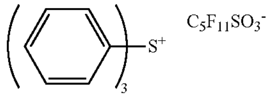
(z61)
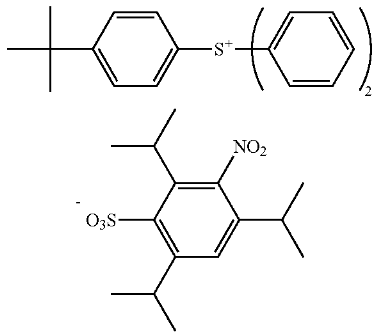
(z62)
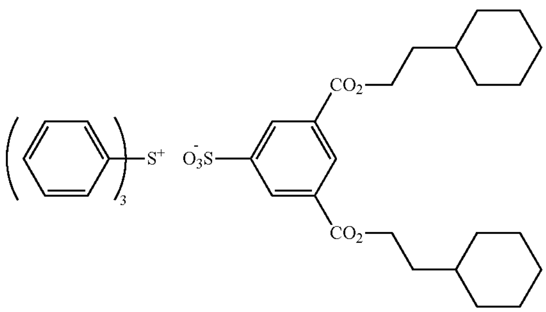
(z63)
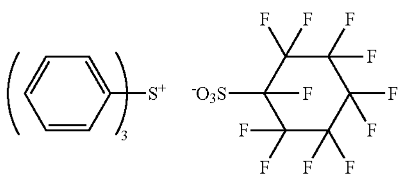
(z64)
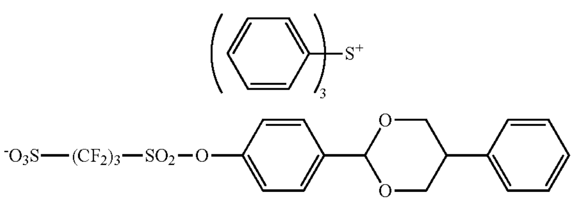
(z65)
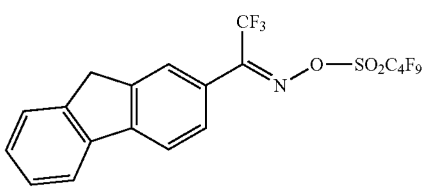
(z66)
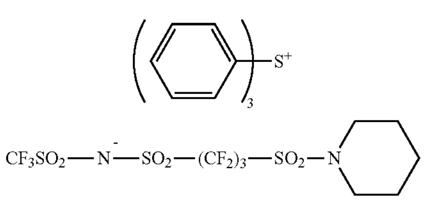
-continued
(z67)
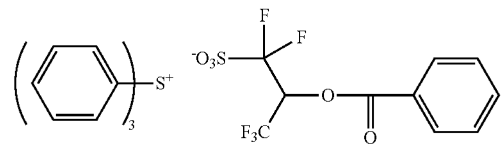
(z68)
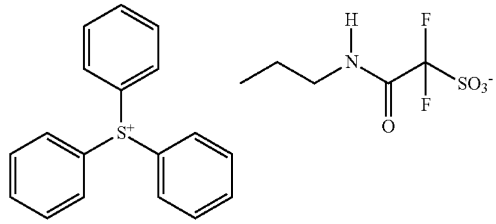
(z69)
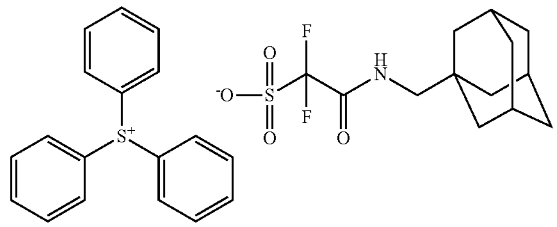
(z70)
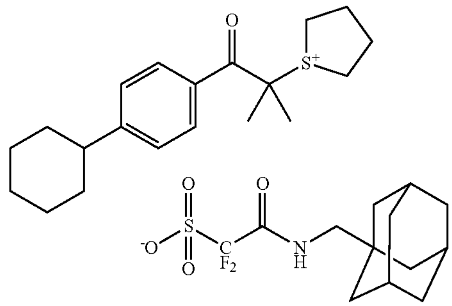
(z71)
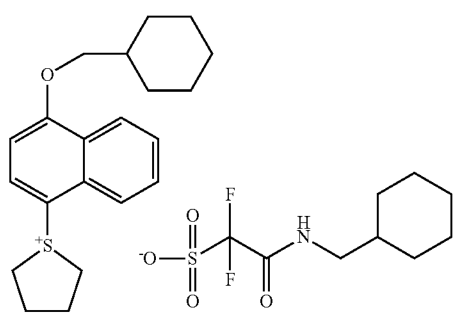
(z72)
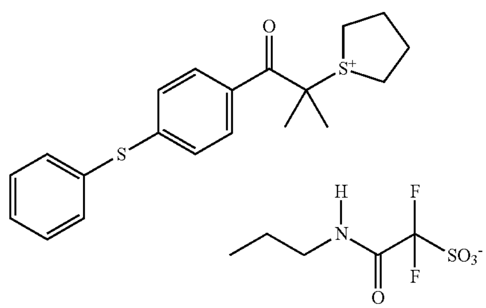

-continued
(z73)
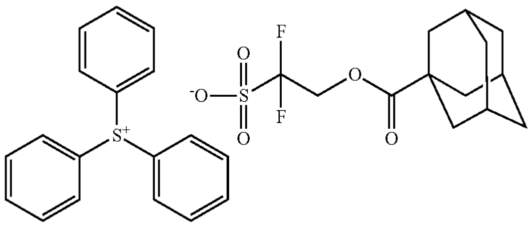
(z74)
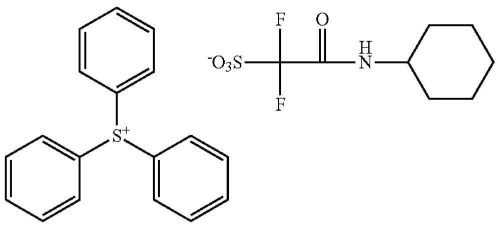
(z75)
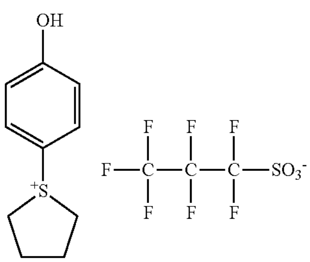
(z76)
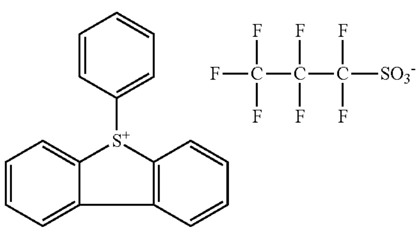
(z77)
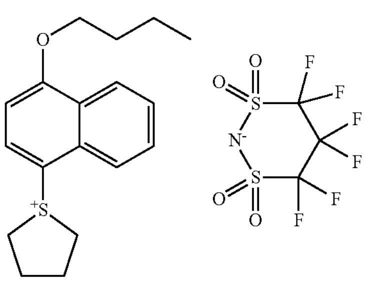
(z78)
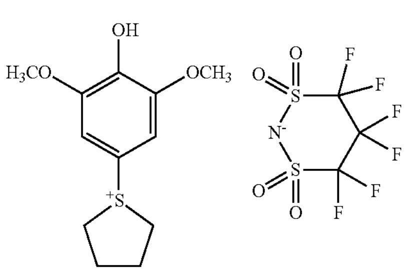
-continued
(z79)
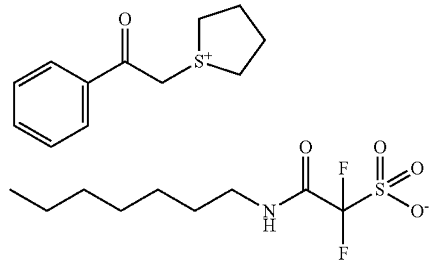
(z80)
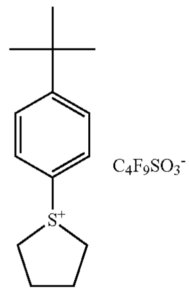
(z81)
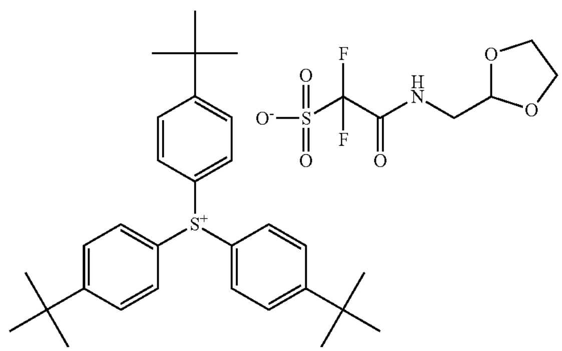
(z82)
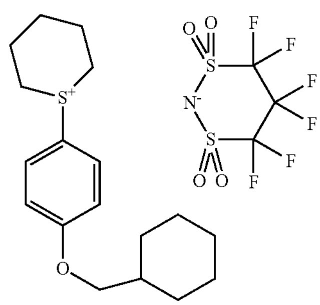
(z83)
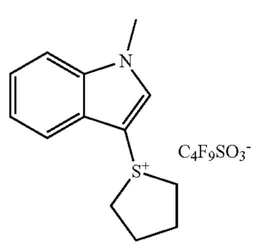

-continued
(z84)
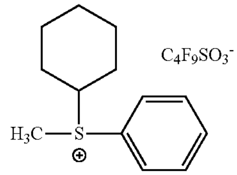
(z85)
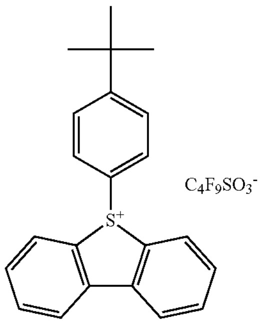
(z86)
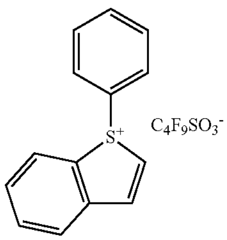
(z87)
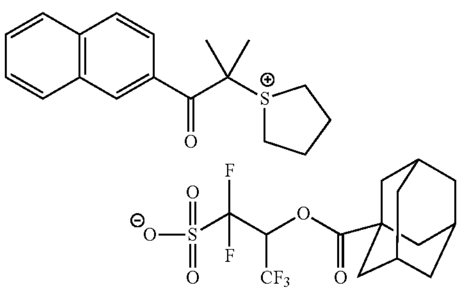
(z88)
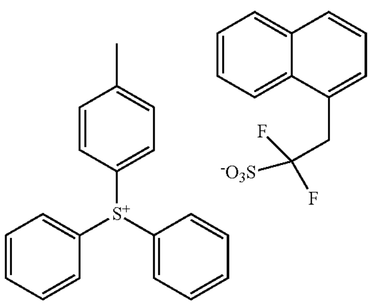
(z89)
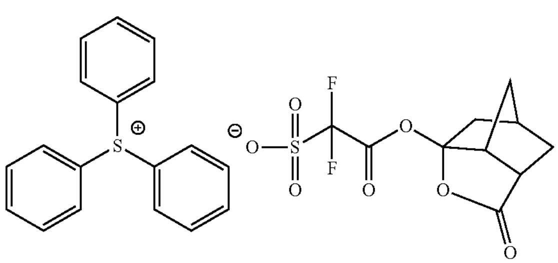
-continued
(z90)
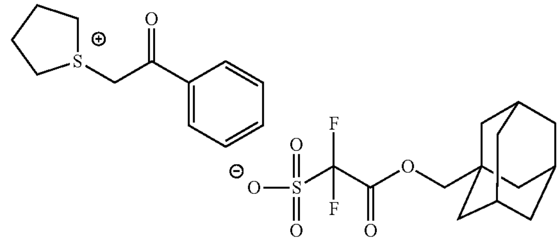
(z91)
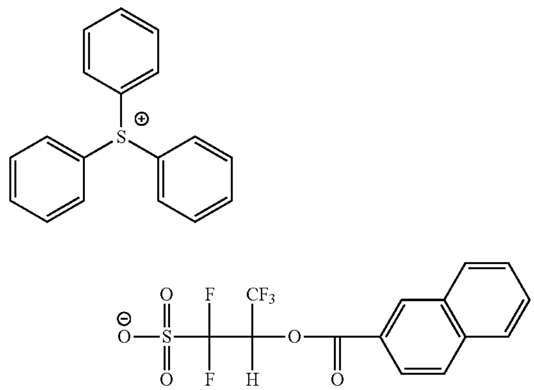
(z92)
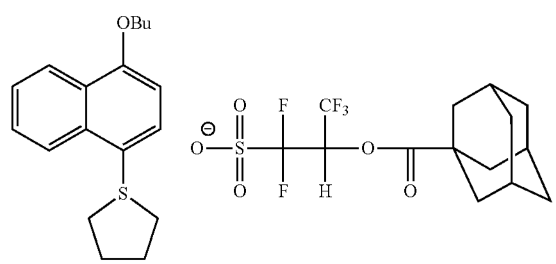
(z93)
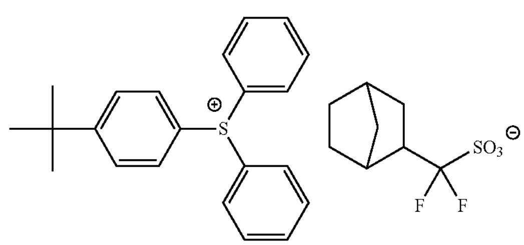
(z94)
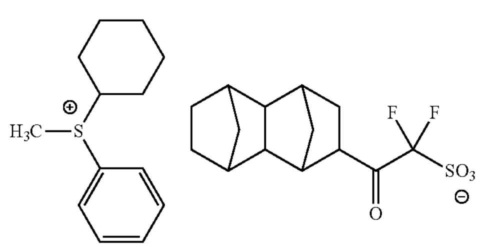
(z95)
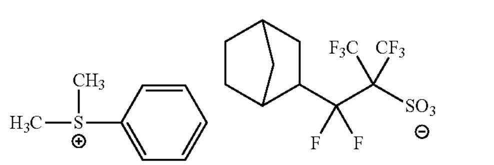

-continued
(z96)
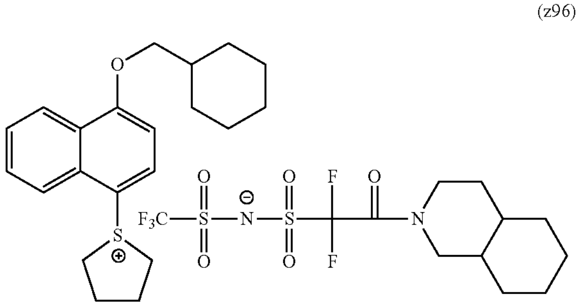
(z97)
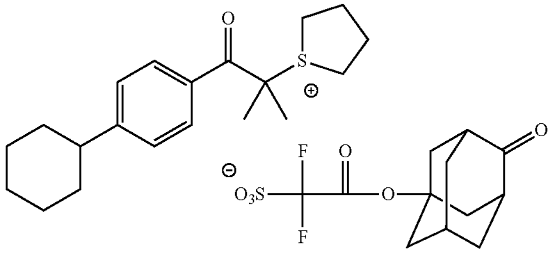
(z98)
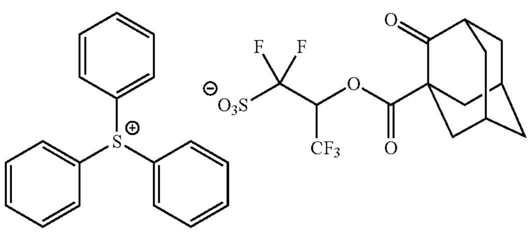
(z99)
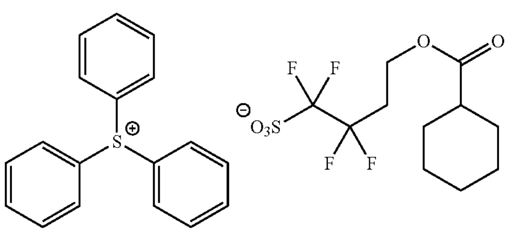
(z100)
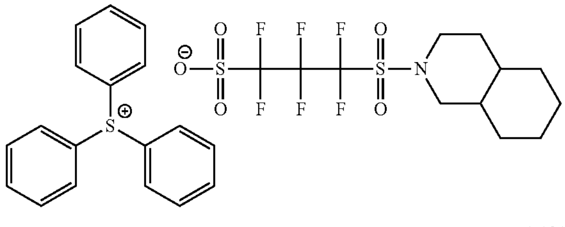
(z101)
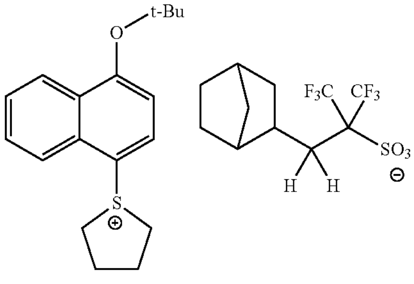
-continued
(z102)
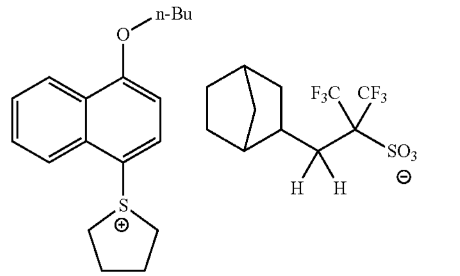
(z103)
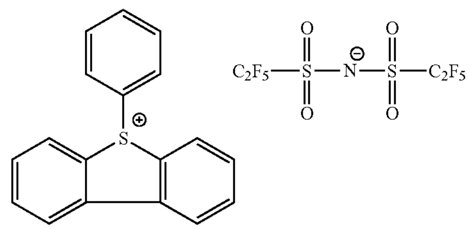
(z104)
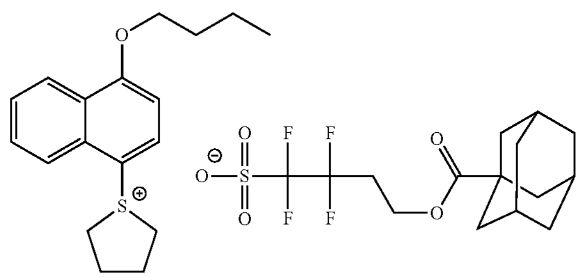
(z105)
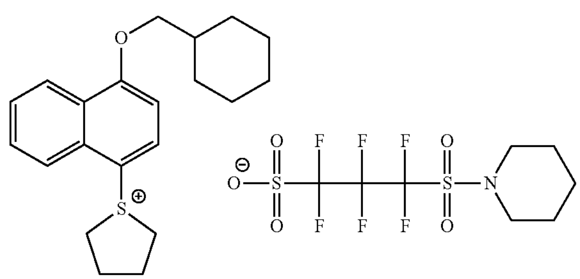
(z106)
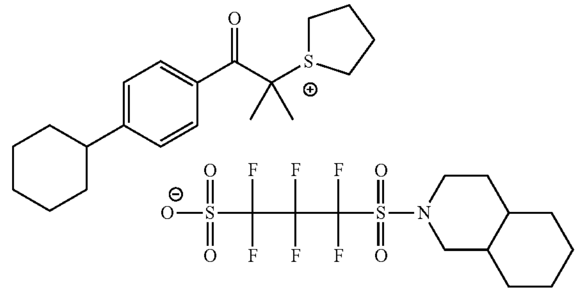

-continued
(z107)
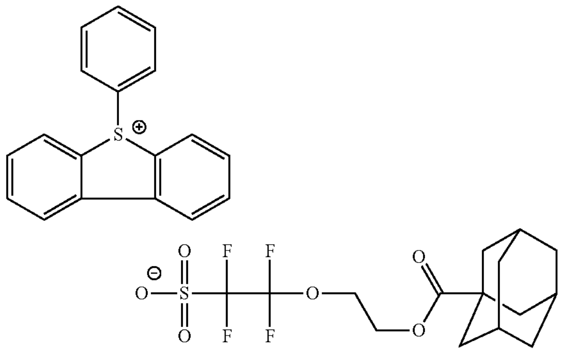
(z108)
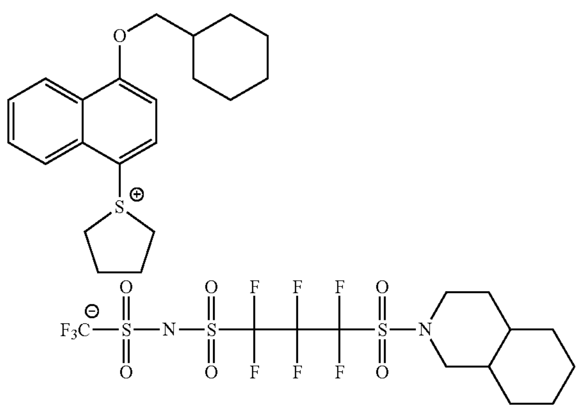
Further, as examples of the compound having the anion represented by any of formulae (B-1) to (B-3), particularly preferred ones among compounds included in the compound (B), are illustrated below, but these examples should not be construed as limiting the scope of the invention.
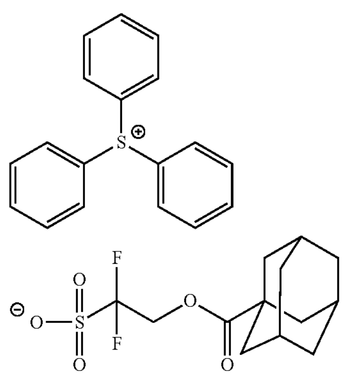
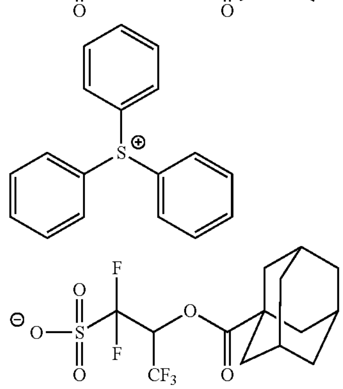
-continued
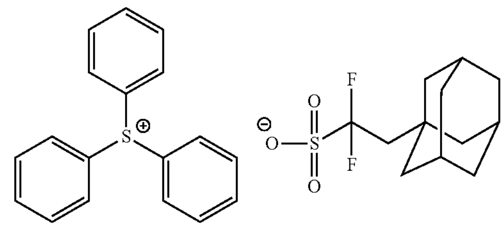
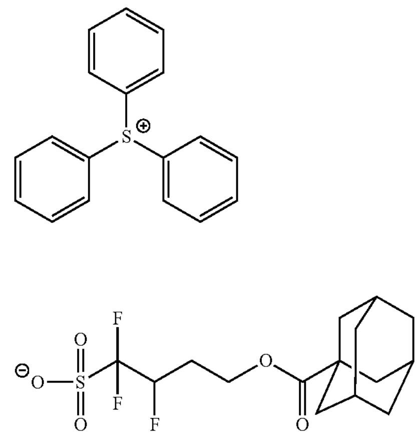
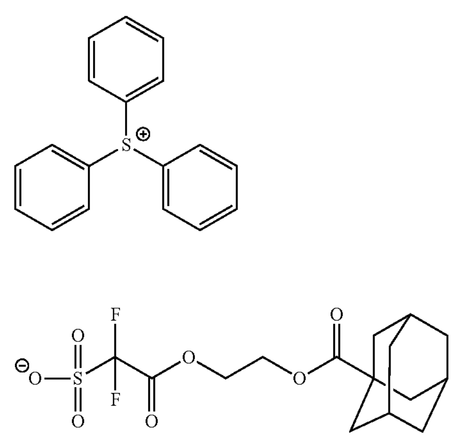
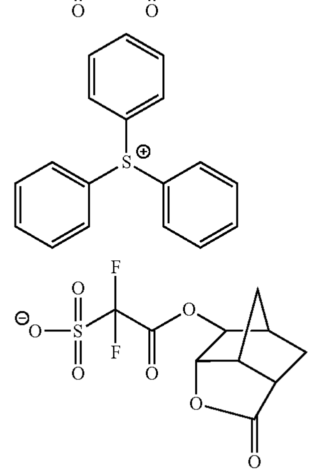

-continued
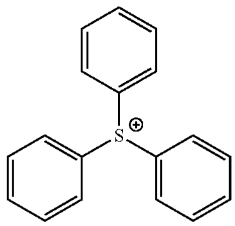
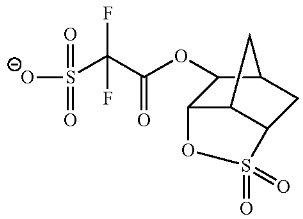
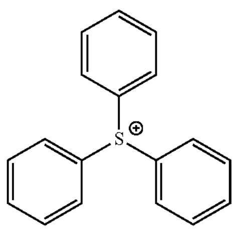
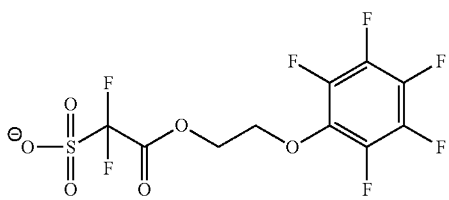
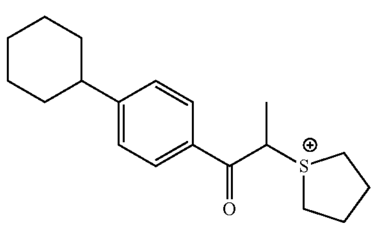
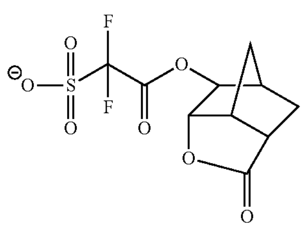
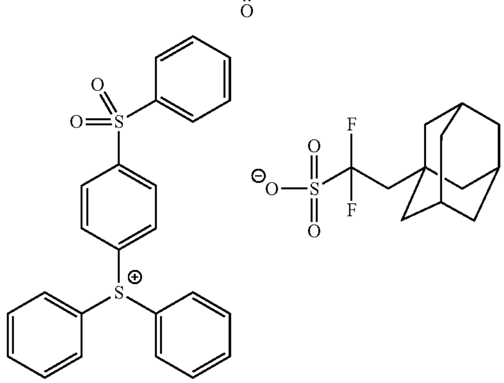
-continued
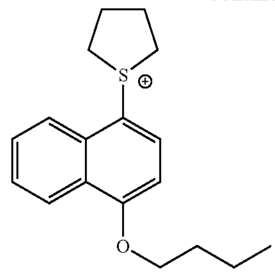
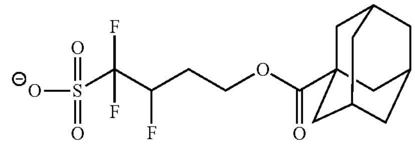
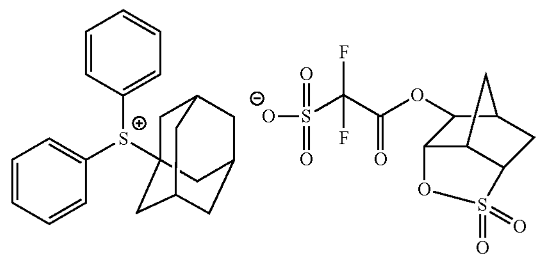
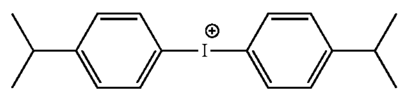
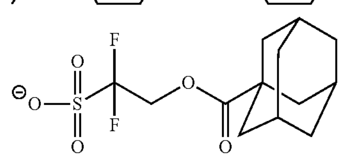
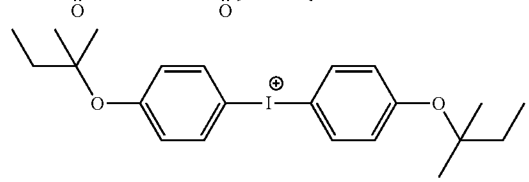
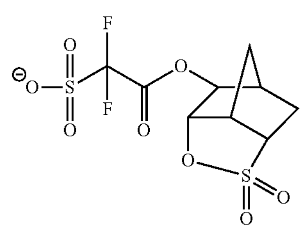
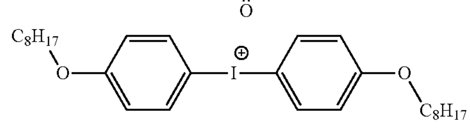
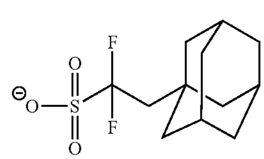
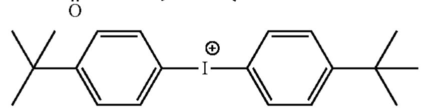

-continued

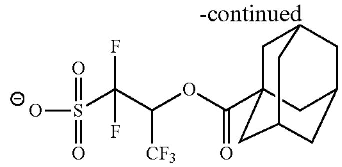

The acid generators can be synthesized in accordance with well-known methods, and more specifically, they can be synthesized in conformance with the methods disclosed e.g. in JP-A-2007-161707; JP-A-2010-100595, paragraphs [0200] to [0210]; WO 2011/093280, paragraphs [0051] to [0058]; WO 2008/153110, paragraphs [0382] to [0385]; and JP-A-2007-161707.

The acid generators can be used alone, or any two or more of them can be used in combination.

The content of the compound capable of generating an acid upon irradiation with an actinic ray or radiation (exclusive of the case represented by formula (ZI-3) or (ZI-4)) in the composition is preferably from 0.1 mass % to 30 mass %, more preferably from 0.5 mass % to 25 mass %, further preferably from 3 mass % to 20 mass %, particularly preferably from 3 mass % to 15 mass %, based on the total solid content of the actinic ray- or radiation-sensitive resin composition (I).

On the other hand, when the acid generator is represented by formula (ZI-3) or (ZI-4), the content is preferably from 5 mass % to 35 mass %, more preferably from 8 mass % to 30 mass %, further preferably from 9 mass % to 30 mass %, particularly preferably from 9 mass % to 25 mass %, based on the total solid content of the composition.

[3] (C) Solvent

The actinic ray-sensitive or radiation-sensitive resin composition (I) generally contains a solvent (C).

Examples of a solvent usable in preparing the actinic ray-sensitive or radiation-sensitive resin composition (I) can include an organic solvent, such as alkylene glycol monoalkyl ether carboxylate, alkylene glycol monoalkyl ether, alkyl lactate, alkyl alkoxypropionate, cyclic lactone (preferably having a carbon number of 4 to 10), monoketone compound (preferably having a carbon number of 4 to 10) which may have a ring, alkylene carbonate, alkyl alkoxyacetate and alkyl pyruvate.

Examples of these solvents include those disclosed e.g. in a published U.S. Patent Application No. 2008/0187860 specification, paragraphs [0441] to [0455].

In the invention, a mixed solvent prepared by mixing a solvent containing a hydroxyl group in the structure and a solvent not containing a hydroxyl group may be used as the organic solvent.

The solvent containing a hydroxyl group and the solvent containing no hydroxyl group can be appropriately selected from the compounds exemplified above. Preferred examples of the solvent containing a hydroxyl group include an alkylene glycol monoalkyl ether and an alkyl lactate. Among them, propylene glycol monomethyl ether (PGME, another name: 1-methoxy-2-propanol) and ethyl lactate are preferred. And preferred examples of the solvent not containing a hydroxyl group include an alkylene glycol monoalkyl ether acetate, an alkyl alkoxypropionate, a monoketone compound which may contain a ring, a cyclic lactone and an alkyl acetate. Of these solvents, propylene glycol monomethyl ether acetate (PGMEA, another name: 1-methoxy-2-acetoxypropane), ethyl ethoxypropionate, 2-heptanone, γ-butyrolactone, cyclohexanone and butyl acetate are particularly suitable, and propylene glycol monomethyl ether acetate, ethyl ethoxypropionate and 2-heptanone are the most suitable.

The mixing ratio (by mass) of the solvent containing a hydroxyl group and the solvent not containing a hydroxyl group is from 1/99 to 99/1, preferably from 10/90 to 90/10, more preferably from 20/80 to 60/40. A mixed solvent in which the solvent not containing a hydroxyl group is contained in a ratio of 50 mass % or more is particularly preferred in view of coating uniformity.

The solvent preferably includes propylene glycol monomethyl ether acetate, and is preferably a solvent composed of propylene glycol monomethyl ether acetate alone or a mixed solvent of two or more kinds of solvents including propylene glycol monomethyl ether acetate.

[4] Hydrophobic Resin (D)

The actinic ray-sensitive or radiation-sensitive resin composition (I) relating to the invention may contain a hydrophobic resin (hereafter referred to as "a hydrophobic resin (D)" or simply "a resin (D)" in some cases), particularly when the composition id applied to immersion exposure. Additionally, it is preferred that the hydrophobic resin (D) be different from the resin (A).

Under such circumstances, the hydrophobic resin (D) is unevenly distributed to the film surface layer and when the immersion medium is water, the static/dynamic contact angle of the resist film surface for water is improved to result in enhancement of followability of immersion liquid.

It is preferred that the hydrophobic resin (D) be designed to be unevenly distributed to the interface as mentioned above, but in contrast to a surfactant, the resin (D) is not necessarily required to have a hydrophilic group in the molecule, and may not contribute to uniform mixing of polar/nonpolar substances.

From the viewpoint of unevenly distribution to the film surface layer, it is preferable that the hydrophobic resin (D) contains one or more kind of any of "fluorine atom", "silicon atom" and "$CH_3$ partial structure contained in the side chain portion of the resin", and it is more preferable that the resin (D) contains two or more kinds thereof.

When the hydrophobic resin (D) contains a fluorine atom and/or a silicon atom, the fluorine atom and/or silicon atom may be contained in the main chain of the resin or may be contained in side chain of the resin.

In the case where the hydrophobic resin (D) contains a fluorine atom, the resin preferably contains a fluorine atom-containing alkyl group, a fluorine atom-containing cycloalkyl group or a fluorine atom-containing aryl group, as a fluorine atom-containing partial structure.

The fluorine atom-containing alkyl group (preferably having a carbon number of 1 to 10, more preferably a carbon number of 1 to 4) is a linear or branched alkyl group with at least one hydrogen atom being substituted for by a fluorine atom and may further have a substituent other than fluorine atom.

The fluorine atom-containing cycloalkyl group is a monocyclic or polycyclic cycloalkyl group with at least one hydrogen atom being substituted for by a fluorine atom and may further have a substituent other than fluorine atom.

The fluorine atom-containing aryl group is an aryl group such as phenyl group or naphthyl group with at least one hydrogen atom being substituted for by a fluorine atom and may further have a substituent other than fluorine atom.

As the fluorine atom-containing alkyl group, fluorine atom-containing cycloalkyl group and fluorine atom-containing aryl group, the groups represented by the following formulae (F2) to (F4) are preferred, but the present invention is not limited thereto.

(F2)

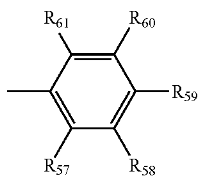

(F3)

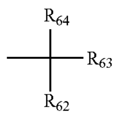

(F4)

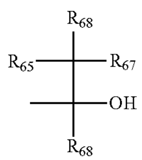

In formulae (F2) to (F4), each of $R_{57}$ to $R_{68}$ independently represents a hydrogen atom, a fluorine atom or an alkyl group (linear or branched), provided that at least one of $R_{57}$ to $R_{61}$, at least one of $R_{62}$ to $R_{64}$, and at least one of $R_{65}$ to $R_{68}$ each independently represents a fluorine atom or an alkyl group (preferably having a carbon number of 1 to 4) with at least one hydrogen atom being substituted for by a fluorine atom.

It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being substituted for by a fluorine atom, more preferably a perfluoroalkyl group having a carbon number of 1 to 4. $R_{62}$ and $R_{63}$ may combine with each other to form a ring.

Specific examples of the group represented by formula (F2) include a p-fluorophenyl group, a pentafluorophenyl group, and a 3,5-di(trifluoromethyl)phenyl group.

Specific examples of the group represented by formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-tert-butyl group, a perfluoroisopentyl group, a perfluorooctyl group, a perfluoro(trimethyl)hexyl group, a 2,2,3,3-tetrafluorocyclobutyl group, and a perfluorocyclohexyl group. Among these, a hexafluoroisopropyl group, a heptafluoroisopropyl group, a hexafluoro(2-methyl) isopropyl group, an octafluoroisobutyl group, a nonafluoro-tert-butyl group and a perfluoroisopentyl group are preferred, and a hexafluoroisopropyl group and a heptafluoroisopropyl group are more preferred.

Specific examples of the group represented by formula (F4) include —$C(CF_3)_2OH$, —$C(C_2F_5)_2OH$, —$C(CF_3)(CH_3)OH$ and —$CH(CF_3)OH$, with —$C(CF_3)_2OH$ being preferred.

The fluorine atom-containing partial structure may be bonded directly to the main chain or may be bonded to the main chain through a group selected from the group consisting of an alkylene group, a phenylene group, an ether bond, a thioether bond, a carbonyl group, an ester bond, an amide bond, a urethane bond and a ureylene bond, or a group formed by combining two or more of these members.

Specific examples of the repeating unit having a fluorine atom are illustrated below, but the present invention is not limited thereto.

In specific examples, $X_1$ represents a hydrogen atom, —$CH_3$, —F or —$CF_3$. $X_2$ represents —F or —$CF_3$.

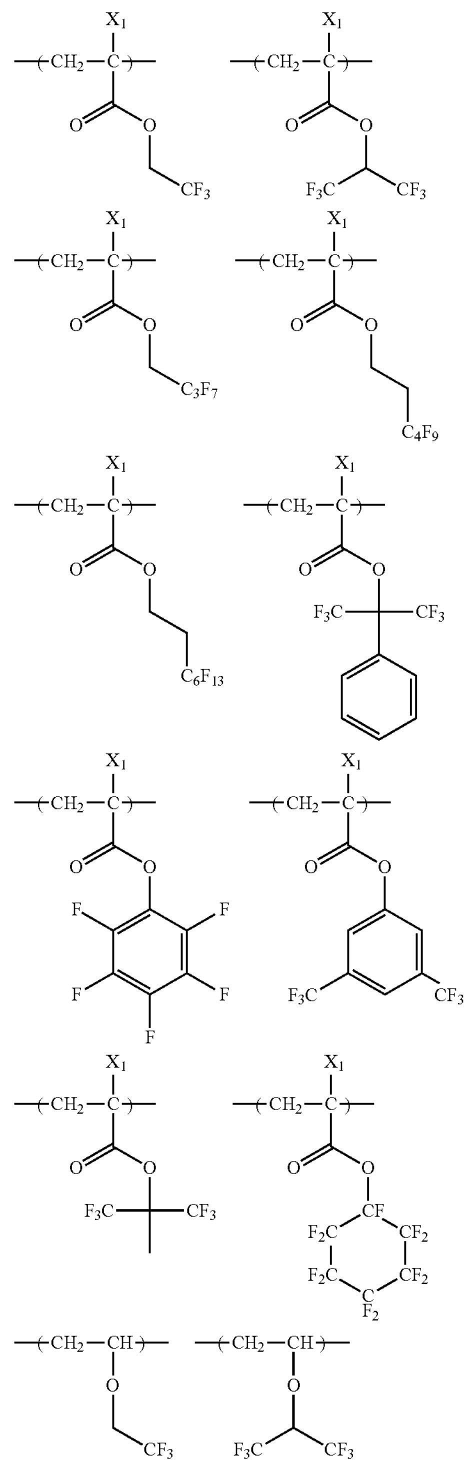

-continued

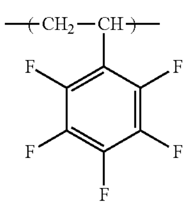
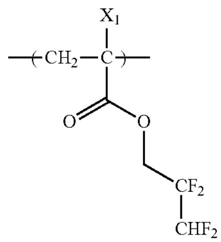
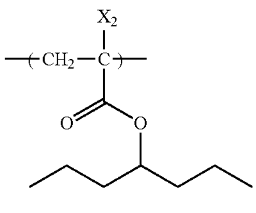
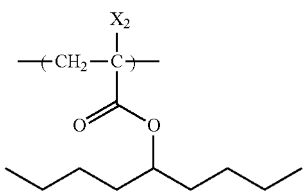
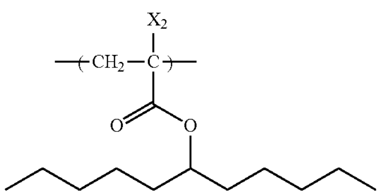
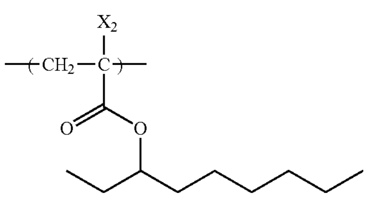
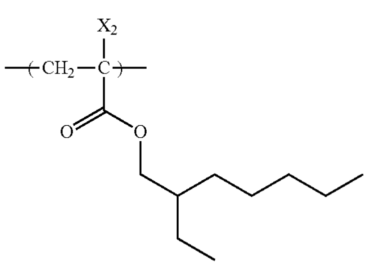
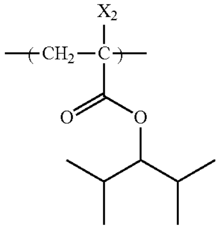
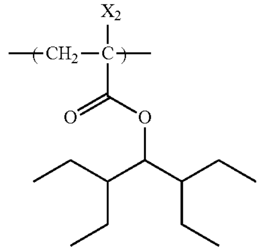

-continued

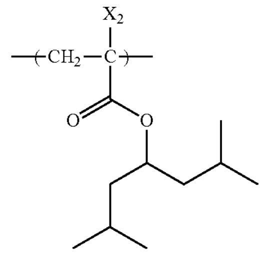
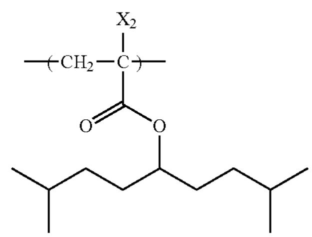
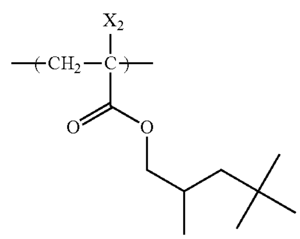
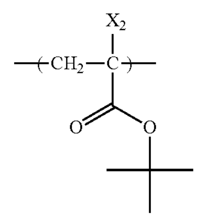
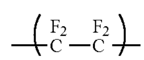
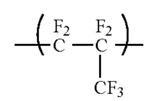
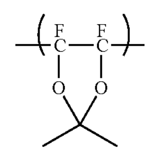
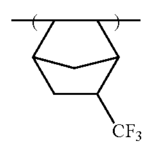
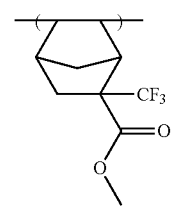
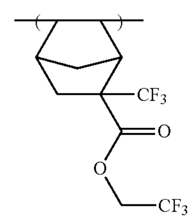
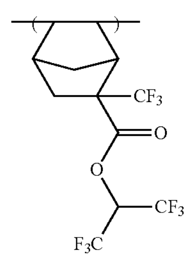

The hydrophobic resin (D) may contain a silicon atom. The resin preferably has an alkylsilyl structure (preferably a trialkylsilyl group) or a cyclic siloxane structure, as a silicon atom-containing partial structure.

Specific examples of the alkylsilyl structure and cyclic siloxane structure include the groups represented by the following formulae (CS-1) to (CS-3):

(CS-1)

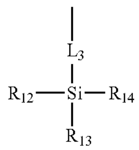

(CS-2)

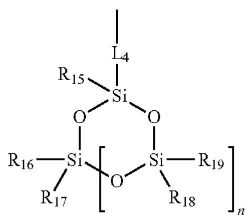

(CS-3)

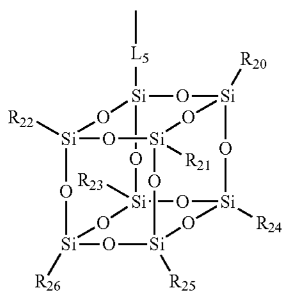

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a sole member or a combination of two or more members (preferably having a total carbon number of 12 or less), selected from the group consisting of an alkylene group, a phenylene group, an ether bond, a thioether bond, a carbonyl group, an ester bond, an amide bond, a urethane bond and a urea bond.

n represents an integer of 1 to 5. n is preferably an integer of 2 to 4.

Specific examples of the repeating unit having a group represented by formulae (CS-1) to (CS-3) are illustrated below, but the present invention is not limited thereto. In specific examples, $X_1$ represents a hydrogen atom, —$CH_3$, —F or —$CF_3$.

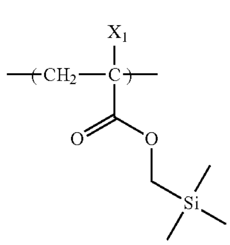

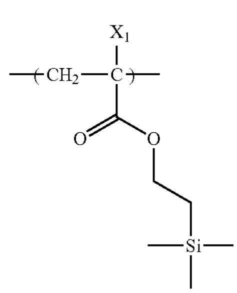

-continued

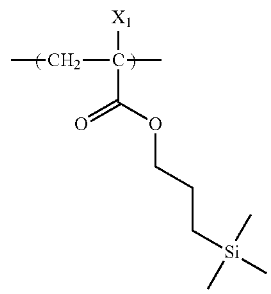

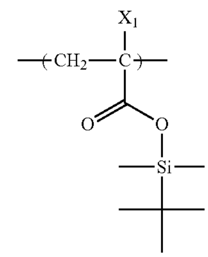

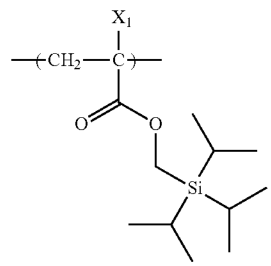

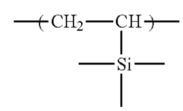

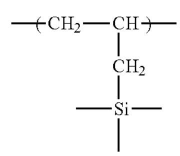

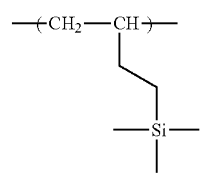

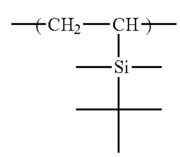

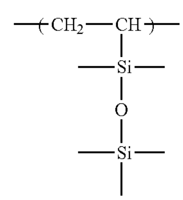

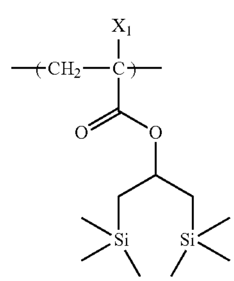

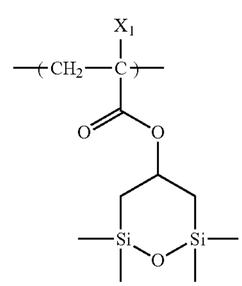

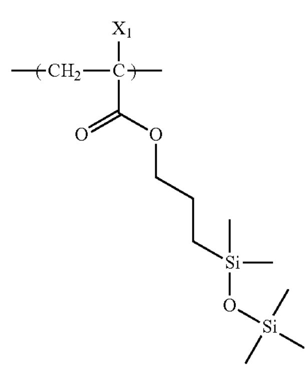

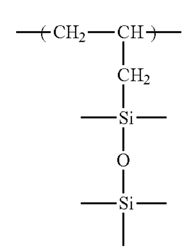

-continued

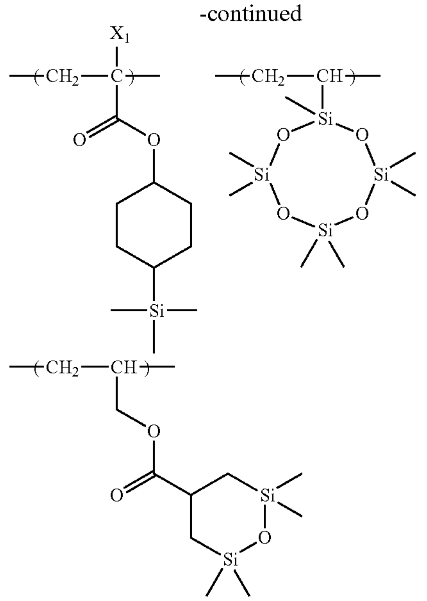

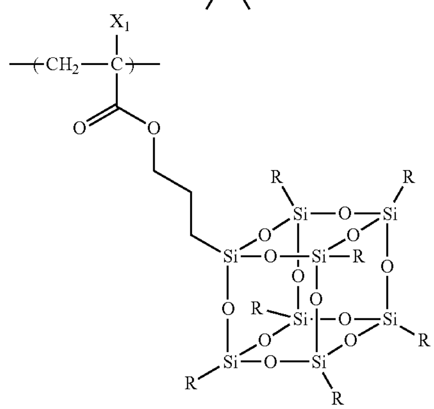

R = $CH_3$, $C_2H_5$, $C_3H_7$, $C_4H_9$

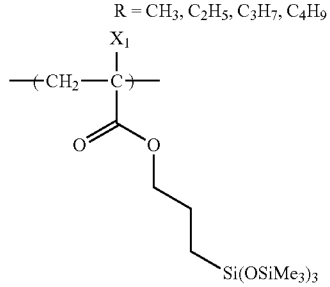

As mentioned above, it is also preferable that the hydrophobic resin (D) has $CH_3$ partial structure in the side chain portion thereof.

Herein, the $CH_3$ partial structure which the resin (D) has in the side chain portion thereof (sometimes referred to as "side chain $CH_3$ partial structures") are intended to include $CH_3$ partial structure which an ethyl group, a propyl group and the like have, respectively.

On the other hand, a methyl group bonded directly to the main chain of the resin (D) (e.g. α-methyl group in the repeating unit having a methacrylic acid structure) makes only a small contribution to surface localization of the resin (D) owing to influence of the main chain, and therefore it is not included in the $CH_3$ partial structure in the present invention.

More specifically, when the resin (D) contains a repeating unit derived from a monomer having a polymerizable moiety with a carbon-carbon double bond and represented e.g. by the following formula (M), and what's more, each of $R_{11}$ to $R_{14}$ in formula (M) is $CH_3$ itself, such $CH_3$ is not included in the $CH_3$ partial structure contained in the side chain in the present invention.

On the other hand, a $CH_3$ partial structure linked to the C—C main chain through some atom or atoms fits into the category of the $CH_3$ partial structure in the invention. When $R_{11}$ in formula (M) is e.g. an ethyl group ($CH_3CH_2$), it is reckoned that the repeating unit has "one" $CH_3$ partial structure in the present invention.

(M)

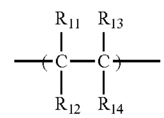

In formula (M), each of $R_{11}$ to $R_{14}$ independently represents a side chain portion.

Examples of the side chain portion of $R_{11}$ to $R_{14}$ include a hydrogen atom and a univalent organic group.

Examples of the univalent organic group as for $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group and an arylaminocarbonyl group. Each of these groups may further have a substituent.

It is preferable that the hydrophobic resin (D) is a resin containing a repeating unit having the $CH_3$ partial structure in a side chain portion thereof. And it is more preferable that such a repeating unit includes at least one repeating unit (x) chosen from a repeating unit represented by the following formula (II) or a repeating unit represented by the following formula (III).

The repeating unit represented by formula (II) is illustrated below in detail.

(II)

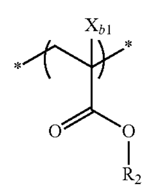

In formula (II), $X_{b1}$ represents a hydrogen atom, an alkyl group, a cyano group or a halogen atom, and $R_2$ represents an organic group which has one or more $CH_3$ partial structure and is stable to an acid. To be more specific herein, the organic group stable to an acid is preferably an organic group having none of "the group capable of decomposing by the action of an acid to produce a polar group" as recited in the illustration of the resin (A).

The alkyl group of $X_{b1}$ is preferably an alkyl group having a carbon number of 1 to 4, and examples include a methyl group, an ethyl group, a propyl group, a hydroxymethyl group and a trifluoromethyl group. Of these groups, a methyl group is preferred.

$X_{b1}$ is preferably a hydrogen atom or a methyl group.

Examples of $R_2$ include an alkyl group, a cycloalkyl group, an alkenyl group, a cycloalkenyl group, an aryl group and an aralkyl group, each of which has one or more $CH_3$ partial structure. Each of the cycloalkyl group, the alkenyl group, the cycloalkenyl group, the aryl group and the aralkyl group may further have an alkyl group as a substituent.

$R_2$ is preferably an alkyl group or a cycloalkyl group which has an alkyl substituent, provided each group has one or more $CH_3$ partial structure.

The number of $CH_3$ partial structure contained in the organic group which has one or more $CH_3$ partial structure and is stable to an acid as $R_2$, is preferably from 2 to 10, more preferably from 2 to 8.

The alkyl group having one or more $CH_3$ partial structure in $R_2$ is preferably a branched alkyl group having a carbon number of 3 to 20. Suitable examples of such an alkyl group include an isopropyl group, an isobutyl group, a 3-pentyl group, a 2-methyl-3-butyl group, a 3-hexyl group, 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group and a 2,3,5,7-tetramethyl-4-heptyl group. Of these groups, an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group and a 2,3,5,7-tetramethyl-4-heptyl group are preferred.

The cycloalkyl group having one or more $CH_3$ partial structure in $R_2$ may be monocyclic or polycyclic. Examples of such a cycloalkyl group include a group containing a carbon number of 5 or more and having a moncyclic, bicyclic, tricyclic or tetracyclic structure. The carbon number thereof is preferably from 6 to 30, more preferably from 7 to 25. Suitable examples of the cycloalkyl group include an adamantyl group, a noradamantyl group, a decaline residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Of these groups, an adamantyl group, a norbornyl group, a cyclohexyl group, a cyclopentyl group, a tetracyclododecanyl group and tricyclodecanyl group are preferred. Among these groups, a norbornyl group, a cyclopentyl group and a cyclohexyl group are preferred.

The alkenyl group having one or more $CH_3$ partial structure in $R_2$ is preferably a linear or branched alkenyl group having a carbon number of 1 to 20, and it is more preferably a branched alkenyl group.

The aryl group having one or more $CH_3$ partial structure in $R_2$ is preferably an aryl group having a carbon number of 6 to 20, such as a phenyl group or a naphthyl group, and it is more preferably a phenyl group.

The aralkyl group having one or more $CH_3$ partial structure in $R_2$ is preferably an aralkyl group having a carbon number of 7 to 12, such as a benzyl group, a phenetyl group or a naphthylmethyl group.

Specific examples of the hydrocarbon group having two or more $CH_3$ partial structures in $R_2$ include an isopropyl group, an isobutyl group, a t-butyl group, a 3-pentyl group, a 2-methyl-3-butyl group, a 3-hexyl group, a 2,3-dimethyl-2-butyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, 2,3,5,7-tetramethyl-4-heptyl group, a 3,5-dimethylcyclohexyl group, a 4-isopropylcyclohexyl group, a 4-t-butylcyclohexyl group and an isobornyl group. Preferred ones of these groups include an isobutyl group, a t-butyl group, a 2-methyl-3-butyl group, a 2,3-dimethyl-2-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, a 3,5-dimethylcyclohexyl group, a 3,5-di-tert-butylcyclohexyl group, a 4-isopropylcyclohexyl group, a 4-t-butylcyclohexyl group and an isobornyl group.

Suitable examples of the repeating unit represented by formula (II) are illustrated below. Incidentally, these examples should not be construed as limiting the scope of the present invention.

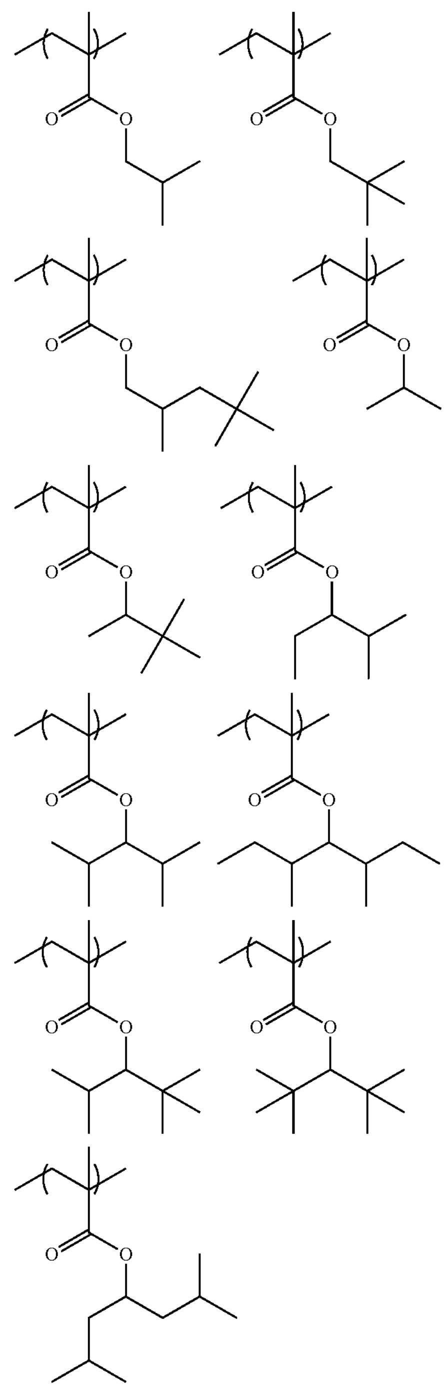

-continued

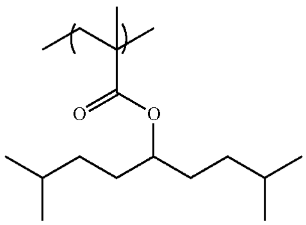

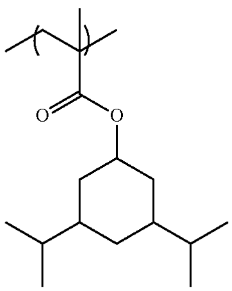

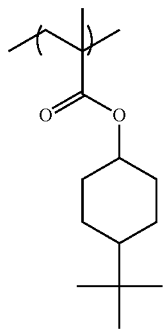

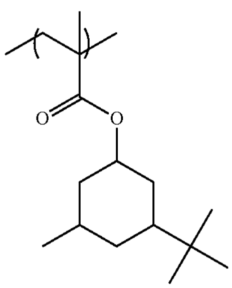

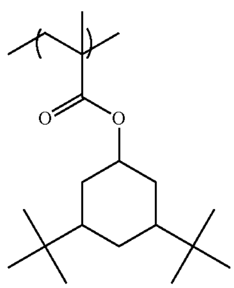

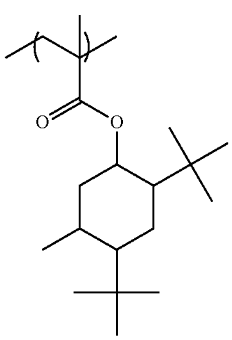

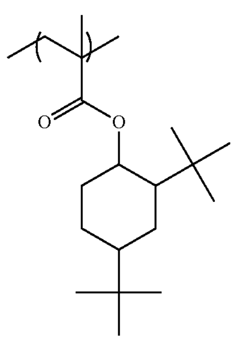

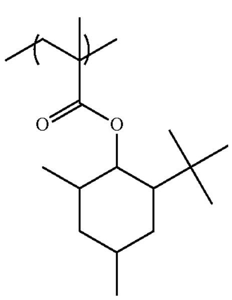

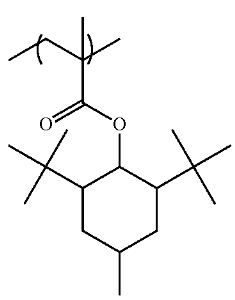

-continued

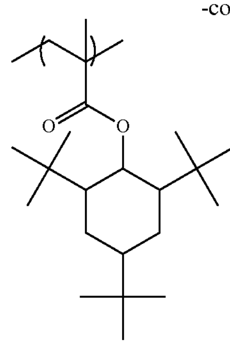

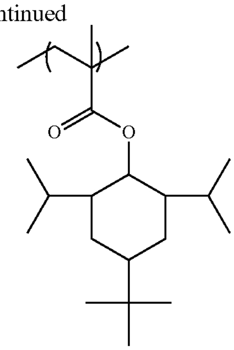

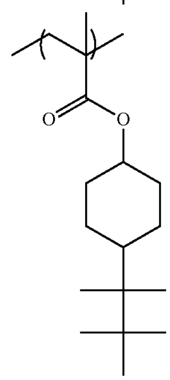

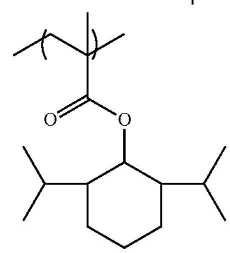

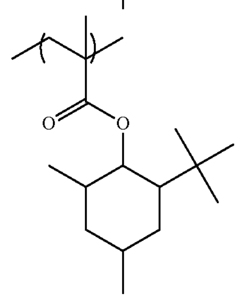

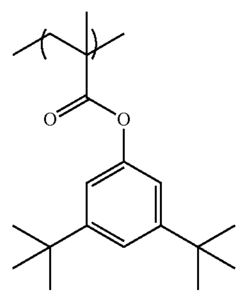

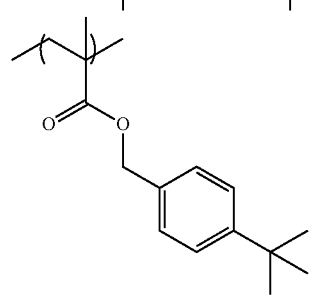

The repeating unit represented by formula (II) is preferably a repeating unit which is stable to an acid (acid-indecomposable), and more specifically, it is a repeating unit which is free of a group capable of decomposing by the action of an acid to produce a polar group.

The repeating unit represented by the following formula (III) is illustrated below in detail.

(III)

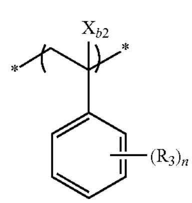

In formula (III), $X_{b2}$ represents a hydrogen atom, an alkyl group, a cyano group or a halogen atom, $R_3$ represents an organic group which has one or more $CH_3$ partial structure and is stable to an acid, and n represents an integer of 1 to 5.

The alkyl group of $X_{b2}$ is preferably an alkyl group having a carbon number of 1 to 4, and examples thereof include a methyl group, an ethyl group, a propyl group, a hydroxymethyl group and a trifluoromethyl group, and preferably a hydrogen atom.

$X_{b2}$ is preferably a hydrogen atom.

$R_3$ is an organic group stable to an acid. To be more specific, $R_3$ is preferably an organic group having none of the group capable of decomposing by the action of an acid to produce a polar group as recited in the illustration of the resin (A).

An example of $R_3$, an alkyl group having one or more $CH_3$ partial structure can be exemplified. The organic group which has one or more $CH_3$ partial structure and is stable to an acid as $R_3$ preferably has $CH_3$ partial structure of 1 to 10, more preferably has $CH_3$ partial structure of 1 to 8, and further preferably has $CH_3$ partial structure of 1 to 4.

The alkyl group having one or more $CH_3$ partial structure in $R_3$ is preferably a branched alkyl group having a carbon number of 3 to 20. Suitable examples of such an alkyl group include an isopropyl group, an isobutyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group and 2,3,5,7-tetramethyl-4-heptyl group. Preferred ones of these groups include an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group and a 2,3,5,7-tetramethyl-4-heptyl group.

Examples of the alkyl group having two or more $CH_3$ partial structures in $R_3$ include an isopropyl group, an isobutyl group, a t-butyl group, a 3-pentyl group, a 2,3-dimethylbutyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group and 2,3,5,7-tetramethyl-4-heptyl group. Of these groups, preferred ones are those having a carbon number of 5 to 20, and examples include an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group and 2,6-dimethylheptyl group.

n represents an integer of 1 to 5, preferably 1 to 3, more preferably 1 or 2.

Suitable examples of the repeating unit represented by formula (III) are illustrated below. Incidentally, these examples should not be construed as limiting the scope of the present invention.

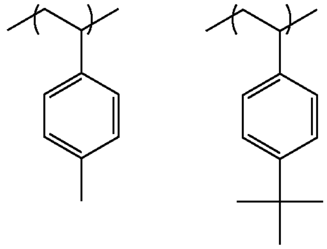

-continued

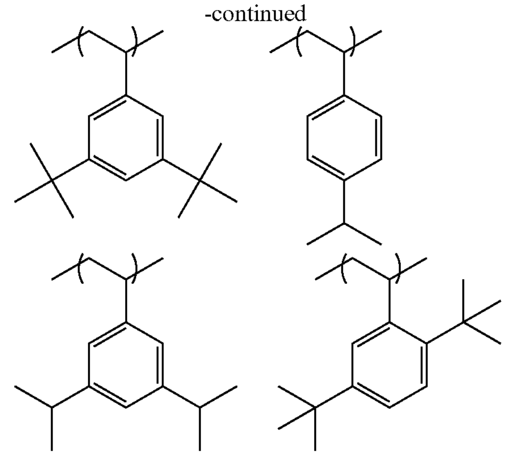

The repeating unit represented by formula (III) is preferably a repeating unit which is stable to an acid (acid-indecomposable), and more specifically, it is a repeating unit which is free of a group capable of decomposing by the action of an acid to produce a polar group.

When the resin (D) contains a $CH_3$ partial structure in the side chain portion thereof and moreover has no fluorine atom and no silicon atom in particular, the content of at least one repeating unit (x) among the repeating unit represented by formula (II) and the repeating unit represented by formula (III) is preferably 90 mol % or more, more preferably 95 mol % or more, based on all repeating units of the resin (D). And such content is generally 100 mol % or less based on all repeating units of the resin (D).

When the resin (D) contains at least one repeating unit (x) among the repeating unit represented by formula (II) and the repeating unit represented by formula (III) in a proportion of 90 mol % or more with respect to all repeating units of the resin (D), surface free energy of the resin (D) increases. Thus the resin (D) comes to easily localize to the resist film surface, and the static/dynamic contact angle of the resist film with respect to water is improved with certainty to result in enhancement of followability of immersion liquid.

In addition, the hydrophobic resin (D) may have at least one group selected from the class consisting of the following (x) to (z) in the case of containing (i) a fluorine atom and/or a silicon atom as well as in the case of containing (ii) $CH_3$ partial structure in the side chain portion:

(x) an acid group, (y) a lactone structure-containing, an acid anhydride group or an acid imide group, (z) a group capable of decomposing by the action of an acid.

Examples of the acid group (x) include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group.

Preferred acid groups include a fluorinated alcohol group (preferably hexafluoroisopropanol), a sulfonimide group, and a bis(alkylcarbonyl)methylene group.

The repeating unit having (x) an acid group includes, for example, a repeating unit where the acid group is directly bonded to the main chain of the resin, such as repeating unit by an acrylic acid or a methacrylic acid, and a repeating unit where the acid group is bonded to the main chain of the resin through a linking group, and the acid group may be also introduced into the terminal of the polymer chain by using an acid group-containing polymerization initiator or chain transfer agent at the polymerization. All of these cases are preferred. The repeating unit having (x) an acid group may have at least either a fluorine atom or a silicon atom.

The content of the repeating unit having (x) an acid group is preferably from 1 to 50 mol %, more preferably from 3 to 35 mol %, still more preferably from 5 to 20 mol %, based on all repeating units in the hydrophobic resin (D).

Specific examples of the repeating unit having (x) an acid group are illustrated below, but the present invention is not limited thereto. In the formulae, Rx represents a hydrogen atom, $CH_3$, $CF_3$ or $CH_2OH$.

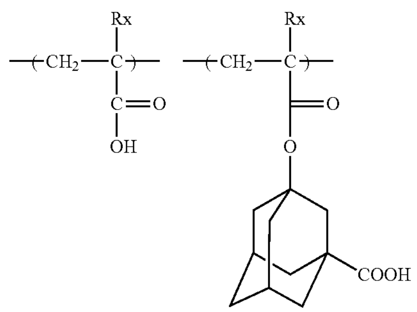

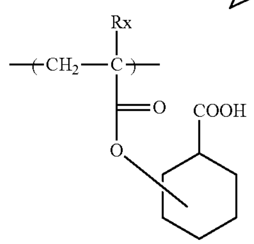

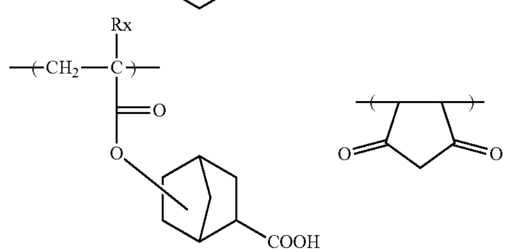

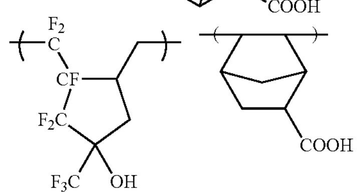

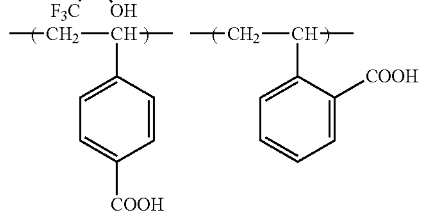

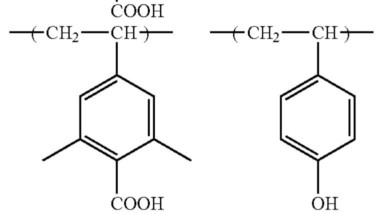

-continued

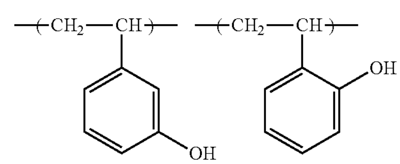

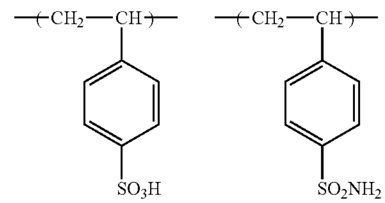

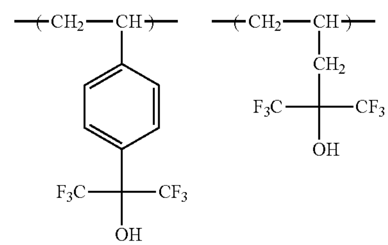

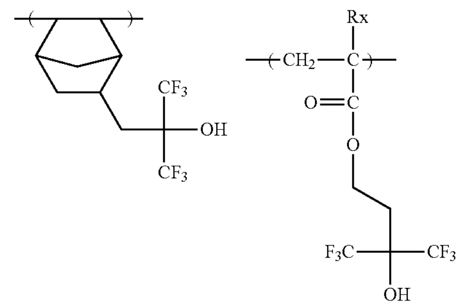

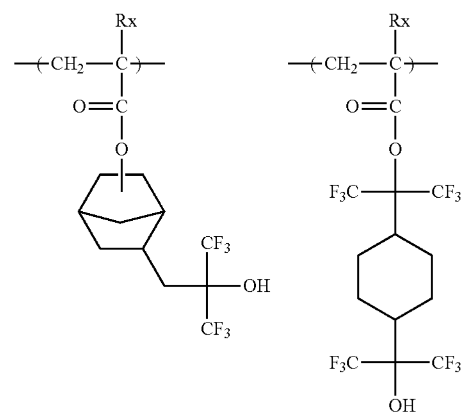

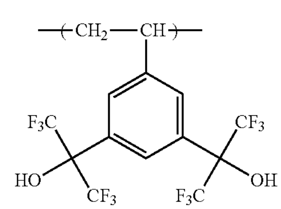

-continued

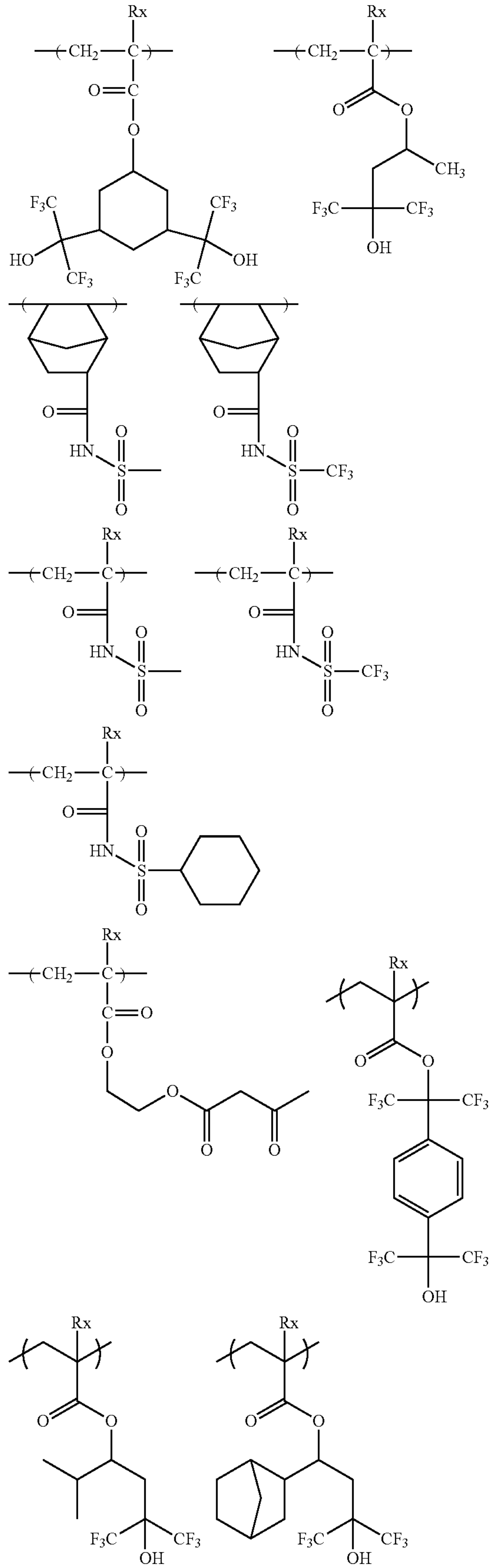

The (y) lactone structure-containing group, acid anhydride group or acid imide group is preferably a lactone structure-containing group.

The repeating unit containing such a group is, for example, a repeating unit where the group is directly bonded to the main chain of the resin, such as repeating unit by an acrylic acid ester or a methacrylic acid ester. This repeating unit may be a repeating unit where the group is bonded to the main chain of the resin through a linking group. Alternatively, in this repeating unit, the group may be introduced into the terminal of the resin by using a polymerization initiator or chain transfer agent containing the group at the polymerization.

Examples of the repeating unit having a lactone structure-containing group are the same as those of the repeating unit having a lactone structure described above in the paragraph of the acid-decomposable resin (A).

The content of the repeating unit having a lactone structure-containing group, an acid anhydride group or an acid imide group is preferably from 1 to 100 mol %, more preferably from 3 to 98 mol %, still more preferably from 5 to 95 mol %, based on all repeating units in the hydrophobic resin (D).

Examples of the repeating unit having (z) a group capable of decomposing by the action of an acid, contained in the hydrophobic resin (D), are the same as those of the repeating unit having an acid-decomposable group described for the resin (A). The repeating unit having (z) a group capable of decomposing by the action of an acid may contain at least either a fluorine atom or a silicon atom. In the hydrophobic resin (D), the content of the repeating unit having (z) a group capable of decomposing by the action of an acid is preferably from 1 to 80 mol %, more preferably from 10 to 80 mol %, still more preferably from 20 to 60 mol %, based on all repeating units in the resin (D).

The hydrophobic resin (D) may further contain a repeating unit represented by the following formula (III):

(III)

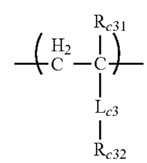

In formula (III), $R_{c31}$ represents a hydrogen atom, an alkyl group (which may be substituted with a fluorine atom or the like), a cyano group or a —$CH_2$—O—$R_{ac2}$ group, wherein $R_{ac2}$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. These groups may be substituted with a fluorine atom or a silicon atom-containing group.

$L_{c3}$ represents a single bond or a divalent linking group.

In formula (III), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably an aryl group having a carbon number of 6 to 20, more preferably a phenyl group or a naphthyl group, and these groups may have a substituent.

$R_{c32}$ is preferably an unsubstituted alkyl group or an alkyl group substituted with a fluorine atom.

The divalent linking group of $L_{c3}$ is preferably an alkylene group (preferably having a carbon number of 1 to 5), an ether bond, a phenylene group or an ester bond (a group represented by —COO—).

The content of the repeating unit represented by formula (III) is preferably from 1 to 100 mol %, more preferably from 10 to 90 mol %, still more preferably from 30 to 70 mol %, based on all repeating units in the hydrophobic resin.

It is also preferred that the hydrophobic resin (D) further contains a repeating unit represented by the following formula (CII-AB):

(CII-AB)

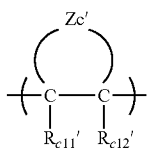

In formula (CII-AB), each of $R_{c11}$' and $R_{c12}$' independently represents a hydrogen atom, a cyano group, a halogen atom, or an alkyl group.

$Z_c$' represents an atomic group for forming an alicyclic structure containing two carbon atoms (C—C) to which $Z_c$' is bonded.

The content of the repeating unit represented by formula (CII-AB) is preferably from 1 to 100 mol %, more preferably from 10 to 90 mol %, still more preferably from 30 to 70 mol %, based on all repeating units in the hydrophobic resin.

Specific examples of the repeating units represented by formulae (III) and (CII-AB) are illustrated below, but the present invention is not limited thereto. In the formulae, Ra represents H, $CH_3$, $CH_2OH$, $CF_3$ or CN.

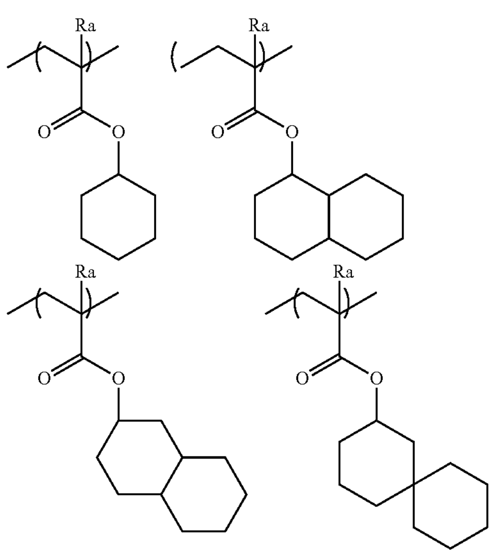

-continued

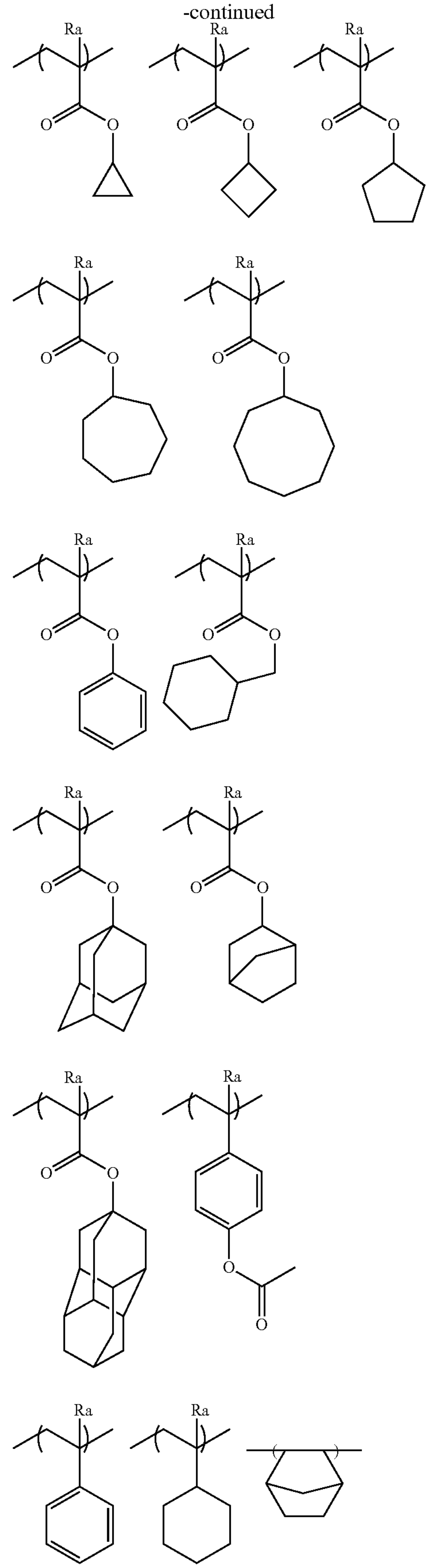

-continued

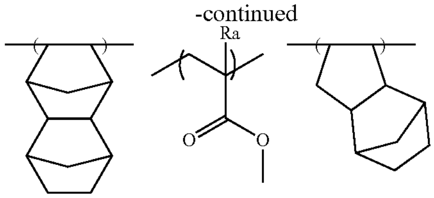

In the case where the hydrophobic resin (D) contains a fluorine atom, the fluorine atom content is preferably from 5 to 80 mass %, more preferably from 10 to 80 mass %, based on the weight average molecular weight of the hydrophobic resin (D). Also, the fluorine atom-containing repeating unit preferably accounts for 10 to 100 mol %, more preferably from 30 to 100 mol %, based on all repeating units contained in the hydrophobic resin (D).

In the case where the hydrophobic resin (D) contains a silicon atom, the silicon atom content is preferably from 2 to 50 mass %, more preferably from 2 to 30 mass %, based on the weight average molecular weight of the hydrophobic resin (D). Also, the silicon atom-containing repeating unit preferably accounts for 10 to 100 mol %, more preferably from 20 to 100 mol %, based on all repeating units contained in the hydrophobic resin (D).

On the other hand, in particular, when the resin (D) contains $CH_3$ partial structure in the side chain portion thereof, it is also preferable that the resin (D) has a form free of both fluorine atom and silicon atom in a substantial sense. To be concrete in this case, the content of the fluorine atom- or silicon atom-containing repeating unit is preferably 5 mol % or less, more preferably 3 mol % or less, further preferably 1 mol % or less, ideally 0 mol % (i.e., not containing both of fluorine atom and silicon atom), based on all repeating units in the resin (D). In addition, it is preferable that the resin (D) is composed substantially of a repeating unit whose constituent atom is only an atom selected from the group consisting of a carbon atom, an oxygen atom, a hydrogen atom, a nitrogen atom and a sulfur atom. More specifically, the repeating unit whose constituent atom is only an atom selected from the group consisting of a carbon atom, an oxygen atom, a hydrogen atom, a nitrogen atom and a sulfur atom makes up preferably 95 mol % or more, more preferably 97 mol % or more, further preferably 99 mol % or more, ideally 100 mol %, of all repeating units in the resin (D).

The weight average molecular of the hydrophobic resin (D) is, in terms of standard polystyrene, preferably from 1,000 to 100,000, more preferably from 1,000 to 50,000, still more preferably from 2,000 to 15,000.

As for the hydrophobic resin (D), one resin may be used, or a plurality of resins may be used in combination.

The content of the hydrophobic resin (D) in the composition is preferably from 0.01 to 10 mass %, more preferably from 0.05 to 8 mass %, still more preferably from 0.1 to 5 mass %, based on the total solid content of the composition of the present invention.

In the hydrophobic resin (D), similarly to the resin (A), it is of course preferred that the content of impurities such as metal is small, but the content of residual monomers or oligomer components is also preferably from 0.01 to 5 mass %, more preferably from 0.01 to 3 mass %, still more preferably from 0.05 to 1 mass %. By satisfying this range, an actinic ray-sensitive or radiation-sensitive resin composition (I) free from in-liquid extraneous substances and change with aging of sensitivity or the like can be obtained. Furthermore, in view of resolution, resist profile, side wall of resist pattern, roughness and the like, the molecular weight distribution (Mw/Mn, sometimes referred to as "polydispersity") is preferably from 1 to 5, more preferably from 1 to 3, still more preferably from 1 to 2.

As the hydrophobic resin (D), various commercial products may be used, or the resin may be synthesized by a conventional method (for example, radical polymerization). Examples of the general synthesis method include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred.

The reaction solvent, the polymerization initiator, the reaction conditions (such as temperature and concentration) and the method for purification after reaction are the same as those described for the resin (A), but in the synthesis of the hydrophobic resin (D), the concentration at the reaction is preferably from 30 to 50 mass %.

Specific examples of the hydrophobic resin (D) are illustrated below. Also, the molar ratio of repeating units (corresponding to repeating units starting from the left), weight average molecular weight and polydispersity of each resin are shown in Table later.

(HR-1)

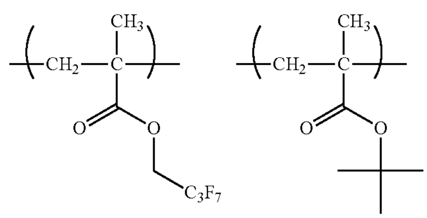

(HR-2)

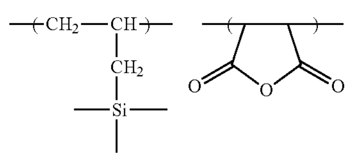

(HR-3)

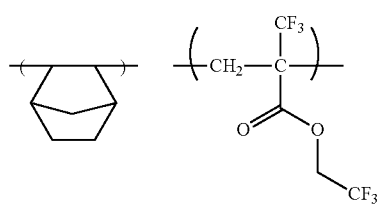

(HR-4)

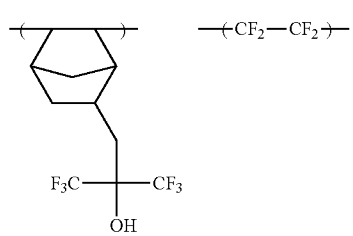

(HR-5)

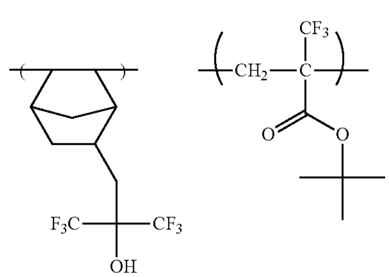

-continued
(HR-6)
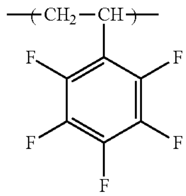
(HR-7)
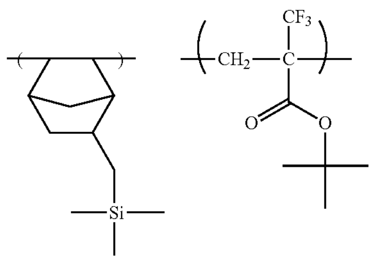
(HR-8)
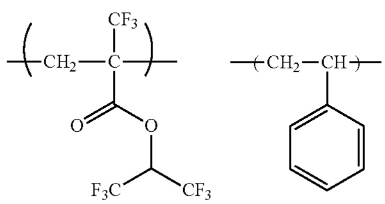
(HR-9)
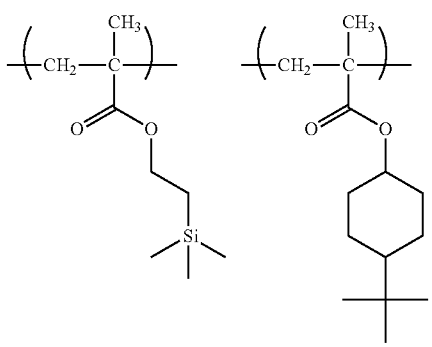
(HR-10)
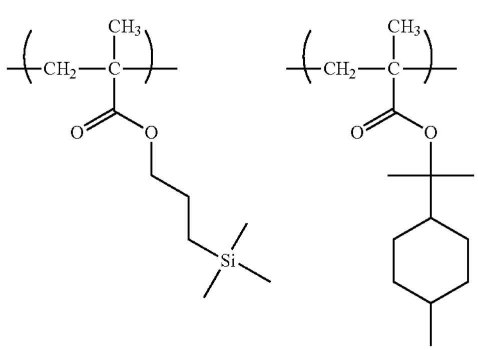
-continued
(HR-11)
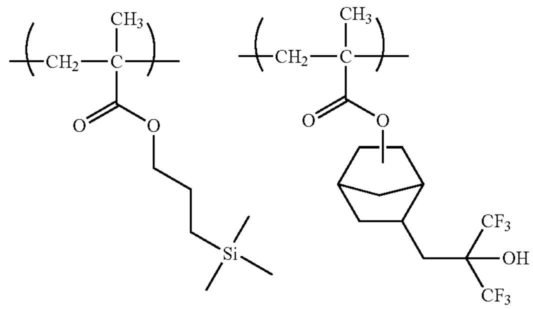
(HR-12)
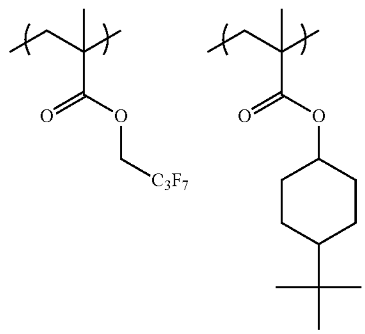
(HR-13)
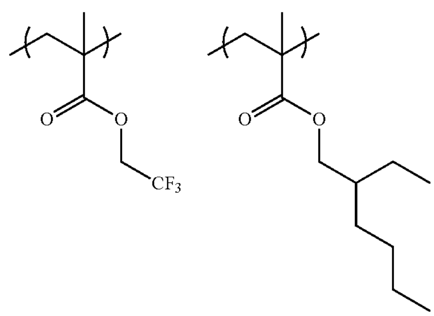
(HR-14)
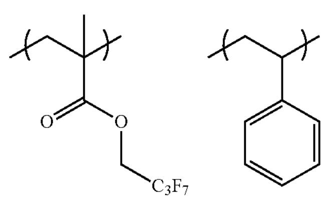
(HR-15)
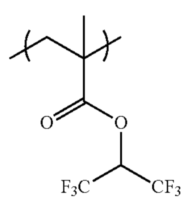
(HR-16)
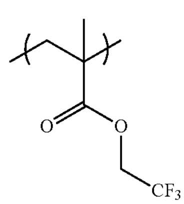

-continued
(HR-17)
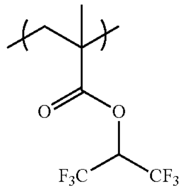
(HR-18)
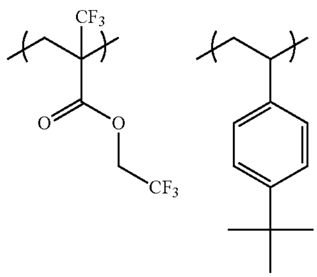
(HR-19)
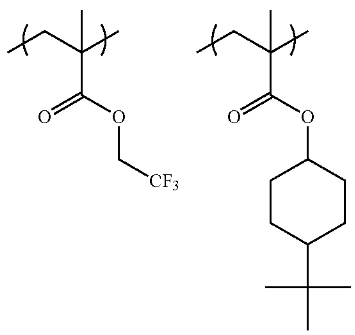
(HR-20)
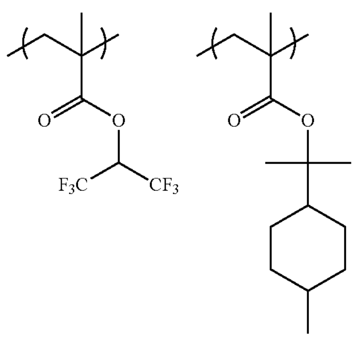
(HR-21)
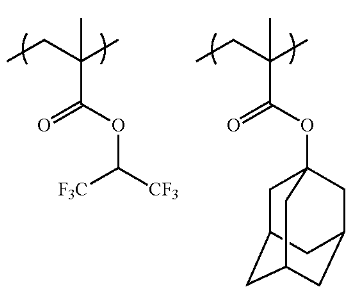
(HR-22)
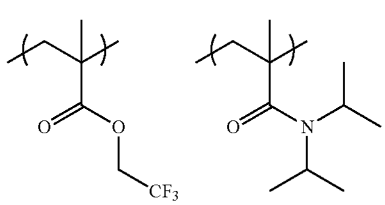
-continued
(HR-23)
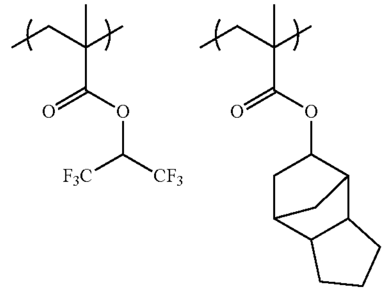
(HR-24)
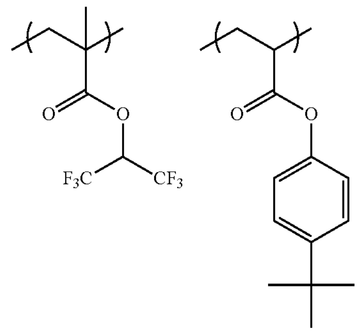
(HR-25)
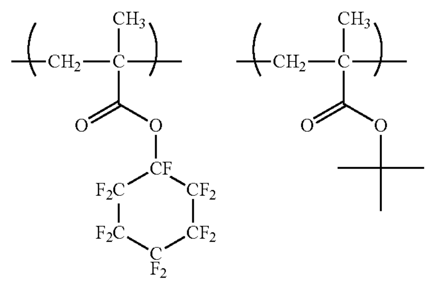
(HR-26)
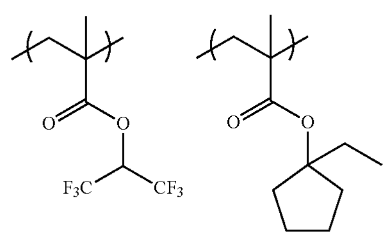
(HR-27)
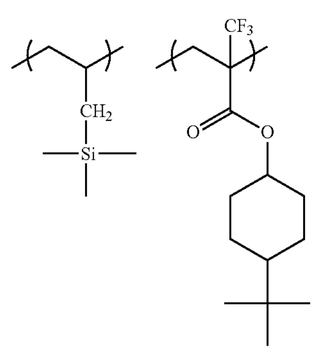

-continued
(HR-28)
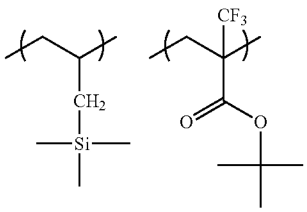
(HR-29)
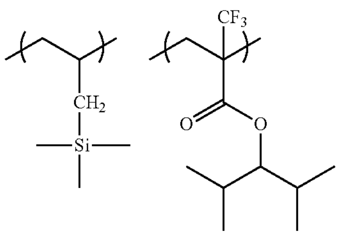
(HR-30)
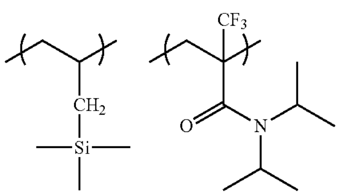
(HR-31)
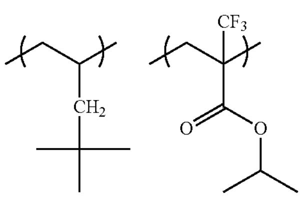
(HR-32)
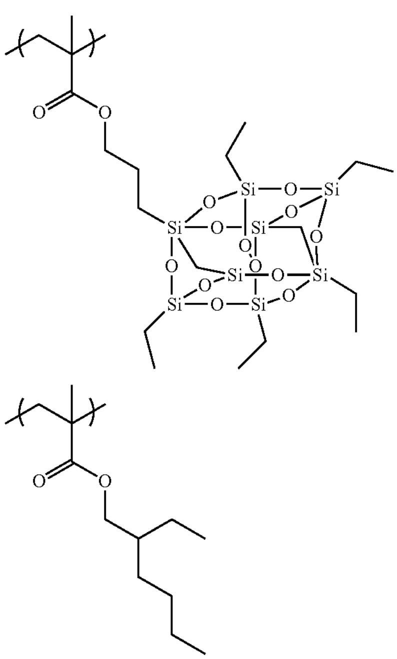
-continued
(HR-33)
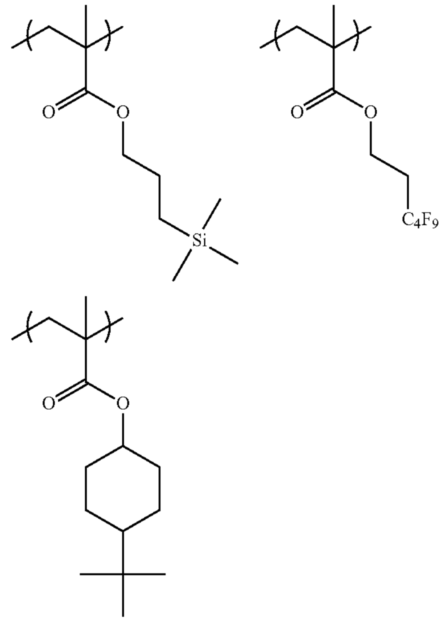
(HR-34)
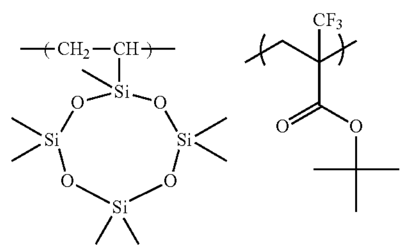
(HR-35)
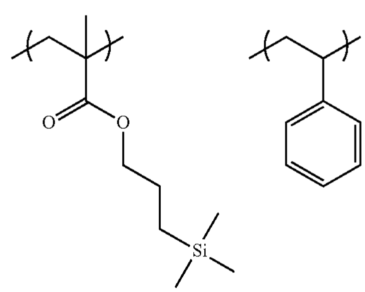
(HR-36)
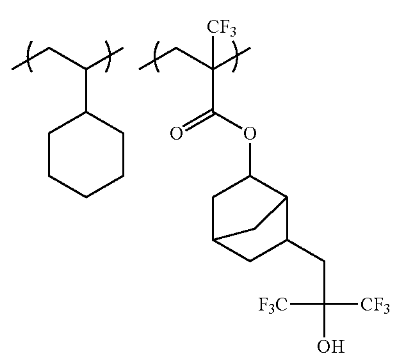

(HR-37)
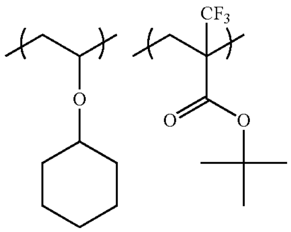
(HR-38)
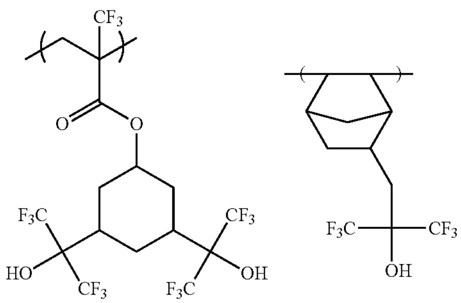
(HR-39)
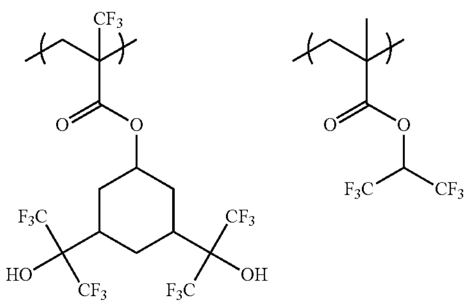
(HR-40)
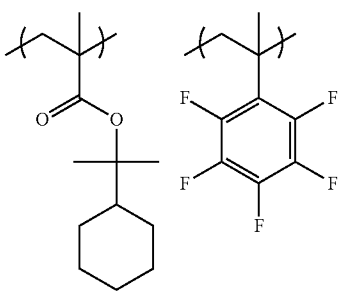
(HR-41)
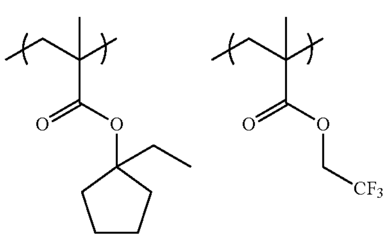
(HR-42)
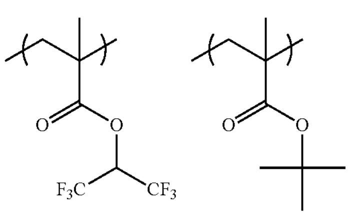
(HR-43)
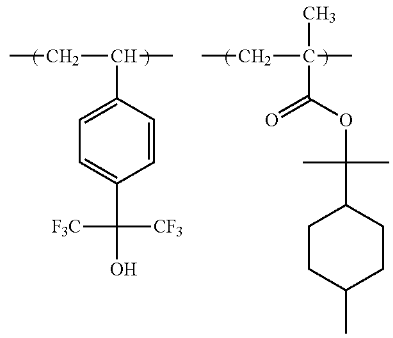
(HR-44)
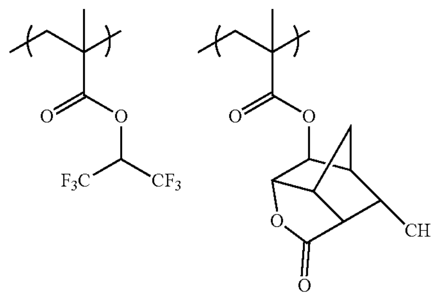
(HR-45)
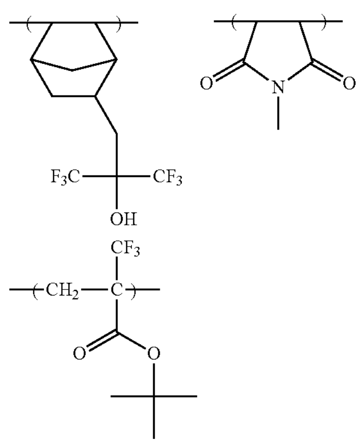
(HR-46)
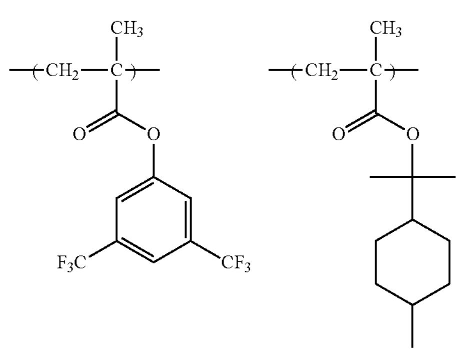

-continued
(HR-47)
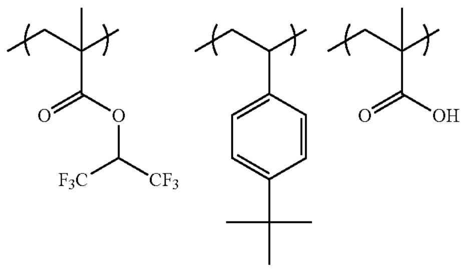
(HR-48)
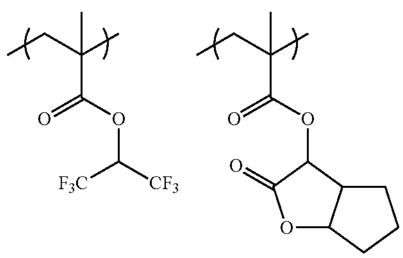
(HR-49)
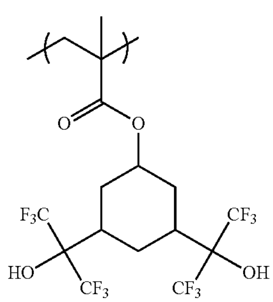
(HR-50)
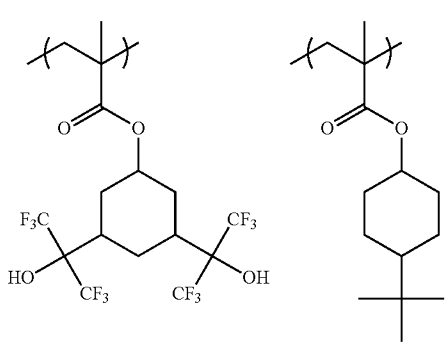
-continued
(HR-51)
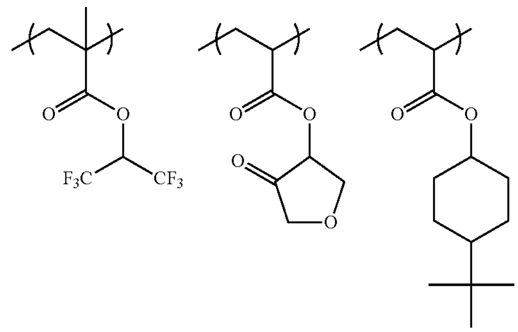
(HR-52)
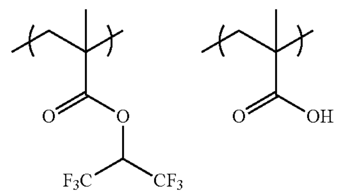
(HR-53)
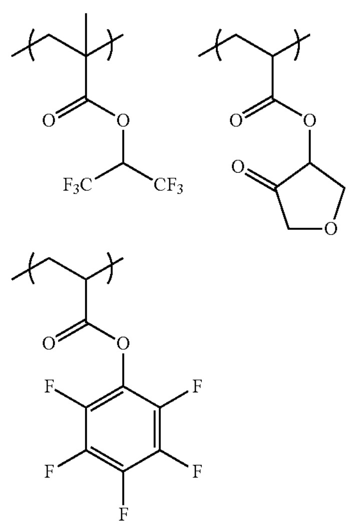
(HR-54)
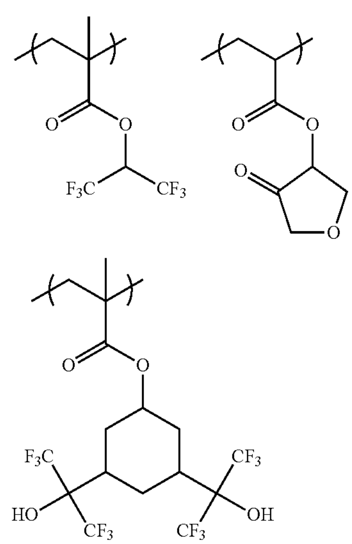

-continued
(HR-55)
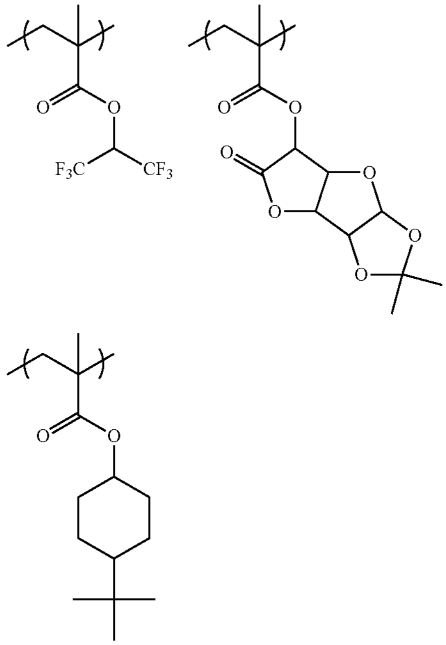
(HR-56)
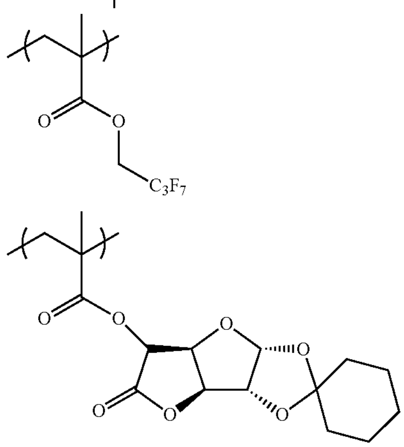
(HR-57)
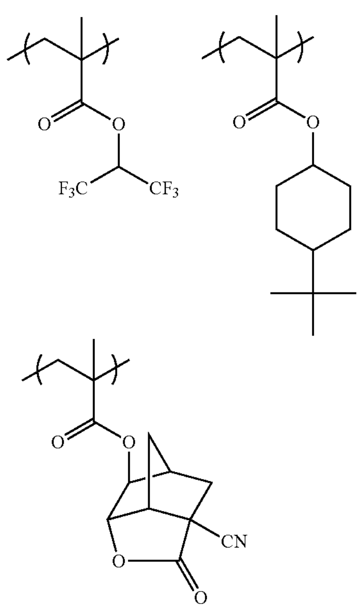
-continued
(HR-58)
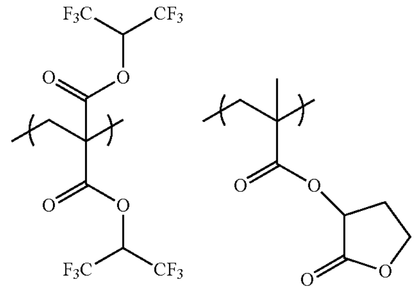
(HR-59)
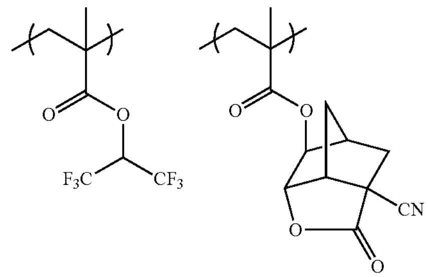
(HR-60)
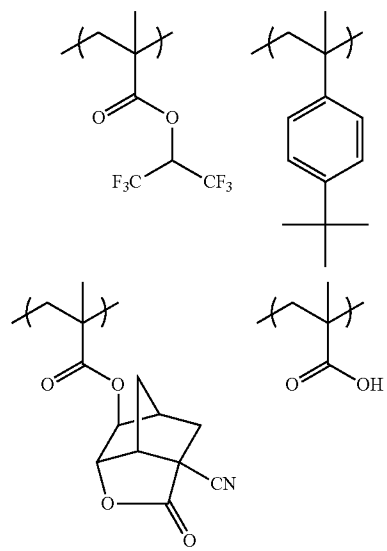
(HR-61)
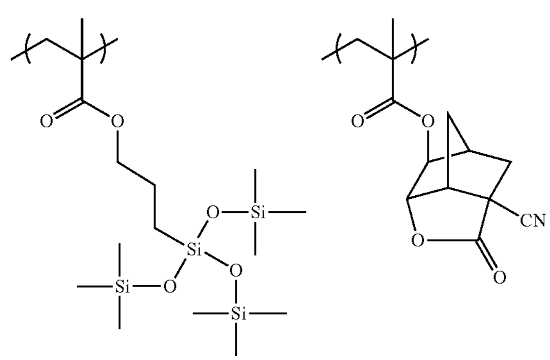

-continued
(HR-62)
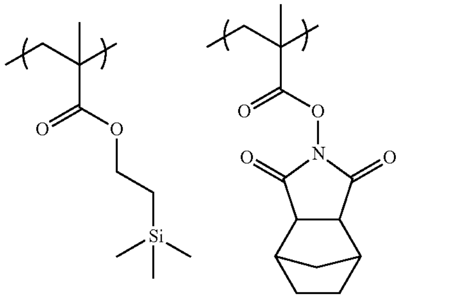
(HR-63)
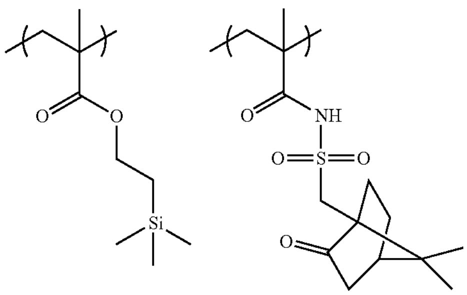
(HR-64)
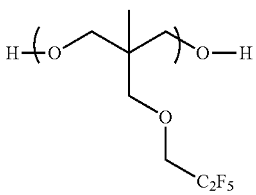
(HR-65)
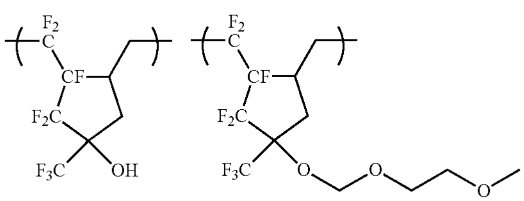
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
-continued
| Resin | Composition | Mw | Mw/Mn |
|---|---|---|---|
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |
(C-1)
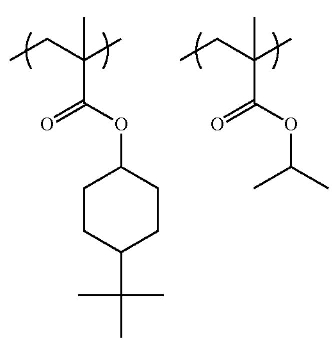

(C-2)
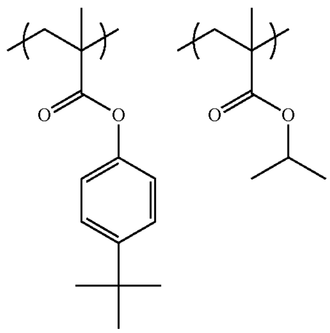
(C-3)
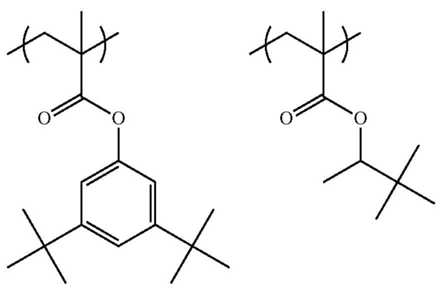
(C-4)
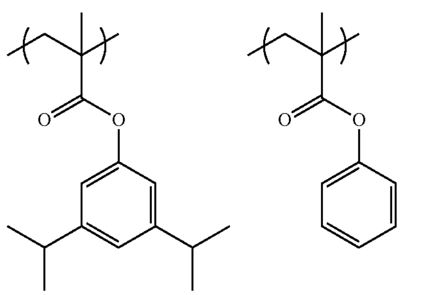
(C-5)
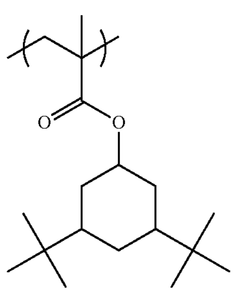
(C-6)
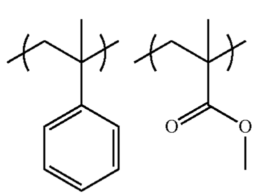
(C-7)
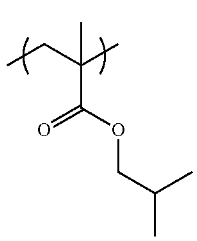
(C-8)
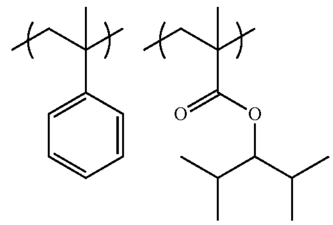
(C-9)
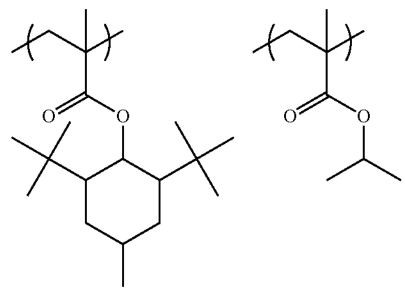
(C-10)
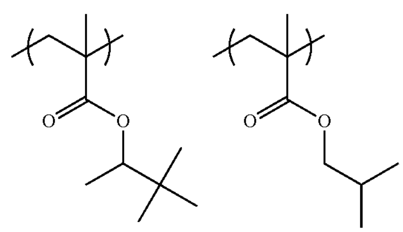
(C-11)
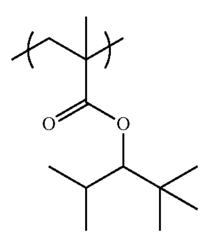
(C-12)
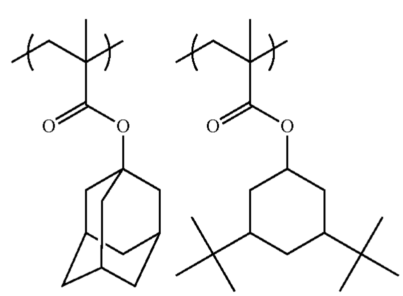
(C-13)
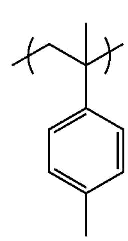

-continued
(C-14)
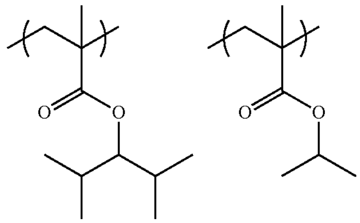
(C-15)
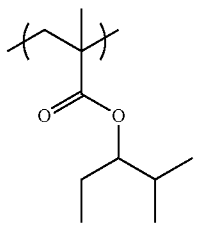
(C-16)
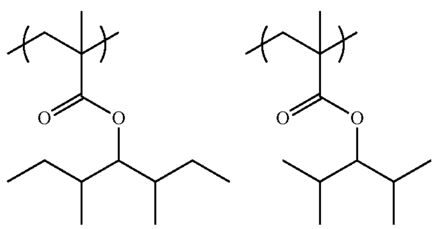
(C-17)
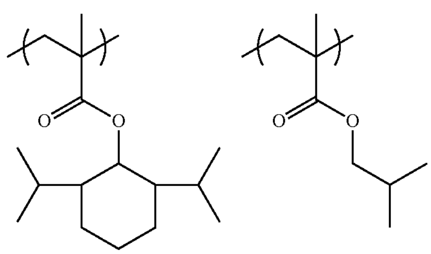
(C-18)
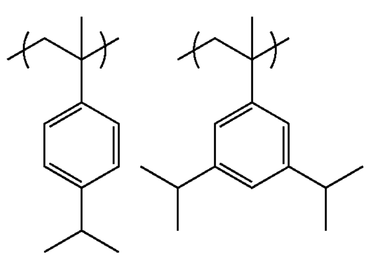
(C-19)
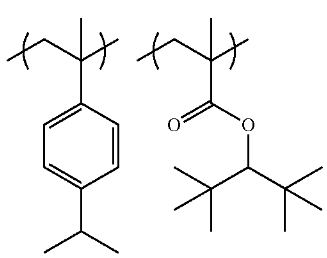
-continued
(C-20)
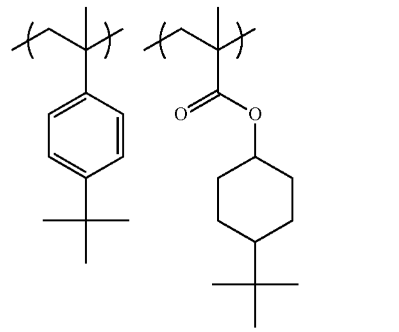
(C-21)
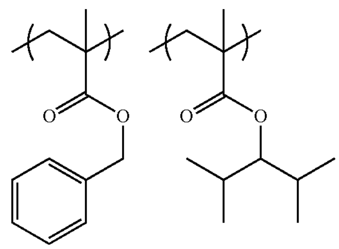
(C-22)
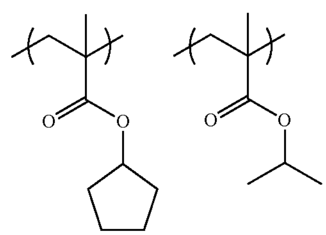
(C-23)
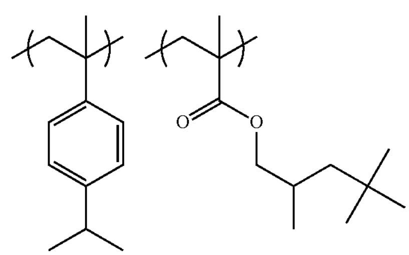
(C-24)
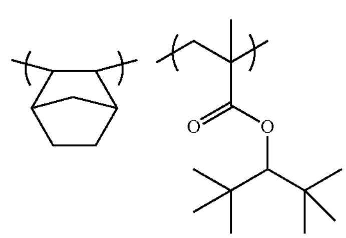

-continued
(C-25)
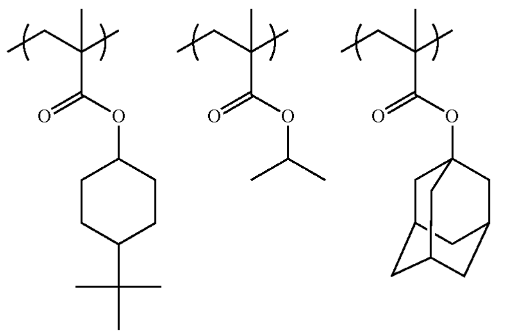
(C-26)
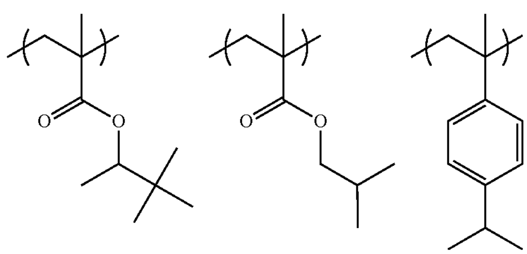
(C-27)
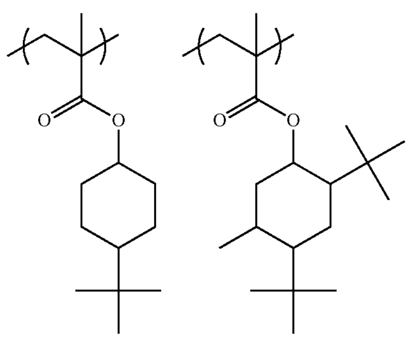
(C-28)
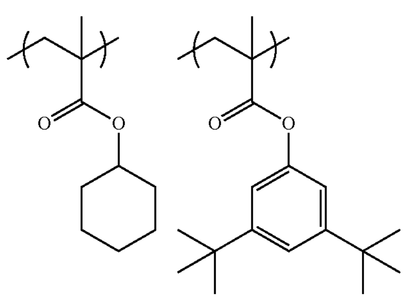
(D-1)
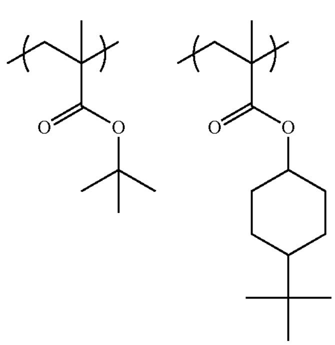
-continued
(D-2)
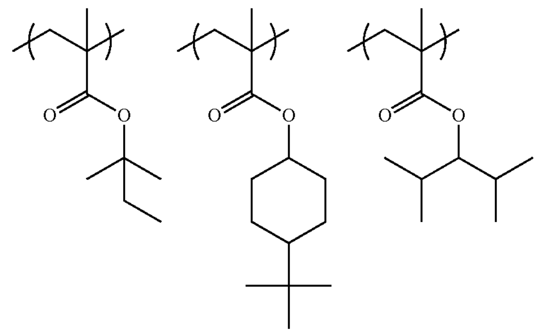
(D-3)
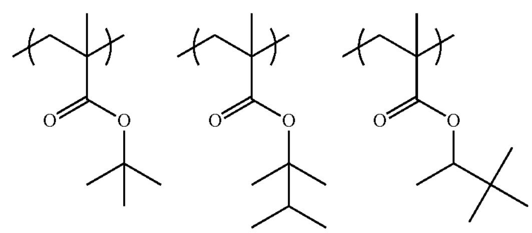
(D-4)
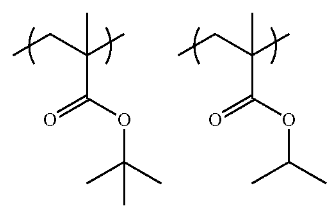
(D-5)
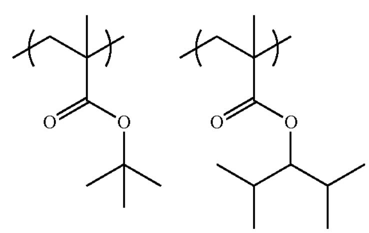
(D-6)
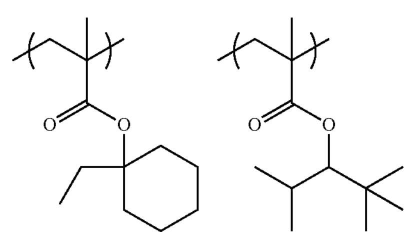
(D-7)
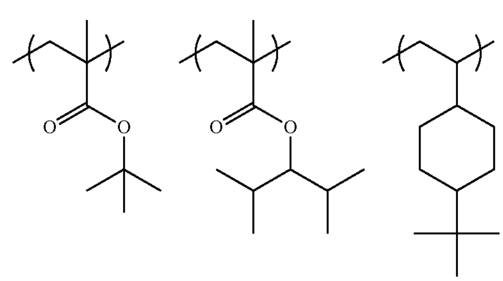

-continued
(D-8)
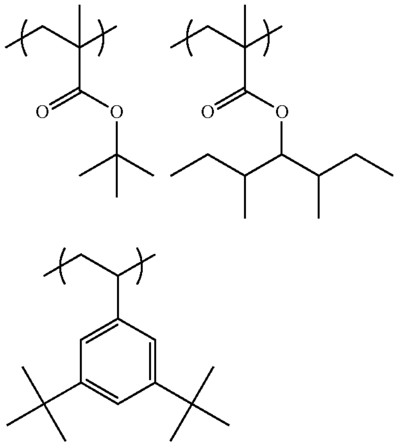
(D-9)
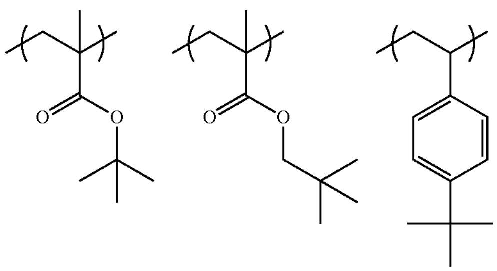
(D-10)
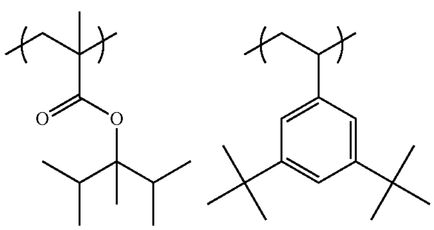
(D-11)
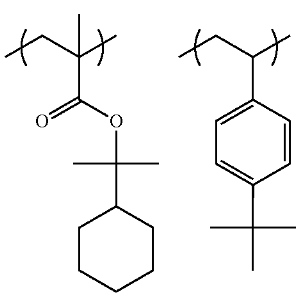
(D-12)
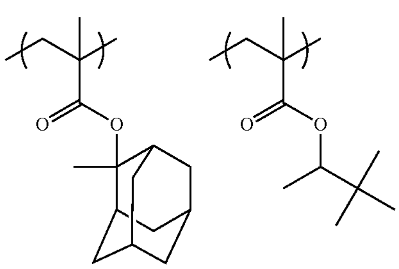
-continued
(D-13)
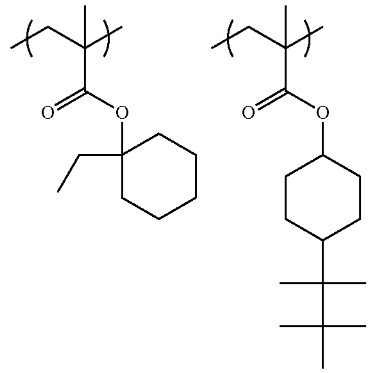
(D-14)
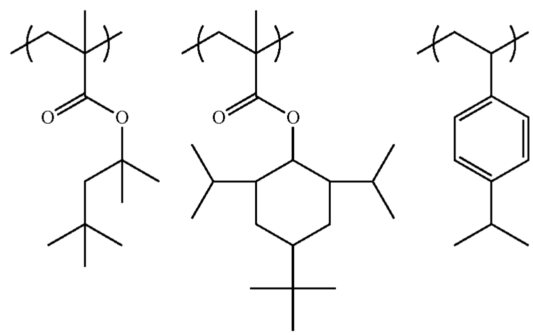
(D-15)
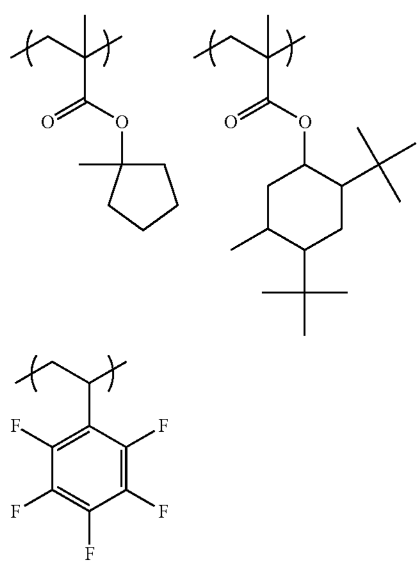

-continued (D-16)

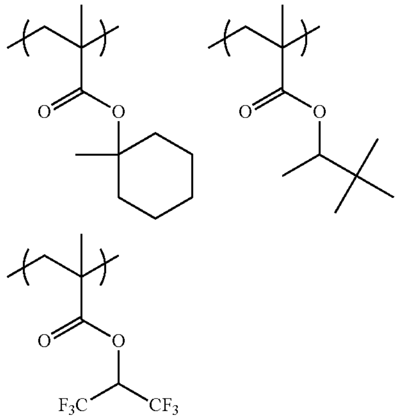

| Resin | Composition | Mw | Mw/Mn |
|---|---|---|---|
| C-1 | 50/50 | 9600 | 1.74 |
| C-2 | 60/40 | 34500 | 1.43 |
| C-3 | 30/70 | 19300 | 1.69 |
| C-4 | 90/10 | 26400 | 1.41 |
| C-5 | 100 | 27600 | 1.87 |
| C-6 | 80/20 | 4400 | 1.96 |
| C-7 | 100 | 16300 | 1.83 |
| C-8 | 5/95 | 24500 | 1.79 |
| C-9 | 20/80 | 15400 | 1.68 |
| C-10 | 50/50 | 23800 | 1.46 |
| C-11 | 100 | 22400 | 1.57 |
| C-12 | 10/90 | 21600 | 1.52 |
| C-13 | 100 | 28400 | 1.58 |
| C-14 | 50/50 | 16700 | 1.82 |
| C-15 | 100 | 23400 | 1.73 |
| C-16 | 60/40 | 18600 | 1.44 |
| C-17 | 80/20 | 12300 | 1.78 |
| C-18 | 40/60 | 18400 | 1.58 |
| C-19 | 70/30 | 12400 | 1.49 |
| C-20 | 50/50 | 23500 | 1.94 |
| C-21 | 10/90 | 7600 | 1.75 |
| C-22 | 5/95 | 14100 | 1.39 |
| C-23 | 50/50 | 17900 | 1.61 |
| C-24 | 10/90 | 24600 | 1.72 |
| C-25 | 50/40/10 | 23500 | 1.65 |
| C-26 | 60/30/10 | 13100 | 1.51 |
| C-27 | 50/50 | 21200 | 1.84 |
| C-28 | 10/90 | 19500 | 1.66 |
| D-1 | 50/50 | 16500 | 1.72 |
| D-2 | 10/50/40 | 18000 | 1.77 |
| D-3 | 5/50/45 | 27100 | 1.69 |
| D-4 | 20/80 | 26500 | 1.79 |
| D-5 | 10/90 | 24700 | 1.83 |
| D-6 | 10/90 | 15700 | 1.99 |
| D-7 | 5/90/5 | 21500 | 1.92 |
| D-8 | 5/60/35 | 17700 | 2.10 |
| D-9 | 35/35/130 | 25100 | 2.02 |
| D-10 | 70/30 | 19700 | 1.85 |
| D-11 | 75/25 | 23700 | 1.80 |
| D-12 | 10/90 | 20100 | 2.02 |
| D-13 | 5/35/60 | 30100 | 2.17 |
| D-14 | 5/45/50 | 22900 | 2.02 |
| D-15 | 15/75/10 | 28600 | 1.81 |
| D-16 | 25/55/20 | 27400 | 1.87 |

[5-1] (N) Basic Compound or Ammonium Salt Compound Whose Basicity Decreases Upon Irradiation with an Actinic Ray or Radiation The actinic ray-sensitive or radiation-sensitive resin composition (I) of the present invention preferably contains a basic compound or ammonium salt compound whose basicity decreases upon irradiation with an actinic ray or radiation (hereinafter sometimes referred to as "compound (N)").

The compound (N) is preferably (N-1) a compound having a basic functional group or an ammonium group and a group capable of generating an acidic functional group upon irradiation with an actinic ray or radiation. That is, the compound (N) is preferably a basic compound having a basic functional group and a group capable of generating an acidic functional group upon irradiation with an actinic ray or radiation, or an ammonium salt compound having an ammonium group and a group capable of generating an acidic functional group upon irradiation with an actinic ray or radiation.

The compound which is generated by the decomposition of the compound (N) or (N-1) upon irradiation with an actinic ray or radiation and whose basicity is decreased includes a compound represented by the following formulae (PA-I), (PA-II) or (PA-III), and from the standpoint that excellent effects can be attained at a high level in terms of all of LWR, local pattern dimension uniformity and DOF, a compound represented by formula (PA-II) or (PA-III) is preferred.

The compound represented by formula (PA-I) is described below.

$$Q\text{-}A_1\text{-}(X)_n\text{—}B\text{—}R \qquad \text{(PA-I)}$$

In formula (PA-I), $A_1$ represents a single bond or a divalent linking group.

Q represents —$SO_3H$ or —$CO_2H$. Q corresponds to an acidic functional group that is generated upon irradiation with an actinic ray or radiation.

X represents —$SO_2$— or —CO—.

n represents 0 or 1.

B represents a single bond, an oxygen atom or —N(Rx)-.

Rx represents a hydrogen atom or a monovalent organic group.

R represents a monovalent organic group having a basic functional group, or a monovalent organic group having an ammonium group.

The divalent linking group of $A_1$ is preferably a divalent organic group having a carbon number of 2 to 12, and examples thereof include an alkylene group and a phenylene group. An alkylene group having at least one fluorine atom is preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is substituted for by a fluorine atom, more preferably an alkylene group where the carbon atom bonded to the Q site has a fluorine atom, still more preferably a perfluoroalkylene group, yet still more preferably a perfluoroethylene group, a perfluoropropylene group or a perfluorobutylene group.

The monovalent organic group in Rx is preferably an organic group having a carbon number of 4 to 30, and examples thereof include an alkyl group, a cycloalkyl group, an aryl group, an aralkyl group and an alkenyl group.

The alkyl group in Rx may have a substituent and is preferably a linear or branched alkyl group having a carbon number of 1 to 20, and the alkyl chain may contain an oxygen atom, a sulfur atom or a nitrogen atom.

Here, the alkyl group having a substituent includes particularly a group where a cycloalkyl group is substituted on a linear or branched alkyl group (for example, an adamantylmethyl group, an adamantylethyl group, a cycohexylethyl group and a camphor residue).

The cycloalkyl group in Rx may have a substituent and is preferably a cycloalkyl group having a carbon number of 3 to 20, and the ring may contain an oxygen atom.

The aryl group in Rx may have a substituent and is preferably an aryl group having a carbon number of 6 to 14.

The aralkyl group in Rx may have a substituent and is preferably an aralkyl group having a carbon number of 7 to 20.

The alkenyl group in Rx may have a substituent, and examples thereof include a group having a double bond at an arbitrary position of the alkyl group described as Rx.

Preferred examples of the partial structure of the basic functional group include a crown ether structure, a primary to tertiary amine structure, and a nitrogen-containing heterocyclic structure (e.g., pyridine, imidazole, pyrazine).

Preferred examples of the partial structure of the ammonium group include a primary to tertiary ammonium structure, a pyridinium structure, an imidazolinium structure, and a pyrazinium structure.

The basic functional group is preferably a functional group having a nitrogen atom, more preferably a structure having a primary to tertiary amino group or a nitrogen-containing heterocyclic structure. In such a structure, from the standpoint of enhancing the basicity, it is preferred that all atoms adjacent to the nitrogen atom contained in the structure are a carbon atom or a hydrogen atom. Also, in view of enhancing the basicity, an electron-withdrawing functional group (e.g., carbonyl group, sulfonyl group, cyano group, halogen atom) is preferably not bonded directly to the nitrogen atom.

The monovalent organic group in the monovalent organic group (group R) containing such a structure is preferably an organic group having a carbon number of 4 to 30, and examples thereof include an alkyl group, a cycloalkyl group, an aryl group, an aralkyl group and an alkenyl group. Each of these groups may have a substituent.

Examples of the alkyl group, cycloalkyl group, aryl group, aralkyl group and alkenyl group in the alkyl group, cycloalkyl group, aryl group, aralkyl group and alkenyl group each containing a basic functional group or an ammonium group of R are the same as those of the alkyl group, cycloalkyl group, aryl group, aralkyl group and alkenyl group described as Rx.

Examples of the substituent which each of the groups above may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 20). The cyclic structure in the aryl group, cycloalkyl group and the like may further have an alkyl group (preferably having a carbon number of 1 to 20) as a substituent. The aminoacyl group may further have one or two alkyl groups (preferably having a carbon number of 1 to 20) as a substituent.

When B is —N(Rx)-, R and Rx are preferably combined to form a ring. By forming a ring structure, the stability is enhanced and the composition using this compound is also increased in the storage stability. The number of carbons constituting the ring is preferably from 4 to 20, and the ring may be monocyclic or polycyclic and may contain an oxygen atom, a sulfur atom or a nitrogen atom.

Examples of the monocyclic structure include a 4- to 8-membered ring containing a nitrogen atom. Examples of the polycyclic structure include a structure formed by combining two monocyclic structures or three or more monocyclic structures. The monocyclic structure and polycyclic structure may have a substituent, and preferred examples of the substituent include a halogen atom, a hydroxyl group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 15), an acyloxy group (preferably having a carbon number of 2 to 15), an alkoxycarbonyl group (preferably having a carbon number of 2 to 15), and an aminoacyl group (preferably having a carbon number of 2 to 20). The cyclic structure in the aryl group, cycloalkyl group and the like may further have an alkyl group (preferably having a carbon number of 1 to 15) as a substituent. The aminoacyl group may have one or two alkyl groups (preferably having a carbon number of 1 to 15) as a substituent.

Out of the compounds represented by formula (PA-I), a compound where the Q site is a sulfonic acid can be synthesized using a general sulfonamidation reaction. For example, this compound can be obtained by a method of selectively reacting one sulfonyl halide moiety of a bis-sulfonyl halide compound with an amine compound to form a sulfonamide bond and then hydrolyzing the other sulfonyl halide moiety, or a method of ring-opening a cyclic sulfonic anhydride through a reaction with an amine compound.

The compound represented by formula (PA-II) is described below.

$$Q_1\text{-}X_1\text{—NH—}X_2\text{-}Q_2 \qquad \text{(PA-II)}$$

In formula (PA-II), each of $Q_1$ and $Q_2$ independently represents a monovalent organic group, provided that either one of $Q_1$ and $Q_2$ has a basic functional group. It is also possible that $Q_1$ and $Q_2$ are combined to form a ring and the ring formed has a basic functional group.

Each of $X_1$ and $X_2$ independently represents —CO— or —$SO_2$—.

Here, —NH— corresponds to an acidic functional group that is generated upon irradiation with an actinic ray or radiation.

In formula (PA-II), the monovalent organic group of $Q_1$ and $Q_2$ is preferably an organic group having a carbon number of 1 to 40, and examples thereof include an alkyl group, a cycloalkyl group, an aryl group, an aralkyl group, and an alkenyl group.

The alkyl group of $Q_1$ and $Q_2$ may have a substituent and is preferably a linear or branched alkyl group having a carbon number of 1 to 30, and the alkyl chain may contain an oxygen atom, a sulfur atom or a nitrogen atom.

The cycloalkyl group of $Q_1$ and $Q_2$ may have a substituent and is preferably a cycloalkyl group having a carbon number of 3 to 20, and the ring may contain an oxygen atom or a nitrogen atom.

The aryl group of $Q_1$ and $Q_2$ may have a substituent and is preferably an aryl group having a carbon number of 6 to 14.

The aralkyl group of $Q_1$ and $Q_2$ may have a substituent and is preferably an aralkyl group having a carbon number of 7 to 20.

The alkenyl group of $Q_1$ and $Q_2$ may have a substituent and includes a group having a double bond at an arbitrary position of the alkyl group above.

Examples of the substituent which each of the groups above may have include a halogen atom, a hydroxyl group, a nitro group, a cyano group, a carboxy group, a carbonyl group, a cycloalkyl group (preferably having a carbon number of 3 to 10), an aryl group (preferably having a carbon number of 6 to 14), an alkoxy group (preferably having a carbon number of 1 to 10), an acyl group (preferably having a carbon number of 2 to 20), an acyloxy group (preferably having a carbon number of 2 to 10), an alkoxycarbonyl group (preferably having a carbon number of 2 to 20), and an aminoacyl group (preferably having a carbon number of 2 to 10). The cyclic structure in the aryl group, cycloalkyl group and the like may further have an alkyl group (preferably having a carbon number of 1 to 10) as a substituent. The aminoacyl group may further have an alkyl group (preferably having a carbon number of 1 to 10) as a substituent. Examples of the alkyl group having a substituent include a perfluoroalkyl group such as perfluoromethyl group, perfluoroethyl group, perfluoropropyl group and perfluorobutyl group.

Preferred examples of the partial structure of the basic functional group contained in at least either $Q_1$ or $Q_2$ are the same as those described for the basic functional group contained in R of formula (PA-I).

Examples of the structure where $Q_1$ and $Q_2$ are combined to form a ring and the ring formed has a basic functional group include a structure where the organic groups of $Q_1$ or $Q_2$ are further bonded by an alkylene group, an oxy group, an imino group or the like.

In formula (PA-II), at least either one of $X_1$ and $X_2$ is preferably —$SO_2$—.

The compound represented by formula (PA-III) is described below.

$$Q_1\text{-}X_1\text{—NH—}X_2\text{-}A_2\text{-}(X_3)_m\text{—B-}Q_3 \qquad \text{(PA-III)}$$

In formula (PA-III), each of $Q_1$ and $Q_3$ independently represents a monovalent organic group, provided that either one of $Q_1$ and $Q_3$ has a basic functional group. It is also possible that $Q_1$ and $Q_3$ are combined to form a ring and the ring formed has a basic functional group.

Each of $X_1$, $X_2$ and $X_3$ independently represents —CO— or —$SO_2$—.

$A_2$ represents a divalent linking group.

B represents a single bond, an oxygen atom or —N(Qx)-.

Qx represents a hydrogen atom or a monovalent organic group.

When B is —N(Qx)-, $Q_3$ and Qx may combine to form a ring.

m represents 0 or 1.

Here, —NH— corresponds to an acidic functional group that is generated upon irradiation with an actinic ray or radiation.

$Q_1$ has the same meaning as $Q_1$ in formula (PA-II).

Examples of the organic group of $Q_3$ are the same as those of the organic group of $Q_1$ and $Q_2$ in formula (PA-II).

Examples of the structure where $Q_1$ and $Q_3$ are combined to form a ring and the ring formed has a basic functional group include a structure where the organic groups of $Q_1$ or $Q_3$ are further bonded by an alkylene group, an oxy group, an imino group or the like.

The divalent linking group of $A_2$ is preferably a divalent linking group having a carbon number of 1 to 8 and containing a fluorine atom, and examples thereof include a fluorine atom-containing alkylene group having a carbon number of 1 to 8, and a fluorine atom-containing phenylene group. A fluorine atom-containing alkylene group is more preferred, and the carbon number thereof is preferably from 2 to 6, more preferably from 2 to 4. The alkylene chain may contain a linking group such as oxygen atom and sulfur atom. The alkylene group is preferably an alkylene group where from 30 to 100% by number of the hydrogen atom is substituted for by a fluorine atom, more preferably a perfluoroalkylene group, still more preferably a perfluoroethylene group having a carbon number of 2 to 4.

The monovalent organic group of Qx is preferably an organic group having a carbon number of 4 to 30, and examples thereof include an alkyl group, a cycloalkyl group, an aryl group, an aralkyl group, and an alkenyl group. Examples of the alkyl group, cycloalkyl group, aryl group, aralkyl group and alkenyl group are the same as those for Rx in formula (PA-I).

In formula (PA-III), each of $X_1$, $X_2$ and $X_3$ is preferably —$SO_2$—.

The compound (N) is preferably a sulfonium salt compound of the compound represented by formula (PA-I), (PA-II) or (PA-III), or an iodonium salt compound of the compound represented by formula (PA-I), (PA-II) or (PA-III), more preferably a compound represented by the following formula (PA1) or (PA2):

(PA1)

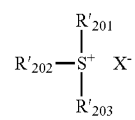

(PA2)

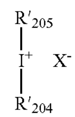

In formula (PA1), each of $R'_{201}$, $R'_{202}$ and $R'_{203}$ independently represents an organic group, and specific examples thereof are the same as those for $R_{201}$, $R_{202}$ and $R_{203}$ of formula (ZI) in the component (B).

$X^-$ represents a sulfonate or carboxylate anion after elimination of a hydrogen atom in the —$SO_3$H moiety or —COOH moiety of the compound represented by formula (PA-I), or an anion after elimination of a hydrogen atom from the —NH— moiety of the compound represented by formula (PA-II) or (PA-III).

In formula (PA2), each of $R'_{204}$ and $R'_{205}$ independently represents an aryl group, an alkyl group or a cycloalkyl group. Specific examples thereof are the same as those for $R_{204}$ and $R_{205}$ of formula (Zip in the component (B).

$X^-$ represents a sulfonate or carboxylate anion after elimination of a hydrogen atom in the —$SO_3$H moiety or —COOH moiety of the compound represented by formula (PA-I), or an anion after elimination of a hydrogen atom from the —NH— moiety of the compound represented by formula (PA-II) or (PA-III).

The compound (N) decomposes upon irradiation with an actinic ray or radiation to generate, for example, a compound represented by formula (PA-I), (PA-II) or (PA-III).

The compound represented by formula (PA-I) is a compound having a sulfonic acid group or a carboxylic acid group together with a basic functional group or an ammonium group and thereby being reduced in or deprived of the basicity or changed from basic to acidic, relative to the compound (N).

The compound represented by formula (PA-II) or (PA-III) is a compound having an organic sulfonylimino group or an organic carbonylimino group together with a basic functional group and thereby being reduced in or deprived of the basicity or changed from basic to acidic, relative to the compound (N).

In the present invention, the expression "reduced in the basicity upon irradiation with an actinic ray or radiation" means that the acceptor property for a proton (an acid generated upon irradiation with an actinic ray or radiation) of the compound (N) is decreased by the irradiation with an actinic ray or radiation. The expression "reduced in the acceptor property" means that when an equilibrium reaction of producing a noncovalent bond complex as a proton adduct from a basic functional group-containing compound and a proton takes place or when an equilibrium reaction of causing the counter cation of the ammonium group-containing compound to be exchanged with a proton takes place, the equilibrium constant in the chemical equilibrium decreases.

A compound (N) whose basicity decreases upon irradiation with an actinic ray or radiation is contained in the resist film, so that in the unexposed area, the acceptor property of the compound (N) is sufficiently brought out and an unintended reaction between an acid diffused from the exposed area or the like and the resin (A) can be suppressed, whereas in the exposed area, the acceptor property of the compound (N) decreases and the intended reaction of an acid with the resin (A) unfailingly occurs. It is presumed that by virtue of such an operation mechanism, a pattern excellent in terms of line width roughness (LWR), local pattern dimension uniformity, focus latitude (DOF) and pattern profile is obtained.

The basicity can be confirmed by measuring the pH, or a calculation value can be computed using a commercially available software.

Specific examples of the compound (N) capable of generating a compound represented by formula (PA-I) upon irradiation with an actinic ray or radiation are illustrated below, but the present invention is not limited thereto.

(PA-1)

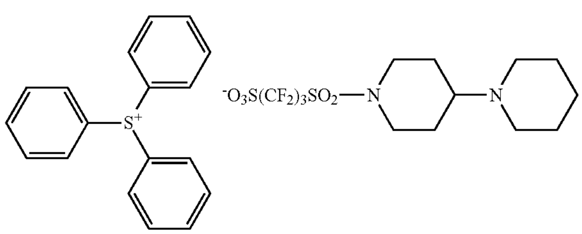

(PA-2)

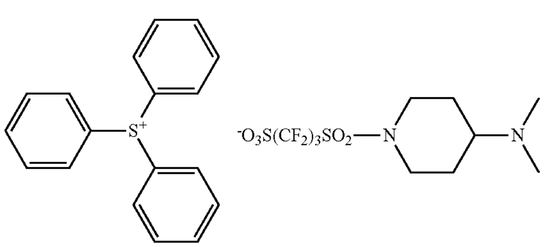

(PA-3)

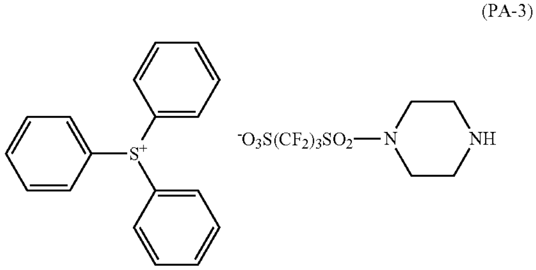

-continued (PA-4)

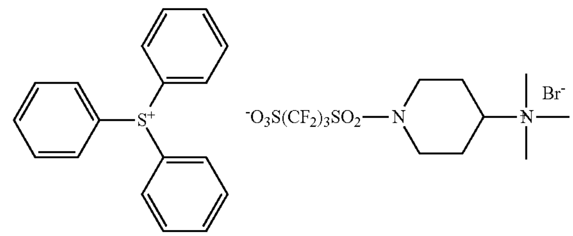

(PA-5)

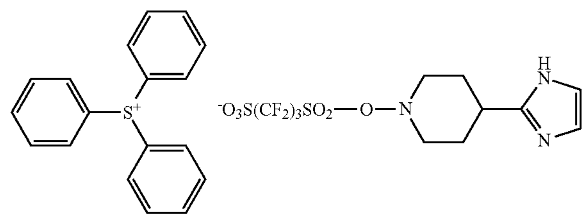

(PA-6)

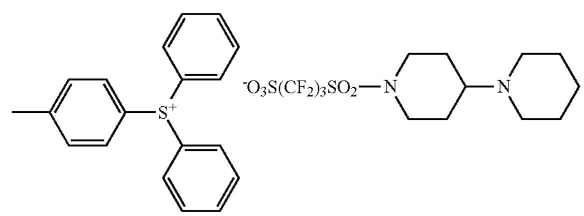

(PA-7)

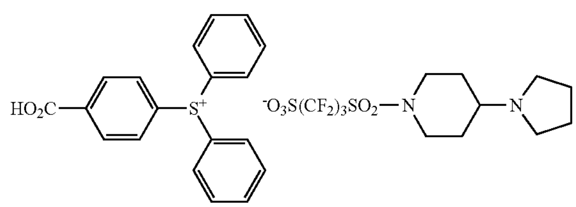

(PA-8)

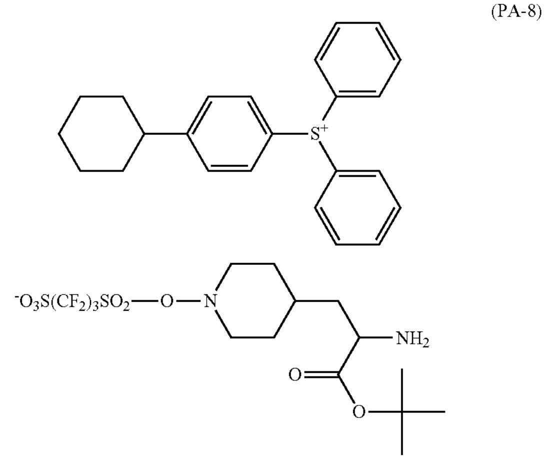

(PA-9)

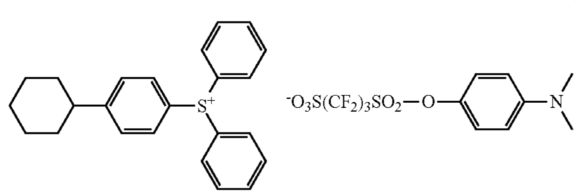

-continued
(PA-10)
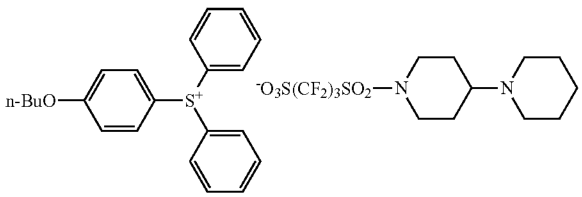
(PA-11)
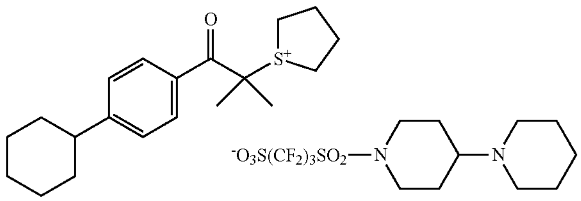
(PA-12)
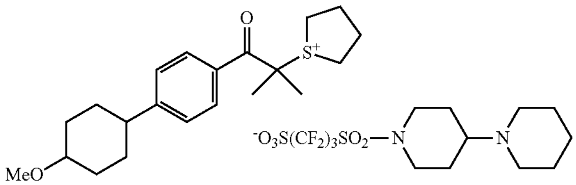
(PA-13)
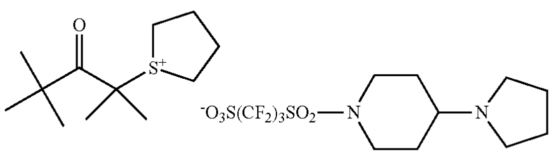
(PA-14)
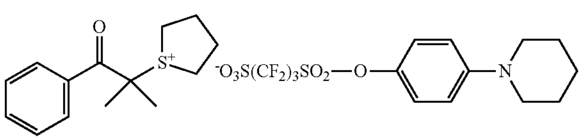
(PA-15)
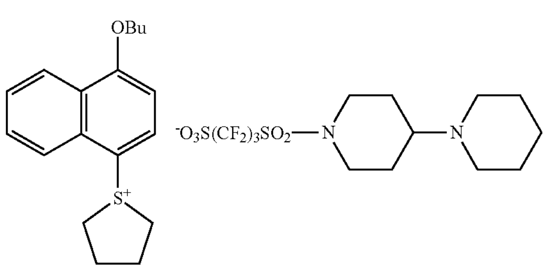
(PA-16)
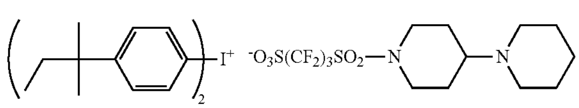
-continued
(PA-17)
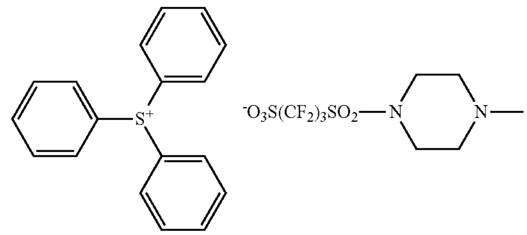
(PA-18)
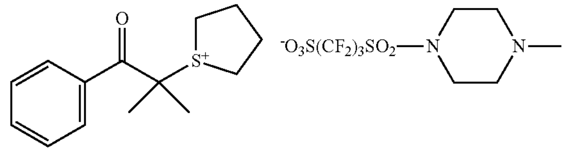
(PA-19)
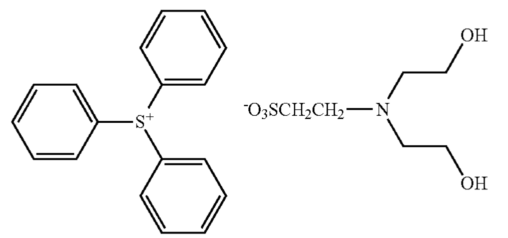
(PA-20)
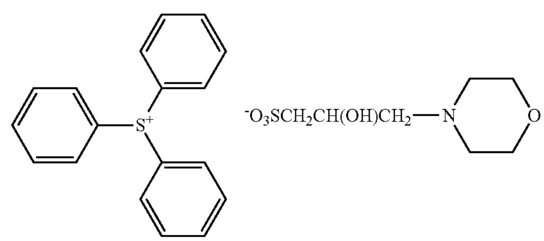
(PA-21)
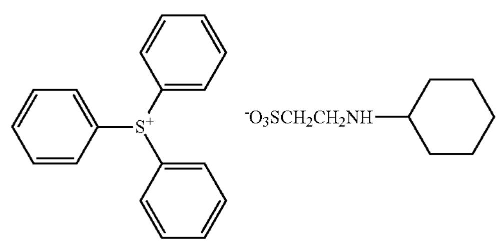
(PA-22)
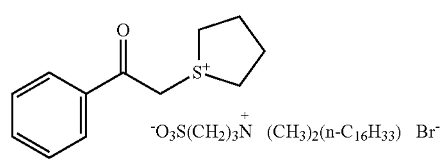
(PA-23)
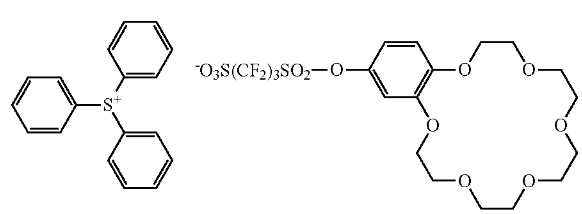

-continued (PA-24)

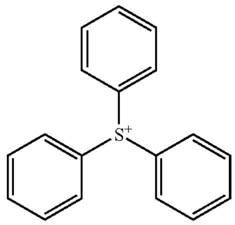

(PA-25)

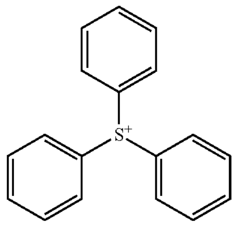

(PA-26)

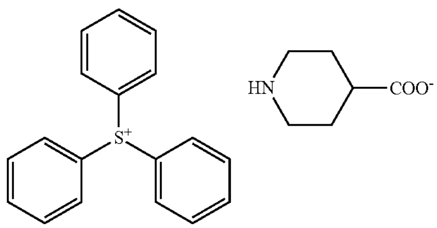

(PA-27)

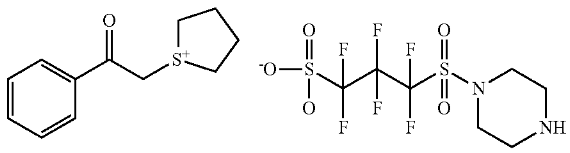

These compounds can be easily synthesized from a compound represented by formula (PA-I) or a lithium, sodium or potassium salt thereof and a hydroxide, bromide, chloride or the like of iodonium or sulfonium, by utilizing the salt exchange method described in JP-T-11-501909 (the term "JP-T" as used herein means a "published Japanese translation of a PCT patent application") or JP-A-2003-246786. The synthesis may be also performed in accordance with the synthesis method described in JP-A-7-333851.

Specific examples of the compound (N) capable of generating a compound represented by formula (PA-II) or (PA-III) upon irradiation with an actinic ray or radiation are illustrated below, but the present invention is not limited thereto.

(PA-28)

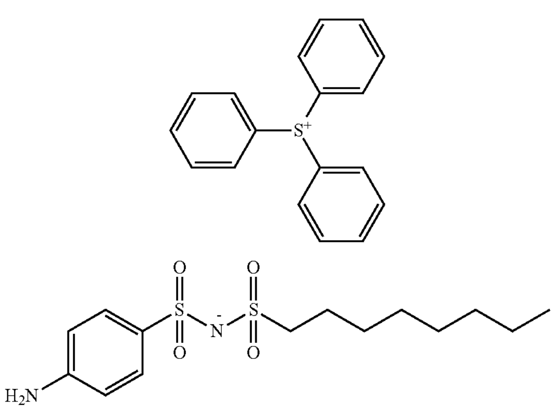

-continued (PA-29)

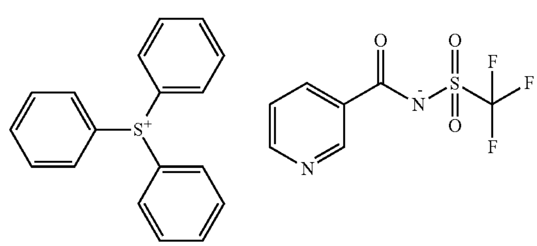

(PA-30)

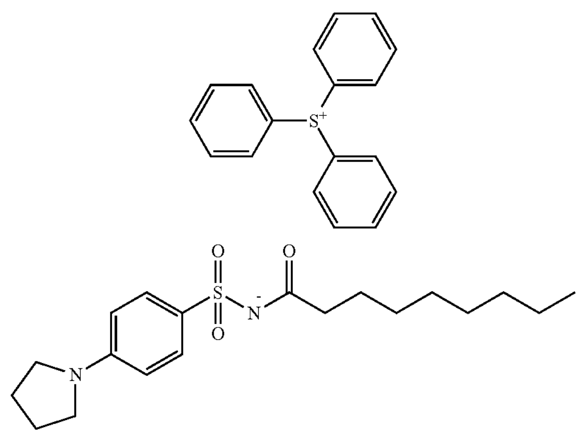

(PA-31)

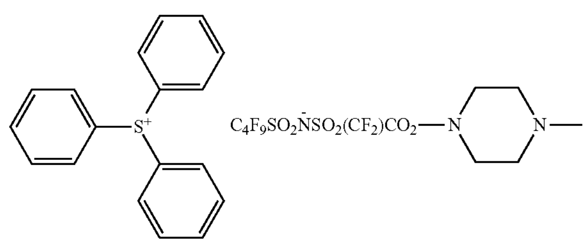

(PA-32)

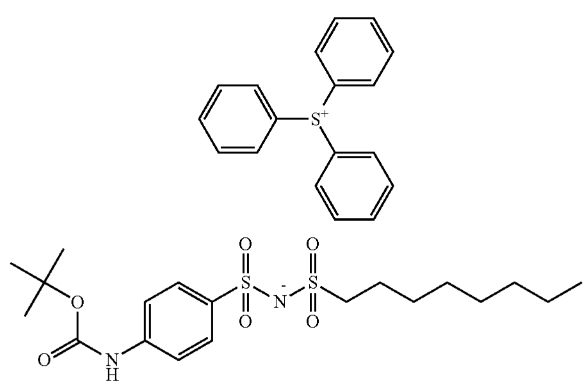

(PA-33)

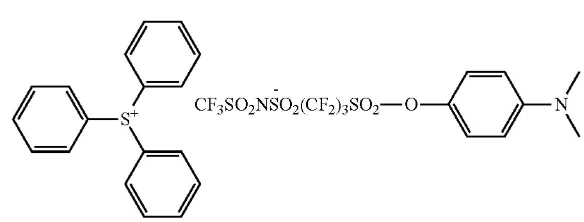

-continued
(PA-34)
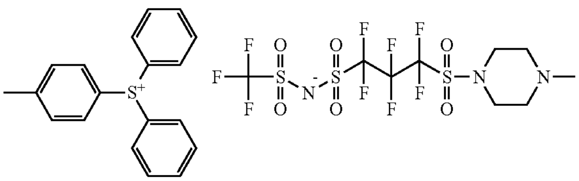
(PA-35)
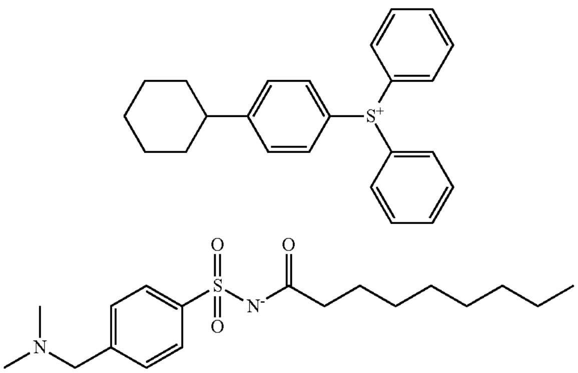
(PA-36)
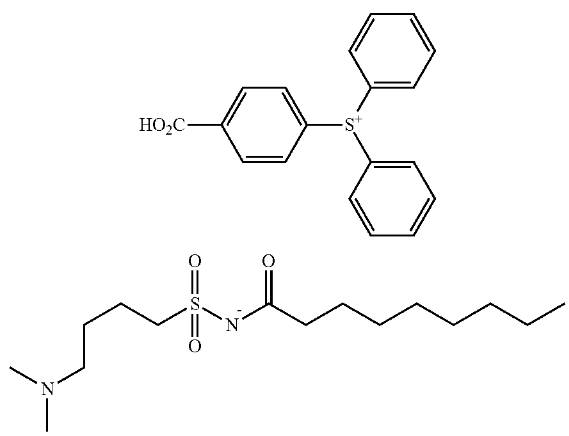
(PA-37)
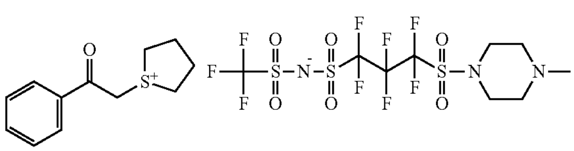
(PA-38)
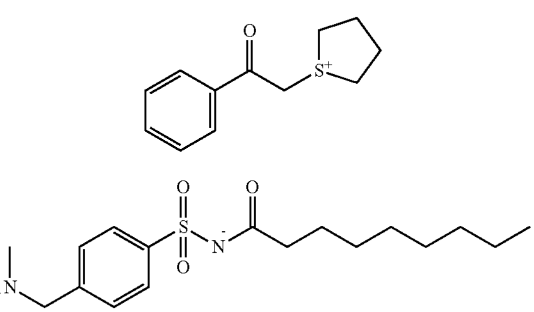
-continued
(PA-39)
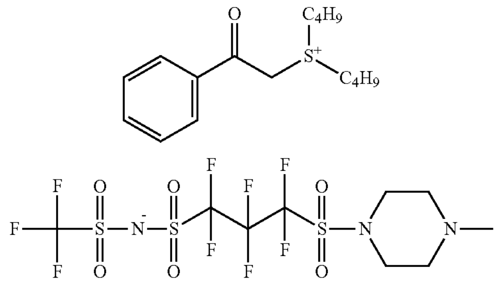
(PA-40)
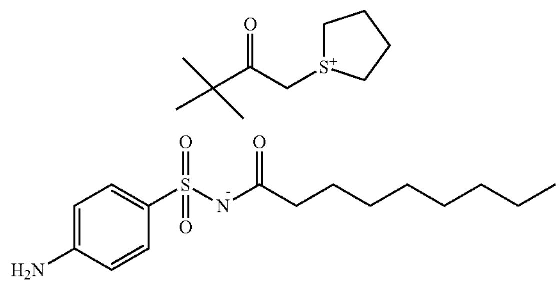
(PA-41)
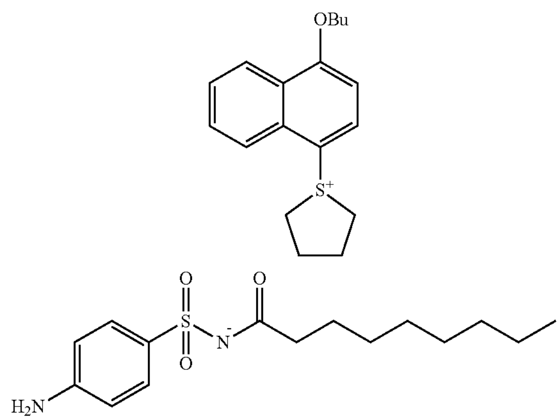
(PA-42)
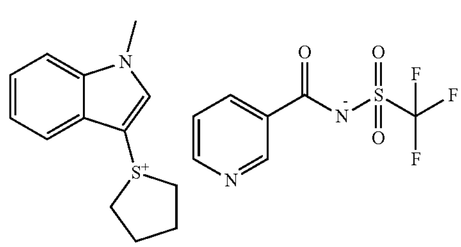
(PA-43)
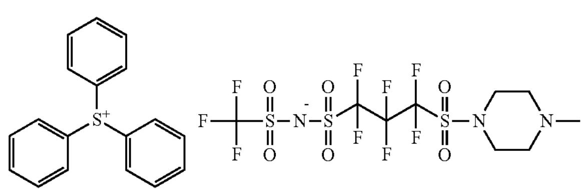

(PA-44)
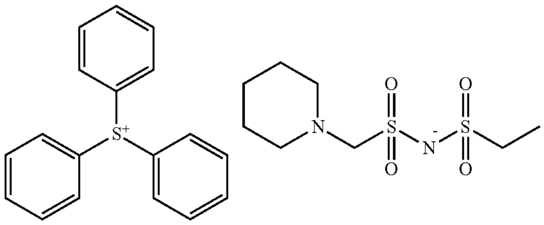
(PA-45)
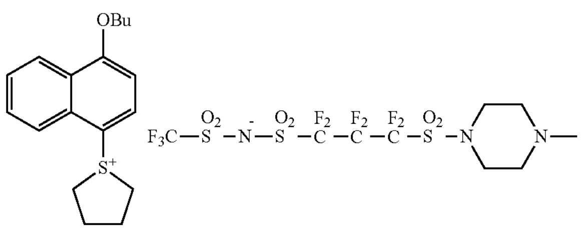
(PA-46)
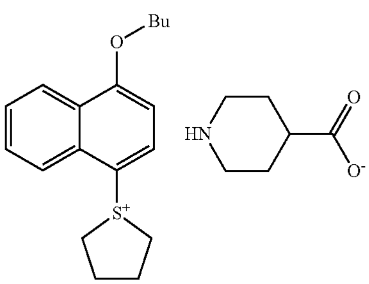
(PA-47)
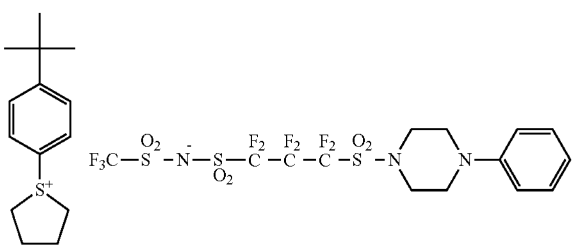
(PA-48)
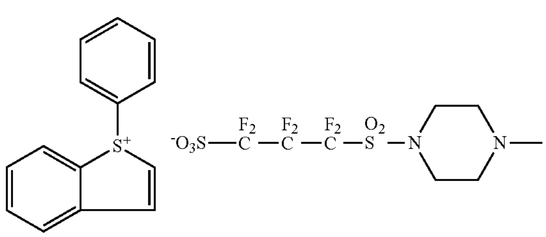
(PA-49)
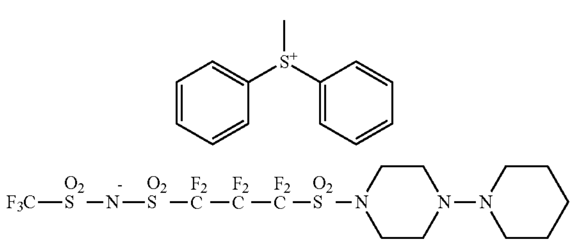
(PA-50)
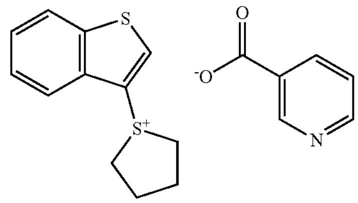
(PA-51)
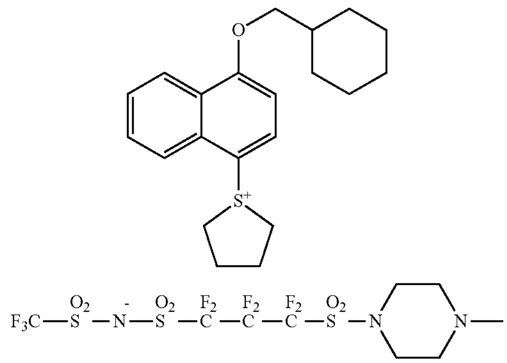
(PA-52)
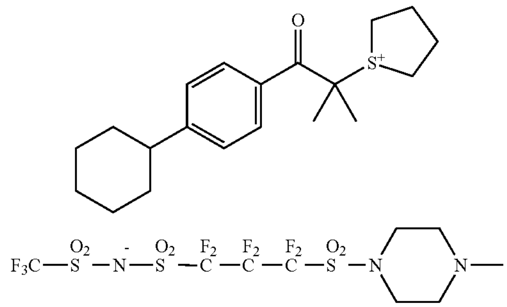
(PA-53)
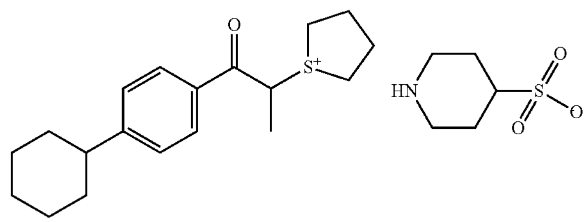
(PA-54)
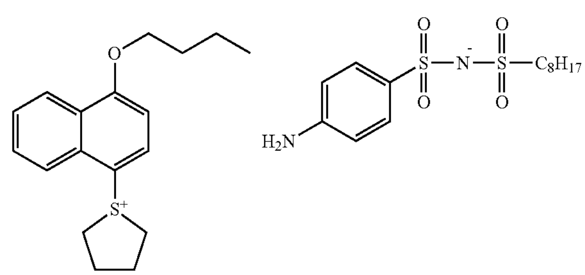

-continued
(PA-55)
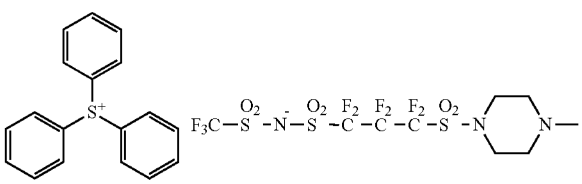
(PA-56)
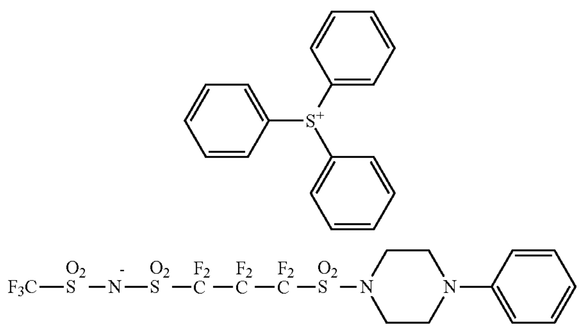
(PA-57)
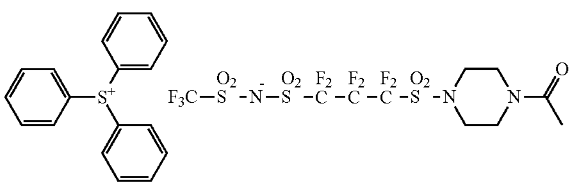
(PA-58)
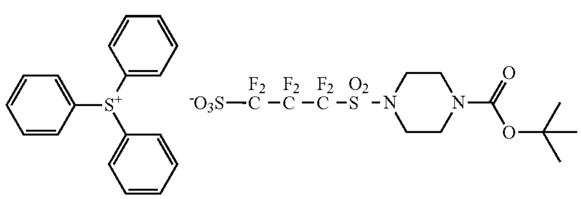
(PA-59)
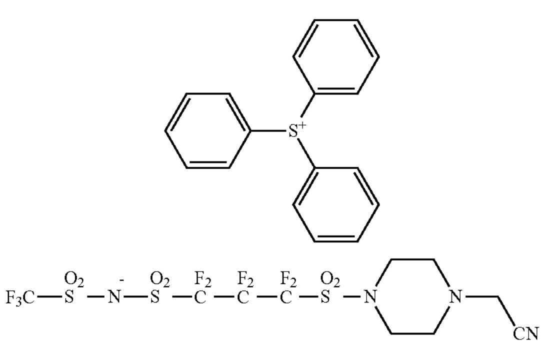
-continued
(PA-60)
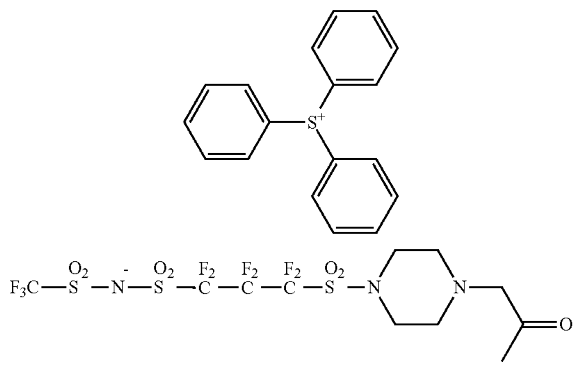
(PA-61)
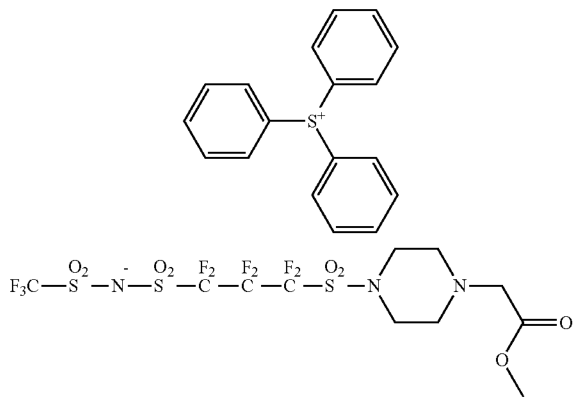
(PA-62)
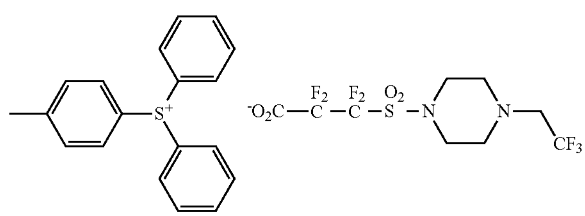
(PA-63)
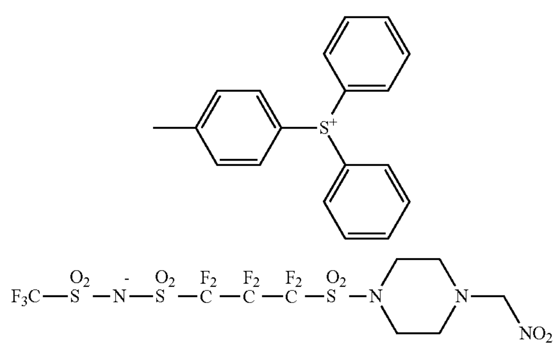
(PA-64)
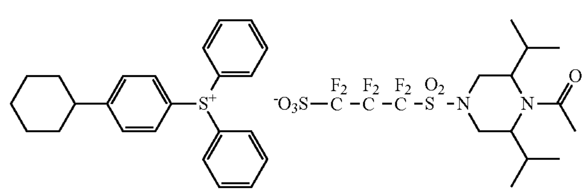

-continued (PA-65)

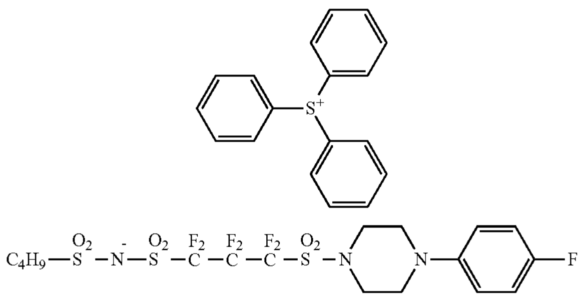

(PA-66)

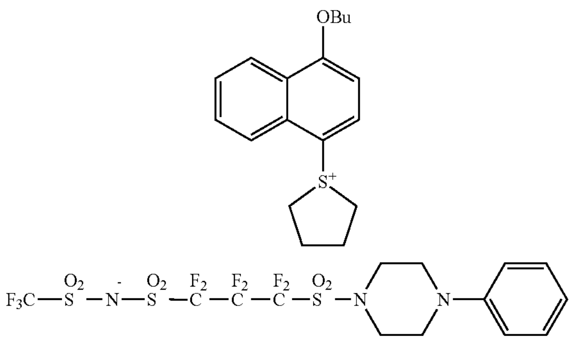

(PA-67)

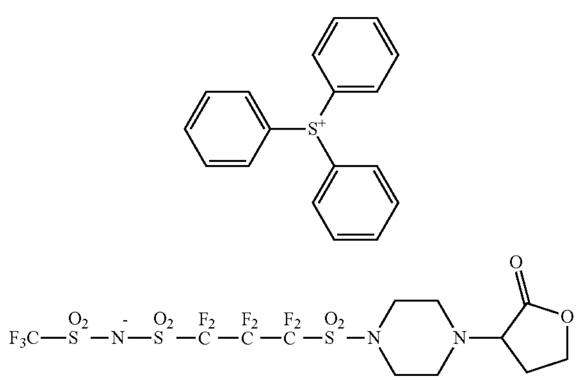

(PA-68)

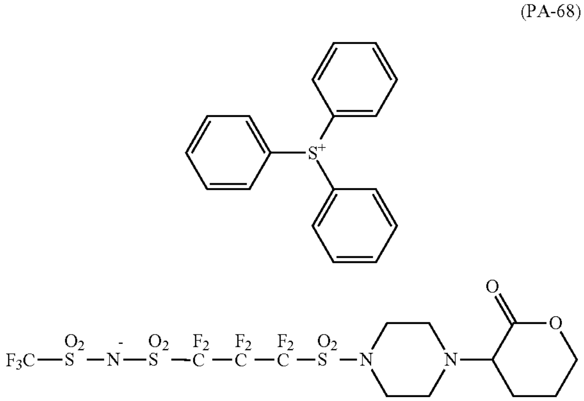

-continued (PA-69)

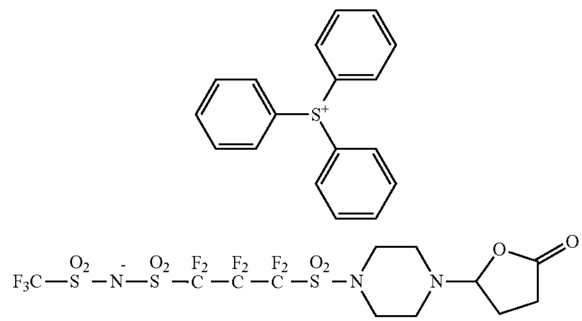

These compounds can be easily synthesized by using a general sulfonic acid esterification reaction or sulfonamidation reaction. For example, the compound may be obtained by a method of selectively reacting one sulfonyl halide moiety of a bis-sulfonyl halide compound with an amine, alcohol or the like containing a partial structure represented by formula (PA-II) or (PA-III) to form a sulfonamide bond or a sulfonic acid ester bond and then hydrolyzing the other sulfonyl halide moiety, or a method of ring-opening a cyclic sulfonic anhydride by an amine or alcohol containing a partial structure represented by formula (PA-II). The amine or alcohol containing a partial structure represented by formula (PA-II) or (PA-III) can be synthesized by reacting an amine or alcohol with an anhydride (e.g., $(R'O_2C)_2O$, $(R'SO_2)_2O$) or an acid chloride compound (e.g., $R'O_2CCl$, $R'SO_2Cl$) under basic conditions (R' is, for example, a methyl group, an n-octyl group or a trifluoromethyl group). In particular, the synthesis may be performed in accordance with synthesis examples and the like in JP-A-2006-330098.

The molecular weight of the compound (N) is preferably from 500 to 1,000.

The actinic ray-sensitive or radiation-sensitive resin composition (I) of the present invention may or may not contain the compound (N), but in the case of containing the compound (N), the content thereof is preferably from 0.1 to 20 mass %, more preferably from 0.1 to 10 mass %, based on the solid content of the actinic ray-sensitive or radiation-sensitive resin composition.

[5-2] (N') Basic Compound

The actinic ray-sensitive or radiation-sensitive resin composition (I) of the present invention may contain (N') a basic compound which is different from the compound (N) so as to reduce the change in performance with aging from exposure to heating.

Preferred examples of the basic compound (N') include a compound having a structure represented by the following formulae (A') to (E'):

(A')

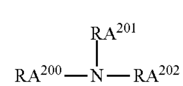

(B')

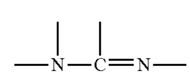

(C')

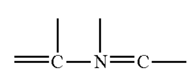

-continued (D′)

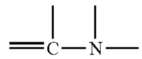

(E′)

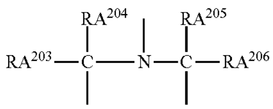

In formulae (A') and (E'), each of $RA^{200}$, $RA^{201}$ and $RA^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $RA^{201}$ and $RA^{202}$ may combine with each other to form a ring. Each of $RA^{203}$, $RA^{204}$, $RA^{205}$ and $RA^{206}$, which may be the same or different, represents an alkyl group (preferably having a carbon number of 1 to 20).

The alkyl group may have a substituent, and the alkyl group having a substituent is preferably an aminoalkyl group having a carbon number of 1 to 20, a hydroxyalkyl group having a carbon number of 1 to 20, or a cyanoalkyl group having a carbon number of 1 to 20.

The alkyl group in formulae (A') and (E') is more preferably unsubstituted.

Preferred examples of the basic compound (N') include guanidine, aminopyrrolidine, pyrazole, pyrazoline, piperazine, aminomorpholine, aminoalkylmorpholine, and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include a triarylsulfonium hydroxide, a phenacylsulfonium hydroxide, and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure becomes a carboxylate, and examples thereof include an acetate, an adamantane-1-carboxylate, and a perfluoroalkyl carboxylate. Examples of the compound having a trialkylamine structure include tri(n-butyl)amine and tri(n-octyl)amine Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Other preferred basic compounds include a phenoxy group-containing amine compound, a phenoxy group-containing ammonium salt compound, a sulfonic acid ester group-containing amine compound, and a sulfonic acid ester group-containing ammonium salt compound.

In the phenoxy group-containing amine compound, phenoxy group-containing ammonium salt compound, sulfonic acid ester group-containing amine compound and sulfonic acid ester group-containing ammonium salt compound, at least one alkyl group is preferably bonded to the nitrogen atom and also, the alkyl chain preferably contains an oxygen atom to form an oxyalkylene group. The number of oxyalkylene groups in the molecule is 1 or more, preferably from 3 to 9, more preferably from 4 to 6. Among oxyalkylene groups, those having a structure of $-CH_2CH_2O-$, $-CH(CH_3)CH_2O-$ or $-CH_2CH_2CH_2O-$ are preferred.

Specific examples of the phenoxy group-containing amine compound, phenoxy group-containing ammonium salt compound, sulfonic acid ester group-containing amine compound and sulfonic acid ester group-containing ammonium salt compound include, but are not limited to, Compounds (C1-1) to (C3-3) illustrated in paragraph [0066] of U.S. Patent Application Publication 2007/0224539.

A nitrogen-containing organic compound having a group capable of leaving by the action of an acid may be also used as a kind of the basic compound. Examples of this compound include a compound represented by the following formula (F). Incidentally, the compound represented by the following formula (F) exhibits an effective basicity in the system as a result of elimination of the group capable of leaving by the action of an acid.

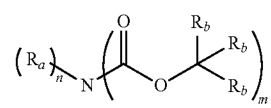

(F)

In formula (F), each Ra independently represents a hydrogen atom, an alkyl group, a cycloalkyl group, an aryl group, or an aralkyl group. Also, when n=2, two Ra's may be the same or different, and two Ra's may combine with each other to form a divalent heterocyclic hydrocarbon group (preferably having a carbon number of 20 or less) or a derivative thereof.

Each Rb independently represents a hydrogen atom, an alkyl group, a cycloalkyl group, an aryl group or an aralkyl group, provided that in —C(Rb)(Rb)(Rb), when one or more Rb's are a hydrogen atom, at least one of remaining Rb's is a cyclopropyl group or a 1-alkoxyalkyl group.

At least two Rb's may combine to form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In formula (F), each of the alkyl group, cycloalkyl group, aryl group and aralkyl group represented by Ra and Rb may be substituted with a functional group such as hydroxyl group, cyano group, amino group, pyrrolidino group, piperidino group, morpholino group and oxo group, an alkoxy group, or a halogen atom.

Examples of the alkyl group, cycloalkyl group, aryl group and aralkyl group (each of these alkyl group, cycloalkyl group, aryl group and aralkyl group may be substituted with the above-described functional group, an alkoxy group or a halogen atom) of R include:

a group derived from a linear or branched alkane such as methane, ethane, propane, butane, pentane, hexane, heptane, octane, nonane, decane, undecane and dodecane, or a group where the group derived from an alkane is substituted with one or more kinds of or one or more groups of cycloalkyl group such as cyclobutyl group, cyclopentyl group and cyclohexyl group;

a group derived from a cycloalkane such as cyclobutane, cyclopentane, cyclohexane, cycloheptane, cyclooctane, norbornane, adamantane and noradamantane, or a group where the group derived from a cycloalkane is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from an aromatic compound such as benzene, naphthalene and anthracene, or a group where the group derived from an aromatic compound is substituted with one or more kinds of or one or more groups of linear or branched alkyl group such as methyl group, ethyl group, n-propyl group, i-propyl group, n-butyl group, 2-methylpropyl group, 1-methylpropyl group and tert-butyl group;

a group derived from a heterocyclic compound such as pyrrolidine, piperidine, morpholine, tetrahydrofuran, tetrahydropyran, indole, indoline, quinoline, perhydroquinoline, indazole and benzimidazole, or a group where the group derived from a heterocyclic compound is substituted with one or more kinds of or one or more groups of linear or branched alkyl group or aromatic compound-derived group; a group where the group derived from a linear or branched alkane or the group derived from a cycloalkane is substituted with one or more kinds of or one or more groups of aromatic compound-derived group such as phenyl group, naphthyl group and anthracenyl group; and a group where the substituent above is substituted with a functional group such as hydroxyl group, cyano group, amino group, pyrrolidino group, piperidino group, morpholino group and oxo group.

Examples of the divalent heterocyclic hydrocarbon group (preferably having a carbon number of 1 to 20) formed by combining Ra's with each other or a derivative thereof include a group derived from a heterocyclic compound such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline and 1,5,9-triazacyclododecane, and a group where the group derived from a heterocyclic compound is substituted with one or more kinds of or one or more groups of linear or branched alkane-derived group, cycloalkane-derived group, aromatic compound-derived group, heterocyclic compound-derived group, and functional group such as hydroxyl group, cyano group, amino group, pyrrolidino group, piperidino group, morpholino group and oxo group.

Specific examples of the compound represented by formula (F) are illustrated below.

(D-1)

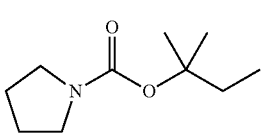

-continued (D-2)

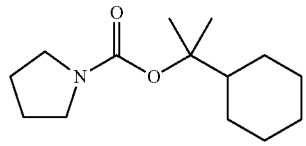

(D-3)

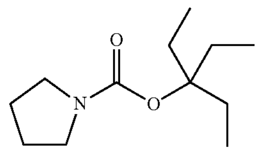

(D-4)

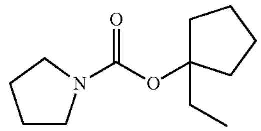

(D-5)

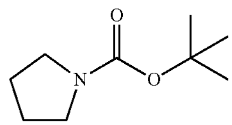

(D-6)

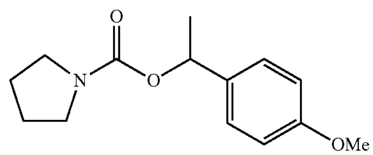

(D-7)

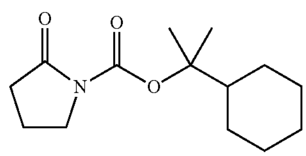

(D-8)

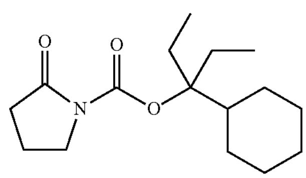

(D-9)

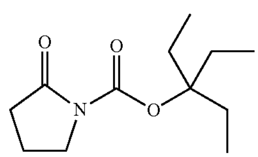

(D-10)

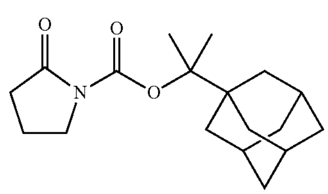

(D-11)

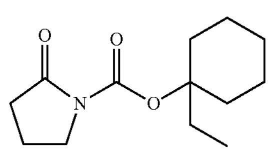

-continued
(D-12)
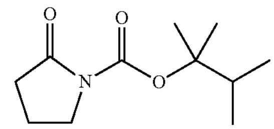
(D-13)
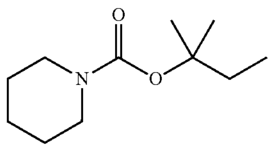
(D-14)
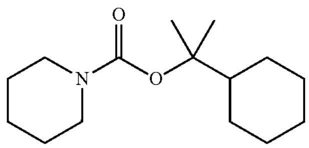
(D-15)
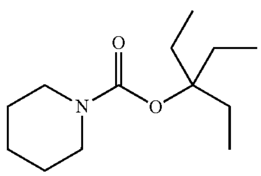
(D-16)
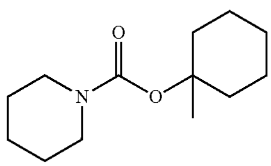
(D-17)
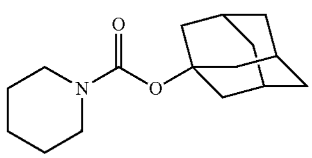
(D-18)
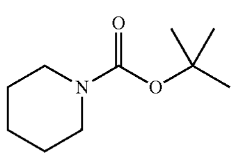
(D-19)
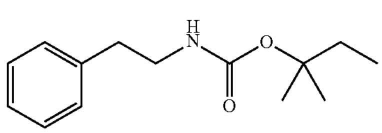
(D-20)
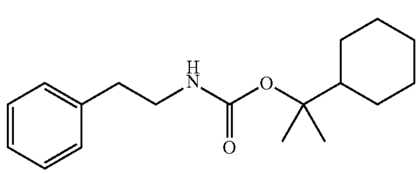
(D-21)
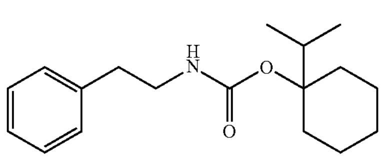
-continued
(D-22)
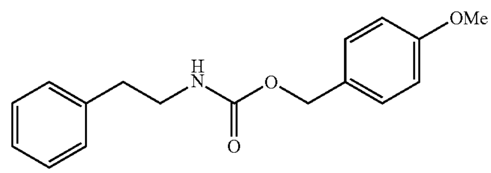
(D-23)
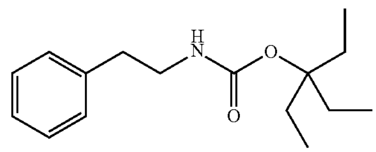
(D-24)
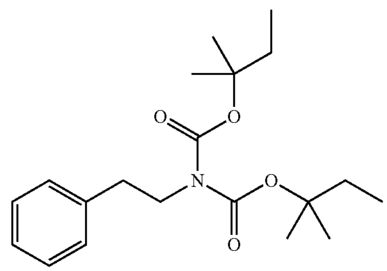
(D-25)
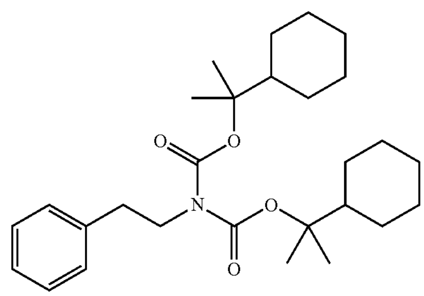
(D-26)
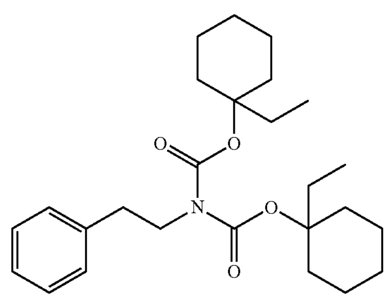
(D-27)
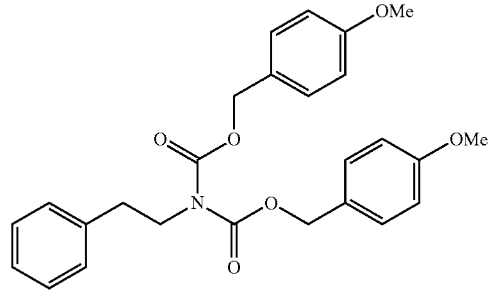

-continued
(D-28)
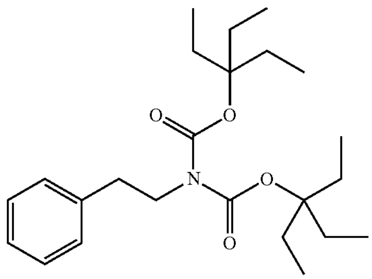
(D-29)
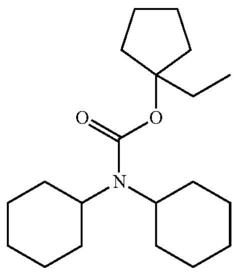
(D-30)
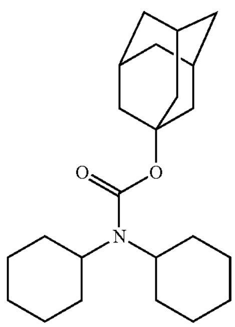
(D-31)
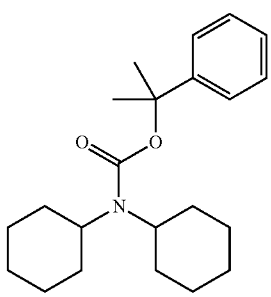
(D-32)
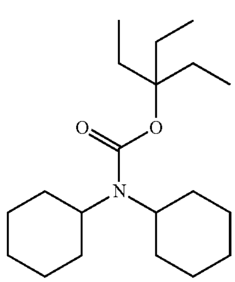
-continued
(D-33)
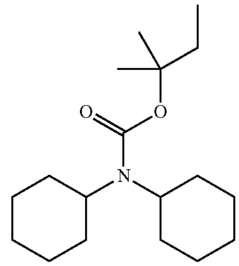
(D-34)
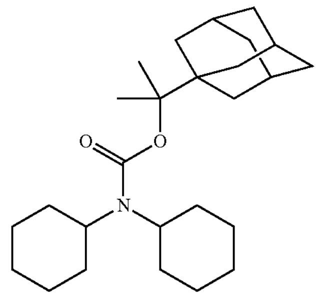
(D-35)
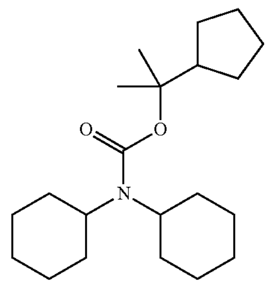
(D-36)
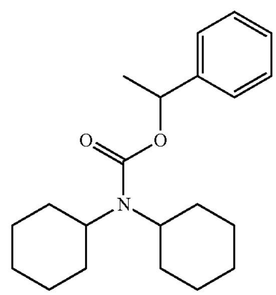
(D-37)
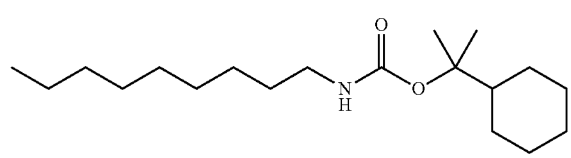
(D-38)
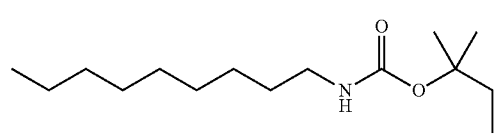
(D-39)
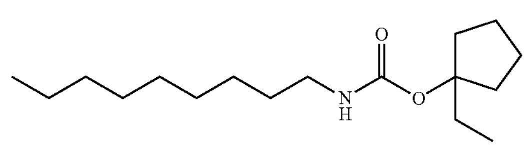

-continued
(D-40)
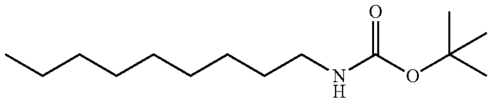
(D-41)
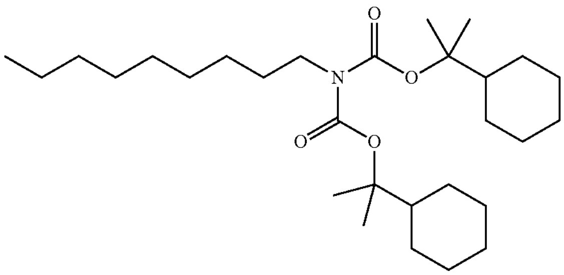
(D-42)
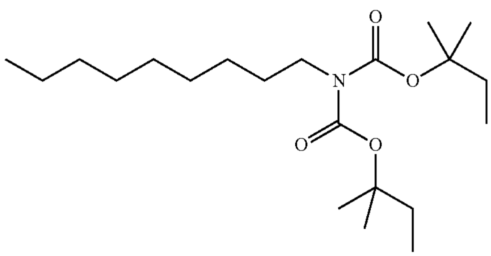
(D-43)
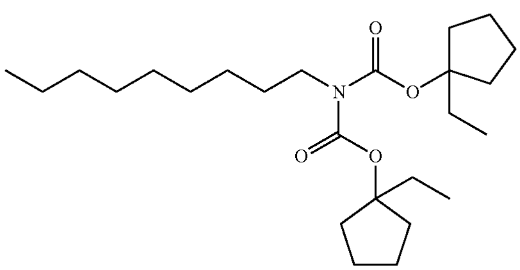
(D-44)
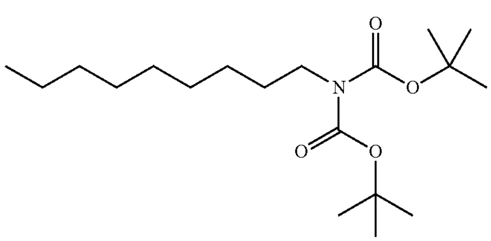
(D-45)
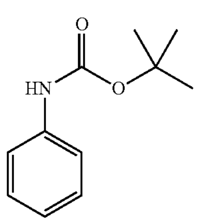
-continued
(D-46)
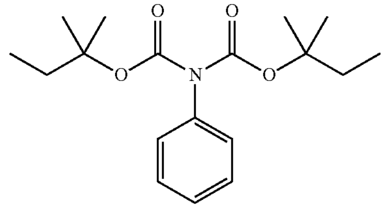
(D-47)
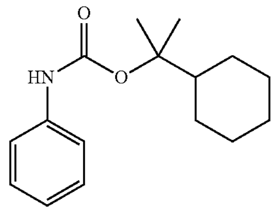
(D-48)
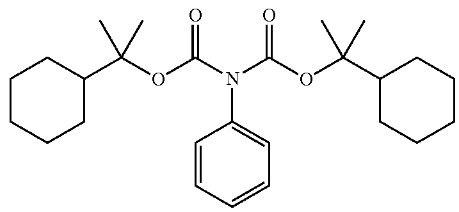
(D-49)
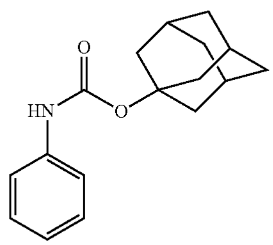
(D-50)
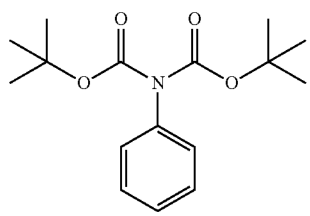
(D-51)
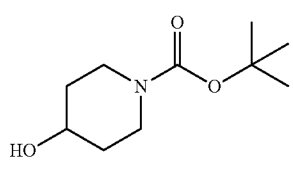
(D-52)
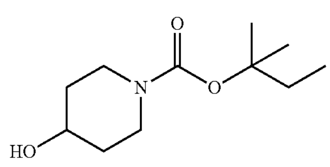
(D-53)
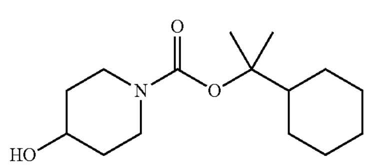

-continued (D-54)

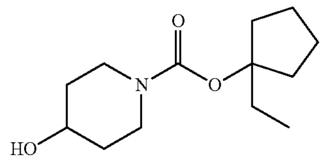

(D-55)

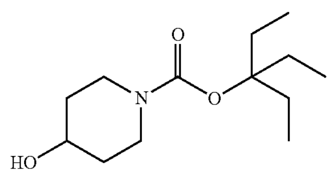

As for the compound represented by formula (F), a commercially available product may be used, or the compound may be synthesized from a commercially available amine by the method described, for example, in *Protective Groups in Organic Synthesis,* 4th edition. As a most general method, the compound can be synthesized in accordance with the method described, for example, in JP-A-2009-199021.

As the basic compound (N'), a compound having an amine oxide structure can also be used. Examples of such a compound include triethylamine N-oxide, pyridine N-oxide, tributylamine N-oxide, triethanolamine N-oxide, tris(methoxyethyl)amine N-oxide, tris(2-(methoxymethoxy)ethyl)amine N-oxide, 2,2',2"-nitrilotriethyl propionate N-oxide and N-2-(2-methoxyethoxy)methoxyethylmorpholine N-oxide. In addition, the amine oxide compounds recited in JP-A-2008-102383 are usable, too.

The molecular weight of the basic compound (N') is preferably from 250 to 2,000, more preferably from 400 to 1,000. In view of more reduction of LWR and uniformity of local pattern dimension, the molecular weight of the basic compound is preferably 400 or more, more preferably 500 or more, still more preferably 600 or more.

Such a basic compound (N') may be used in combination with the compound (N), and one basic compound may be used alone, or two or more basic compounds may be used in combination.

The actinic ray-sensitive or radiation-sensitive resin composition (I) of the present invention may or may not contain the basic compound (N'), but in the case of containing the basic compound, the amount used thereof is usually from 0.001 to 10 mass %, preferably from 0.01 to 5 mass %, based on the solid content of the actinic ray-sensitive or radiation-sensitive resin composition (I).

[6] (F) Surfactant

The actinic ray-sensitive or radiation-sensitive resin composition (I) of the present invention may or may not further contain a surfactant, but in the case of containing a surfactant, it is preferred to contain any one of fluorine-containing and/or silicon-containing surfactants (a fluorine-containing surfactant, a silicon-containing surfactant and a surfactant containing both a fluorine atom and a silicon atom), or two or more thereof.

By containing the surfactant, the actinic ray-sensitive or radiation-sensitive resin composition (I) of the present invention can give a resist pattern improved in the sensitivity, resolution and adherence and reduced in the development defect when an exposure light source of 250 nm or less, particularly 220 nm or less, is used.

The fluorine-containing and/or silicon-containing surfactants include the surfactants described in paragraph [0276] of U.S. Patent Application Publication No. 2008/0248425, and examples thereof include EFtop EF301 and EF303 (produced by Shin-Akita Kasei K. K.); Florad FC430, 431 and 4430 (produced by Sumitomo 3M Inc.); Megaface F171, F173, F176, F189, F113, F110, F177, F120 and R08 (produced by DIC Corp.); Surflon S-382, SC101, 102, 103, 104, 105 and 106, and KH-20 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, EF352, EF801, EF802 and EF601 (produced by JEMCO Inc.); PF636, PF656, PF6320 and PF6520 (produced by OMNOVA); and FTX-204G, 208G, 218G, 230G, 204D, 208D, 212D, 218D and 222D (produced by NEOS Co., Ltd.). In addition, Polysiloxane Polymer KP-341 (produced by Shin-Etsu Chemical Co., Ltd.) may be also used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

Examples of the surfactant coming under the surfactant above include Megaface F178, F-470, F-473, F-475, F-476 and F-472 (produced by DIC Corp.); a copolymer of a $C_6F_{13}$ group-containing acrylate (or methacrylate) with a (poly(oxyalkylene)) acrylate (or methacrylate); and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactants, described in paragraph [0280] of U.S. Patent Application Publication No. 2008/0248425 may be also used.

One of these surfactants may be used alone, or some of them may be used in combination.

In the case where the actinic ray-sensitive or radiation-sensitive resin composition (I) contains a surfactant, the amount of the surfactant used is preferably from 0.0001 to 2 mass %, more preferably from 0.0005 to 1 mass %, based on the total amount of the actinic ray-sensitive or radiation-sensitive resin composition (I) (excluding the solvent).

On the other hand, when the amount of the surfactant added is set to 10 ppm or less based on the total amount of the actinic ray-sensitive or radiation-sensitive resin composition (I) (excluding the solvent), the hydrophobic resin for use in the present invention is more unevenly distributed to the surface, so that the resist film surface can be made more hydrophobic and the followability of water at the immersion exposure can be more enhanced.

[7] (G) Other Additives

The actinic ray-sensitive or radiation-sensitive resin composition (I) of the present invention may or may not contain an onium carboxylate. Examples of the onium carboxylate include those described in paragraphs [0605] to [0606] of U.S. Patent Application Publication No. 2008/0187860.

Such an onium carboxylate can be synthesized by reacting a sulfonium hydroxide, iodonium hydroxide or ammonium hydroxide and a carboxylic acid with silver oxide in an appropriate solvent.

In the case where the actinic ray-sensitive or radiation-sensitive resin composition (I) contains an onium carboxylate, the content thereof is generally from 0.1 to 20 mass %, preferably from 0.5 to 10 mass %, more preferably from 1 to 7 mass %, based on the total solid content of the composition.

The actinic ray-sensitive or radiation-sensitive resin composition (I) of the present invention may further contain, for example, an acid-increasing agent illustrated later in the composition (II), a dye, a plasticizer, a photosensitizer, a light absorber, an alkali-soluble resin, a dissolution inhibitor, and a compound for accelerating dissolution in a developer (for example, a phenol compound having a molecular weight of 1,000 or less, or a carboxyl group-containing alicyclic or aliphatic compound), if desired.

The phenol compound having a molecular weight of 1,000 or less can be easily synthesized by one skilled in the art by referring to the method described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid, and a cyclohexanedicarboxylic acid.

From the standpoint of enhancing the resolution, the actinic ray-sensitive or radiation-sensitive resin composition (I) of the present invention is preferably used in a film thickness of 30 to 250 nm, more preferably from 30 to 200 nm. Such a film thickness can be achieved by setting the solid content concentration in the composition to an appropriate range, thereby imparting an appropriate viscosity and enhancing the coatability and film-forming property.

The solid content concentration of the actinic ray-sensitive or radiation-sensitive resin composition (I) of the present invention is usually from 1.0 to 10 mass %, preferably from 2.0 to 5.7 mass %, more preferably from 2.0 to 5.3 mass %. By setting the solid content concentration to the range above, the resist solution can be uniformly coated on a substrate and furthermore, a resist pattern improved in the line width roughness can be formed. The reason therefor is not clearly known, but it is considered that thanks to a solid content concentration of 10 mass % or less, preferably 5.7 mass % or less, aggregation of materials, particularly, a photoacid generator, in the resist solution is suppressed, as a result, a uniform resist film can be formed.

The solid content concentration is a weight percentage of the weight of resist components excluding the solvent, based on the total weight of the actinic ray-sensitive or radiation-sensitive resin composition (I).

The actinic ray-sensitive or radiation-sensitive resin composition (I) of the present invention is used by dissolving the components above in a predetermined organic solvent, preferably in the above-described mixed solvent, filtering the solution through a filter, and coating the filtrate on a predetermined support (substrate). The filter used for filtration is preferably a polytetrafluoroethylene-, polyethylene- or nylon-made filter having a pore size of 0.1 μM or less, more preferably 0.05 μm or less, still more preferably 0.03 μm or less. In the filtration through a filter, as described, for example, in JP-A-2002-62667, circulating filtration may be performed, or the filtration may be performed by connecting a plurality of kinds of filters in series or in parallel. Also, the composition may be filtered a plurality of times. Furthermore, a deaeration treatment or the like may be applied to the composition before and after filtration through a filter.

<Composition (II)>

Next the composition (II) used in the pattern forming method of the present invention is illustrated below.

[8] (A') Compound Capable of Increasing Polarity by an Action of an Acid to Decrease Solubility in an Organic Solvent-Containing Remover The compound (A') which is incorporated in the composition (II) and can increase polarity by an action of an acid to decrease solubility in an organic solvent-containing remover, though may be a resin or a low-molecular compound, is typically a compound having a group capable of decomposing by the action of an acid to produce a polar group (an acid-decomposable group).

Examples and preferred examples of the acid-decomposable group, those of the polar group, and those of a group capable of decomposing and leaving by the action of an acid are the same as their respective ones recited in the illustration of the resin (A) in the actinic ray-sensitive or radiation-sensitive resin composition (I).

In addition, when the compound (A') is a resin, the compound (A') in resin form can contain various ones of the repeating units described in the illustration of the resin (A), and ranges of preferred contents of such repeating units relative to all repeating units of the resin (A) are also the same as those in the illustration of the resin (A) in the actinic ray-sensitive or radiation-sensitive resin composition (I).

Further, the compound (A') as the resin may contain a repeating unit represented by the following formula (I).

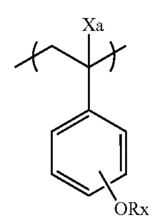

(I)

In formula (I), Xa represents a hydrogen atom, or a linear or branched alkyl group.

Rx represents a hydrogen atom or a group capable of decomposing and leaving by the action of an acid.

The linear or branched alkyl group as for Xa may have a substituent, and it is preferably a linear or branched alkyl group having a carbon number of 1 to 4, and examples include a methyl group, an ethyl group, an n-propyl group, an isopropyl group, an n-butyl group, an isobutyl group and a t-butyl group. Examples of the substituent include a hydroxyl group and halogen atoms (e.g. fluorine atom).

Xa is preferably a hydrogen atom, a methyl group, a trifluoromethyl group or a hydroxymethyl group.

Examples and preferred examples of the group capable of decomposing and leaving by the action of an acid as for Rx include the same ones as recited as examples and preferred examples of the group protecting a polar group constituting the acid-decomposable group in the resin (A) and capable of decomposing and leaving by the action of an acid.

From the viewpoint of not only allowing a sufficient reduction of solubility in an organic developer in an area of the second film formed on the resist pattern, in which the area is an area where the compound (A')'s polarity-increasing reaction has progressed but also allowing a sufficient retention of the solubility in an area of the second film in which the area is an area where the compound (A') has not yet undergone reaction with the acid generated from the compound (B), thereby enhancing solution contrast, the content of the repeating unit represented by formula (I) in the compound (A') as the resin for use in the present invention (the total content in a case where a plurality of repeating units of formula (I) are incorporated) is preferably 10 mol % or less, more preferably 5 mol % or less, ideally 0 mol %, based on all repeating units of the compound (A') as the resin. In other words, the absence of such a repeating unit is particularly preferred. When the repeating unit represented by formula (I) is present in a proportion of 20 mol % or more with respect to all repeating units of the compound (A') as the resin, the compound (A') has too high solubility in an organic solvent, and there develops a tendency to lessen the effect of effectively reducing trench dimension or hole dimension.

In addition, the compound (A') as the resin may contain a repeating unit having an aromatic group, except for the repeating unit represented by formula (I). The aromatic group the repeating unit has is preferably a non-phenolic aromatic group.

Here, the term non-phenolic aromatic group refers to an aromatic group which is not an aromatic group having a phenolic hydroxyl group or an aromatic group having a group derived from a phenolic hydroxyl group (e.g. a group whose phenolic hydroxyl group is protected by a group capable of decomposing and leaving by the action of an acid), such as a group containing the repeating unit represented by formula (I).

The non-phenolic aromatic group may have a substituent, and preferably an aryl group having a carbon number of 6 to 10, and examples include a phenyl group and a naphthyl group.

The substituent has no particular restriction so long as it is not a phenolic hydroxyl group, and examples include a linear or branched alkyl group having a carbon number of 1 to 4, a cycloalkyl group having a carbon number of 3 to 10, an aryl group having a carbon number of 6 to 10, a halogen atom such as a fluorine atom, a cyano group, an amino group, a nitro group and a carboxyl group. The linear or branched alkyl group having a carbon number of 1 to 4, the cycloalkyl group having a carbon number of 3 to 10 and the aryl group having a carbon number of 6 to 10 as the substituent may further have a substituent. Such a further substituent may be a halogen atom such as a fluorine atom.

When the non-phenolic aromatic group is a phenyl group and the phenyl group has a substituent, the substituent is preferably situated at the 4-position of the phenyl group.

In point of etching resistance, the non-phenolic aromatic group is preferably a phenyl group which may have a substituent.

The repeating unit having an aromatic group, other than the repeating unit represented by formula (I), is preferably a repeating unit represented by the following formula (II).

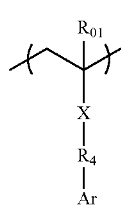

(II)

In formula (II), $R_{01}$ represents a hydrogen atom or a linear or branched alkyl group, X represents a single bond or a divalent linking group, Ar represents an aromatic group, and $R_4$ represents a single bond or an alkylene group.

Examples and preferred examples of the linear or branched alkyl group relating to $R_{01}$ include the same groups as those recited as examples and preferred examples of the linear or branched alkyl group relating to $R_0$ in formula (III).

X is preferably a divalent linking group, and the divalent linking group is preferably —COO—, —CONH— or the like.

Examples and preferred example of the aromatic group Ar are preferably a non-phenolic aromatic group, and examples of these groups include the same groups as those recited above.

The alkylene group as for $R_4$ may have a substituent, and it is preferably an alkylene group having a carbon number of 1 to 4, and examples include a methylene group, an ethylene group and a propylene group. Examples of a substituent which the alkylene group as for $R_4$ may have include an alkyl group having a carbon number of 1 to 4 and a halogen atom such as a fluorine atom.

The substituent which the alkylene group as for $R_4$ may have may combine with the substituent which the non-phenolic aromatic group Ar may have, thereby to form a ring. Examples of the group forming the ring include an alkylene group (such as an ethylene group and a propylene group).

From the viewpoint of a suitable glass transition temperature (Tg) of the resin in pattern formation, $R_4$ is preferably a single bond or a methylene group which may be substituted with a substituent.

From the viewpoint of allowing not only a sufficient reduction of solubility in an organic developer in an area of the second film formed on the resist pattern, in which the area is an area where the compound (A')'s polarity-increasing reaction has progressed, but also a sufficient retention of the solubility in an area of the second film in which the area is an area where the compound (A') has not yet undergone reaction with the acid generated from the compound (B), thereby enhancing solution contrast, and moreover from the viewpoint of giving etching resistance, the content of a repeating unit represented by formula (II) (the total content in a case where a plurality of repeating units of formula (II) are incorporated) is preferably from 10 mol % to 70 mol %, far preferably from 20 mol % to 60 mol %, particularly preferably from 30 mol % to 50 mol %, based on all repeating units of the compound (A') as the resin.

Suitable range of the weight-average molecular weight and polydispersity of the compound (A') as the resin, determined by GPC (the values calculated in terms of polystyrene), are the same as those presented in the description of the resin (A) in the actinic ray-sensitive or radiation-sensitive resin composition (I).

It is preferable that the compound (A') in resin form is similar to the resin (A). To be concrete, when the solubility parameter of the compound (A') is symbolized as SP(A') and the solubility parameter of the resin (A) is symbolized as SP(A), it is preferred that the expression $|SP(A')-SP(A)|\leq 5$ [$MPa^{1/2}$] is satisfied, it is more preferred that $|SP(A')-SP(A)|\leq 3$ [$MPa^{1/2}$] is satisfied, and it is further preferred that $|SP(A')-SP(A)|\leq 1$ [$MPa^{1/2}$] is satisfied.

Additionally, the solubility parameter mentioned in the present invention is the solubility parameter estimated by the Okitsu Method (*Journal of the Adhesion Society of Japan*, vol. 29, No. 5 (1993); *Adhesion,* 246, Vol. 38(6) (1994)), and it is calculated by adding up molar attraction constants (F) of various atomic groups (structural units) constituting a resin or a compound and dividing the added-up value by resin's or compound's molar volume (V).

Contribution of Each Structural Unit to Solubility Parameter

| Structural Unit | Molar Attraction Constant (F) | Molar Volume (V) |
|---|---|---|
| $CH_3$ | 205 | 31.8 |
| $CH_2$ | 132 | 16.5 |
| CH | 28.6 | −1 |
| CH (polymer) | 28.6 | 1.9 |
| C | −81.7 | −14.8 |
| C (polymer) | −81.7 | −19.2 |
| COO | 353 | 19.6 |
| COO (polymer) | 330 | 22 |
| OH (polymer) | 282 | 17 |
| 5-Membered ring | 110 | 16 |
| 6-Membered ring | 100 | 12 |
| CN (polymer) | 420 | 27 |
| COOH | 373 | 24.4 |

The solubility parameter can be estimated by means of the following expression wherein the value obtained by adding up molar attraction constant (F) of each structural unit as listed in the above table is divided by the value obtained by adding up molar volume (V).

$$\text{Solubility parameter(SP value)}=2.04549\times\Sigma F/\Sigma V\ [(\text{MPa})^{1/2}]$$

As an example, the case (Case 1) of estimating the SP value of the following repeating unit is explained.

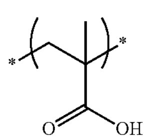

Because the repeating unit contains:

$CH_3$: one $CH_2$: one

C (polymer): one

COOH: one, the added-up values are as follows.

$$\Sigma F=205+132-81.7+373=628.3$$

$$\Sigma V=31.8+16.5-19.2+24.4=53.5$$

Thus the SP value is estimated as follows:

$$\text{SP value}=2.04549\times628.3/53.5=24.02[(\text{MPa})^{1/2}]$$

Next, as an example of estimating the SP value of a resin, the case (Case 2) of estimating the SP value of the resin represented by the following formula (wherein the ratio of repeating units is expressed on a molar ratio basis) is illustrated.

In estimating the SP value of the resin, ΣF and ΣV values of repeating unit are calculated first, and then each of the ΣF and ΣV values is multiplied by the molar ratio of the corresponding repeating unit, and further the thus multiplied ΣF values of all repeating units in the resin are added up and the thus multiplied ΣV values of all repeating units in the resin are also added up, and thereby the ΣF and ΣV values of the resin are obtained.

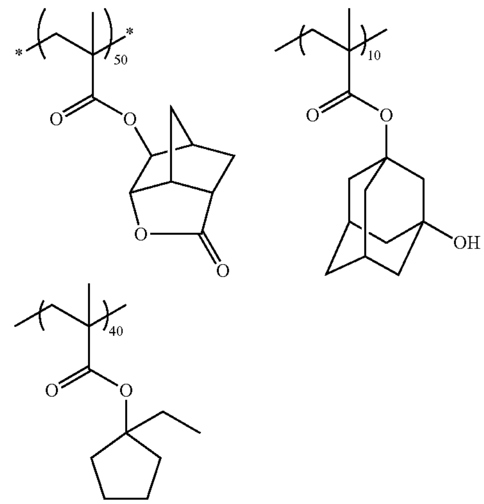

Thus the SP value is estimated as follows:

$$\text{SP value}=2.04549\times(1652.3\times0.5+1853.1\times0.1+1478.6\times0.4)/(163.6\times0.5+168.5\times0.1+162.2\times0.4)=20.05\ [(\text{MPa})^{1/2}]$$

It is more preferred that the compound (A') as the resin is same as the resin (A).

On the other hand, when the compound (A') is a low-molecular compound, the compound (A') as a low-molecular compound (hereinafter referred simply to as "low-molecular compound (A') in some cases) is typically a non-polymeric compound having an acid-decomposable group.

The molecular weight of the low-molecular compound (A') is preferably from 500 to 5,000, far preferably from 600 to 4,000, particularly preferably from 700 to 3,000.

The term "non-polymeric" represents that it is different from a high-molecular compound having a repeating unit formed by polymerization of a monomer.

To be more specific, the non-polymeric compound is not a compound referred to as a polymer or an oligomer produced by cleaving the unsaturated bond of a compound (monomer) while using an initiator and making linkages grow by chain reaction, but it is preferably a compound having a definite molecular weight in the foregoing range (a compound having no molecular-weight distribution in a substantial sense).

For instance, a cyclic compound definite in molecular weight which is formed by condensation reaction is included in the "non-polymeric" compound, and an oligomer ranging in number-average molecular weight from 500 to 5,000 is not included in the "non-polymeric" compound.

The low-molecular compound (A') preferably has an aromatic ring. The aromatic ring is preferably an aromatic ring having a carbon number of 6 to 20, and examples include a monocyclic aromatic ring, such as a benzene ring, and a condensed polycyclic aromatic ring, such as a naphthalene ring and an anthracene ring. The aromatic ring is preferably a monocyclic aromatic ring, and more preferably a benzene ring.

The number of the aromatic ring contained in the low-molecular compound (A') is preferably from 2 to 10, more preferably from 2 to 6, further preferably from 3 to 5.

The low-molecular compound (A') is not limited to particular one, but preferably a compound represented by the following formula (1), a fullerene derivative, a polynuclear phenol derivative or the like, more preferably a compound represented by formula (1).

(1)

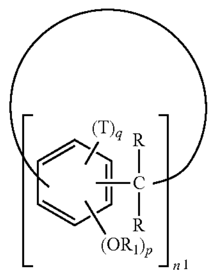

In formula (1), each R independently represents a hydrogen atom or a substituent, and each R in the compound represented by formula (1) may be the same as or different from every other R.

$OR_1$ represents a hydroxyl group or a group having a structure capable of decomposing by the action of an acid to produce a polar group, and each $OR_1$ in the compound represented by formula (1) may be same as or different from every other $OR_1$. However, at least one of the plurality of $OR_1$s and the plurality of Rs is a group having a structure capable of decomposing by the action of an acid to produce a polar group.

T represents a hydrogen atom or a substituent, and when a plurality of Ts are present, each T may be the same as or different from every other T.

p represents an integer of 1 to 4.

q represents an integer represented by (4-p).

n1 represents an integer of 3 or more.

n1 ps may be the same value or different values.

n1 qs may be the same value or different values.

In the case where $OR_1$ represents a hydroxyl group, $R_1$ represents a hydrogen atom.

In the case where $OR_1$ represents a group having a structure capable of decomposing by the action of an acid to produce a polar group (hereinafter, sometimes referred to as "acid-decomposable structure"), the acid-decomposable structure preferably has a structure where a polar group is protected by a group capable of leaving by the action of an acid.

The polar group is not particularly limited as long as it is a group capable of being sparingly solubilized or insolubilized in an organic solvent-containing developer, but examples thereof include a phenolic hydroxyl group, an acidic group (a group capable of dissociating in an aqueous 2.38 mass % tetramethylammonium hydroxide solution which has been conventionally used as the developer for a resist) such as carboxyl group, fluorinated alcohol group (preferably hexafluoroisopropanol group), sulfonic acid group, sulfonamide group, sulfonylimide group, (alkylsulfonyl)(alkylcarbonyl)methylene group, (alkylsulfonyl)(alkylcarbonyl)imide group, bis(alkylcarbonyl)methylene group, bis(alkylcarbonyl)imide group, bis(alkylsulfonyl)methylene group, bis(alkylsulfonyl)imide group, tris(alkylcarbonyl)methylene group and tris(alkylsulfonyl)methylene group, and an alcoholic hydroxyl group.

The alcoholic hydroxyl group is a hydroxyl group bonded to a hydrocarbon group and indicates a hydroxyl group except for a hydroxyl group directly bonded on an aromatic ring (phenolic hydroxyl group), and an aliphatic alcohol substituted with an electron-withdrawing group such as fluorine atom at the α-position (for example, a fluorinated alcohol group (e.g., hexafluoroisopropanol)) is excluded from the hydroxyl group. The alcoholic hydroxyl group is preferably a hydroxyl group having a pKa of 12 to 20.

Preferred polar groups include a carboxyl group, a fluorinated alcohol group (preferably hexafluoroisopropanol group), and a sulfonic acid group.

$R_1$ can be appropriately selected from those proposed for a hydroxystyrene-based resin, a (meth)acrylic resin and the like used in a chemical amplification resist composition for KrF or ArF, and examples thereof include a substituted methyl group, a 1-substituted ethyl group, a 1-substituted-n-propyl group, a 1-branched alkyl group, a silyl group, an acyl group, a 1-substituted alkoxymethyl group, a cyclic ether group, an alkoxycarbonyl group, and an alkoxycarbonylalkyl group.

Here, $R_1$ includes:

(a) a group capable of leaving from the oxygen atom in "$OR_1$" by the action of an acid to convert $OR_1$ into OH (that is, a phenolic hydroxyl group as the polar group) (hereinafter, sometimes referred to as "group (a)"), and (b) a group having a structure capable of producing a polar group without allowing an atom in $R_{1c}$ which is bonded to the oxygen atom of "$OR_1$", to leave from the oxygen atom of "$OR_1$" by the action of an acid (hereinafter, sometimes referred to as "group (b)").

$R_1$ as the group (a) is a group capable of leaving by the action of an acid and is preferably a substituted methyl group, a 1-substituted ethyl group, a 1-substituted-n-propyl group, a 1-branched alkyl group, a silyl group, an acyl group, a 1-substituted alkoxymethyl group, a cyclic ether group or an alkoxycarbonyl group.

$R_1$ as the group (b) is preferably an alkoxycarbonylalkyl group. In this case, the alkoxycarbonylalkyl group as $R_1$ generates a carboxyl group as the polar group by the action of an acid.

Incidentally, $R_1$ is preferably free from a crosslinking functional group (more specifically, a crosslinking functional group capable of crosslinking with another compound represented by formula (1) by the action of an acid).

The substituted methyl group is preferably a substituted methyl group having a carbon number of 2 to 20, more preferably a substituted methyl group having a carbon number of 4 to 18, still more preferably a substituted methyl group having a carbon number of 6 to 16. Examples thereof include a methoxymethyl group, a methylthiomethyl group, an ethoxymethyl group, an n-propoxymethyl group, an isopropoxymethyl group, an n-butoxymethyl group, a tert-butoxymethyl group, a 2-methylpropoxymethyl group, an ethyithiomethyl group, a methoxyethoxymethyl group, a phenylmethyl group, a phenyloxymethyl group, a 1-cyclopentyloxymethyl group, a 1-cyclohexyloxymethyl group, a benzylthiomethyl group, a phenacyl group, a 4-bromophenacyl group, a 4-methoxyphenacyl group, a piperonyl group, and groups represented by the following structure group (9).

(9)

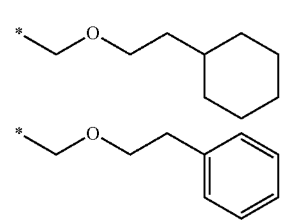

-continued
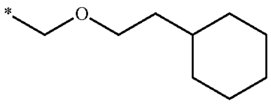
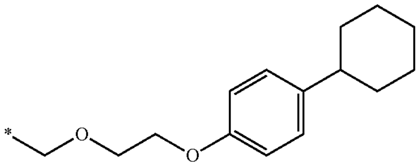
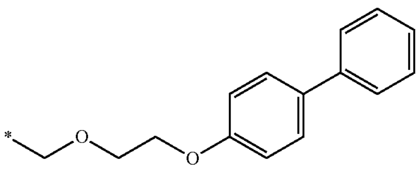
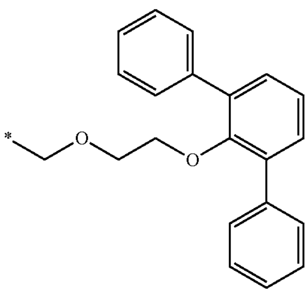
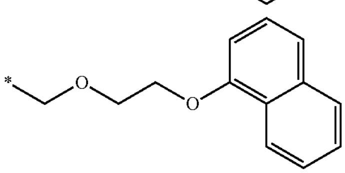
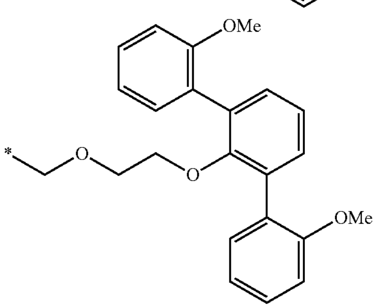
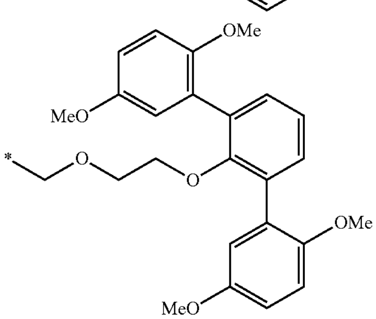
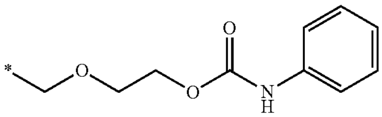
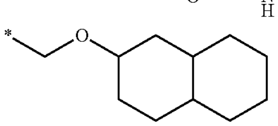
-continued
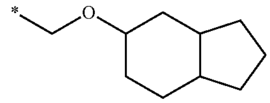
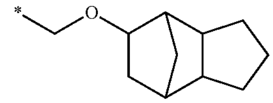
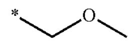
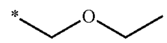
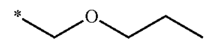
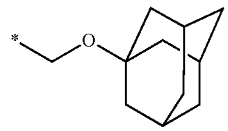
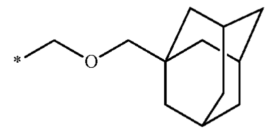
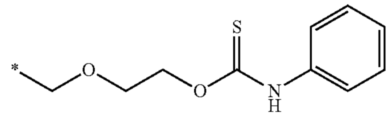
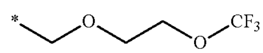
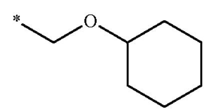
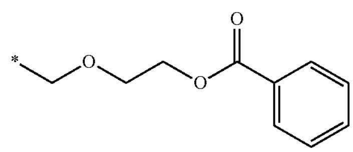
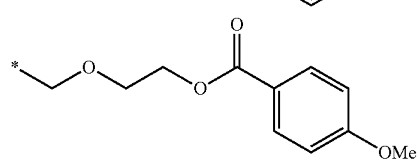
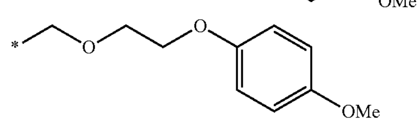
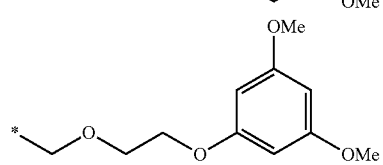
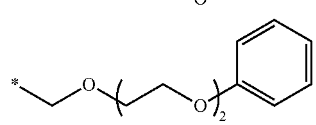
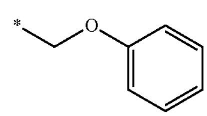
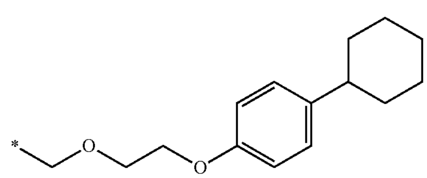
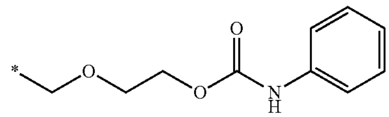
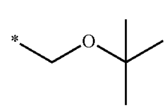
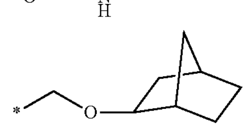

-continued

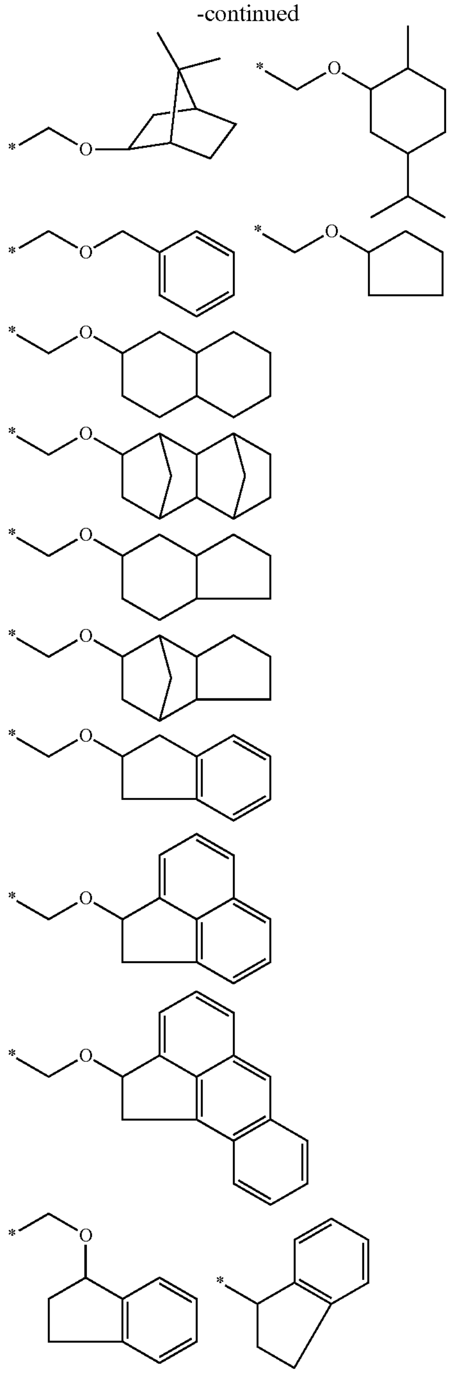

The 1-substituted ethyl group is preferably a 1-substituted ethyl group having a carbon number of 3 to 20, more preferably a 1-substituted ethyl group having a carbon number of 5 to 18, still more preferably a substituted ethyl group having a carbon number of 7 to 16. Examples thereof include a 1-methoxyethyl group, a 1-methylthioethyl group, a 1,1-dimethoxyethyl group, a 1-ethoxyethyl group, a 1-ethylthioethyl group, a 1,1-diethoxyethyl group, an n-propoxyethyl group, an isopropoxyethyl group, an n-butoxyethyl group, a tert-butoxyethyl group, a 2-methylpropoxyethyl group, a 1-phenoxyethyl group, a 1-phenylthioethyl group, a 1,1-diphenoxyethyl group, a 1-cyclopentyloxyethyl group, a 1-cyclohexyloxyethyl group, a 1-phenylethyl group, a 1,1-diphenylethyl group, and groups represented by the following structure group (10).

(10)

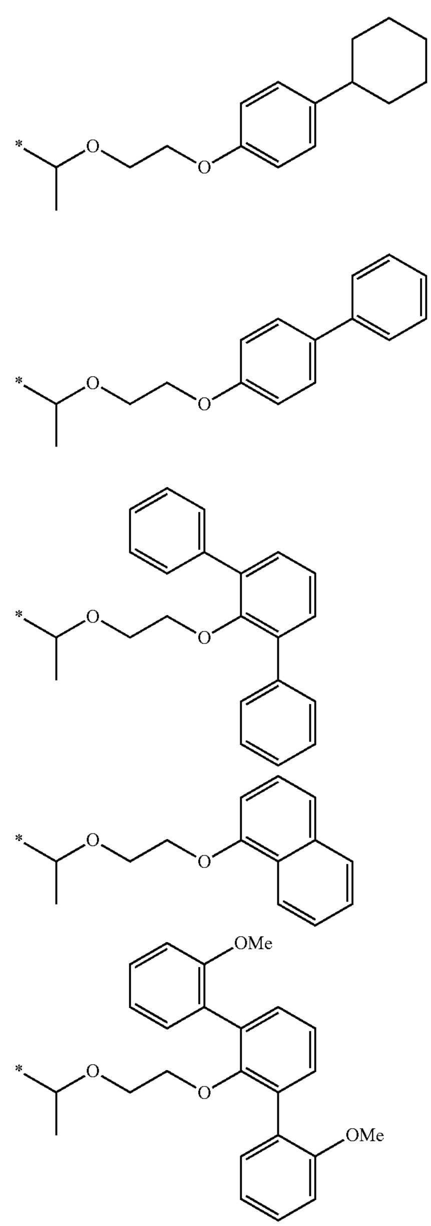

-continued
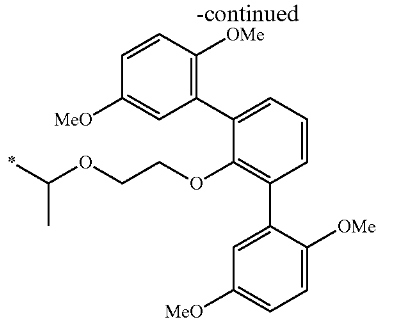
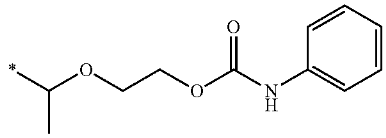
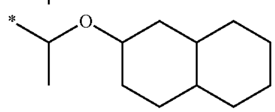
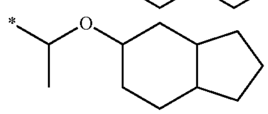
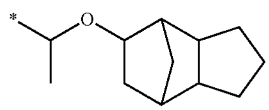
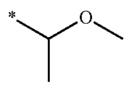
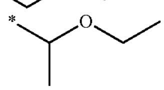
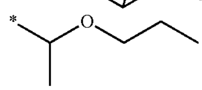
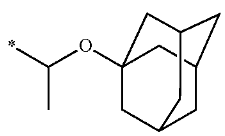
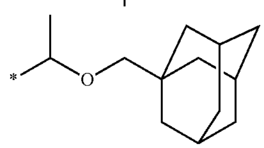
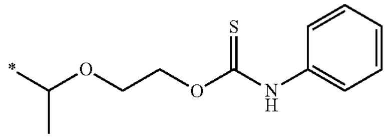
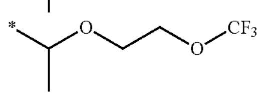
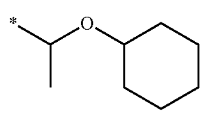
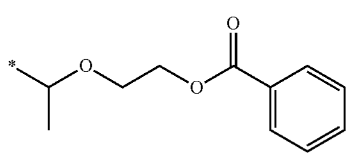
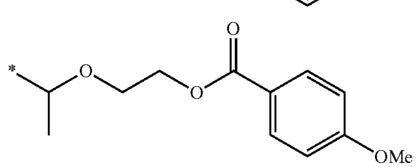
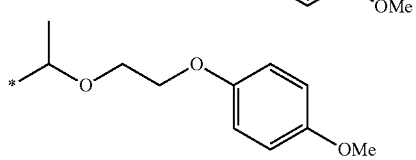
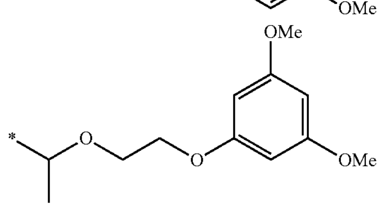
-continued
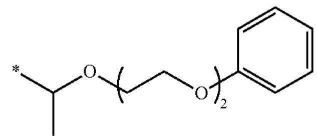
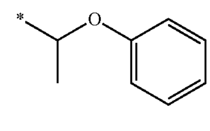
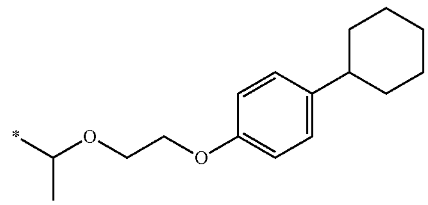
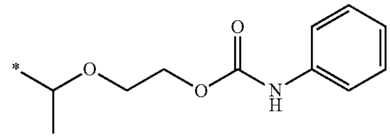
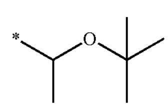
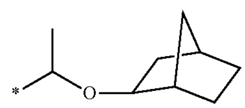
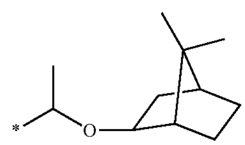
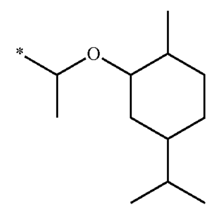
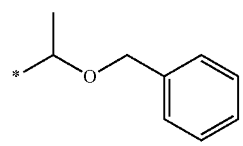
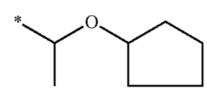
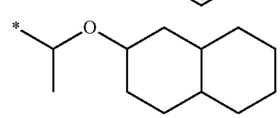
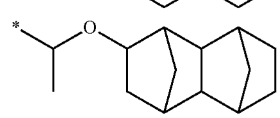
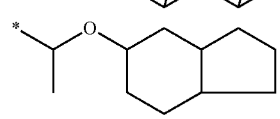
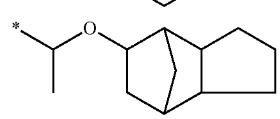
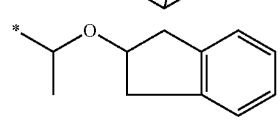
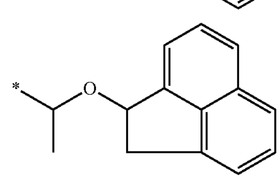

-continued

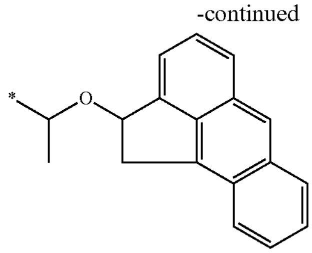

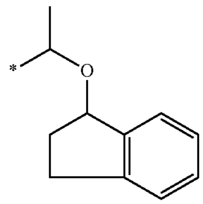

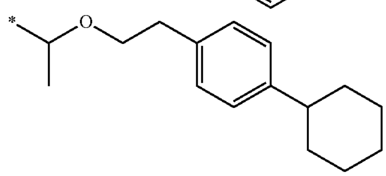

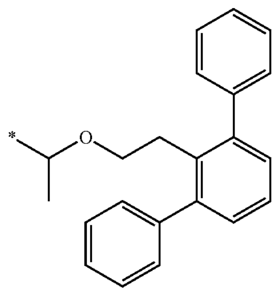

The 1-substituted-n-propyl group is preferably a 1-substituted-n-propyl group having a carbon number of 4 to 20, more preferably a 1-substituted-n-propyl group having a carbon number of 6 to 18, still more preferably a 1-substituted-n-propyl group having a carbon number of 8 to 16. Examples thereof include a 1-methoxy-n-propyl group and a 1-ethoxy-n-propyl group.

The 1-branched alkyl group is preferably a 1-branched alkyl group having a carbon number of 3 to 20, more preferably a 1-branched alkyl group having a carbon number of 5 to 18, still more preferably a branched alkyl group having a carbon number of 7 to 16. Examples thereof include an isopropyl group, a sec-butyl group, a tert-butyl group, a 1,1-dimethylpropyl group, a 1-methylbutyl group, a 1,1-dimethylbutyl group, a 2-methyladamantyl group, and a 2-ethyladamantyl group.

The silyl group is preferably a silyl group having a carbon number of 1 to 20, more preferably a silyl group having a carbon number of 3 to 18, still more preferably a silyl group having a carbon number of 5 to 16. Examples thereof include a trimethylsilyl group, an ethyldimethylsilyl group, a methyldiethylsilyl group, a triethylsilyl group, a tert-butyldimethylsilyl group, a tert-butyldiethylsilyl group, a tert-butyldiphenylsilyl group, a tri-tert-butylsilyl group, and a triphenylsilyl group.

The acyl group is preferably an acyl group having a carbon number of 2 to 20, more preferably an acyl group having a carbon number of 4 to 18, still more preferably an acyl group having a carbon number of 6 to 16. Examples thereof include an acetyl group, a phenoxyacetyl group, a propionyl group, a butyryl group, a heptanoyl group, a hexanoyl group, a valeryl group, a pivaloyl group, an isovaleryl group, a lauroyl group, an adamantylcarbonyl group, a benzoyl group, and a naphthoyl group.

The 1-substituted alkoxymethyl group is preferably a 1-substituted alkoxymethyl group having a carbon number of 2 to 20, more preferably a 1-substituted alkoxymethyl group having a carbon number of 4 to 18, still more preferably a 1-substituted alkoxymethyl group having a carbon number of 6 to 16. Examples thereof include a 1-cyclopentylmethoxymethyl group, a 1-cyclopentylethoxymethyl group, a 1-cyclohexylmethoxymethyl group, a 1-cyclohexylethoxymethyl group, a 1-cyclooctylmethoxymethyl group, and a 1-adamantylmethoxymethyl group.

The cyclic ether group is preferably a cyclic ether group having a carbon number of 2 to 20, more preferably a cyclic ether group having a carbon number of 4 to 18, still more preferably a cyclic ether group having a carbon number of 6 to 16. Examples thereof include a tetrahydropyranyl group, a tetrahydrofuranyl group, a tetrahydrothiopyranyl group, a tetrahydrothiofuranyl group, a 4-methoxytetrahydropyranyl group, and a 4-methoxytetrahydrothiopyranyl group.

The alkoxycarbonyl group is preferably an alkoxycarbonyl group having a carbon number of 2 to 20, more preferably an alkoxycarbonyl group having a carbon number of 4 to 18, still more preferably an alkoxycarbonyl group having a carbon number of 6 to 16. Examples thereof include a methoxycarbonyl group, an ethoxycarbonyl group, an n-propoxycarbonyl group, an isopropoxycarbonyl group, an n-butoxycarbonyl group, a tert-butoxycarbonyl group, a tert-amyloxycarbonyl group, and groups represented by the following structure group (11) where n=0.

The alkoxycarbonylalkyl group is preferably an alkoxycarbonylalkyl group having a carbon number of 3 to 20, more preferably an alkoxycarbonylalkyl group having a carbon number of 4 to 18, still more preferably an alkoxycarbonylalkyl group having a carbon number of 6 to 16. Examples thereof include a methoxycarbonylmethyl group, an ethoxycarbonylmethyl group, an n-propoxycarbonylmethyl group, an isopropoxycarbonylmethyl group, an n-butoxycarbonylmethyl group, and groups represented by the following structure group (11) where n=1 to 4.

(11)

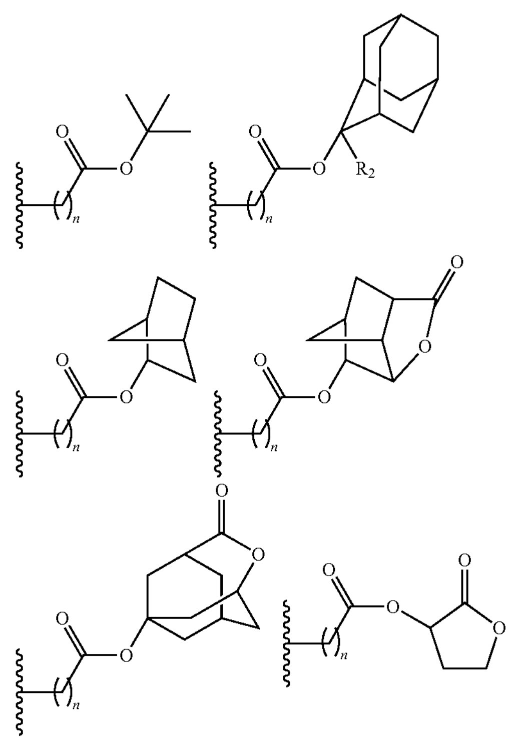

-continued

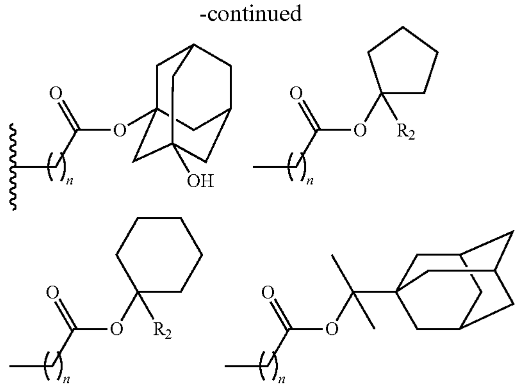

In the structure group (11), $R_2$ is a hydrogen atom or a linear or branched alkyl group having a carbon number of 1 to 4, and n is an integer of 0 to 4.

Each of the groups as $R_1$ may further have a substituent, and the substituent is not particularly limited, but examples thereof are the same as those described later for the substituent represented by T.

$R_1$ is preferably a substituted methyl group, a 1-substituted ethyl group, a 1-substituted alkoxymethyl group, a cyclic ether group, an alkoxycarbonyl group or an alkoxycarbonylalkyl group, and in view of high sensitivity, more preferably a substituted methyl group, a 1-substituted ethyl group, an alkoxycarbonyl group or an alkoxycarbonylalkyl group, still more preferably a group having a structure selected from a cycloalkane having a carbon number of 3 to 12 and an aromatic ring having a carbon number of 6 to 14. The cycloalkane having a carbon number of 3 to 12 may be monocyclic or polycyclic but is preferably polycyclic.

T represents a hydrogen atom or a substituent. The substituent as T includes an alkyl group, a cycloalkyl group, an aryl group, an aralkyl group, an acyl group, an alkoxyl group, a cyano group, a nitro group, a hydroxyl group, a heterocyclic group, a halogen atom, a carboxyl group, and an alkylsilyl group.

T is preferably a hydrogen atom, an alkyl group, a cycloalkyl group, an aralkyl group or a halogen atom, more preferably a hydrogen atom or an aralkyl group, still more preferably a hydrogen atom.

The alkyl group represented by T is preferably an alkyl group having a carbon number of 1 to 20, more preferably an alkyl group having a carbon number of 1 to 10, still more preferably an alkyl group having a carbon number of 1 to 6.

The cycloalkyl group represented by T is preferably a cycloalkyl group having a carbon number of 3 to 20, more preferably a cycloalkyl group having a carbon number of 5 to 15, still more preferably a cycloalkyl group having a carbon number of 5 to 10.

The aryl group represented by T is preferably an aryl group having a carbon number of 6 to 20, more preferably an aryl group having a carbon number of 6 to 15, still more preferably an aryl group having a carbon number of 6 to 10.

The aralkyl group represented by T is preferably an aralkyl group having a carbon number of 7 to 20, more preferably an aralkyl group having a carbon number of 7 to 15, still more preferably an aralkyl group having a carbon number of 7 to 10. Here, the aralkyl group represented by T can function also as the later-described acid-dissociable functional group.

The acyl group represented by T is preferably an acyl group having a carbon number of 2 to 20 and may be an alkylcarbonyl group or an arylcarbonyl group. Examples of the alkylcarbonyl group include an acetyl group, a propanoyl group, a butanoyl group, a hexanoyl group, a cyclohexanoyl group, an adamantanecarbonyl group, a trifluoromethylcarbonyl group, and a pentanoyl group. Examples of the arylcarbonyl group include a benzoyl group, a toluyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxyl group represented by T is preferably an alkoxyl group having a carbon number of 1 to 20, more preferably an alkoxyl group having a carbon number of 1 to 10, still more preferably an alkoxyl group having a carbon number of 1 to 6.

The heterocyclic group represented by T is preferably a heterocyclic group having a carbon number of 2 to 20, more preferably a heterocyclic group having a carbon number of 2 to 10, still more preferably a heterocyclic group having a carbon number of 2 to 6. Examples of the heterocyclic group represented by T include a pyranyl group, a thiophenyl group, an imidazolyl group, a furanyl group, and chromanyl group, with a pyranyl group, a thiophenyl group and a furanyl group being preferred.

The alkylsilyl group represented by T is preferably an alkylsilyl group having a carbon number of 1 to 20, more preferably an alkylsilyl group having a carbon number of 1 to 10, still more preferably an alkylsilyl group having a carbon number of 1 to 6.

Each of the groups as T may further have a substituent, and the substituent is not particularly limited, but examples thereof are the same as those described above for the substituent represented by T.

Examples of the substituent represented by R include an alkyl group, a cycloalkyl group, an aryl group, an aralkyl group, an acyl group, an alkoxyl group, a cyano group, a nitro group, a hydroxyl group, a heterocyclic group, a carboxyl group, an alkylsilyl group, and a group having a structure capable of decomposing by the action of an acid to produce a polar group.

Specific examples of the alkyl group, cycloalkyl group, aryl group, aralkyl group, acyl group, alkoxyl group, heterocyclic group an alkylsilyl group represented by R are the same as specific examples of respective groups in T.

The acid-decomposable structure in the "group having a structure capable of decomposing by the action of an acid to produce a polar group (hereinafter, sometimes referred to as "acid-decomposable structure")" represented by R preferably has a structure where a polar group is protected by a group capable of leaving by the action of an acid, and examples of the polar group are the same as the groups described in $OR_1$.

Also, specific examples of the "group capable of leaving by the action of an acid" in the acid-decomposable group are the same as specific examples of $R_1$ as the group (a) described in $OR_1$.

Each of the groups as R may further have a substituent, and the substituent is not particularly limited, but examples thereof are the same as those described above for the substituent represented by T.

The substituent as R is preferably an alkyl group having a carbon number of 2 to 20 or an aryl group having a carbon number of 6 to 24, more preferably an aryl group having a carbon number of 6 to 24.

In formula (1), it is preferred that out of two Rs in each of n1 repeating units, one is a hydrogen atom and the other is a substituent, and preferred examples of the substituent are the same as those described above.

As described above, at least one of the plurality of $OR_1S$ and the plurality of Rs in the compound represented by formula (1) is a group having a structure capable of decomposing by the action of an acid to produce a polar group.

The structure capable of decomposing by the action of an acid to produce a polar group (hereinafter, sometimes referred to as "acid-decomposable structure") preferably has a structure where a polar group is protected by a group capable of leaving by the action of an acid, and examples of the polar group are the same as the groups described in $OR_1$.

Also, specific examples of the "group capable of leaving by the action of an acid" in the acid-decomposable group are the same as specific examples of $R_1$ as the group (a) described in $OR_1$.

Examples of the "group having an acid-decomposable structure" of R include a group where each of the groups as R is substituted with a structure capable of decomposing by the action of an acid to produce a polar group, and the structure (group) capable of decomposing by the action of an acid to produce a polar group.

The ratio of the "group having an acid-decomposable structure" to the total of all $OR_1$s and $R_4$s in formula (1) is, in terms of the molar ratio, preferably from 1 to 50%, more preferably from 5 to 40%, still more preferably from 10 to 40%.

p is an integer of 1 to 4, preferably an integer of 1 to 3, more preferably 2 or 3, still more preferably 2.

n1 is an integer of 3 or more, preferably an integer of 3 to 8, more preferably 4, 6 or 8, still more preferably 4 or 6, yet still more preferably 4.

Specific examples of the low-molecular compound (A') are illustrated below, but the present invention is not limited thereto.

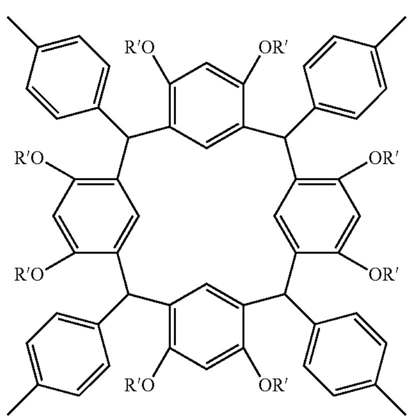

-continued

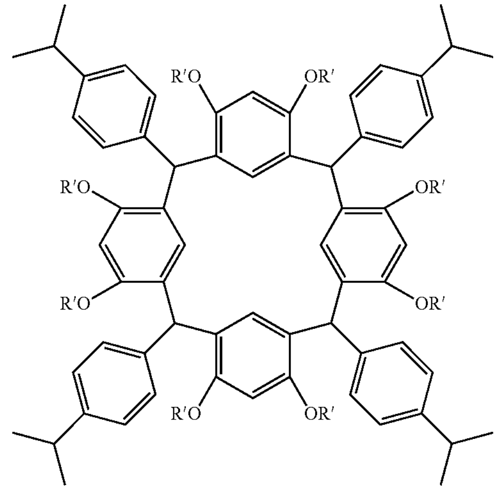

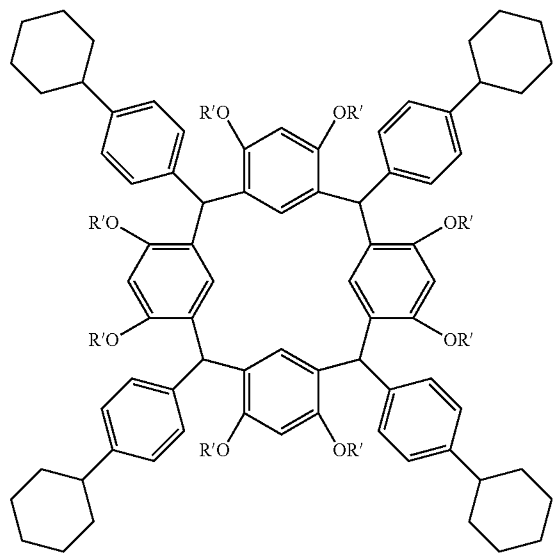

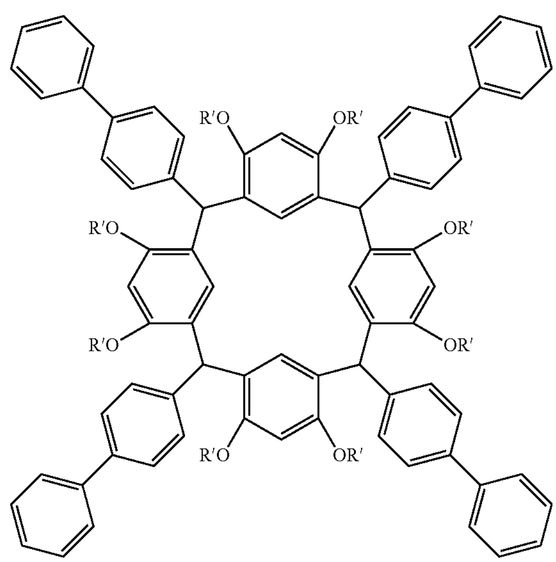

-continued
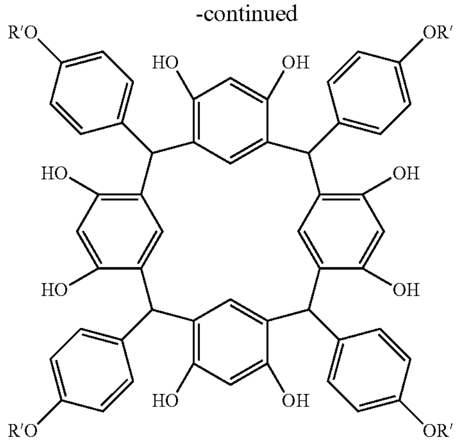
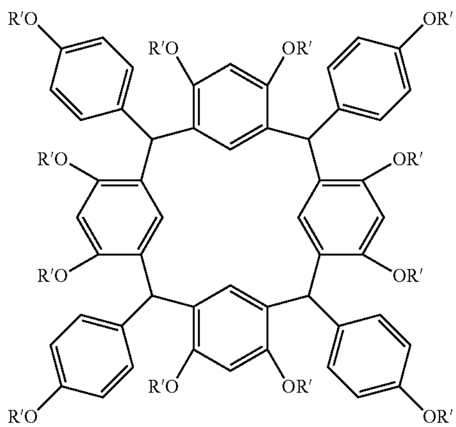
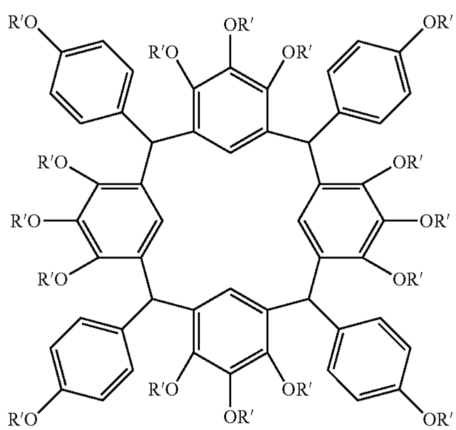
In these specific examples, each R' independently represents a hydrogen atom or the following structure (* represents a bond connected to the oxygen atom in —OR'). However, at least one of the plurality of R's present in the molecule represents the following structure (n represents 1 or 2).
R' =
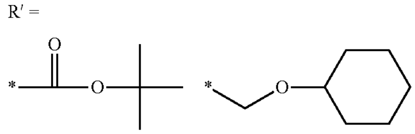
-continued
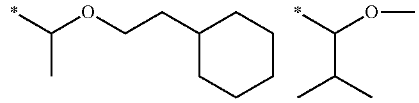
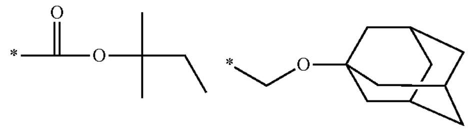
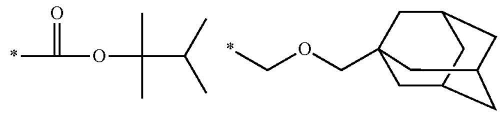
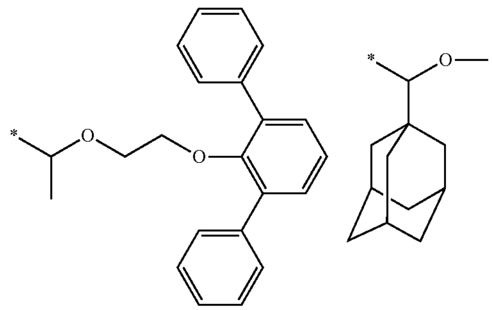
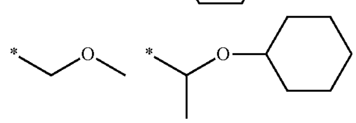
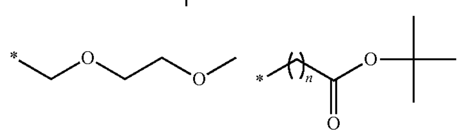
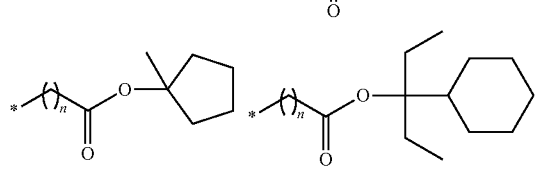
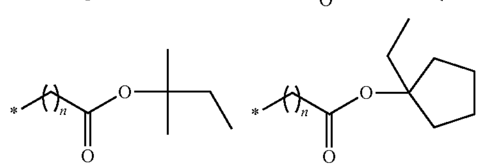
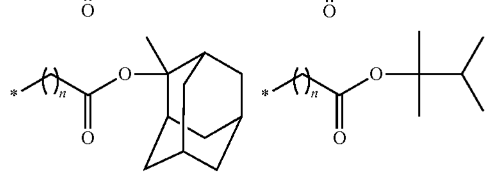
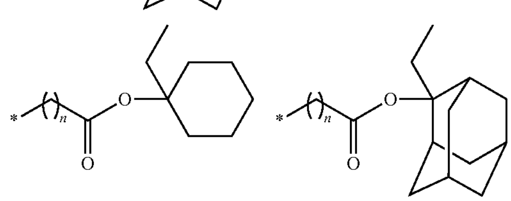
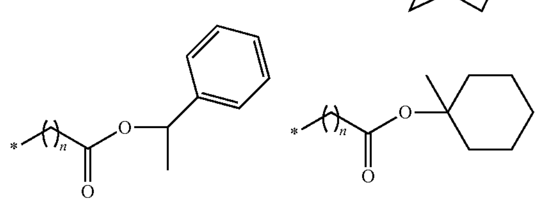

-continued

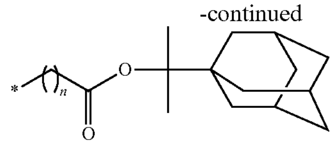

As to the low-molecular compound (A'), the low-molecular compounds disclosed in U.S. patent application Ser. No. 13/381,683 are also incorporated in the present application by reference, as if fully set forth herein.

The low-molecular compound (A') for use in the present invention can be produced in a high yield by a dehydrating condensation reaction starting from various aldehydes including an aromatic aldehyde produced in industry and phenols such as resorcinol and pyrogallol and using a nonmetallic catalyst such as hydrochloric acid and therefore, not only can provide the above-described effects but also is very excellent in view of production.

The low-molecular compound (A') for use in the present invention may take a cis-form or a trans-form and may be either one or a mixture of these structures. The method for obtaining a cyclic compound having only either one structure of a cis-form and a trans-form may be performed by a known method such as separation by column chromatography or preparative liquid chromatography and optimization of reaction solvent, reaction temperature and the like in the production.

The low-molecular compound (A') for use in the present invention can be synthesized by condensation between a corresponding aldehyde compound and a phenolic compound. The acid-decomposable structure contained in the low-molecular compound (A') for use in the present invention may be introduced into an aldehyde compound before condensation or may be introduced by a known method after condensation. The low-molecular compound (A') can be easily synthesized, for example, by the method described in *Proc. of SPIE*, Vol. 72732Q and JP-A-2009-173625.

The low-molecular compound (A') may be purified, if desired, so as to reduce the residual metal amount. Also, remaining of an acid catalyst and a promoter generally causes decrease in the storage stability of the composition (II), or remaining of a basic catalyst generally causes decrease in the sensitivity of the composition (II), and for the purpose of reducing the remaining catalyst, purification may be performed. The purification may be performed by a known method as long as the low-molecular compound (A') is not denatured, and the method is not particularly limited but examples thereof include a method of washing the compound with water, a method of washing the compound with an acidic aqueous solution, a method of washing the compound with a basic aqueous solution, a method of treating the compound with an ion exchange resin, and a method of treating the compound with a silica gel column chromatography. The purification is preferably performed by combining two or more of these purification methods. As for the acidic aqueous solution, basic aqueous solution, ion exchange resin and silica gel column chromatography, an optimal material can be appropriately selected according to the amount and kind of the metal, acidic compound and/or basic compound to be removed, the kind of the low-molecular compound (A') purified, and the like. For example, the acidic aqueous solution includes an aqueous hydrochloric acid, nitric acid or acetic acid solution having a concentration of 0.01 to 10 mol/L; the basic aqueous solution includes an aqueous ammonia solution having a concentration of 0.01 to 10 mol/L; and the ion exchange resin includes a cation exchange resin such as Amberlyst 15J-HG Dry produced by Organo Corporation. After the purification, drying may be performed. The drying can be performed by a known method, and the method is not particularly limited but examples thereof include a method of performing vacuum drying or hot-air drying under the conditions not denaturing the low-molecular compound (A').

The low-molecular compound (A') is preferably low in the sublimability under normal pressure at 100° C. or less, preferably at 120° C. or less, more preferably at 130° C. or less, still more preferably at 140° C. or less, yet still more preferably at 150° C. or less. The low sublimability means that in a thermogravimetric analysis, the weight loss after holding at a predetermined temperature for 10 minutes is 10%, preferably 5%, more preferably 3%, still more preferably 1%, yet still more preferably 0.1%. or less. Thanks to low sublimability, the exposure apparatus can be prevented from contamination by outgassing during exposure. Also, a good pattern profile with low LER can be provided.

The low-molecular compound (A') preferably satisfies $F<3.0$ (F indicates: total number of atoms/(total number of carbon atoms−total number of oxygen atoms)), more preferably $F<2.5$. By satisfying this condition, excellent dry etching resistance is obtained.

The low-molecular compound (A') has a property of dissolving in a solvent that is selected from propylene glycol monomethyl ether acetate, propylene glycol monomethyl ether, 2-heptanone, anisole, butyl acetate, ethyl propionate and ethyl lactate and exhibits a highest ability of dissolving the low-molecular compound (A'), in an amount of preferably 1 wt % or more, more preferably 3 wt % or more, still more preferably 5 wt % or more, yet still more preferably 10 wt % or more, at 23° C. By satisfying such conditions, use of a safety solvent in the semiconductor production process becomes possible.

The glass transition temperature of the low-molecular compound (A') is preferably 100° C. or more, more preferably 120° C. or more, still more preferably 140° C. or more, yet still more preferably 150° C. or more. By virtue of having a glass transition temperature in the range above, heat resistance high enough to maintain the pattern profile during the semiconductor lithography process is obtained and a performance such as high resolution can be imparted.

The crystallization calorific value of the low-molecular compound (A') as determined by a differential scanning calorimetry analysis is preferably less than 20 J/g. Also, the (crystallization temperature)−(glass transition temperature) is preferably 70° C. or more, more preferably 80° C. or more, still more preferably 100° C. or more, yet still more preferably 130° C. or more. When the crystallization calorific value is less than 20 J/g or the (crystallization temperature)−(glass transition temperature) is in the range above, an amorphous film is easily formed by spin-coating the composition (II) and at the same time, the film-forming property can be maintained over a long period of time.

In the present invention, the crystallization calorific value, the crystallization temperature and the glass transition temperature can be measured as follows by using DSC/TA-SOWS manufactured by Shimadzu Corporation and be determined by a differential scanning calorimetry analysis. About 10 mg of a sample is placed in a non-sealed aluminum-made vessel and heated to a temperature not less than the melting point at a temperature rise rate of 20° C./min in a nitrogen gas flow (50 ml/min) The sample is rapidly cooled and thereafter, again heated to a temperature not less than the melting point at a temperature rise rate of 20° C./min in a nitrogen gas flow (30 ml/min) Furthermore, the sample is rapidly cooled and thereafter, again heated to 400° C. at a temperature rise rate of 20° C./min in a nitrogen gas flow (30 ml/min). The temperature at the midpoint of a region where a discontinuous portion appears on the base line (the point where the specific heat is changed to half) is taken as the glass transition temperature (Tg), and the temperature of an exothermic peak developed thereafter is taken as the crystallization temperature. The calorific value is determined from the area of the region surrounded by the exothermic peak and the base line and taken as the crystallization calorific value.

The compound (A') is illustrated as above. The compound (A') may be used alone, or two or more compounds may be used in combination.

The amount added of the compound (A') for use in the present invention is preferably from 30 to 99.9 mass %, more preferably from 50 to 99.7 mass %, still more preferably from 60 to 99.5 mass %, based on the total solid content of the composition (II) (excluding an organic solvent).

[9] Other Ingredient

The composition (II) may further contain the ingredient which may be incorporated in the actinic ray-sensitive or radiation-sensitive resin composition (I), except for the resin (A). (Hereafter, the ingredient is referred to as "other ingredient", too).

Examples and preferred examples of the other ingredients are the same as those recited in the description of the actinic ray-sensitive or radiation-sensitive resin composition (I).

The composition (II) generally contains a solvent for the purpose of forming the second film in the step (iv). It is required that this solvent is selected from the solvent in which the pattern formed in the step (iii) has no solubility. However, the pattern formed in the step (iii) is already made insoluble or slightly soluble in a solvent by the reaction that the resin (A) increases polarity by the action of an acid to decrease solubility in organic solvent-containing developer, and hence the appropriate use of a solvent usable in the composition (I) allows formation of the second film without much of a problem, notably without damage to the pattern.

As a mode of achieving an effect of the present invention with certainty, it is suitable that the composition (I) and the composition (II) contain a common solvent, and it is more suitable that main solvent (when only one kind of solvent is incorporated, the solvent is the main solvent, when two or more kinds of solvents are incorporated, the solvent incorporated in the highest proportion by mass is the main solvent, and when two or more solvents are incorporated in equal proportions by mass, all these solvents are the main solvents) incorporated in the composition (I) and the composition (II), respectively, are identical with each other.

On the other hand, it is preferred that the composition (II) be substantially free of any compound selected from the group consisting of (N) a basic compound or an ammonium-salt compound which each can lower basicity by irradiation with an actinic ray or radiation and (N') a basic compound different from the compound (N) (more specifically, the basic compound content is 1 mass % or less, preferably 0.1 mass % or less, ideally 0 mass %, based on the total solid content in the composition (II), and in other words, it is ideal to contain no basic compound at all). Owing to substantial absence of the basic compound in the composition (II), the acid generated from the compound (B) can resist being deactivated in the second film after having diffused into the second film from the interface between the negative pattern and the second film provided thereon. As a result, the reaction for increasing polarity of the compound (A') in the second film can be induced with more certainty, and thereby trench dimension or hole dimension can be reduced to sufficient degree. Thus there develops a tendency to form a pattern of trenches or holes having ultrafine widths or hole diameters of, say, 40 nm or less with more certainty.

In addition, it is preferred that the composition (II) be substantially free of a compound capable of generating an acid upon irradiation with an actinic ray or radiation (an acid generator) (and more specifically, it is preferred that the acid generator content be 1 mass % or less, preferably 0.1 mass % or less, ideally 0 mass %, based on the total solid content in the composition (II), and in other words, it is ideal to contain no acid generator at all). Thus no acid generator low in affinity for an organic solvent (notably an ionic acid generator, such as onium salt compound) is incorporated in the second film in a substantial sense; as a result, there develops a tendency to more easily remove an area in which the acid generated from the compound (B) is not yet reacted with the compound (A') by the use of an organic solvent-containing remover in the step (vi), and it becomes easy to form with more certainty a pattern of trenches or holes having ultrafine widths or hole diameters of, say, 40 nm or less.

As to "other ingredient" which may further be incorporated in the composition (II), exclusive of the basic compound and the acid generator, the range of the content based on the total solid content in the composition (II) is the same ones as specified in the description of the actinic ray-sensitive or radiation-sensitive resin composition (I).

Further, the composition (II) may contain a compound capable of decomposing by the action of an acid to produce an acid (hereafter simply referred to as "an acid-increasing agent").

The acid-increasing agent in the present invention is stable in the absence of an acid, but decomposes by the action of the acid generated from the acid generator when exposed to light. The pKa value of the generated acid is preferably 3 or less, more preferably 2 or less, further preferably 1 or less, particularly preferably 0 or less. By the way, the pKa value may be determined by actual measurement, e.g. acidic dissociation constant measurement using an infinitely diluted aqueous solution at 25° C., or it may be calculated by the use of a software program e.g. ACD/ChemSketch (ACD/Labs 8.00 Release Product Version: 8.08). Examples of an acid group of the generated acid include a sulfonic acid group, an imidic acid group and a methidic acid group. The generated acid is described below in detail.

By incorporating the acid-increasing agent into the composition (II), after the acid generated from the compound (B) present in the negative pattern diffuses from the interface between the negative pattern and the second film formed thereon into the second film in the step of (v), the acid-increasing agent can ensure the presence of a sufficient quantity of acid in the second film. As a result, it becomes possible to induce with more certainty the reaction for increasing polarity of the compound (A') in the second film and sufficiently reduce trench dimensions or hole dimensions. Thus there are cases where a pattern of trenches or holes having ultrafine widths or hole diameters of, say, 40 nm or less can be formed with more certainty.

As the acid-increasing agent, one of acid-increasing agents described in WO95/29968, WO98/24000, JP-A-8-305262, JP-A-9-34106, JP-A-8-248561, JP-T-8-503082 (the term "JP-T" as used herein means a published Japanese translation of a PCT patent application), U.S. Pat. No.

5,445,917, JP-T-8-503081, U.S. Pat. Nos. 5,534,393, 5,395,736, 5,741,630, 5,334,489, 5,582,956, 5,578,424, 5,453,345 and 5,445,917, European Patents 665,960, 757,628 and 665,961, U.S. Pat. No. 5,667,943, JP-A-10-1508, JP-A-10-282642, JP-A-9-512498, JP-A-2000-62337 and JP-A-2005-17730 may be used, or two or more thereof may be used in combination.

The compound capable of decomposing by the action of an acid to generate an acid is preferably a compound represented by any one of the following formulae (1) to (8), and more preferably a compound represented by the following formula (1), (2), (7) or (8), still more preferably a compound represented by the following formula (7) or (8):

Formula (1)

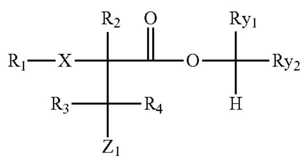

Formula (2)

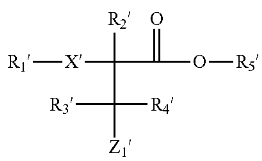

Formula (3)

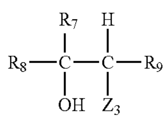

Formula (4)

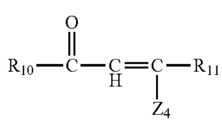

Formula (5)

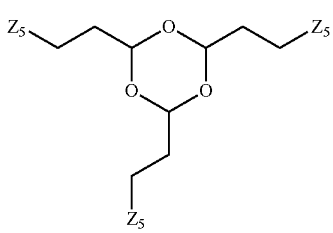

Formula (6)

$$Rb—SO_2—O—R_{12}$$

Formula (7)

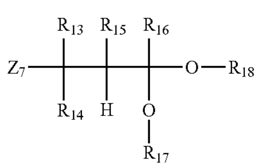

Formula (8)

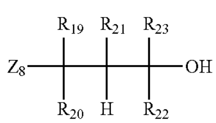

In formula (1), $R_1$ represents an alkyl group, a cycloalkyl group, an alkoxy group, an aryl group or an aryloxy group.

$R_2$ represents an alkyl group or a cycloalkyl group.

$R_1$ and $R_2$ may combine to form a monocyclic or polycyclic cyclic hydrocarbon structure.

Each of $R_3$ and $R_4$ independently represents a hydrogen atom or an alkyl group.

$Ry_1$ represents a hydrogen atom, an alkyl group, a cycloalkyl group, an alkoxy group, an aryl group, or an alkylene group combining with $Ry_2$.

$Ry_2$ represents an aryl group or an aryloxy group.

X represents —$SO_2$—, —SO— or —CO—.

In formula (2), $R_1'$ represents an alkyl group, a cycloalkyl group, an alkoxy group, an aryl group or an aryloxy group.

$R_2'$ represents an alkyl group or a cycloalkyl group.

$R_1'$ and $R_2'$ may combine to form a monocyclic or polycyclic cyclic hydrocarbon structure.

Each of $R_3'$ and $R_4'$ independently represents a hydrogen atom or an alkyl group.

$R_5'$ represents an aryl group-free group capable of leaving by the action of an acid.

X' represents —$SO_2$—, —SO— or —CO—.

In formulae (3) to (6), Rb represents an alkyl group, a cycloalkyl group, an aryl group or an aralkyl group.

$R_7$ represents a hydrogen atom, an alkyl group, a cycloalkyl group, an aryl group or an aralkyl group.

$R_8$ represents an alkyl group, a cycloalkyl group, an aryl group or an aralkyl group.

$R_9$ represents a hydrogen atom, an alkyl group, a cycloalkyl group, an aryl group or an aralkyl group.

$R_9$ may combine with $R_7$ to form a ring.

$R_{10}$ represents an alkyl group, a cycloalkyl group, an alkoxy group, an aryl group, an aralkyl group, an aryloxy group or an alkenyloxy group.

$R_{11}$ represents an alkyl group, a cycloalkyl group, an alkoxy group, an aryl group, an aralkyl group, an aryloxy group or an alkenyl group.

$R_{10}$ and $R_{11}$ may combine with each other to form a ring.

$R_{12}$ represents an alkyl group, a cycloalkyl group, an aryl group, an alkenyl group, an alkynyl group or a cyclic imide group.

In formulae (7) and (8), each of $R_{13}$ to $R_{16}$ and $R_{19}$ to $R_{23}$ represents a hydrogen atom or a monovalent substituent.

Each of $R_{17}$ and $R_{18}$ represents a monovalent substituent, and $R_{17}$ and $R_{18}$ may combine with each other to form a ring.

In formulae (1) to (5), (7) and (8), each of $Z_1$, $Z_1'$, $Z_3$, $Z_4$, $Z_5$, $Z_7$ and $Z_8$ is independently a group represented by any one of the following formulae (Z-a) to (Z-d), and each $Z_5$ may be the same as or different from every other $Z_5$:

$$Rb_1—SO_3— \quad \text{(Z-a)}$$

$$Rb_2—CO_2— \quad \text{(Z-b)}$$

(Z-c)

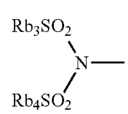

(Z-d)

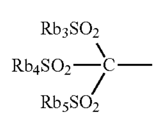

In formulae (Z-a) to (Z-d), each of $Rb_1$ and $Rb_2$ independently represents an organic group.

The organic group of $Rb_1$ and $Rb_2$ is preferably an organic group having a carbon number of 1 to 30, and examples thereof include an alkyl group, a cycloalkyl group, an aryl group, and a group formed by connecting a plurality of these groups through a linking group such as single bond, —O—, —$CO_2$—, —S—, —$SO_3$— and —$SO_2N(Rc_1)$-, wherein $Rc_1$ represents a hydrogen atom or an alkyl group.

Each of $Rb_3$, $Rb_4$ and $Rb_5$ independently represents an organic group. Examples of the organic group of $Rb_3$, $Rb_4$ and $Rb_5$ are the same as those of the organic group of $Rb_1$, and a perfluoroalkyl group having a carbon number of 1 to 4 is particularly preferred.

$Rb_3$ and $Rb_4$ may combine to form a ring. The group formed by combining $Rb_3$ and $Rb_4$ includes an alkylene group and an arylene group and is preferably a perfluoroalkylene group having a carbon number of 2 to 4.

The organic group of $Rb_1$ to $Rb_5$ is preferably an alkyl group substituted with a fluorine atom or a fluoroalkyl group at the 1-position, or a phenyl group substituted with a fluorine atom or a fluoroalkyl group. By virtue of having a fluorine atom or a fluoroalkyl group, the acidity of the acid generated upon irradiation with light is increased and in turn, the sensitivity is enhanced.

Each group in formula (1) is described below.

In formula (1), the alkyl group of $R_1$, $R_2$, $R_3$, $R_4$ and $Ry_1$ is preferably an alkyl group having a carbon number of 1 to 8, and specific examples thereof include a methyl group, an ethyl group, a propyl group, an isopropyl group, a butyl group, and an octyl group.

The cycloalkyl group of $R_1$, $R_2$ and $Ry_1$ is preferably a cycloalkyl group having a carbon number of 4 to 10, and specific examples thereof include a cyclopropyl group, a cyclopentyl group, a cyclohexyl group, a cycloheptyl group, an adamantyl group, a boronyl group, an isoboronyl group, a tricyclodecanyl group, a dicyclopentenyl group, a norbornane epoxy group, a menthyl group, an isomenthyl group, a neomenthyl group, and a tetracyclododecanyl group.

The alkoxy group of $R_1$ and $Ry_1$ is preferably a linear or branched alkoxy group having a carbon number of 1 to 30, and examples thereof include a methoxy group, an ethoxy group, a propoxy group, an isopropoxy group, an n-butoxy group, an isobutoxy group, a sec-butoxy group, a tert-butoxy group, a hexyloxy group, a heptyloxy group, an octyloxy group, a nonyloxy group, a decyloxy group, an undecyloxy group, and a dodecyloxy group.

The aryl group of $R_1$, $Ry_1$ and $Ry_2$ is preferably an aryl group having a carbon number of 6 to 14, and examples thereof include a phenyl group and a naphthyl group.

The aryloxy group of $R_1$ and $Ry_2$ is preferably an aryloxy group having a carbon number of 6 to 20, and examples thereof include a phenoxy group and a naphthoxy group.

The monocyclic or polycyclic cyclic hydrocarbon structure formed by combining $R_1$ and $R_2$ is preferably a cyclic hydrocarbon structure having a carbon number of 3 to 15, and examples thereof include a cyclic hydrocarbon structure having an oxo group, such as cyclopentanone structure, cyclohexanone structure, norbornanone structure and adamantanone structure.

The alkylene group of $Ry_1$, which combines with $Ry_2$, is preferably an alkylene group having a carbon number of 1 to 5, and examples thereof include a methylene group, an ethylene group, a propylene group, and a butylene group.

Each of these groups may have a substituent. Examples of the substituent which each of these groups may have include a halogen atom, a hydroxyl group, a nitro group, a cyano group, a carboxyl group, a cycloalkyl group (preferably having a carbon number of 3 to 20), an aryl group (preferably having a carbon number of 6 to 14), an alkoxy group (preferably having a carbon number of 1 to 20), an acyl group (preferably having a carbon number of 2 to 20) and an acyloxy group (preferably having a carbon number of 2 to 20). The group having a cyclic structure, such as cycloalkyl group and aryl group, may further have an alkyl group (preferably having a carbon number of 1 to 20) as a substituent.

Formula (1) is preferably represented by the following formula (Ia) or (Ib):

(Ia)

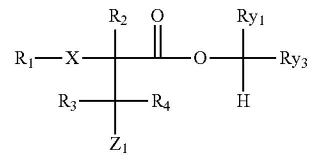

(Ib)

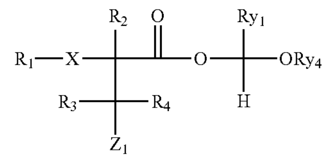

In formulae (Ia) and (Ib), $R_1$ to $R_4$, X and $Z_1$ have the same meanings as $R_1$ to $R_4$, X and $Z_1$ in formula (1).

$R_1$ and $R_2$ may combine to form a monocyclic or polycyclic cyclic hydrocarbon structure.

$Ry_1$ represents a hydrogen atom, an alkyl group, a cycloalkyl group, an alkoxy group, an aryl group, or an alkylene group combining with $Ry_3$ or $Ry_4$.

$Ry_3$ represents an aryl group.

$Ry_4$ represents an aryl group.

Examples of the aryl group of $Ry_3$ and $Ry_4$ in formulae (Ia) and (Ib) are the same as those of the aryl group of $Ry_2$.

The alkylene group of $Ry_1$, which combines with $Ry_3$ or $Ry_4$, is preferably an alkylene group having a carbon number of 1 to 5, and examples thereof include a methylene group, an ethylene group, a propylene group, and a butylene group.

Each of these groups may have a substituent. Specific examples and preferred examples of the substituent which each of these groups may have are the same as specific examples and preferred examples of the substituent which is described above as the substituent which each group in formula (1) may have.

The compound capable of decomposing by the action of an acid to generate an acid, represented by formula (1), can be synthesized as follows. First, an α-substituted acetic acid ester that is an active methylene compound is synthesized by a method of condensing an ester compound under base conditions, a method of reacting an alcohol and a diketene (described in *Synthesis,* 387-388 (1989)), or a method of reacting acetoacetate and chloromethyl ether, and after sequentially performing monoalkylation of the active methylene and hydroxymethylation of the active methylene by the method described in *J. Am. Chem. Soc.,* 120, 37-45 (1998), the hydroxymethylated product is finally reacted with sulfonic acid chloride in the presence of a base.

Specific examples of the acid-increasing agent represented by formula (1) are illustrated below, but the present invention is not limited thereto.

(I-1)

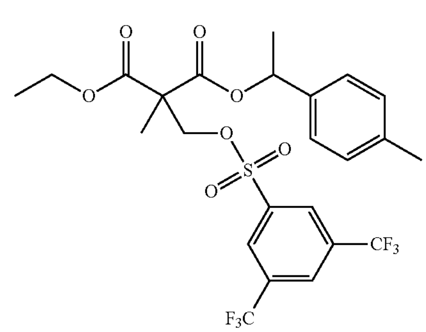

-continued
(I-2)
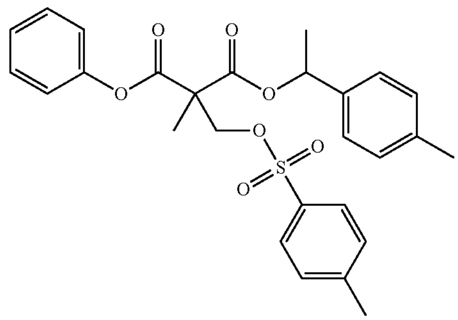
(I-3)
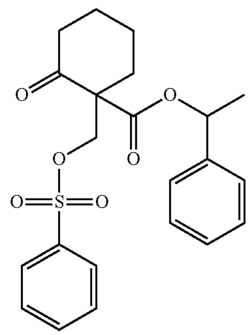
(I-4)
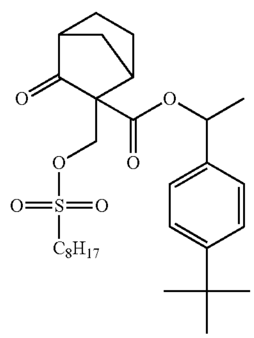
(I-5)
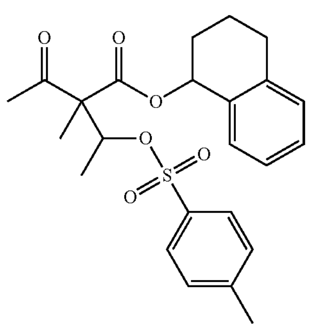
(I-6)
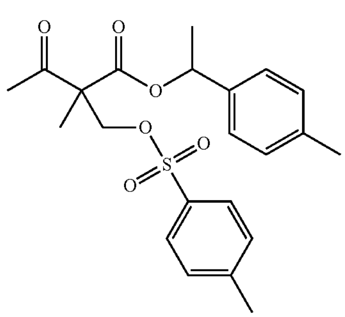
-continued
(I-7)
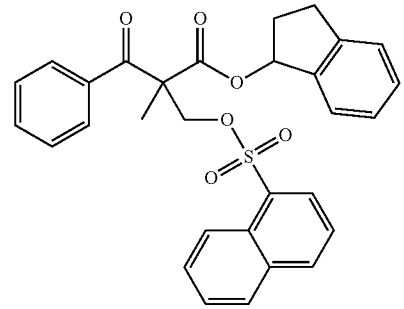
(I-8)
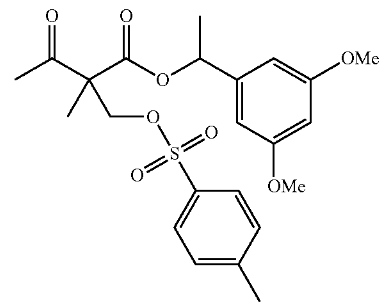
(I-9)
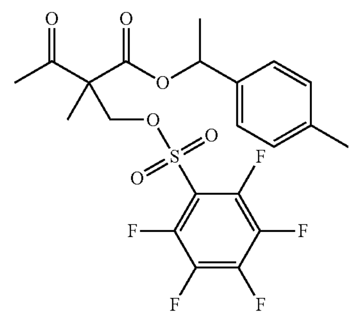
(I-10)
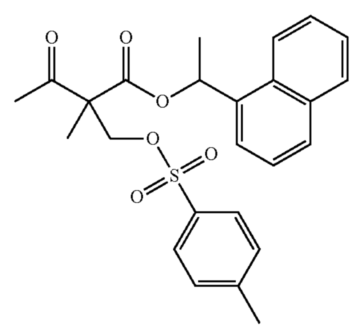
(I-11)
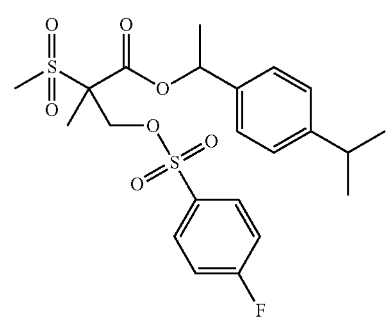

-continued
(I-12)
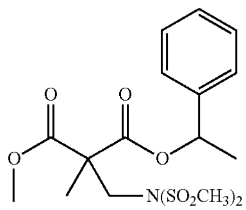
(I-13)
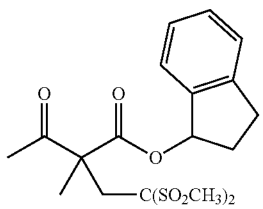
(I-14)
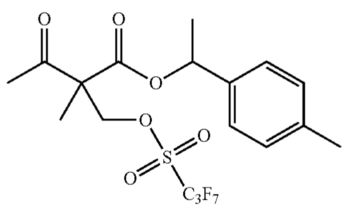
(I-15)
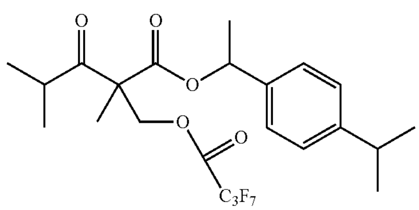
(I-16)
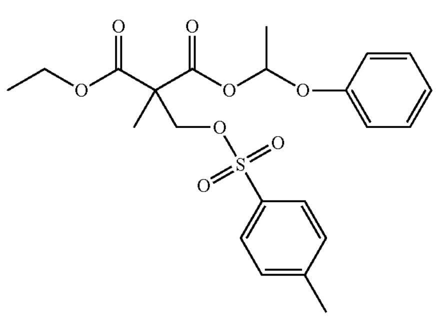
(I-17)
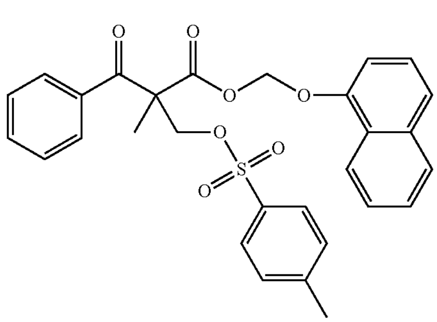
-continued
(I-18)
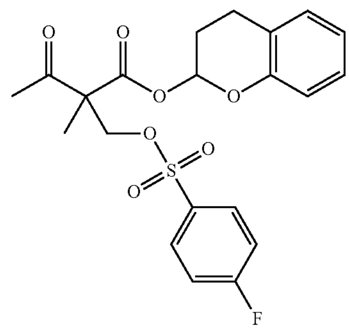
(I-19)
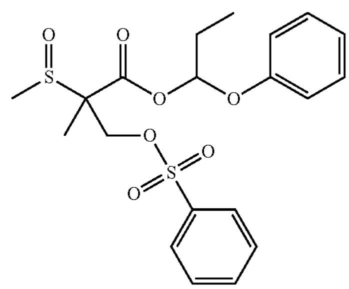
(I-20)
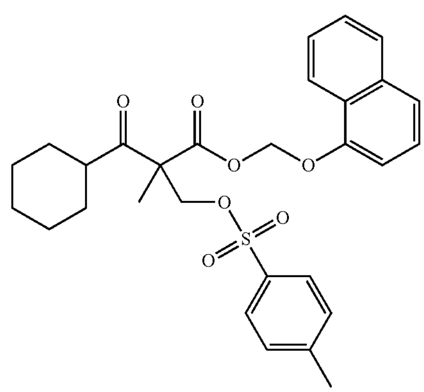
(I-21)
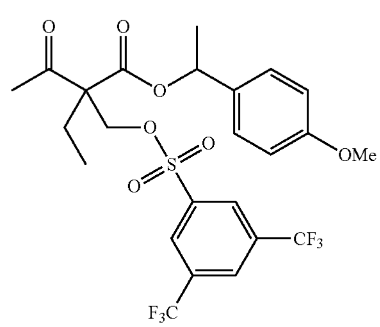
(I-22)
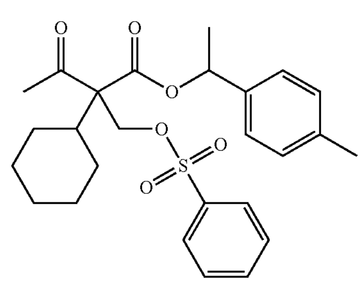

-continued (I-23)

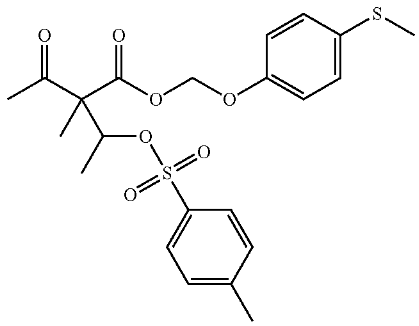

(I-24)

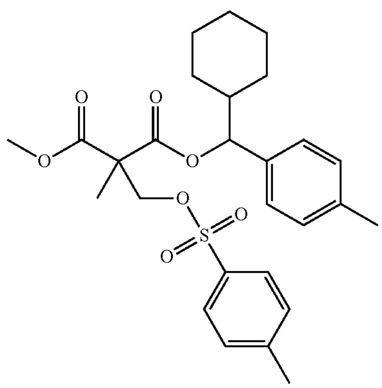

(I-25)

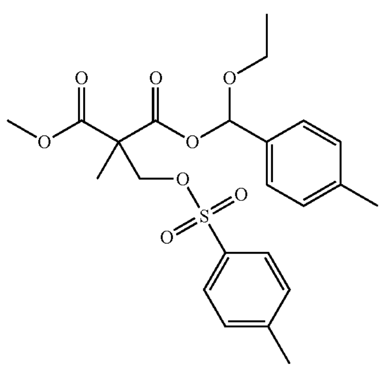

(I-26)

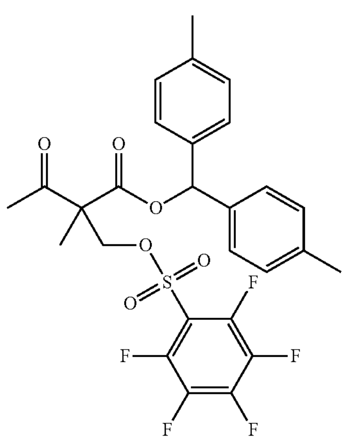

Respective groups in formula (2) are described below.

In formula (2), specific examples and preferred examples of the alkyl group of $R_1'$, $R_2'$, $R_3'$ and $R_4'$ are the same as specific examples and preferred examples of the alkyl group of $R_1$, $R_2$, $R_3$, $R_4$ and $Ry_1$ in formula (1).

Specific examples and preferred examples of the cycloalkyl group of $R_1'$ and $R_2'$ are the same as specific examples and preferred examples of the cycloalkyl group of $R_1$, $R_2$ and $Ry_1$ in formula (1).

Specific examples and preferred examples of the alkoxy group of $R_1'$ are the same as specific examples and preferred examples of the alkoxy group of $R_1$ and $Ry_1$ in formula (1).

Specific examples and preferred examples of the aryl group of $R_1'$ are the same as specific examples and preferred examples of the aryl group of $R_1$, $Ry_1$ and $Ry_2$ in formula (1).

Specific examples and preferred examples of the aryloxy group of $R_1'$ are the same as specific examples and preferred examples of the aryloxy group of $R_1$ and $Ry_2$ in formula (1).

Specific examples and preferred examples of the monocyclic or polycyclic cyclic hydrocarbon structure formed by combining $R_1'$ and $R_2'$ are the same as specific examples and preferred examples of the monocyclic or polycyclic cyclic hydrocarbon structure formed by combining $R_1$ and $R_2$ in formula (1).

Each of these groups may have a substituent. Specific examples and preferred examples of the substituent which each of these groups may have are the same as specific examples and preferred examples of the substituent described above as the substituent which each of the group in formula (1) may have.

The aryl group-free group capable of leaving by the action of an acid of $R_5'$ includes, for example, groups represented by the following formulae (pI) to (pV) and is preferably a group having a monocyclic or polycyclic alicyclic hydrocarbon structure:

(pI)

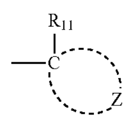

(pII)

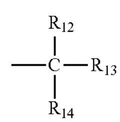

(pIII)

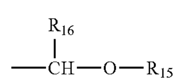

(pIV)

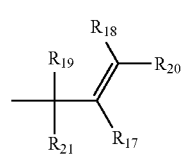

(pV)

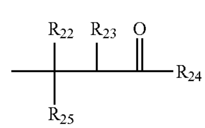

In formulae (pI) to (pV), $R_{11}$ represents an alkyl group. Z represents an atomic group necessary for forming a cycloalkyl group together with the carbon atom.

Each of $R_{12}$ to $R_{14}$ independently represents an alkyl group or a cycloalkyl group. At least one of $R_{12}$ to $R_{14}$ is preferably a cycloalkyl group.

Each of $R_{15}$ and $R_{16}$ independently represents an alkyl group or a cycloalkyl group. At least either one of $R_{15}$ and $R_{16}$ is preferably a cycloalkyl group.

Each of $R_{17}$ to $R_{21}$ independently represents a hydrogen atom, an alkyl group or a cycloalkyl group, provided that either one of $R_{19}$ and $R_{21}$ represents an alkyl group or a cycloalkyl group. At least one of $R_{17}$ to $R_{21}$ is preferably a cycloalkyl group.

Each of $R_{22}$ to $R_{25}$ independently represents a hydrogen atom, an alkyl group or a cycloalkyl group. $R_{23}$ and $R_{24}$ may combine with each other to form a ring. At least one of $R_{22}$ to $R_{25}$ is preferably a cycloalkyl group.

In formulae (pI) to (pV), the alkyl group of $R_{11}$ to $R_{25}$ is preferably a linear or branched alkyl group having a carbon number of 1 to 4, and examples thereof include a methyl group, an ethyl group, an n-propyl group, an isopropyl group, an n-butyl group, an isobutyl group, and a sec-butyl group.

The cycloalkyl group of $R_{12}$ to $R_{25}$ and the cycloalkyl group formed by Z together with the carbon atom may be monocyclic or polycyclic. Specific examples thereof include a group having a monocyclo, bicyclo, tricyclo or tetracyclo structure with a carbon number of 5 or more. The carbon number thereof is preferably from 6 to 30, more preferably from 7 to 25.

Preferred cycloalkyl groups include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group. An adamantyl group, a norbomyl group, a cyclohexyl group, a cyclopentyl group, a tetracyclododecanyl group and a tricyclodecanyl group are more preferred.

These alkyl and cycloalkyl groups may further have a substituent. The further substituent on these alkyl and cycloalkyl groups includes an alkyl group (having a carbon number of 1 to 4), a halogen atom, a hydroxyl group, an alkoxy group (having a carbon number of 1 to 4), a carboxyl group, and an alkoxycarbonyl group (having a carbon number of 2 to 6). The substituent which may be further substituted on the above-described alkyl group, alkoxy group, alkoxycarbonyl group and the like includes a hydroxyl group, a halogen atom, and an alkoxy group.

Formula (2) is preferably the following formula (IIa) or (IIb):

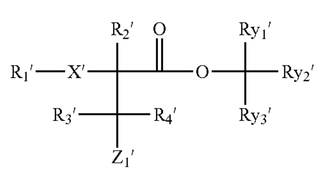

(IIa)

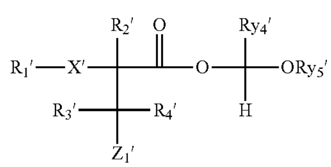

(IIb)

In formulae (IIa) and (IIb), $R_1'$ to $R_4'$, X' and $Z_1'$ have the same meanings as $R_1'$ to $R_4'$, X' and $Z_1'$ in formula (II).

$R_1'$ and $R_2'$ may combine to form a monocyclic or polycyclic cyclic hydrocarbon structure.

Each of $Ry_1'$ to $Ry_3'$ independently represents an alkyl group or a cycloalkyl group. At least two members out of $Ry_1'$ to $Ry_3'$ may combine to form a monocyclic or polycyclic cyclic hydrocarbon structure, provided that at least one of $Ry_1'$ to $Ry_3'$ represents a cycloalkyl group or at least two of $Ry_1'$ to $Ry_3'$ combine to form a monocyclic or polycyclic cyclic hydrocarbon structure.

$Ry_4'$ represents a hydrogen atom, an alkyl group or a cycloalkyl group.

$Ry_5'$ represents a cycloalkyl group.

$Ry_4'$ and $Ry_5'$ may combine to form a monocyclic or polycyclic cyclic hydrocarbon structure.

The alkyl group of $Ry_1'$ to $Ry_4'$ may be either a linear alkyl group or a branched alkyl group and may have a substituent. The linear or branched alkyl group is preferably an alkyl group having a carbon number of 1 to 8, more preferably from 1 to 4, and examples thereof include a methyl group, an ethyl group, a propyl group, an isopropyl group, a butyl group, an isobutyl group, and a tert-butyl group, with a methyl group and an ethyl group being preferred.

The cycloalkyl group of $Ry_1'$ to $Ry_5'$ includes, for example, a monocyclic cycloalkyl group having a carbon number of 3 to 8 and a polycyclic cycloalkyl group having a carbon number of 7 to 14 and may have a substituent. Preferred monocyclic cycloalkyl groups include a cyclopentyl group, a cyclohexyl group and a cyclopropyl group, and preferred polycyclic cycloalkyl groups include an adamantyl group, a norbornane group, a tetracyclododecanyl group, a tricyclodecanyl group and a diamantyl group.

The monocyclic cyclic hydrocarbon structure formed by combining at least two members out of $Ry_1'$ to $Ry_3'$ is preferably a cyclopentane structure or a cyclohexane structure. The polycyclic cyclic hydrocarbon structure formed by combining at least two members out of $Ry_1$ to $Ry_3$ is preferably an adamantane structure, a norbornane structure or a tetracyclododecane structure.

Examples of the monocyclic or polycyclic cyclic hydrocarbon structure formed by combining $Ry_4'$ and $Ry_5'$ include a tetramethylene oxide ring structure, a pentamethylene oxide ring structure, and a hexamethylene oxide ring structure.

Each of these groups may have a substituent. Specific examples and preferred examples of the substituent which each of these groups may have are the same as specific examples and preferred examples of the substituent described above as the substituent which each of groups in formula (1) may have.

The compound capable of decomposing by the action of an acid to generate an acid, represented by formula (2), can be synthesized as follows. First, an α-substituted acetic acid ester that is an active methylene compound is synthesized by a method of condensing an ester compound under base conditions, a method of reacting an alcohol and diketene (described in *Synthesis,* 387-388 (1989)), or a method of reacting acetoacetate and chloromethyl ether, and after sequentially performing monoalkylation of the active methylene and hydroxymethylation of the active methylene by the method described in *J. Am. Chem. Soc.,* 120, 37-45 (1998), the hydroxymethylated product is finally reacted with sulfonic acid chloride in the presence of a base.

Specific examples of the acid-increasing agent represented by formula (2) are illustrated below, but the present invention is not limited thereto.

-continued
(II-1)
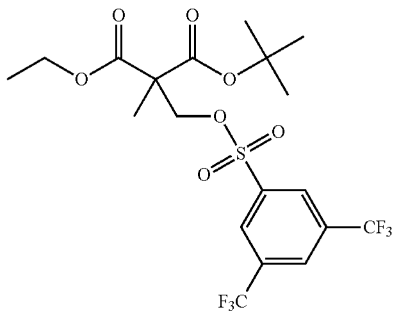
(II-2)
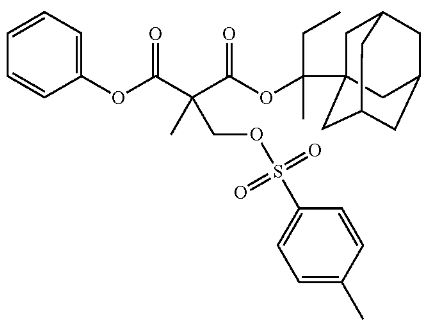
(II-3)
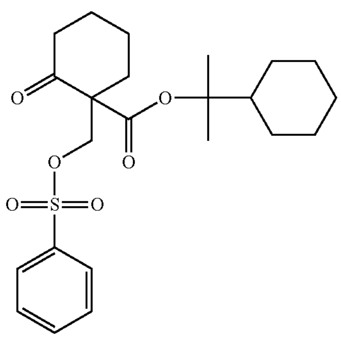
(II-4)
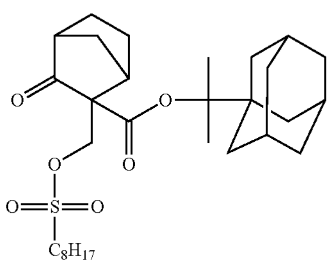
(II-5)
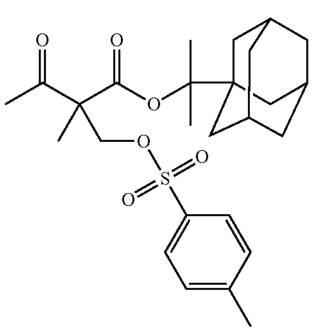
(II-6)
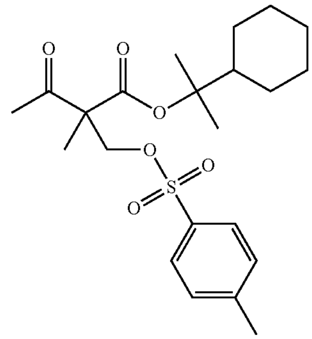
(II-7)
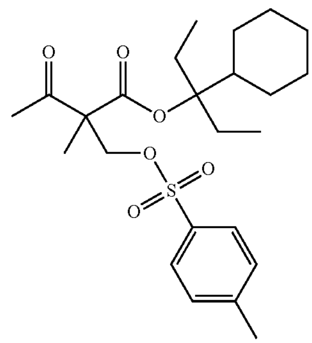
(II-8)
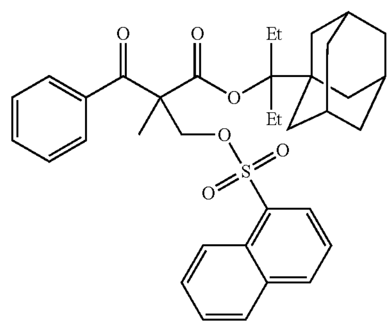
(II-9)
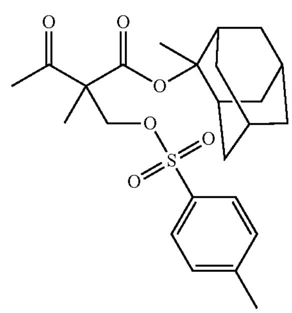
(II-10)
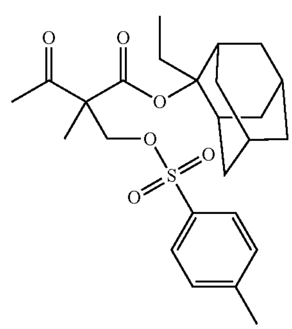

-continued
(II-11)
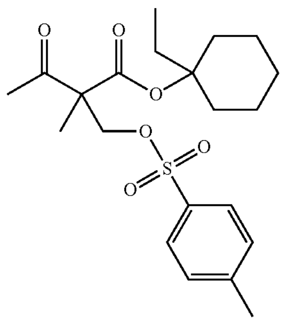
(II-12)
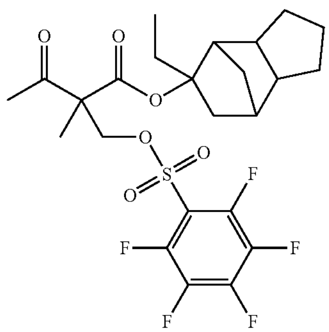
(II-13)
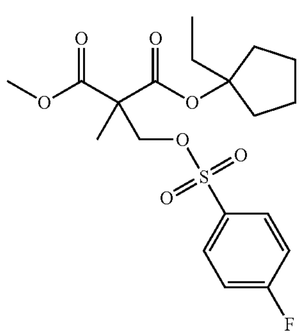
(II-14)
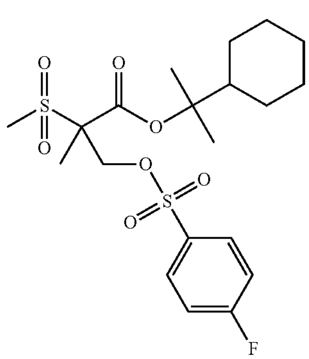
-continued
(II-15)
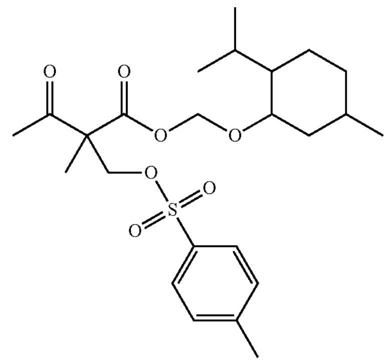
(II-16)
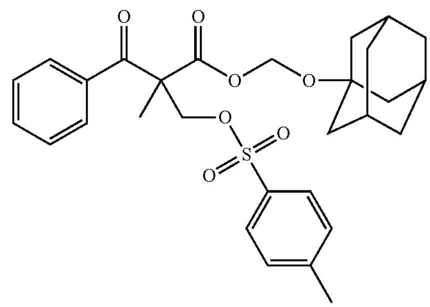
(II-17)
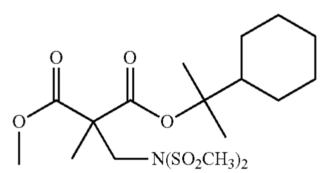
(II-18)
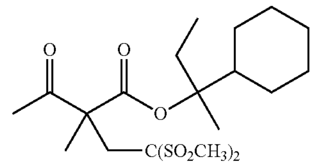
(II-19)
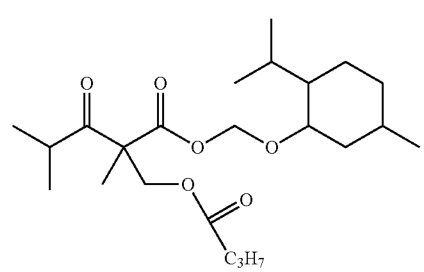
(II-20)
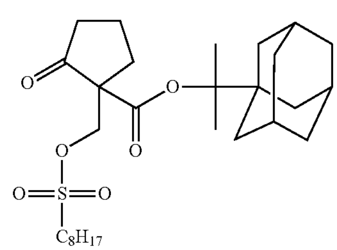

-continued
(II-21)
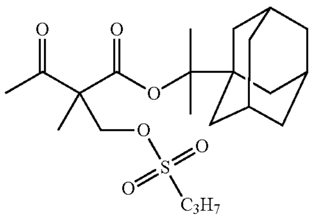
(II-22)
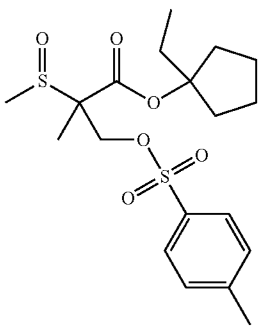
(II-23)
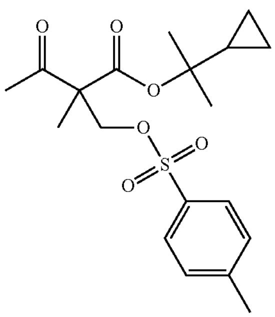
(II-23)
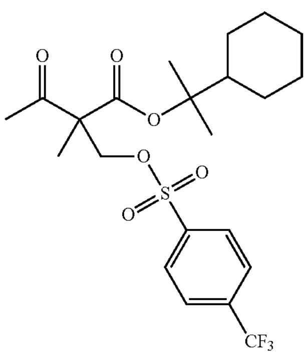
(II-24)
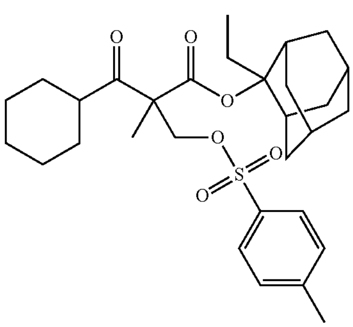
-continued
(II-25)
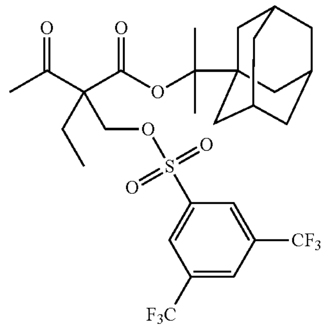
(II-26)
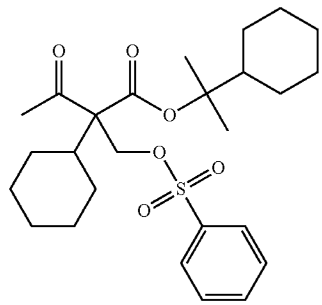
(II-27)
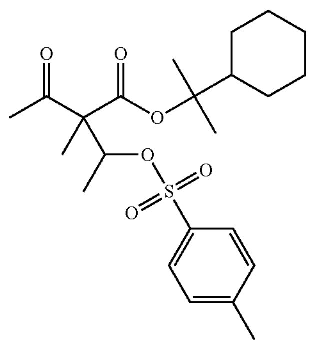
(II-28)
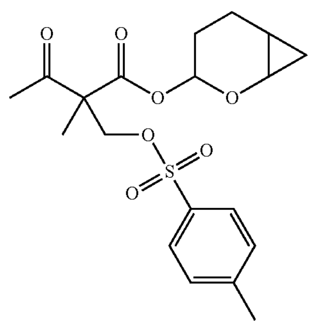
(II-29)
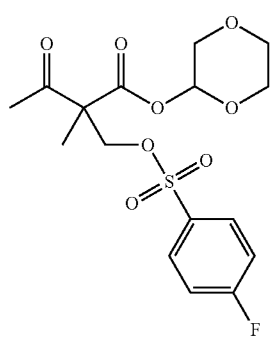

-continued
(II-30)
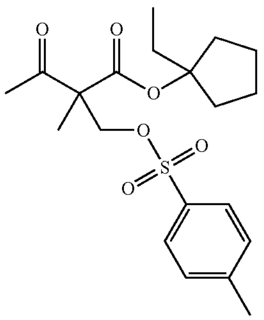
(II-31)
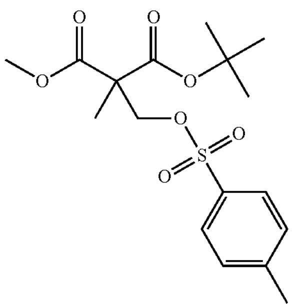
(II-32)
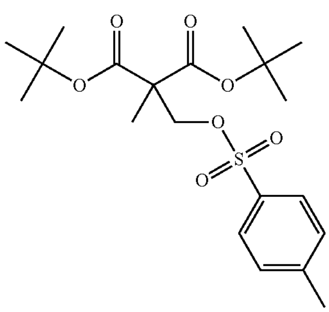
(II-33)
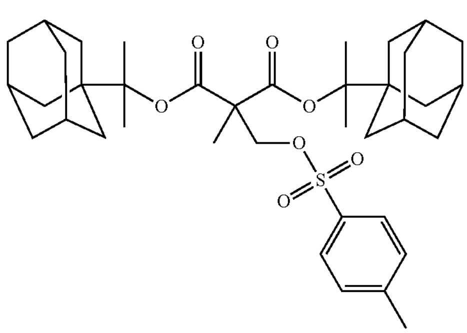
(II-34)
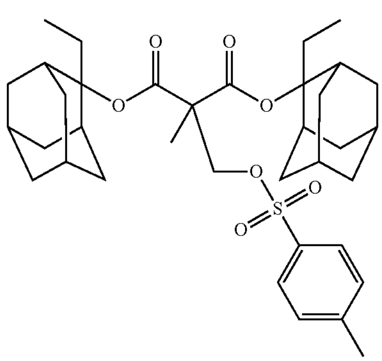
-continued
(II-35)
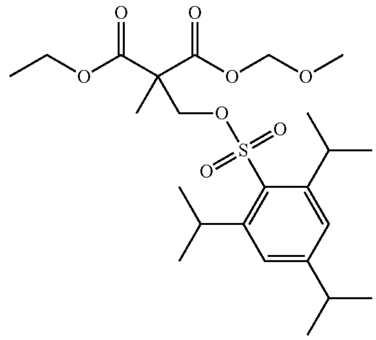
(II-36)
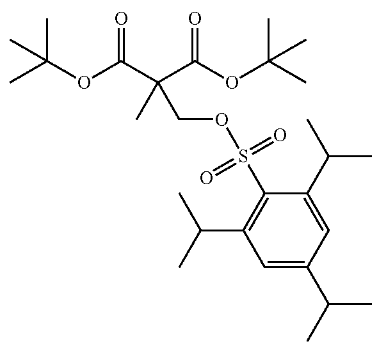
(II-37)
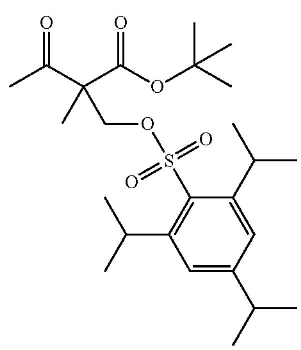
(II-38)
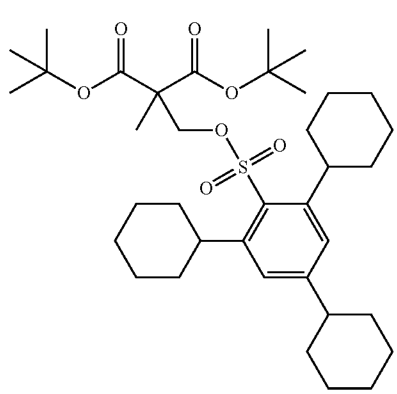

-continued (II-39)

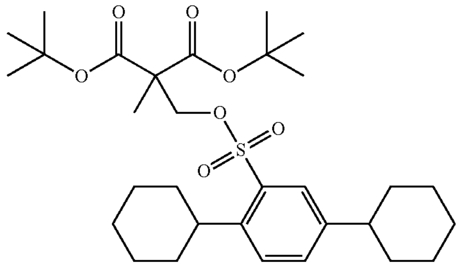

(II-40)

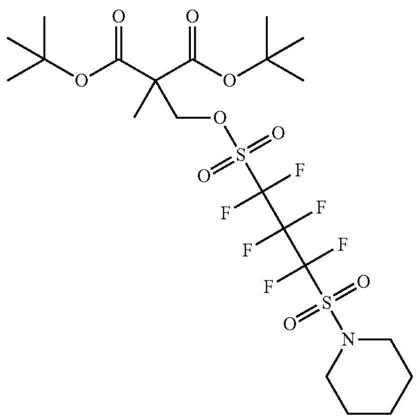

(II-41)

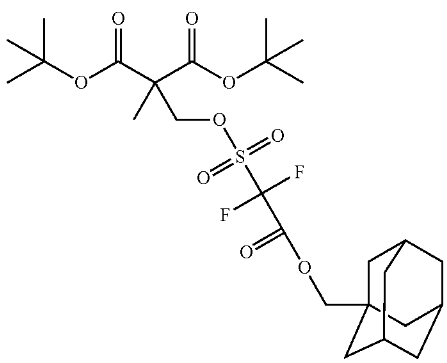

(II-42)

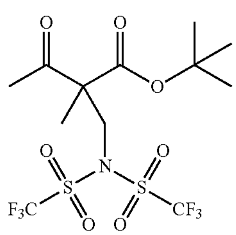

The compounds represented by the following formulae (3) to (6) are described below.

Formula (3)

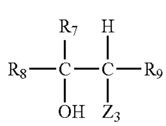

Formula (4)

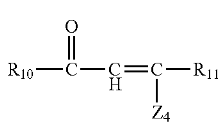

-continued

Formula (5)

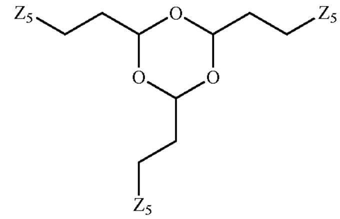

Formula (6)

$$Rb—SO_2—O—R_{12}$$

In formulae (3) to (6), $Z_3$, $Z_4$ and $Z_5$ are as described above.

Rb represents an alkyl group, a cycloalkyl group, an aryl group or an aralkyl group.

$R_7$ represents a hydrogen atom, an alkyl group, a cycloalkyl group, an aryl group or an aralkyl group.

$R_8$ represents an alkyl group, a cycloalkyl group, an aryl group or an aralkyl group.

$R_9$ represents a hydrogen atom, an alkyl group, a cycloalkyl group, an aryl group or an aralkyl group.

$R_9$ may combine with $R_7$ to form a ring.

$R_{10}$ represents an alkyl group, a cycloalkyl group, an alkoxy group, an aryl group, an aralkyl group, an aryloxy group or an alkenyloxy group.

$R_{11}$ represents an alkyl group, a cycloalkyl group, an alkoxy group, an aryl group, an aralkyl group, an aryloxy group or an alkenyl group.

$R_{10}$ and $R_{11}$ may combine with each other to form a ring.

$R_{12}$ represents an alkyl group, a cycloalkyl group, an aryl group, an alkenyl group, an alkynyl group or a cyclic imide group.

In formulae (3) to (6), the alkyl group includes an alkyl group having a carbon number of 1 to 8, and specific examples thereof include a methyl group, an ethyl group, a propyl group, an isopropyl group, a butyl group, and an octyl group.

The cycloalkyl group includes a cycloalkyl group having a carbon number of 4 to 10, and specific examples thereof include a cyclopropyl group, a cyclopentyl group, a cyclohexyl group, a cycloheptyl group, an adamantyl group, a boronyl group, an isoboronyl group, a tricyclodecanyl group, a dicyclopentenyl group, a norbornane epoxy group, a menthyl group, an isomenthyl group, a neomenthyl group, and a tetracyclododecanyl group.

The aryl group includes an aryl group having a carbon number of 6 to 14, and examples thereof include a phenyl group, a naphthyl group, and a tolyl group.

The aralkyl group includes an aralkyl group having a carbon number of 7 to 20, and specific examples thereof include a benzyl group, a phenethyl group and a naphthylethyl group.

The alkoxy group includes an alkoxy group having a carbon number of 1 to 8, and specific examples thereof include a methoxy group, an ethoxy group, a propoxy group, and a butoxy group.

The alkenyl group includes an alkenyl group having a carbon number of 2 to 6, and specific examples thereof include a vinyl group, a propenyl group, an allyl group, a butenyl group, a pentenyl group, a hexenyl group, and a cyclohexenyl group.

The aryloxy group includes an aryloxy group having a carbon number of 6 to 14, and specific examples thereof include a phenoxy group and a naphthoxy group.

The alkenyloxy group includes an alkenyloxy group having a carbon number of 2 to 8, and specific examples thereof include a vinyloxy group and an allyloxy group.

Each of the above-described substituents may further have a substituent, and examples of the substituent include a halogen atom such as Cl, Br and F, a —CN group, an —OH group, an alkyl group having a carbon number of 1 to 4, a cycloalkyl group having a carbon number of 3 to 8, an alkoxy group having a carbon number of 1 to 4, an acylamino group such as acetylamino group, an aralkyl group such as benzyl group and phenethyl group, an aryloxyalkyl group such as phenoxyethyl group, an alkoxycarbonyl group having a carbon number of 2 to 5, and an acyloxy group having a carbon number of 2 to 5, but the range of the substituent is not limited thereto.

Examples of the ring formed by combining $R_4$ and $R_5$ with each other include a 1,3-dioxolane ring and a 1,3-dioxane ring.

Examples of the ring formed by combining $R_7$ and $R_9$ with each other include a cyclopentyl ring and a cyclohexyl ring.

Examples of the ring formed by combining $R_{10}$ and $R_{11}$ with each other include a 3-oxocyclohexenyl ring and a 3-oxoindenyl ring, which each may contain an oxygen atom in the ring.

Examples of the group capable of leaving by the action of an acid of $R_0$ include a tertiary alkyl group such as tert-butyl group and tert-amyl group, an isoboronyl group, a 1-alkoxyethyl group such as 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a tetrahydropyranyl group, a tetrahydrofuranyl group, a trialkylsilyl group, and a 3-oxocyclohexyl group.

Preferred examples of the groups Rb and $R_7$ to $R_{11}$ are as follows:

Rb: a methyl group, an ethyl group, a propyl group, a butyl group, an octyl group, a trifluoromethyl group, a nonafluorobutyl group, a heptadecafluorooctyl group, a 2,2,2-trifluoroethyl group, a phenyl group, a pentafluorophenyl group, a methoxyphenyl group, a toluyl group, a mesityl group, a fluorophenyl group, a naphthyl group, a cyclohexyl group or a camphor group;

$R_7$, $R_9$: a hydrogen atom, a methyl group, an ethyl group, a propyl group, a butyl group, a pentyl group, a cyclopropyl group, a cyclopentyl group, a cyclohexyl group, a phenyl group, a naphthyl group, a benzyl group, a phenethyl group, or groups forming a cyclopentyl ring or a cyclohexyl ring by combining with each other;

$R_8$: a methyl group, an ethyl group, an isopropyl group, a tert-butyl group, a neopentyl group, a cyclohexyl group, a phenyl group or a benzyl group;

$R_{10}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyloxy group, a methylvinyloxy group, or groups forming a 3-oxocyclohexenyl ring or a 3-oxoindenyl ring, which may contain an oxygen atom, by combining with each other; and $R_{11}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group, an allyl group, or groups forming a 3-oxocyclohexenyl ring or a 3-oxoindenyl ring, which may contain an oxygen atom, by combining with each other.

In formula (6), when $R_{12}$ represents an alkyl group, the alkyl group includes a linear or branched alkyl group having a carbon number of 1 to 20, and specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a tert-butyl group, an isopentyl group, a neopentyl group, a 1-methylbutyl group, an isohexyl group, a 2-ethylhexyl group, and a 2-methylhexyl group. Among these, a linear alkyl group having a carbon number of 1 to 12, and a branched alkyl group having a carbon number of 3 to 12 are preferred.

When $R_{12}$ represents a cycloalkyl group, the cycloalkyl group includes a cycloalkyl group having a carbon number of 3 to 20, and specific examples thereof include a cyclohexyl group, a cyclopentyl group, and a 2-norbornyl group. Among these, a cycloalkyl group having a carbon number of 5 to 10 is preferred.

When $R_{12}$ represents a substituted alkyl group or a substituted cycloalkyl group, the substituent is a monovalent nonmetallic atom group excluding hydrogen, and preferred examples thereof include a halogen atom (e.g., —F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugate base group thereof (hereinafter, referred to as "phosphonato group"), a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3$H(alkyl)) and a conjugate base group thereof (hereinafter, referred to as "alkylphosphonato group"), a monoarylphosphono group (—$PO_3$H(aryl)) and a conjugate base group thereof (hereinafter, referred to as "arylphosphonato group"), a phosphonoxy group (—$OPO_3H_2$) and a conjugate base group thereof (hereinafter, referred to as "phosphonatoxy group"), a dialkylphosphonoxy group (—$OPO_3$(alkyl)$_2$), a diarylphosphonoxy group (—$OPO_3$(aryl)$_2$), an alkylarylphosphonoxy group (—$OPO_3$(alkyl)(aryl)), a monoalkylphosphonoxy group (—$OPO_3$H(alkyl)) and a conjugate base group thereof (hereinafter, referred to as "alkylphosphonatoxy group"), a monoaryiphosphonoxy group (—$OPO_3$H(aryl)) and a conjugate base group thereof (hereinafter, referred to as "arylphosphonatoxy group"), a cyano group, a nitro group, an aryl group, an alkenyl group, and an alkynyl group.

In these substituents, specific examples of the alkyl group include the above-described alkyl groups, and specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxyphenylcarbonyl group, a phenoxycarbonylphenyl group, an N-phenylcarbamoylphenyl group, a phenyl group, a cyanophenyl group, a sulfophenyl group, a sulfonatophenyl group, a phosphonophenyl group, and a phosphonatophenyl group. Examples of the alkenyl group include a vinyl group, a 1-propenyl group, a 1-butenyl group, a cinnamyl group, and a 2-chloro-1-ethenyl group, and examples of the alkynyl group include an ethynyl group, a 1-propynyl group, a 1-butynyl group, and a trimethylsilylethynyl group. $R_{13}$ in the acyl group ($R_{13}$CO—) is hydrogen or the above-described alkyl, cycloalkyl or aryl group.

Among these substituents, more preferred are a halogen atom (e.g., —F, —Br, —Cl, —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group, and an alkenyl group.

The alkylene group in the substituted alkyl group includes a divalent organic residue structure formed by removing any one hydrogen atom on the above-described alkyl group having a carbon number of 1 to 20, and a linear alkylene group having a carbon number of 1 to 12, a branched alkylene group having a carbon number of 3 to 12 and a cyclic alkylene group having a carbon number of 5 to 10 are preferred. Specific preferred examples of the substituted alkyl group obtained by combining the above-described substituent and an alkylene group include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonoxypropyl group, a phosphonatoxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

When $R_{12}$ represents an aryl group, the aryl group includes a condensed ring formed by fusing 1 to 3 benzene rings, and a condensed ring formed by fusing a benzene ring and a 5-membered unsaturated ring, and specific examples thereof include a phenyl group, a naphthyl group, an anthryl group, a phenanthryl group, an indenyl group, an acenaphthenyl group, and a fluorenyl group. Among these, a phenyl group and a naphthyl group are preferred. Other than the above-described carbocyclic aryl group, the aryl group includes a heterocyclic (hetero) aryl group. As the heterocyclic aryl group, those containing from 3 to 20 carbon atoms and from 1 to 5 heteroatoms, such as pyridyl group, furyl group, quinolyl group fused with another benzene ring, benzofuryl group, thioxanthone group and carbazole group, are used.

When $R_{12}$ represents a substituted aryl group, an aryl group having a monovalent nonmetallic atom group (excluding hydrogen) as a substituent on the ring-forming carbon atom of the above-described aryl group is used as the substituted aryl group. Preferred examples of the substituent include those described above as the substituent on the alkyl and cycloalkyl groups.

Specific preferred examples of the substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propenylphenyl group, a 2-butynylphenyl group, and a 3-butynylphenyl group.

When $R_{12}$ represents an alkenyl group, a substituted alkenyl group [—C($R_{14}$)═C($R_{15}$)($R_{16}$)], an alkynyl group or a substituted alkynyl group [—C≡C($R_{17}$)], each of $R_{14}$ to $R_{17}$ may be a monovalent nonmetallic atom group. Preferred examples of $R_{14}$ to $R_{17}$ include a hydrogen atom, a halogen atom, an alkyl group, a substituted alkyl group, an aryl group, and a substituted aryl group. Specific examples of these groups include those described above as examples. The substituents $R_{14}$ to $R_{17}$ are more preferably a hydrogen atom, a halogen atom, or a linear, branched or cyclic alkyl group having a carbon number of 1 to 10. Specific examples of the alkenyl group, substituted alkenyl group, alkynyl group and substituted alkynyl group include a vinyl group, a 1-butenyl group, a 1-pentenyl group, a 1-hexenyl group, a 1-octenyl group, a 1-methyl-1-propenyl group, a 2-methyl-1-propenyl group, a 2-methyl-1-butenyl group, a 2-phenyl-1-ethenyl group, a 2-chloro-1-ethenyl group, an ethynyl group, a propynyl group, and a phenylethyl group.

When $R_{12}$ represents a cyclic imide group, a cyclic imide having a carbon number of 4 to 20, such as succinic acid imide, phthalic acid imide, cyclohexanedicarboxylic acid imide and norbornenedicarboxylic acid imide, may be used as the cyclic imide.

Specific examples of the compounds represented by formulae (3) to (6) are illustrated below, but the contents of the present invention are not limited thereto.

(3-1)

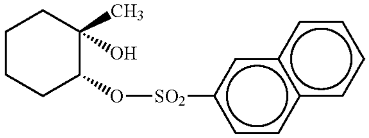

(3-2)

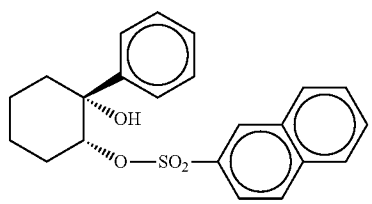

(3-3)

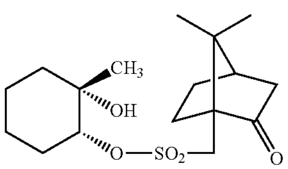

(3-4)

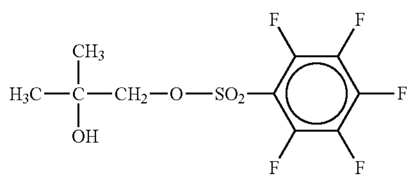

(3-5)

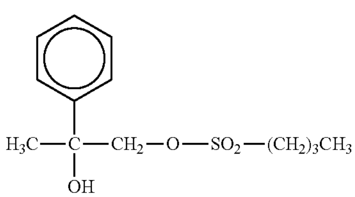

(3-6)

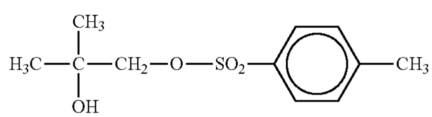

(3-7)

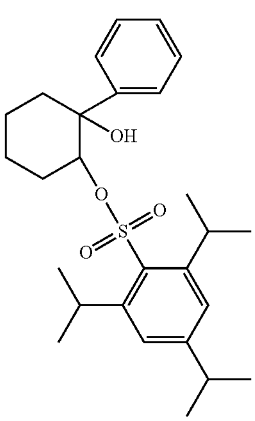

(3-8)

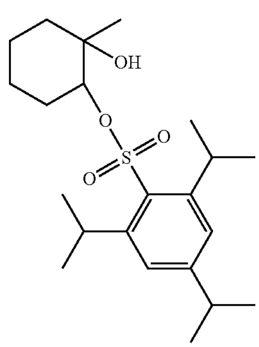

-continued
(3-9)
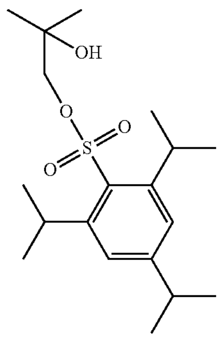
(3-10)
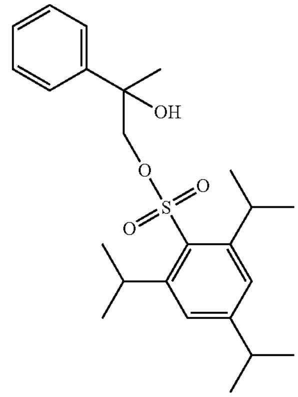
(3-11)
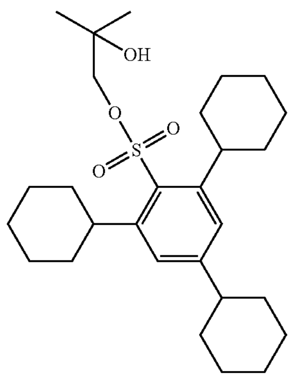
(3-12)
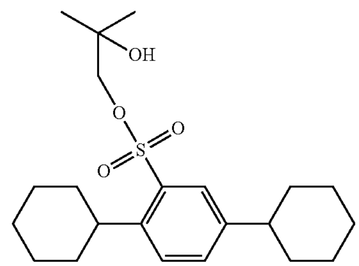
(3-13)
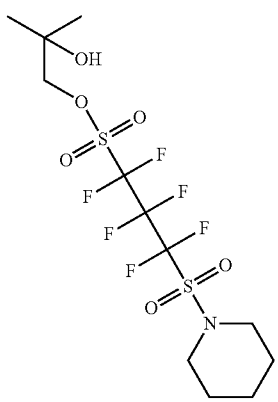
(3-14)
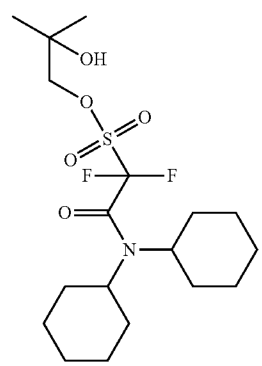
(3-15)
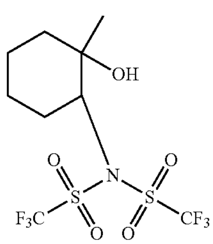
(4-1)
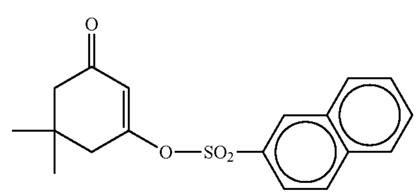
(4-2)
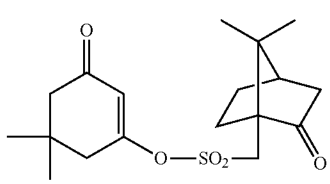
(4-3)
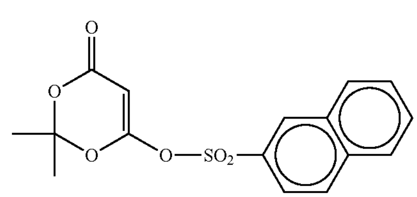

-continued
(4-4)
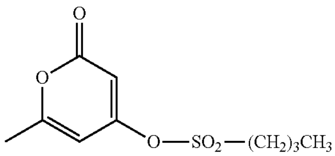
(4-5)
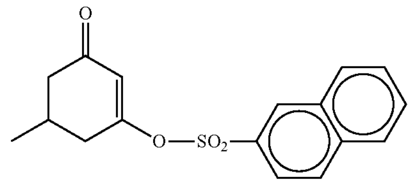
(4-6)
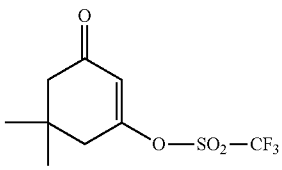
(4-7)
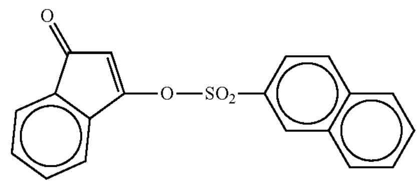
(4-8)
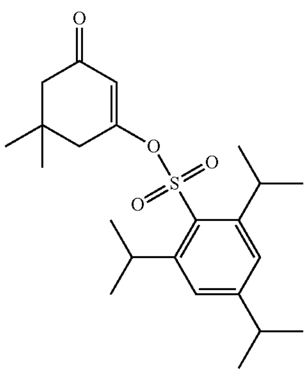
(4-9)
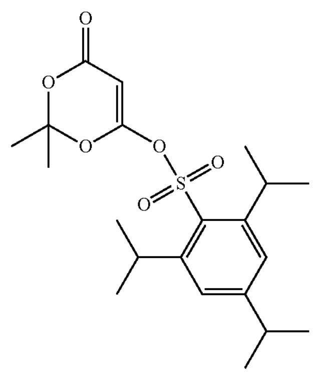
(4-10)
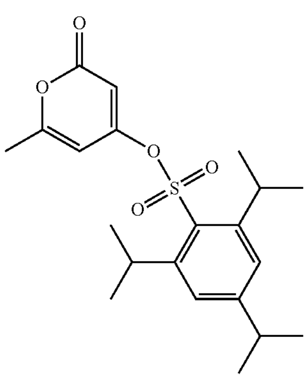
(4-11)
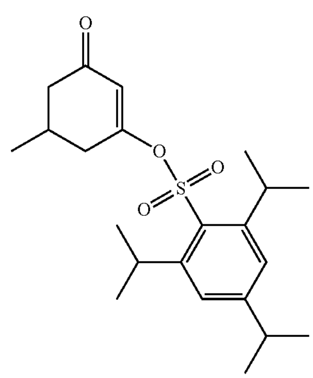
(4-12)
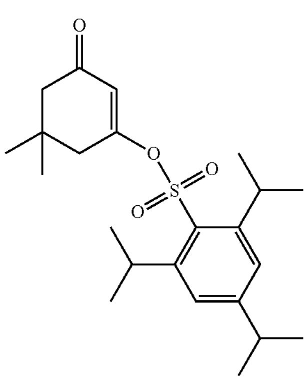
(4-13)
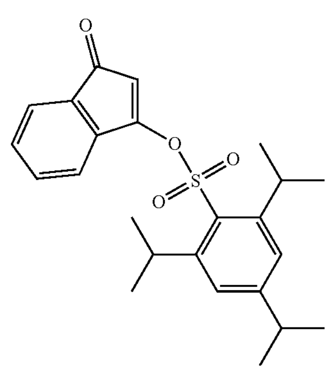

-continued
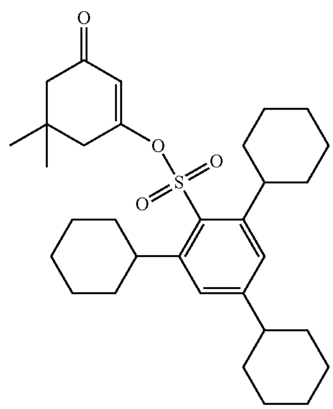
(4-14)
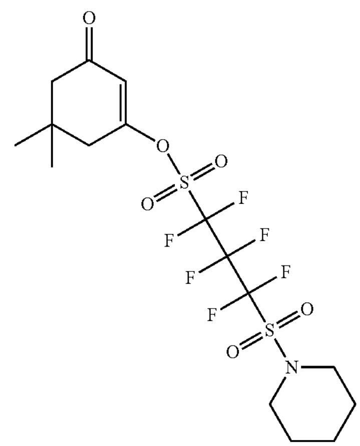
(4-15)
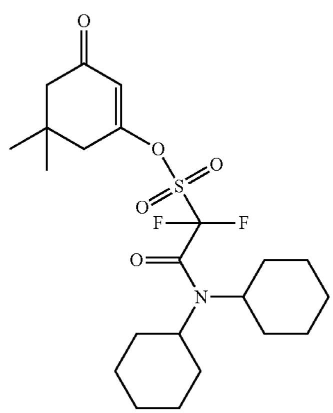
(4-16)
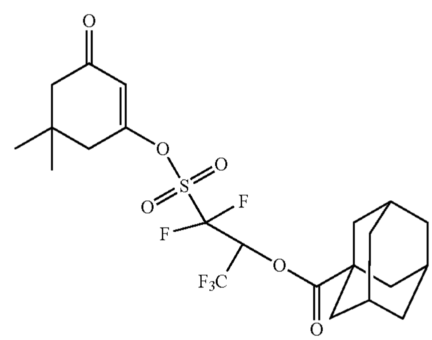
(4-17)
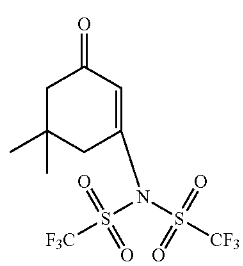
(4-18)
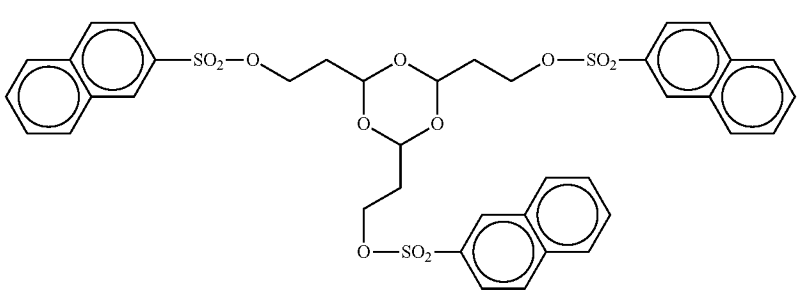
(5-1)

-continued
(5-2)
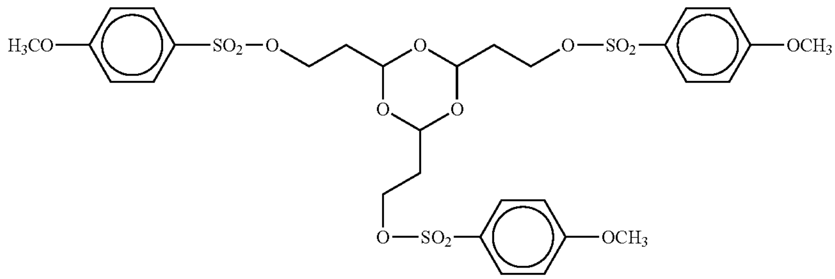
(5-3)
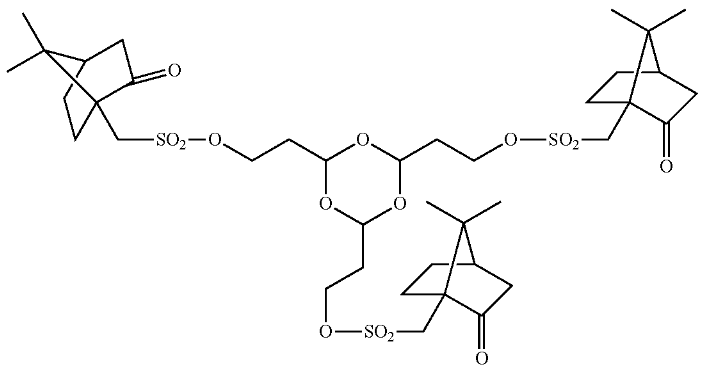
(5-4)
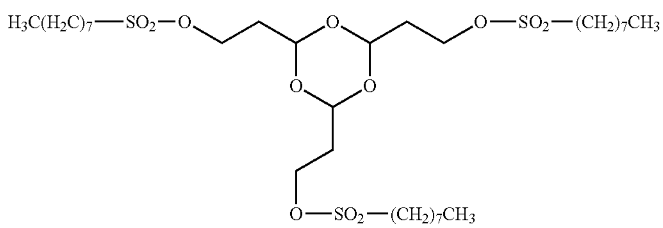
(6-1)
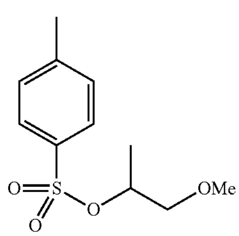
(6-2)
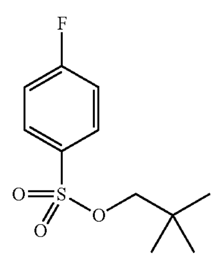
(6-3)
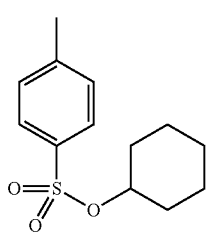
(6-4)
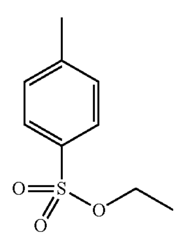

-continued
(6-5)
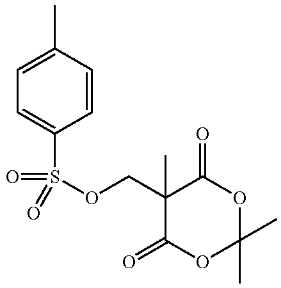
(6-6)
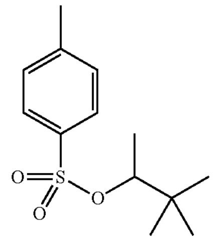
(6-7)
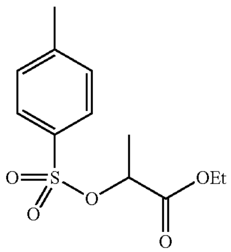
(6-8)
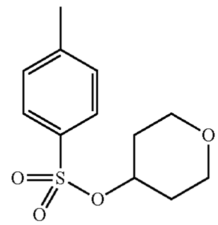
(6-9)
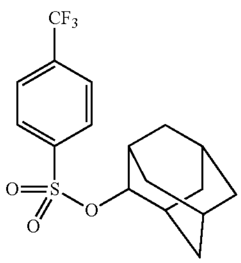
(6-10)
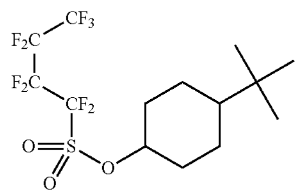
(6-11)
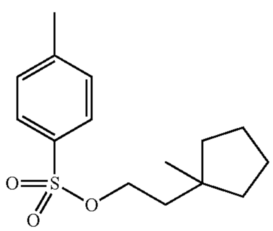
(6-12)
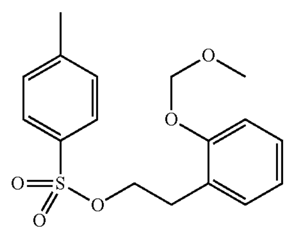
(6-13)
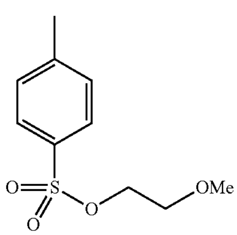
(6-14)
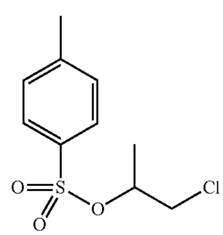
(6-15)
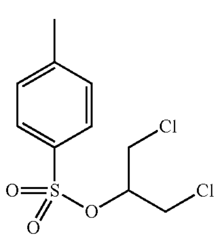
(6-16)
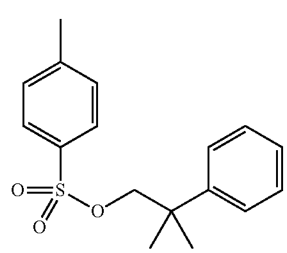

-continued

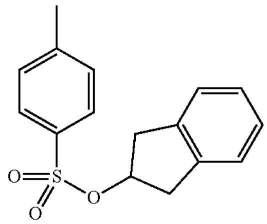

(6-17)

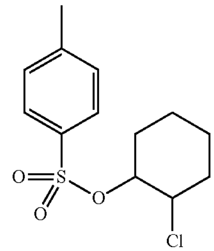

(6-18)

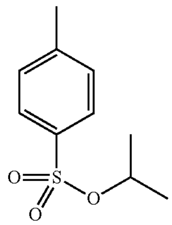

(6-19)

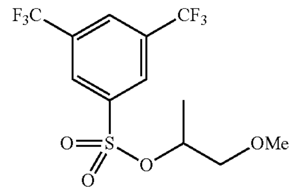

(6-20)

The compound represented by the following formula (7) or (8) is described below.

Formula (7)

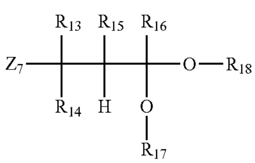

Formula (8)

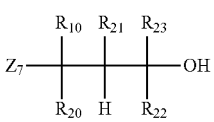

In formulae (7) and (8), each of $R_{13}$ to $R_{16}$ and $R_{19}$ to $R_{23}$ represents a hydrogen atom or a monovalent substituent.

Each of $R_{17}$ and $R_{18}$ represents a monovalent substituent, and $R_{17}$ and $R_{18}$ may combine with each other to form a ring.

$Z_7$ and $Z_8$ are as described above.

Incidentally, the compound represented by formula (7) may have a plurality of groups represented by $Z_7$ in the same molecule. Similarly, the compound represented by formula (8) may have a plurality of groups represented by $Z_8$ in the same molecule.

$R_{13}$ to $R_{16}$ in formula (7) are described below.

In formula (7), each of $R_{13}$ to $R_{16}$ represents a hydrogen atom or a monovalent substituent.

Examples of the monovalent substituent include an alkyl group, a cycloalkyl group, an alkenyl group, an alkynyl group, an aryl group, a halogen atom, an alkoxy group, an aryloxy group, an alkanoyl group, an alkoxycarbonyl group, an aryloxycarbonyl group, an alkylsulfonyloxy group, an arylsulfonyloxy group, an alkylsulfonyl group, an arylsulfonyl group, a cyano group, an alkylthioxy group, an arylthioxy group, and a heterocyclic group. Of these, an alkyl group, a cycloalkyl group, an alkenyl group, an alkynyl group, an aryl group, an alkoxy group, an aryloxy group, an alkanoyl group, an alkoxycarbonyl group, an aryloxycarbonyl group, an alkylsulfonyloxy group, an arylsulfonyloxy group, an alkylsulfonyl group, an arylsulfonyl group, a cyano group, an alkylthioxy group, an arylthioxy group and a heterocyclic group may have a substituent.

The alkyl group is preferably an alkyl group having a carbon number 1 to 30, and examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The cycloalkyl group may have a monocyclic structure or a polycyclic structure. Preferred examples of the cycloalkyl group having a monocyclic structure include a cyclopentyl group, a cyclohexyl group, and a cyclooctyl group. Preferred examples of the cycloalkyl group having a polycyclic structure include a norbornyl group, a tricyclodecanyl group, a tetracyclodecanyl group, a tetracyclododecanyl group, and an adamantyl group. The cycloalkyl group is preferably a cycloalkyl group having a carbon number of 3 to 8, and, for example, a cyclopentyl group and a cyclohexyl group are more preferred.

The alkenyl group is preferably an alkenyl group having a carbon number of 2 to 10, and examples thereof include a vinyl group, an allyl group, and a styryl group.

The alkynyl group is preferably an alkynyl group having a carbon number of 2 to 10, and examples thereof include an ethynyl group, a propynyl group, and a propargyl group.

The aryl group is preferably an aryl group having a carbon number of 6 to 30, and examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-, m- or p-tolyl group, a xylyl group, an o-, m- or p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The halogen atom includes a fluorine atom, a chlorine atom, a bromine atom, and an iodine atom.

Examples of the alkoxy group include a methoxy group, an ethoxy group, a propioxy group, an n-butoxy group, a trifluoromethoxy group, a hexyloxy group, a tert-butoxy group, a 2-ethylhexyloxy group, a cyclohexyloxy group, a decyloxy group, and a dodecyloxy group.

Examples of the aryloxy group include a phenyloxy group, a 1-naphthyloxy group, a 2-naphthyloxy group, a tolyloxy group, a methoxyphenyloxy group, a naphthyloxy group, a chlorophenyloxy group, a trifluoromethylphenyloxy group, a cyanophenyloxy group, and a nitrophenyloxy group.

The alkanoyl group is preferably an alkanoyl group having a carbon number of 2 to 20, and examples thereof include an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group is preferably an alkoxycarbonyl group having a carbon number of 2 to 20, and examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Examples of the aryloxycarbonyl group include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-tri fluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The alkylsulfonyloxy group is preferably an alkylsulfonyloxy group having a carbon number of 1 to 20, and examples thereof include a methylsulfonyloxy group, an ethylsulfonyloxy group, a propylsulfonyloxy group, an isopropylsulfonyloxy group, a butylsulfonyloxy group, a hexylsulfonyloxy group, a cyclohexylsulfonyloxy group, an octylsulfonyloxy group, a 2-ethylhexylsulfonyloxy group, a decanoylsulfonyloxy group, a dodecanoylsulfonyloxy group, an octadecanoylsulfonyloxy group, a cyanomethylsulfonyloxy group, a methoxymethylsulfonyloxy group, and a perfluoroalkylsulfonyloxy group.

The arylsulfonyloxy group is preferably an arylsulfonyloxy group having a carbon number of 6 to 30, and examples thereof include a phenylsulfonyloxy group, a 1-naphthylsulfonyloxy group, a 2-naphthylsulfonyloxy group, a 2-chlorophenylsulfonyloxy group, a 2-methyiphenylsulfonyloxy group, a 2-methoxyphenylsulfonyloxy group, a 2-butoxyphenylsulfonyloxy group, a 3-chlorophenylsulfonyloxy group, a 3-trifluoromethylphenylsulfonyloxy group, a 3-cyanophenylsulfonyloxy group, a 3-nitrophenylsulfonyloxy group, a 4-fluorophenylsulfonyloxy group, a 4-cyanophenylsulfonyloxy group, a 4-methoxyphenylsulfonyloxy group, a 4-methylsulfanylphenylsulfonyloxy group, a 4-phenylsulfanylphenylsulfonyloxy group, and a 4-dimethylaminophenylsulfonyloxy group.

The alkylsulfonyl group is preferably an alkylsulfonyl group having a carbon number of 1 to 20, and examples thereof include a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methoxymethylsulfonyl group, and a perfluoroalkylsulfonyl group.

The arylsulfonyl group is preferably an arylsulfonyl group having a carbon number of 6 to 30, and examples thereof include a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, and a 4-dimethylaminophenylsulfonyl group.

Examples of the alkylthioxy group include a methylthioxy group, an ethylthioxy group, a propylthioxy group, an n-butylthioxy group, a trifluoromethylthioxy group, a hexylthioxy group, a tert-butylthioxy group, a 2-ethylhexylthioxy group, a cyclohexylthioxy group, a decylthioxy group, and a dodecylthioxy group.

Examples of the arylthioxy group include a phenylthioxy group, a 1-naphthylthioxy group, a 2-naphthylthioxy group, a tolylthioxy group, a methoxyphenylthioxy group, a naphthylthioxy group, a chlorophenylthioxy group, a trifluoromethylphenylthioxy group, a cyanophenylthioxy group, and a nitrophenylthioxy group.

The heterocyclic group is preferably an aromatic or aliphatic heterocyclic ring containing a nitrogen atom, an oxygen atom, a sulfur atom or a phosphorus atom. Examples of the heterocyclic group include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl, and a thioxanthryl group.

Examples of the substituent which any one of $R_{13}$ to $R_{16}$ may have include a halogen atom such as fluorine atom, chlorine atom, bromine atom and iodine atom; an alkoxy group such as methoxy group, ethoxy group and tert-butoxy group; an aryloxy group such as phenoxy group and p-tolyloxy group; an alkoxycarbonyl group such as methoxycarbonyl group, butoxycarbonyl group and phenoxycarbonyl group; an acyloxy group such as acetoxy group, propionyloxy group and benzoyloxy group; an acyl group such as acetyl group, benzoyl group, isobutyryl group, acryloyl group, methacryloyl group and methoxalyl group; an alkylsulfanyl group such as methylsulfanyl group and tert-butylsulfanyl group; an arylsulfanyl group such as phenylsulfanyl group and p-tolylsulfanyl group; an alkylamino group such as methylamino group and cyclohexylamino group; a dialkylamino group such as dimethylamino group, diethylamino group, morpholino group and piperidino group; an arylamino group such as phenylamino group and p-tolylamino group; an alkyl group such as methyl group, ethyl group, tert-butyl group and dodecyl group; an aryl group such as phenyl group, p-tolyl group, xylyl group, cumenyl group, naphthyl group, anthryl group and phenanthryl group; a hydroxy group; a carboxy group; a formyl group; a mercapto group; a sulfo group; a mesyl group; a p-toluenesulfonyl group; an amino group; a nitro group; a cyano group; a trifluoromethyl group; a trichloromethyl group; a trimethylsilyl group; a phosphinico group; a phosphono group; a trimethylammoniumyl group; a dimethylsulfoniumyl group; and a triphenylphenancylphosphoniumyl group.

Two or more of $R_{13}$ to $R_{16}$ may combine with each other to form a ring structure. This ring structure may be an aliphatic or aromatic hydrocarbon ring or may be a heterocyclic ring containing a heteroatom. These $R_{13}$ to $R_{16}$ may also form a polycondensed ring.

Examples of the aliphatic or aromatic hydrocarbon ring include those having a 6-membered, 5-membered or 7-membered ring structure. The hydrocarbon ring is preferably a hydrocarbon ring having a 6-membered or 5-membered ring structure, more preferably a hydrocarbon ring having a 5-membered ring structure.

Examples of the heterocyclic ring include those containing a sulfur atom, an oxygen atom or a nitrogen atom as the heteroatom. A heterocyclic ring containing a sulfur atom as the heteroatom is preferred.

Examples of the polycondensed ring include a condensed ring composed of only a hydrocarbon ring. Examples of such a polycondensed ring include a condensed ring formed by fusing 2 to 4 benzene rings, and a condensed ring formed by fusing a benzene ring and a 5-membered unsaturated ring.

The polycondensed ring may be a condensed ring containing at least one heterocyclic ring. Examples of such a polycondensed ring include a condensed ring formed by fusing a benzene ring and a 5-membered heterocyclic ring, and a condensed ring formed by fusing a benzene ring and a 6-membered heterocyclic ring.

Examples of the ring structure which can be formed by $R_{13}$ to $R_{16}$ include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, a dithiolane ring, an oxirane ring, a dioxirane ring, a thiirane ring, a pyrrolidine ring, a piperidine ring, an imidazole ring, an isoxazole ring, a benzothiazole ring, an oxazole ring, a thiazole ring, a benzothiazole ring, a benzimidazole ring, a benzoxazole ring, a pyridine ring, a pyrazine ring, a pyrimidine ring, a pyridazine ring, an indolizine ring, an indole ring, a benzofuran ring, a benzothiophene ring, a benzodithiole ring, an isobenzofuran ring, a quinolizine ring, a quinoline ring, a phthalazine ring, a naphthyridine ring, a quinoxaline ring, a quinazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among others, a dithiolane ring, a benzodithiole ring, a benzothiazole ring, a benzimidazole ring and a benzoxazole ring are preferred.

Each of $R_{13}$ to $R_{16}$ is independently preferably a hydrogen atom, an alkyl group, a cycloalkyl group or an aryl group.

$R_{17}$ and $R_{18}$ are described below.

In formula (1), each of $R_{17}$ and $R_{18}$ represents a monovalent substituent. Examples of the monovalent substituent include a monovalent organic group and a silyl group. Examples of the monovalent organic group include an alkyl group, a cycloalkyl group, an alkenyl group, an alkynyl group, an aryl group, an alkanoyl group, an alkoxycarbonyl group, an aryloxycarbonyl group, an alkylsulfonyl group, an arylsulfonyl group, an alkylthiocarbonyl group, an arylthiocarbonyl group, and a dialkylaminocarbonyl group. These monovalent organic groups may further have a substituent.

Examples of the alkyl group, cycloalkyl group, alkenyl group, alkynyl group, aryl group, alkanoyl group, alkoxycarbonyl group, aryloxycarbonyl group, alkylsulfonyl group, arylsulfonyl group, alkylthiocarbonyl group and arylthiocarbonyl group are the same as those described above for $R_{13}$ to $R_{16}$.

Examples of the dialkylaminocarbonyl group which may have a substituent include a dimethylaminocarbonyl group, a diethylaminocarbonyl group, a dipropylaminocarbonyl group, and a dibutylaminocarbonyl group.

$R_{17}$ and $R_{18}$ may combine with each other to form a ring. $R_{17}$ and $R_{18}$ preferably combine with each other to form a cyclic acetal structure. The cyclic acetal structure may have, as a substituent, an aliphatic or aromatic hydrocarbon ring or a heterocyclic ring containing a heteroatom. Also, the hydrocarbon ring and/or the heterocyclic ring may form a condensed ring with the cyclic acetal. Examples of the hydrocarbon ring and heterocyclic ring are the same as those described above for $R_{13}$ to $R_{16}$.

$R_{19}$ to $R_{23}$ in formula (8) are described.

Each of $R_{19}$ to $R_{23}$ represents a hydrogen atom or a monovalent substituent.

$R_{19}$ is, for example, an alkyl group, a cycloalkyl group, an aryl group, an aralkyl group, an alkoxy group, an aryloxy group, an alkenyloxy group or a hydrogen atom.

$R_{20}$ is, for example, an alkyl group, a cycloalkyl group, an aryl group, an aralkyl group, an alkoxy group, an aryloxy group, an alkenyl group or a hydrogen atom.

$R_{21}$ is, for example, an alkyl group, a cycloalkyl group, an aryl group, an aralkyl group, an alkoxy group, an aryloxy group, an alkenyl group or a hydrogen atom.

$R_{22}$ is, for example, an alkyl group, a cycloalkyl group, an aryl group, an aralkyl group, an alkoxy group, an aryloxy group, an alkenyl group or a hydrogen atom.

$R_{23}$ is, for example, an alkyl group, a cycloalkyl group, an aryl group, an aralkyl group, an alkoxy group, an aryloxy group, an alkenyl group or a hydrogen atom.

The alkyl group is preferably an alkyl group having a carbon number of 1 to 8, and examples thereof include a methyl group, an ethyl group, a propyl group, an isopropyl group, a butyl group, and an octyl group.

The cycloalkyl group is preferably a cycloalkyl group having a carbon number of 4 to 10, and examples thereof include a cyclopropyl group, a cyclopentyl group, a cyclohexyl group, a cyclobutyl group, an adamantyl group, a boronyl group, an isoboronyl group, a tricyclodecanyl group, a dicyclopentenyl group, a norbornane epoxy group, a menthyl group, an isomenthyl group, a neomenthyl group, and a tetracyclododecanyl group.

The aryl group is preferably an aryl group having a carbon number of 6 to 14, and examples thereof include a phenyl group, a naphthyl group and a tolyl group.

The aralkyl group includes an aralkyl group having a carbon number of 7 to 20, and specific examples thereof include a benzyl group, a phenethyl group and a naphthylethyl group.

The alkoxy group is preferably an alkoxy group having a carbon number of 1 to 8, and examples thereof include a methoxy group, an ethoxy group, a propoxy group, a cyclohexyloxy group, and a butoxy group.

The aryloxy group is preferably an aryloxy group having a carbon number of 6 to 14, and examples thereof include a phenoxy group and a naphthoxy group.

The alkenyl group is preferably an alkenyl group having a carbon number of 2 to 6, and examples thereof include a vinyl group, a propenyl group, an allyl group, a butenyl group, a pentenyl group, a hexenyl group, and a cyclohexenyl group.

The alkenyloxy group is preferably an alkenyloxy group having a carbon number of 2 to 8, and examples thereof include a vinyloxy group and an allyloxy group.

These alkyl, cycloalkyl, aryl, aralkyl, alkoxy, aryloxy, alkenyl and alkenyloxy groups may have a substituent. Examples of the substituent include a halogen atom such as Cl, Br and F, a —CN group, an —OH group, an alkyl group having a carbon number of 1 to 4, a cycloalkyl group having a carbon number of 3 to 8, an alkoxy group having a carbon number of 1 to 4, an acylamino group such as acetylamino group, an aralkyl group such as benzyl group and phenethyl group, an aryloxyalkyl group such as phenoxyethyl group, an alkoxycarbonyl group having a carbon number of 2 to 5, and an acyloxy group having a carbon number of 2 to 5.

$R_{19}$ is preferably, for example, a hydrogen atom, a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyloxy group or a methylvinyloxy group.

$R_{20}$ is preferably, for example, a hydrogen atom, a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group or an allyl group.

$R_{21}$ is preferably, for example, a hydrogen atom, a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group or an allyl group.

$R_{22}$ is preferably, for example, a hydrogen atom, a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group or an allyl group.

$R_{23}$ is preferably, for example, a hydrogen atom, a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group or an allyl group.

At least two of $R_{19}$ to $R_{23}$ may combine with each other to form a ring structure.

Examples of the compound represented by formula (7) or (8) include the followings.

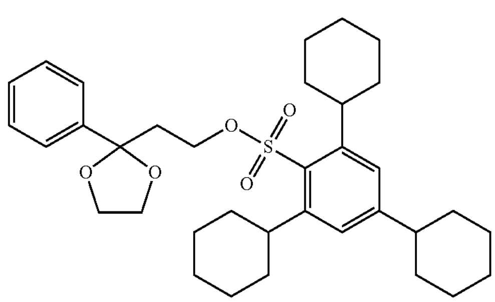

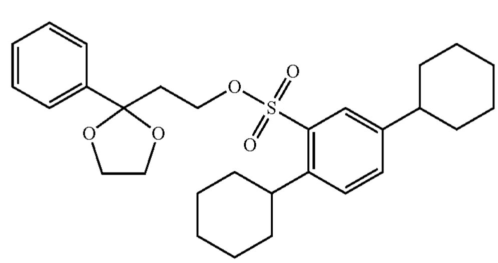

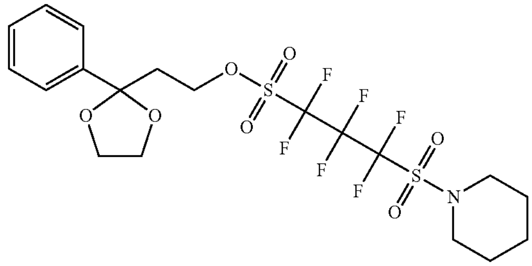

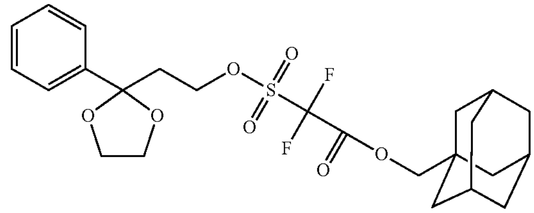

-continued
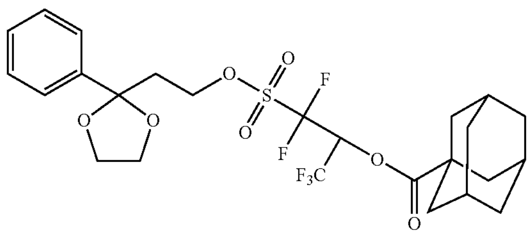
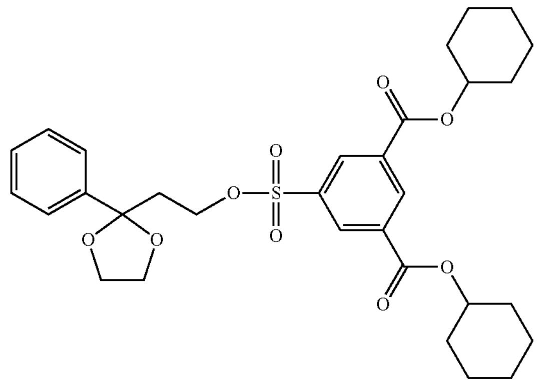
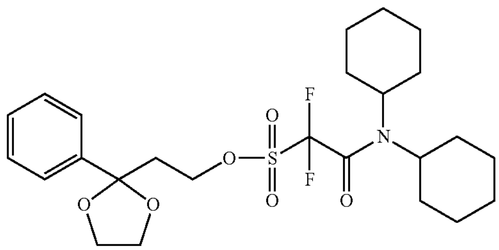
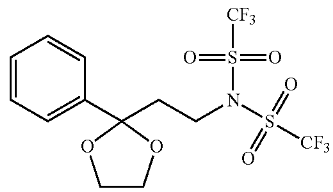
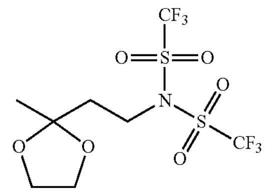
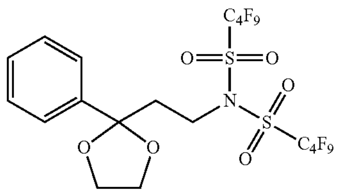
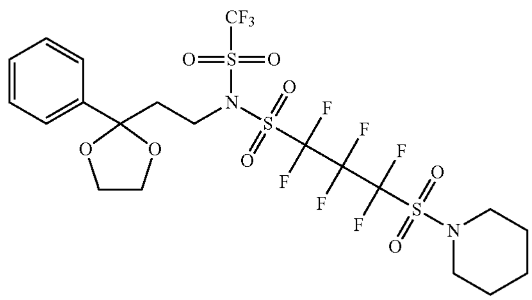
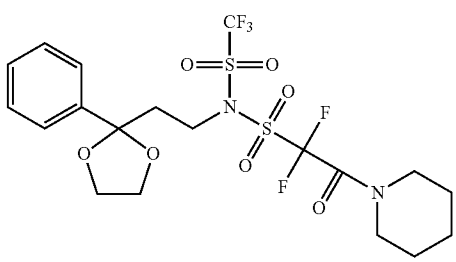
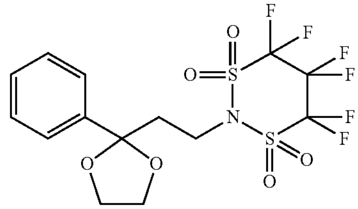
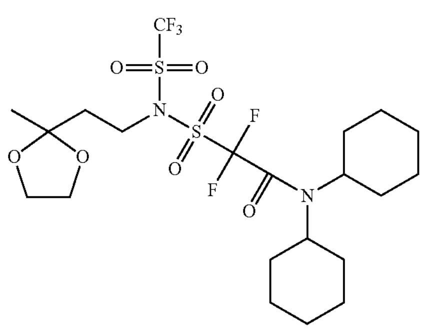
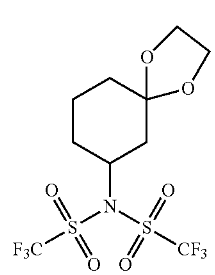
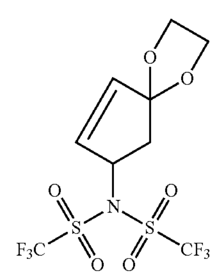

-continued
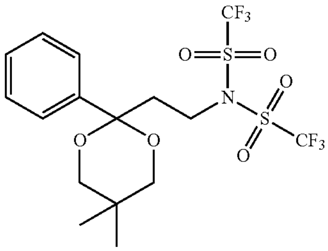
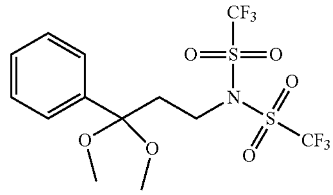
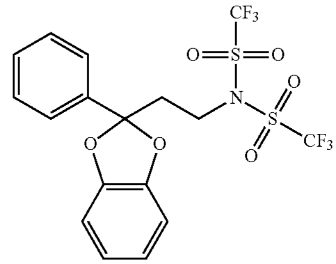
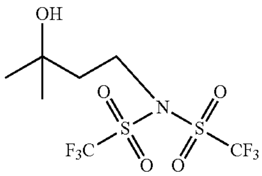
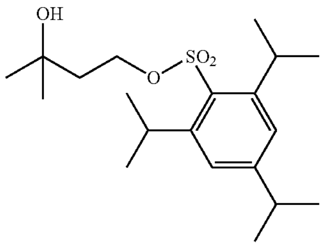
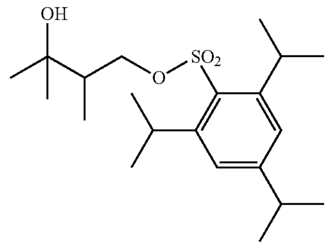
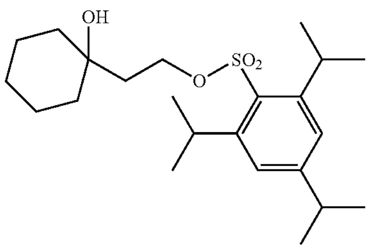
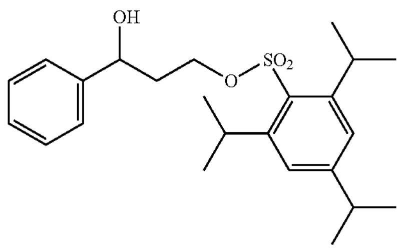
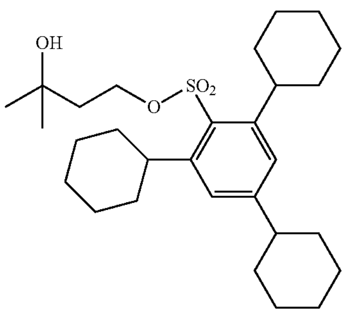
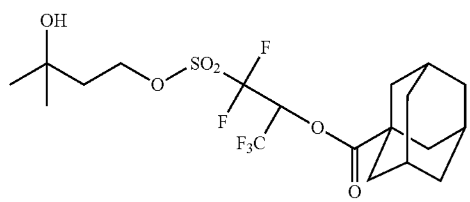
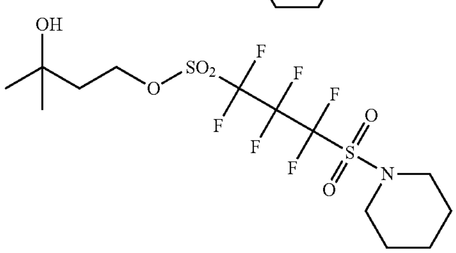
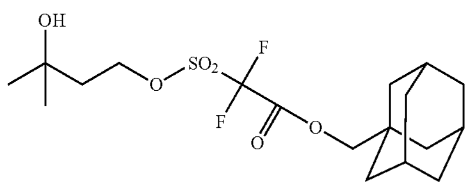
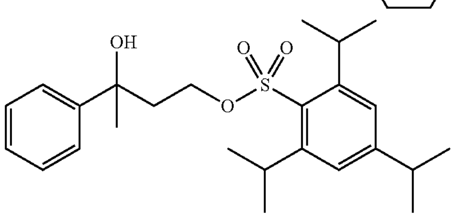
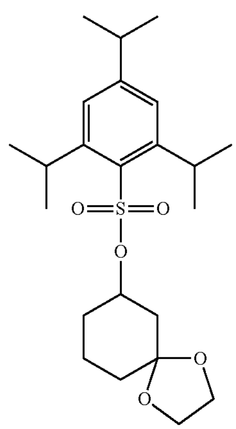
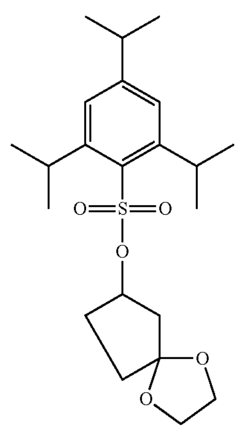

-continued
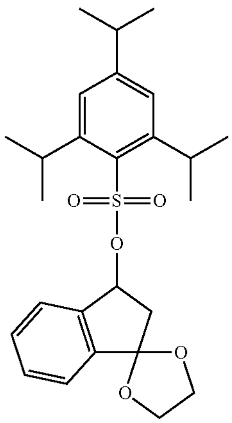
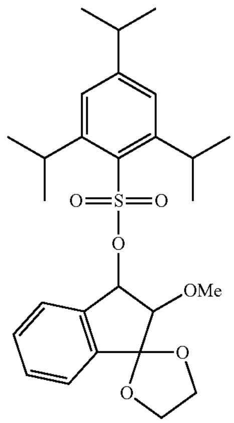
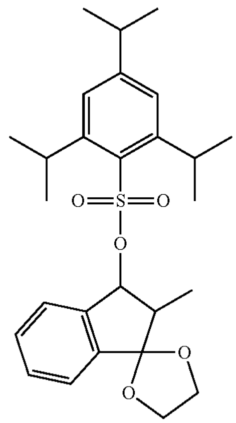
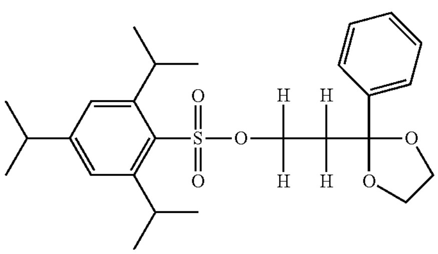
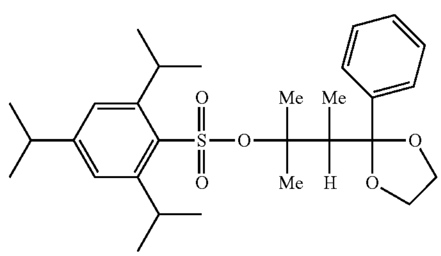
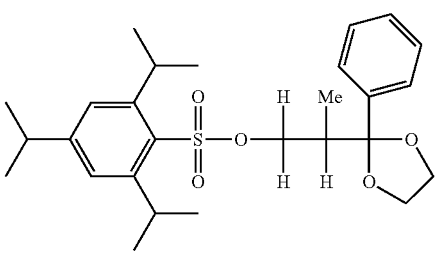
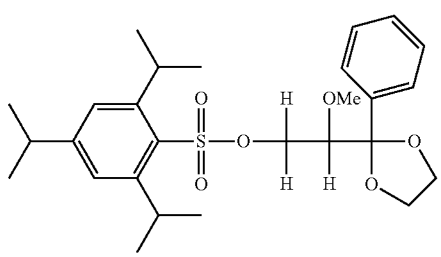
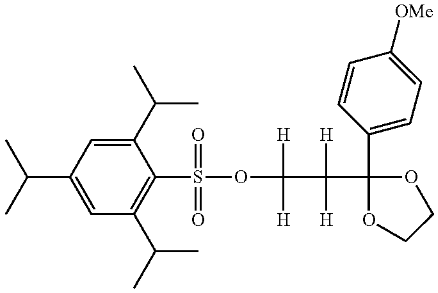
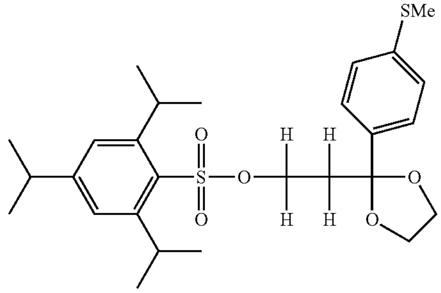

-continued
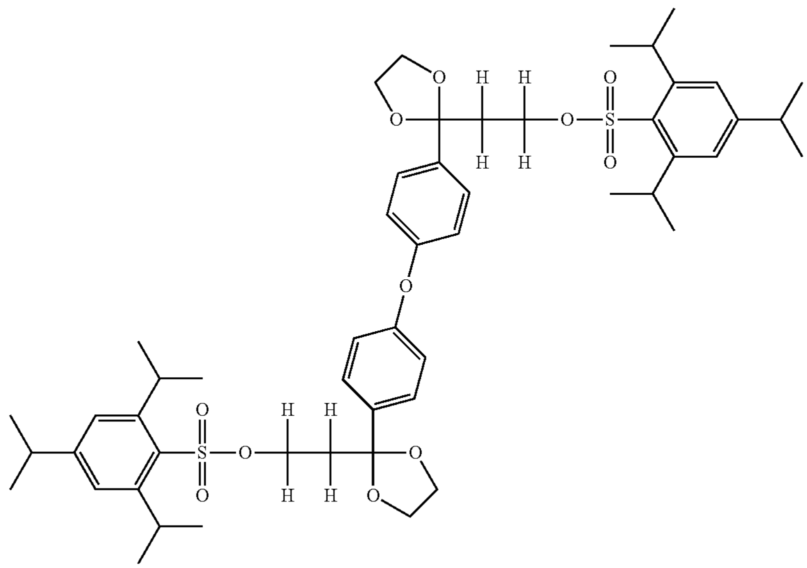
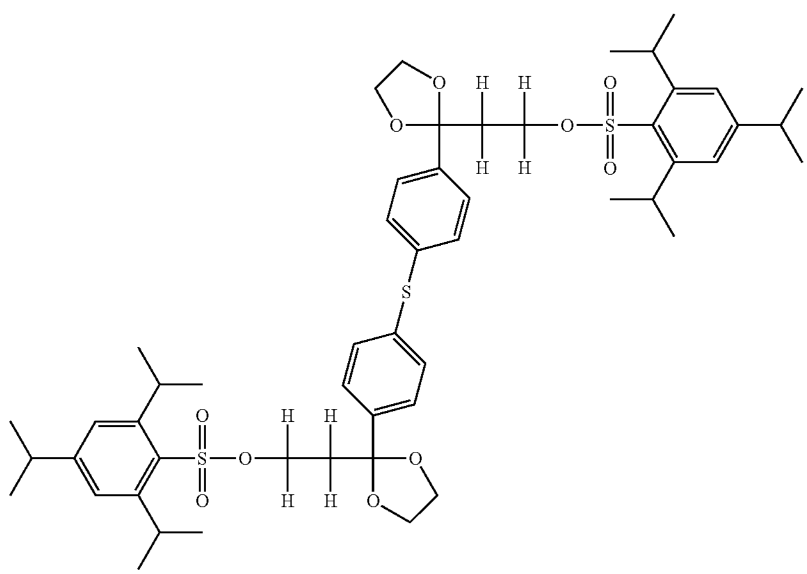
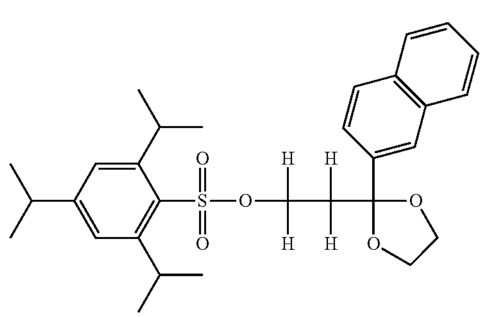
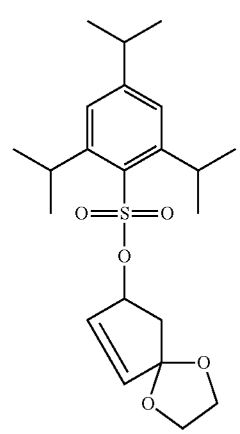

-continued

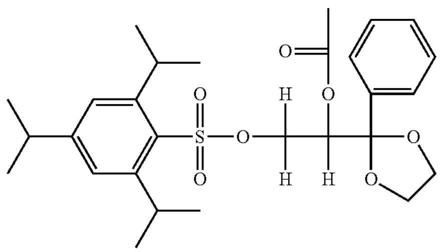

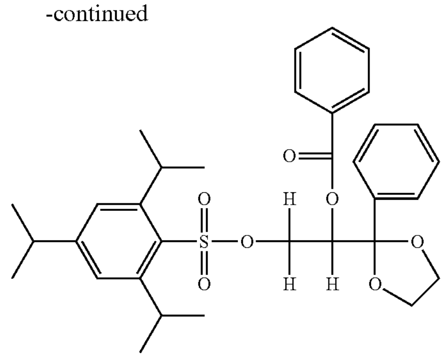

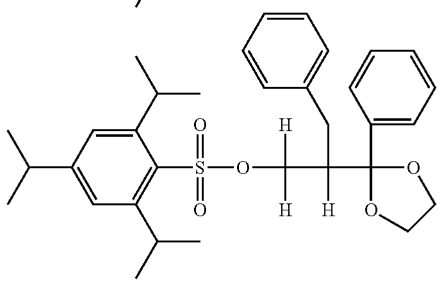

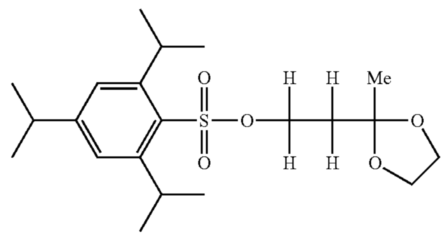

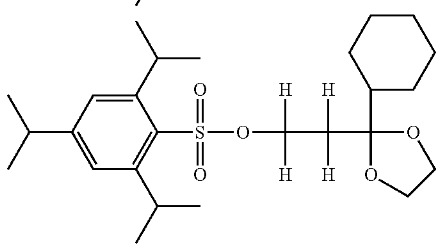

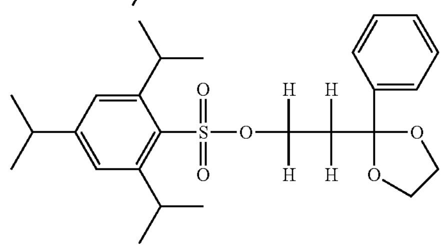

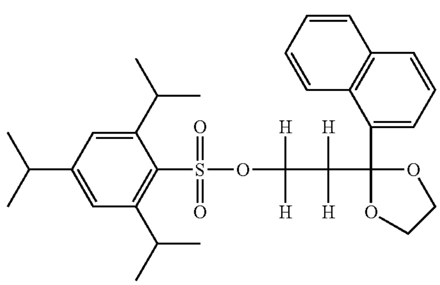

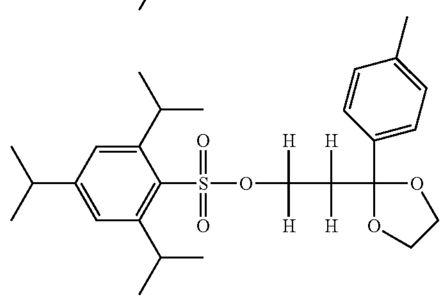

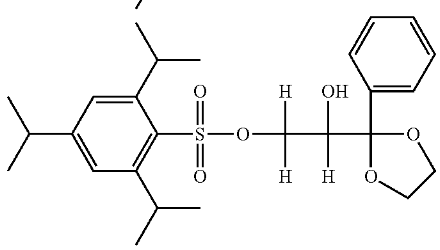

As for the production method of the compound represented by formula (7) or (8), a corresponding alcohol compound and a sulfonyl halide or a sulfonic anhydride are reacted in an inert solvent such as THF, DMF and acetonitrile or a basic solvent such as pyridine in the presence of a base (for example, triethylamine or pyridine), whereby the compound can be easily synthesized. The reaction temperature is preferably from −10 to 60° C.

Also, when an alkylsulfonyl halide, an arylsulfonyl halide or the like is used as the sulfonyl halide above, compounds capable of generating various corresponding sulfonic acids can be synthesized.

The acid generated from the acid-increasing agent is preferably a sulfonic acid, an imide acid, a carboxylic acid or a methide acid, more preferably a sulfonic acid or an imide acid, still more preferably a sulfonic acid.

In other words, in formulae (1) to (5), (7) and (8), each of $Z_1$, $Z_1'$, $Z_3$, $Z_4$, $Z_5$, $Z_7$ and $Z_8$ is independently preferably a group ($Rb_1$—$SO_3$—) represented by formula (Z-a).

In the present invention, the acid-increasing agent can be used alone or in combination with two or more thereof.

The composition (II) may or may not contain an acid-increasing agent. When the composition (II) contains the acid-increasing agent, the content of the acid-increasing agent is preferably from 0.1 to 50 mass %, more preferably from 0.5 to 30 mass %, further preferably from 1.0 to 20 mass %, based on the total solid content of the composition (II).

Up to this point the composition (II) for use in the present pattern forming method has been illustrated, and the present invention also relates to a composition that contains the compound (A') capable of increasing polarity by the action of an acid to decrease solubility in an organic solvent-containing remover, and that is usable in the step (iv) of the present pattern forming method.

Further, the present invention relates to a manufacturing method for an electronic device, wherein the present pattern forming method is included, and also relates to an electronic device produced by using the manufacturing method.

The electronic device produced in the present invention is suitable for installation in electrical-and-electronic equipment (e.g. household electrical appliances, OA and media associated equipment, optical equipment, communications equipment).

EXAMPLES

Synthesis Example (Synthesis of Resin A-1)

Cyclohexanone in an amount of 102.3 parts by mass was heated up to 80° C. in a stream of nitrogen. Into this liquid with stirring, a mixed solution containing 22.2 parts by mass of a monomer represented by the following structural formula M-1, 22.8 parts by mass of a monomer represented by the following structural formula M-2, 6.6 parts by mass of a monomer represented by the following structural formula M-3, 189.9 parts by mass of cyclohexanone and 2.40 parts by mass of dimethyl 2,2'-azobisisobutyrate (V-601, a product of Wako Pure Chemical Industries, Ltd.) was dripped over 5 hours. After the conclusion of the dripping, the resulting mixture was stirred at 80° C. for additional 2 hours. The reaction solution thus obtained was set aside until it cooled, and then re-precipitation was performed using a large amount of hexane/ethyl acetate (9:1 by mass) mixture. The precipitate thus formed was filtered off, and subjected to vacuum drying. As a result, 41.1 parts by mass of a resin (A-1) according to the present invention was obtained.

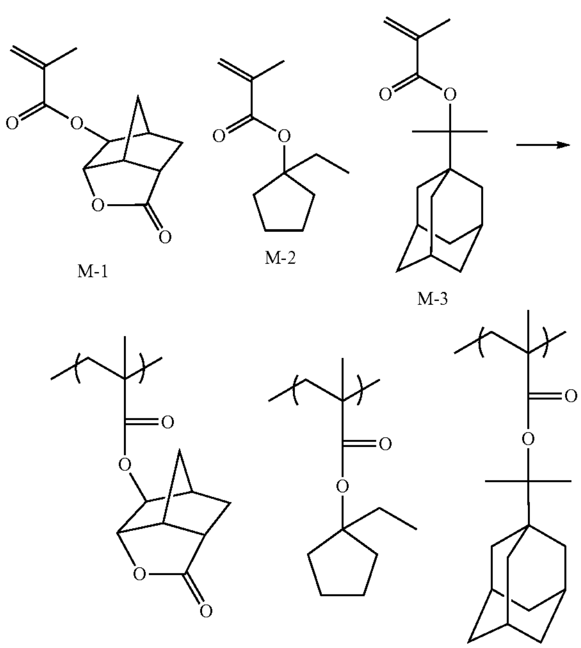

M-1 M-2 M-3

A-1

The resin thus obtained had a weight-average molecular weight of 9,500 (Mw: value measured by GPC (carrier: tetrahydrofuran (THF)) and calculated in terms of polystyrene) and a polydispersivity (Mw/Mn) of 1.60. And the constitutional ratio (molar ratio) of the resin was 40/50/10 as measured by $^{13}$C-NMR.

<Resin (A) and Compound (A')>

Likewise, Resins A-2 to A-20 were synthesized. Regarding to the resins A-2 to A-20, the constitutional ratio of the repeating units (molar ratio: corresponding to the sequence presented in a left-to-right direction), weight-average molecular weight (Mw) and polydispersity (Mw/Mn) of each resin are shown below in addition to those of the resin A-1.

A-1

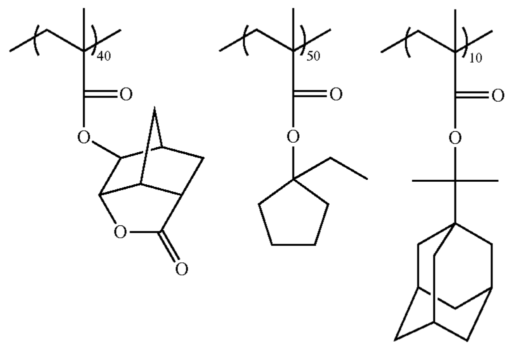

Mw: 9500
Mw/Mn: 1.60

A-2

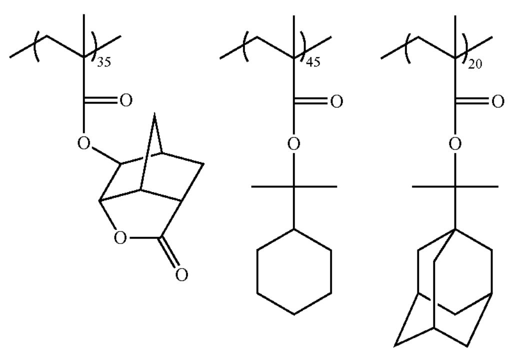

Mw: 16300
Mw/Mn: 1.65

A-3

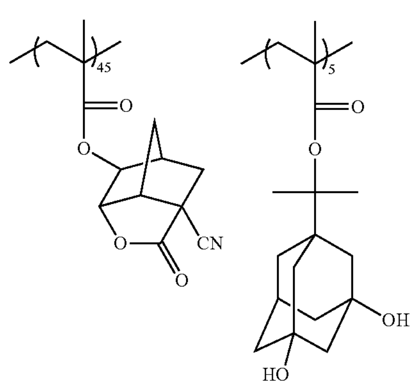

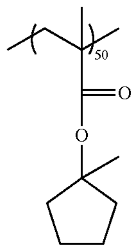
Mw: 11100
Mw/Mn: 1.63
A-4
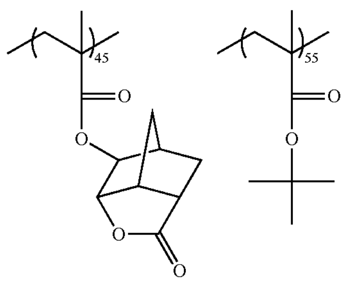
Mw: 18000
Mw/Mn: 1.70
A-5
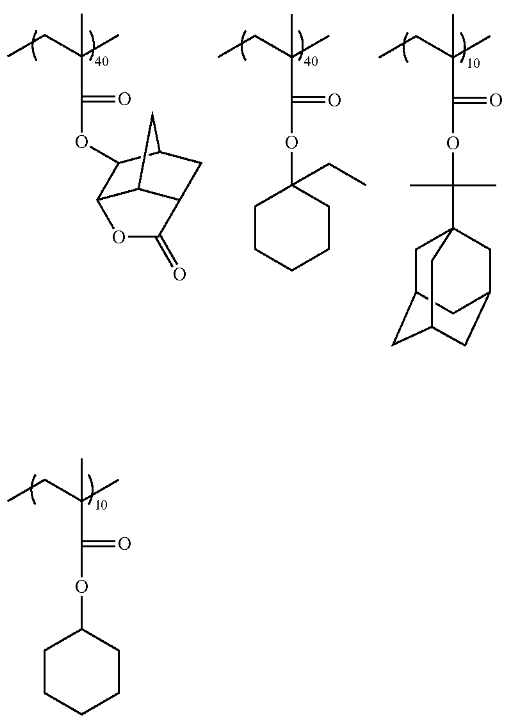
Mw: 13500
Mw/Mn: 1.67
A-6
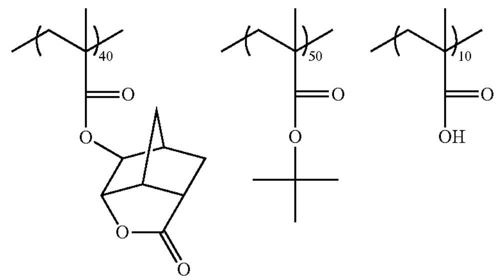
Mw: 15500
Mw/Mn: 1.71
A-7
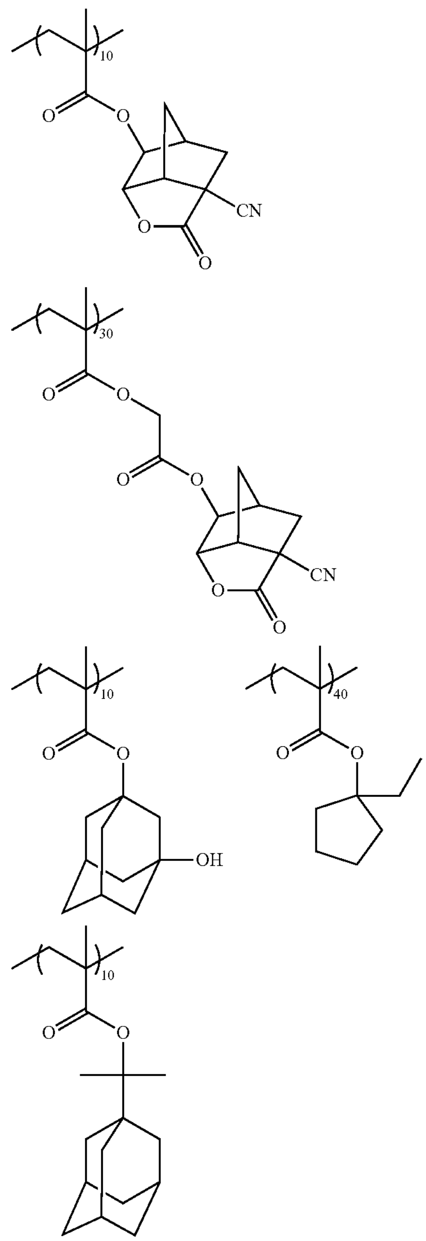
Mw: 10900
Mw/Mn: 1.65

-continued
A-8
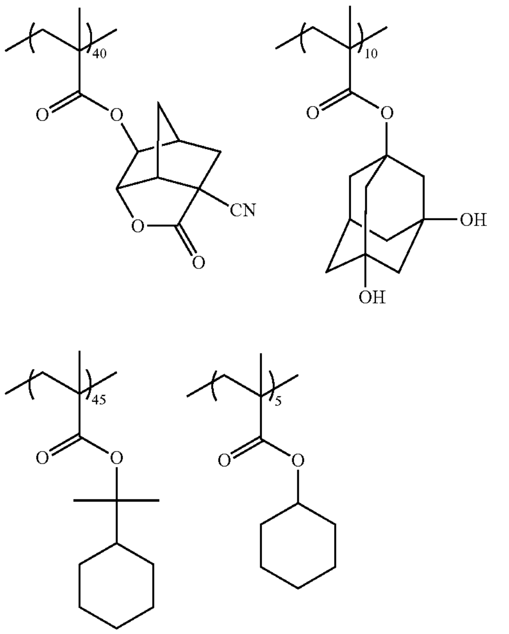
Mw: 10200
Mw/Mn: 1.66
A-9
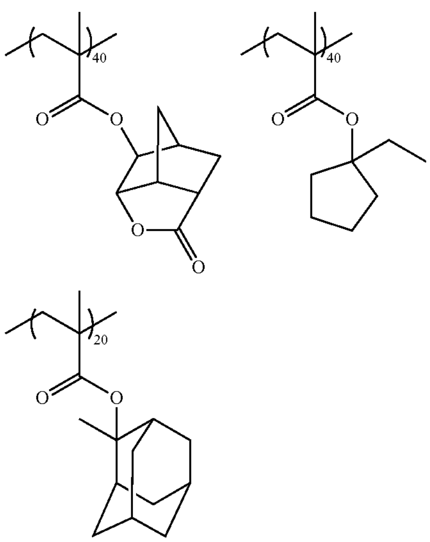
Mw: 10300
Mw/Mn: 1.71
A-10
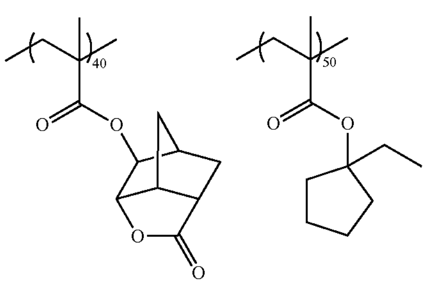
-continued
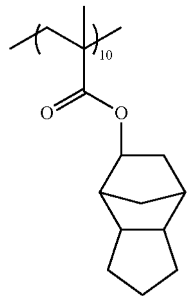
Mw: 9500
Mw/Mn: 1.66
A-11
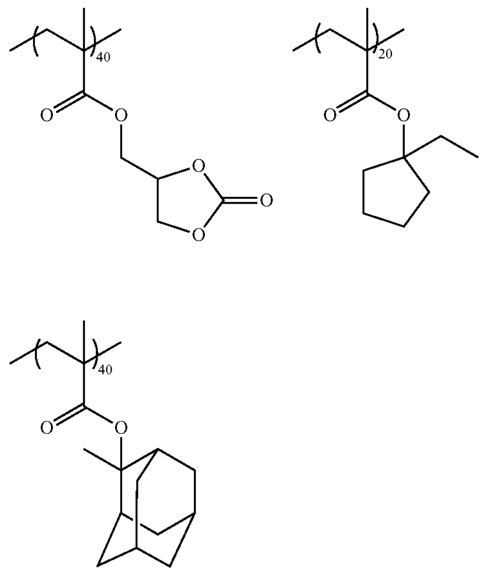
Mw: 7100
Mw/Mn: 1.62
A-12
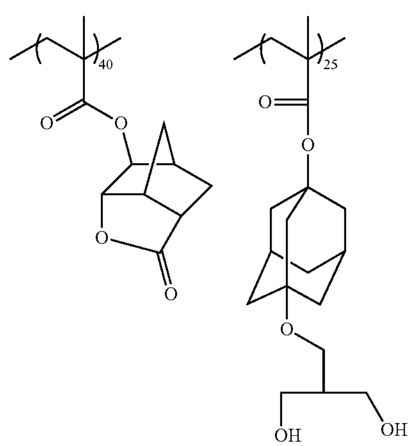

-continued
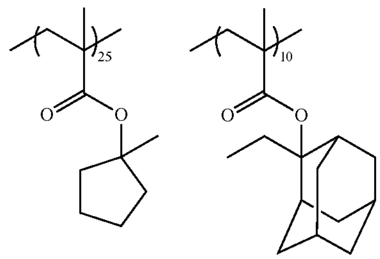
Mw: 6800
Mw/Mn: 1.65
A-13
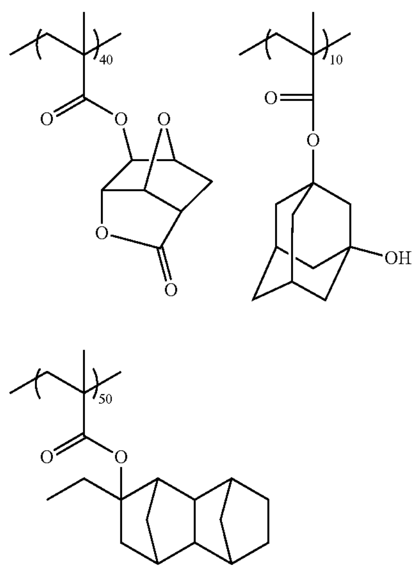
Mw: 10800
Mw/Mn: 1.71
A-14
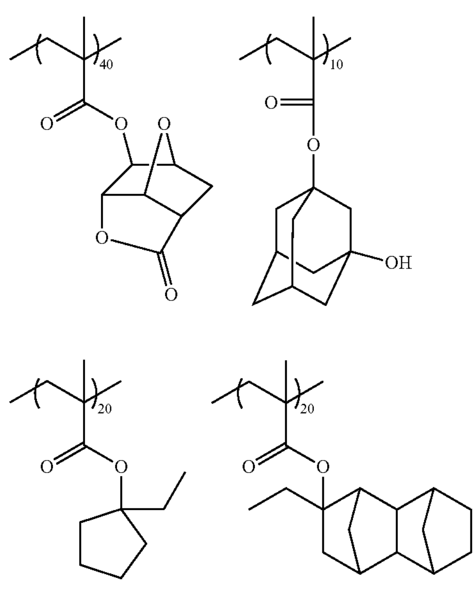
-continued
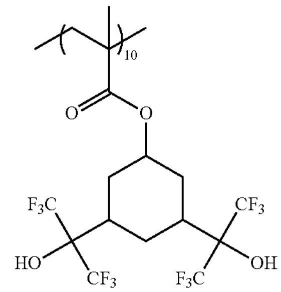
Mw: 9600
Mw/Mn: 1.72
A-15
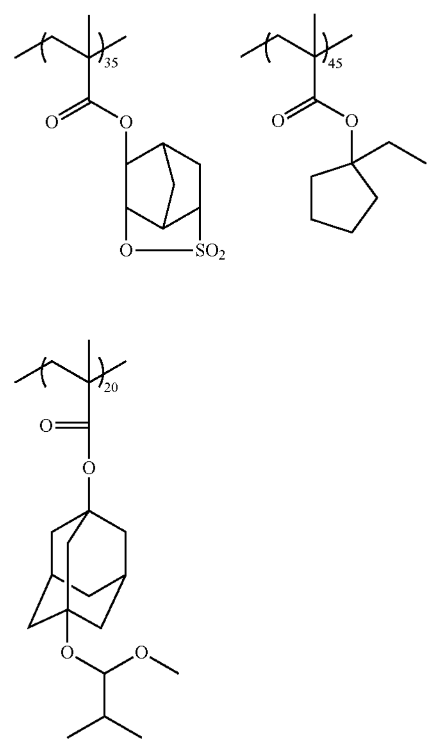
Mw: 10500
Mw/Mn: 1.62
A-16
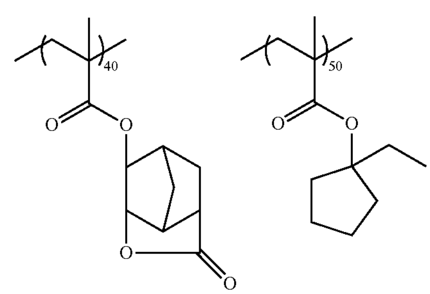

-continued
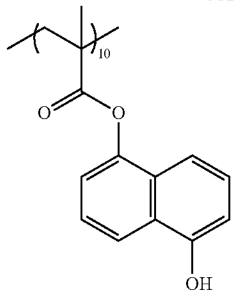
Mw: 8900
Mw/Mn: 1.67
A-17
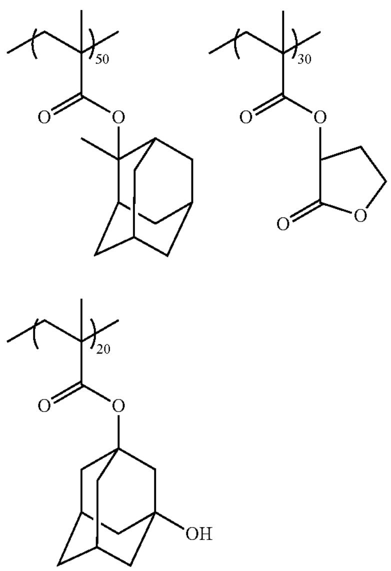
Mw: 11000
Mw/Mn: 1.68
A-18
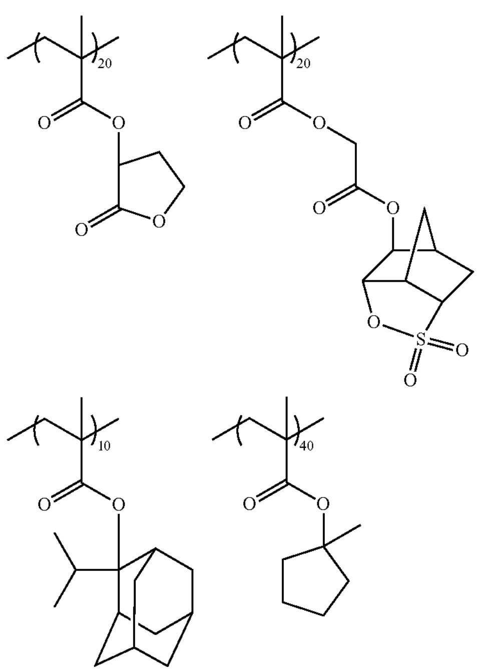
-continued
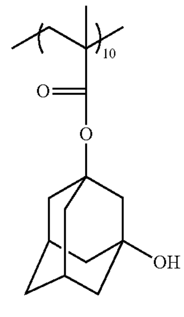
Mw: 11200
Mw/Mn: 1.65
A-19
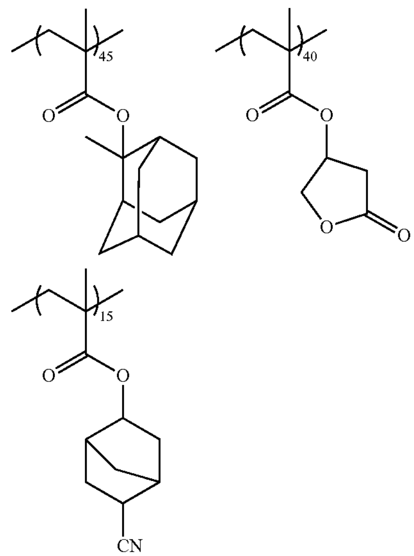
Mw: 9800
Mw/Mn: 1.70
A-20
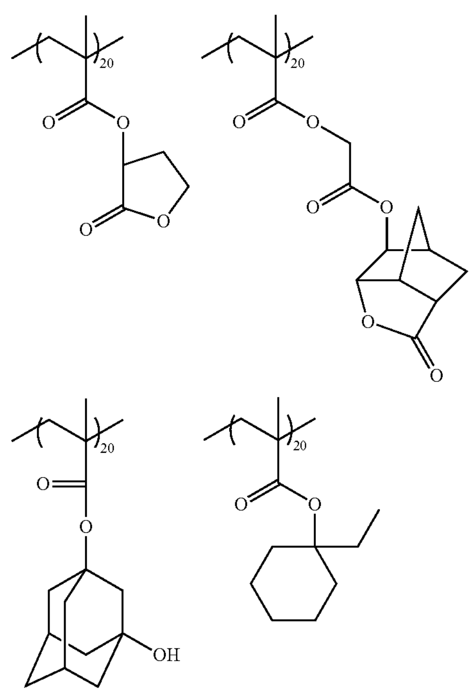

-continued

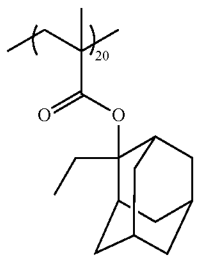

Mw: 9500
Mw/Mn: 1.68

<Hydrophobic Resin>

In the similar manner to the above, resins D-1 to D-13 were synthesized. Regarding to the resins D-1 to D-13 also, the constitutional ratio of repeating units (molar ratio: corresponding to the sequence presented in a left-to-right direction), weight-average molecular weight (Mw) and polydispersity (Mw/Mn) of each resin are shown below.

D-1

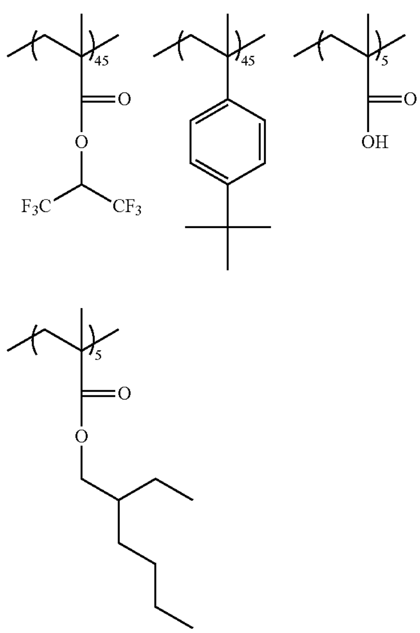

Mw: 7000
Mw/Mn: 1.66

D-2

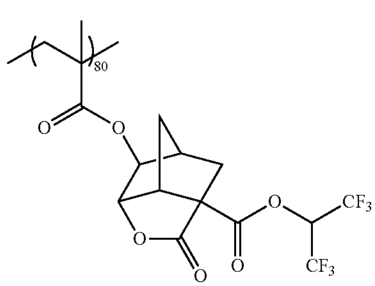

-continued

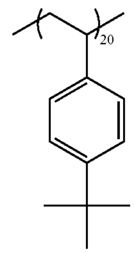

Mw: 12000
Mw/Mn: 1.71

D-3

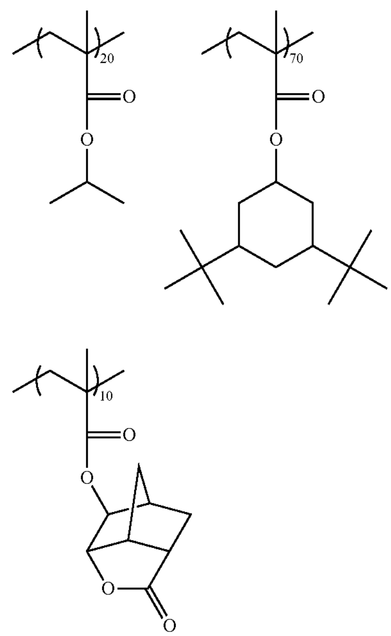

Mw: 8900
Mw/Mn: 1.62

D-4

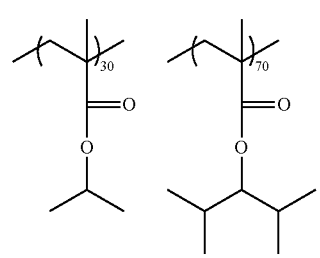

Mw: 22000
Mw/Mn: 1.67

D-5

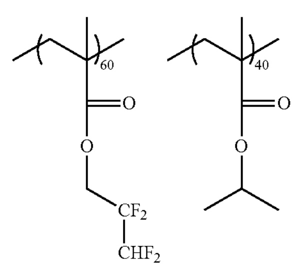

Mw: 14000
Mw/Mn: 1.61

-continued
D-6
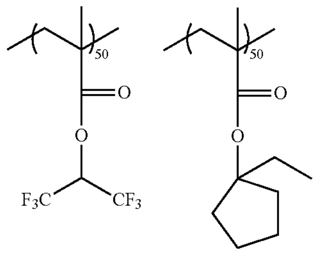
Mw: 9200
Mw/Mn: 1.60
D-7
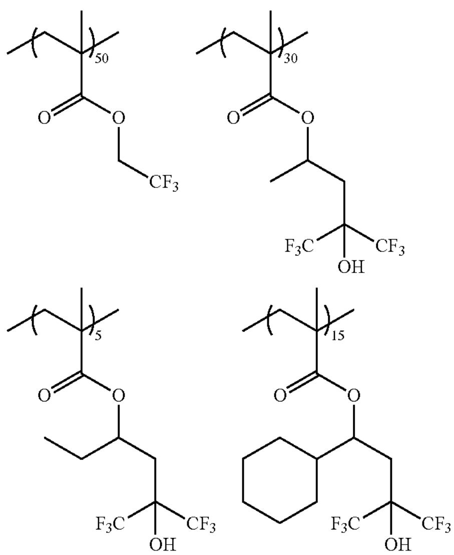
Mw: 9500
Mw/Mn: 1.72
D-8
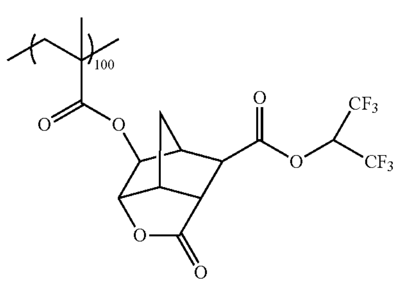
Mw: 12000
Mw/Mn: 1.73
D-9
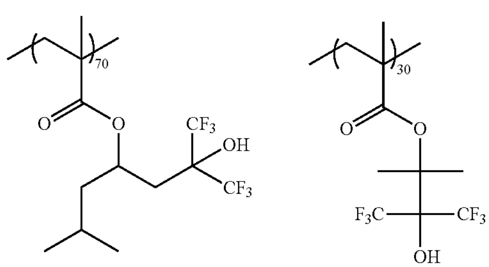
Mw: 9900
Mw/Mn: 1.65
-continued
D-10
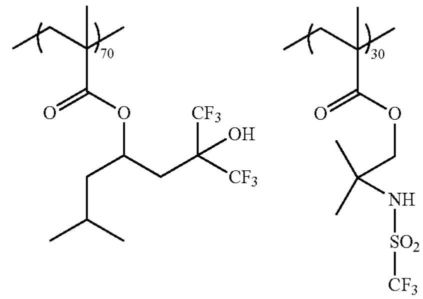
Mw: 10300
Mw/Mn: 1.60
D-11
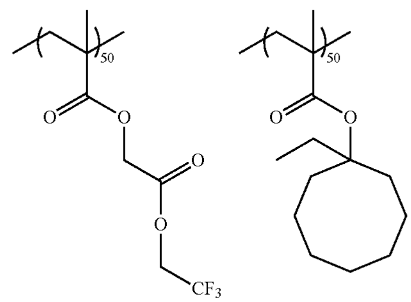
Mw: 11300
Mw/Mn: 1.68
D-12
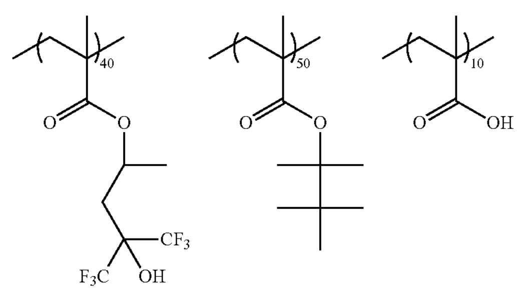
Mw: 9000
Mw/Mn: 1.65
D-13
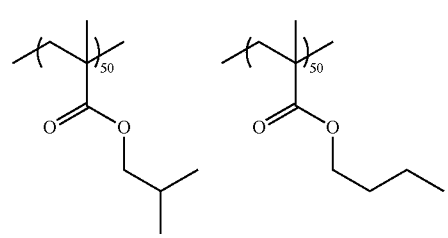
Mw: 13000
Mw/Mn: 1.65
<Acid Generator>
Each of the following compounds was used as an acid generator.

PAG-1
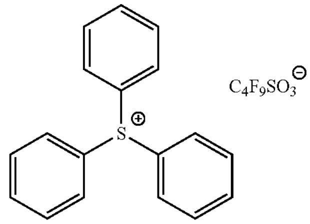
PAG-2
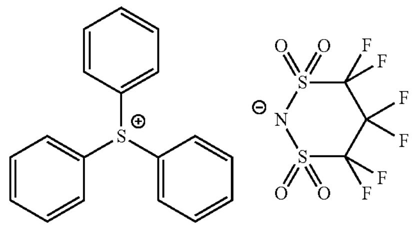
PAG-3
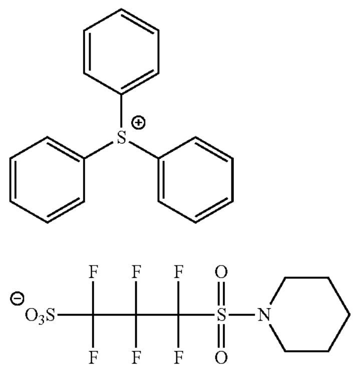
PAG-4
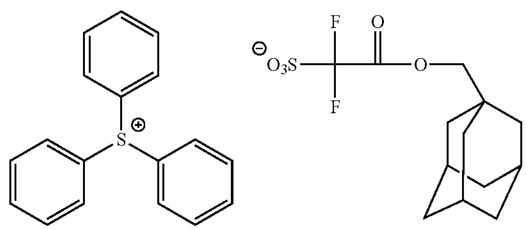
PAG-5
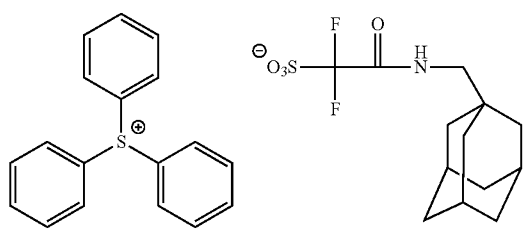
PAG-6
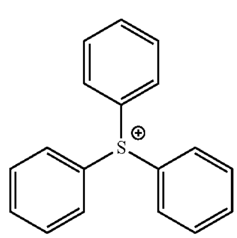
-continued
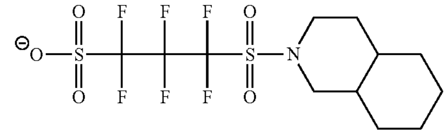
PAG-7
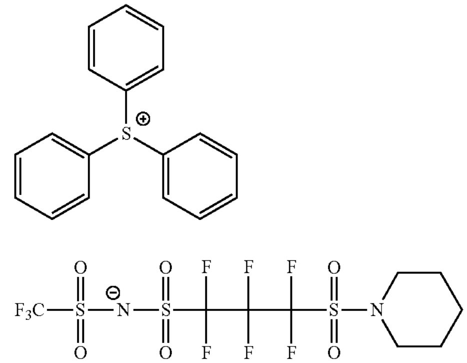
PAG-8
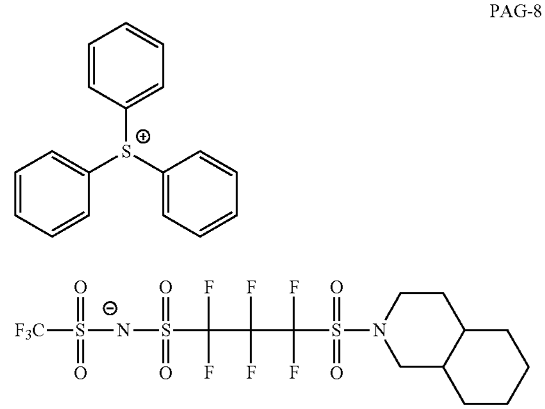
PAG-9
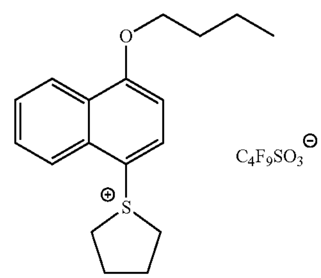
PAG-10
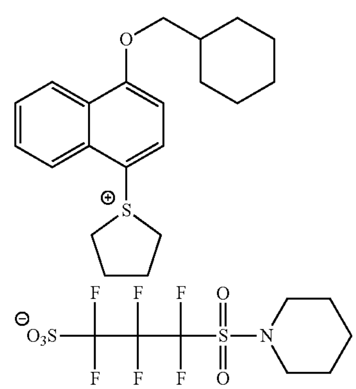

-continued

PAG-11

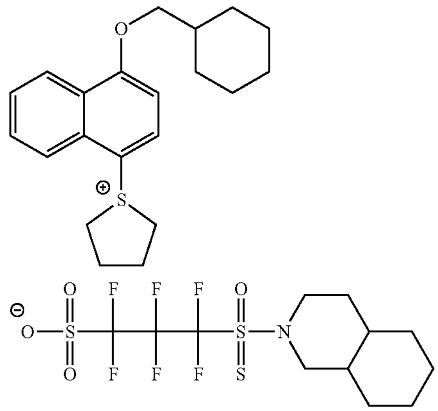

PAG-12

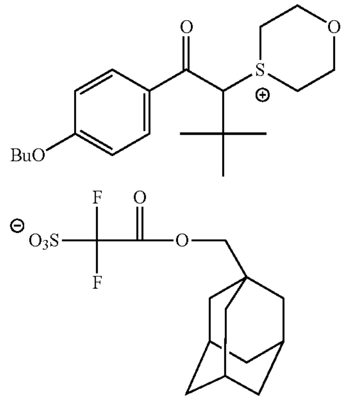

PAG-13

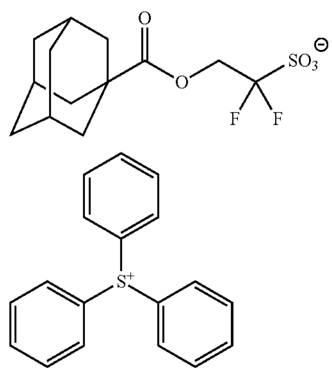

<(N) Basic Compound Capable of Lowering Basicity Upon Irradiation with Actinic Ray or Radiation, and (N') Basic Compound>

Each of the following compounds was used as a basic compound capable of lowering basicity upon irradiation with an actinic ray or radiation, or as another basic compound.

C-1

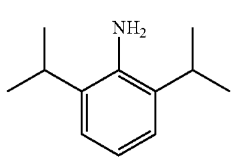

-continued

C-2

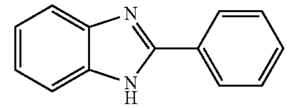

C-3

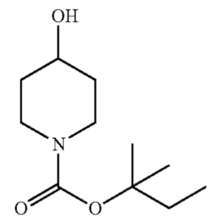

C-4

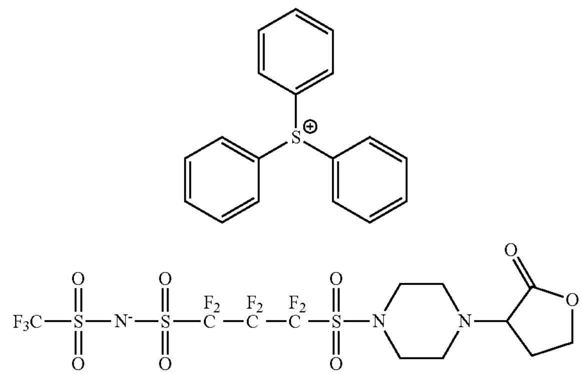

C-5

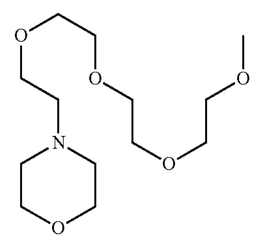

C-6

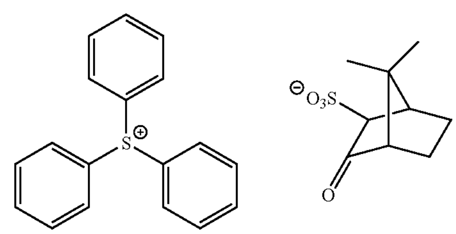

C-7: Tri-n-pentylamine

<Acid-Increasing Agent>

Each of the following compounds was used as an acid-increasing agent.

E-1

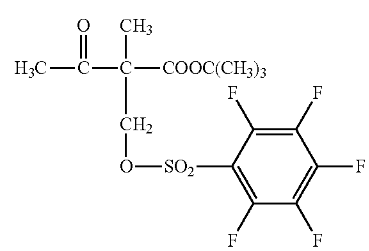

-continued

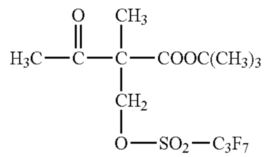
E-2

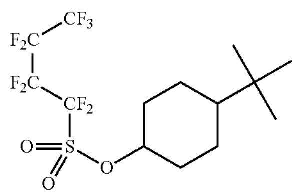
E-3

<Surfactant>

The following compounds were used as a surfactant.

W-1: Megaface F176 (a product of DIC Corp., a fluorine-containing surfactant)

W-2: Megaface R08 (a product of DIC Corp., a fluorine- and silicon-containing surfactant)

W-3: Polysiloxane Polymer KP-341 (a product of Shin-Etsu Chemical Co., Ltd., a silicon-containing surfactant)

W-4: Troysol S-336 (a product of Troy Chemical Corporation)

W-5: KH-20 (a product of Asahi Glass Co., Ltd.)

W-6: PolyFox PF-6320 (a product of OMNOVA Solutions Inc., a fluorine-containing surfactant)

<Solvent>

The followings were used as a solvent.

SL-1: Propylene glycol monomethyl ether acetate (PGMEA)

SL-2: Propylene glycol monomethyl ether propionate

SL-3: 2-Heptane

SL-4: Ethyl lactate

SL-5: Propylene glycol monomethyl ether (PGME)

SL-6: Cyclohexanone

SL-7: γ-Butyrolactone

SL-8: Propylene carbonate

<Developer and Remover>

The followings were used as a developer or a remover.

SG-1: Butyl acetate

SG-2: Methyl amyl ketone

SG-3: Ethyl-3-ethoxypropionate

SG-4: Pentyl acetate

SG-5: Isopentyl acetate

SG-6: Propylene glycol monomethyl ether acetate (PGMEA)

SG-7: Cyclohexanone

<Rinsing Solution>

The followings were used as a rinsing solution.

SR-1: 4-Methyl-2-pentanol

SR-2: 1-Hexanol

SR-3: Butyl acetate

SR-4: Methyl amyl ketone

SR-5: Ethyl-3-ethoxypropionate

<Cross-Linked Layer Forming Material>

Cross-linked layer forming material (Z-1): The same one as the cross-linked layer forming material B1 disclosed in JP-A-2008-310314, paragraph [0386]

Examples 1 to 21 and Comparative Examples 1 and 2

Method of Forming Pattern Through Use of First Film (Preparation of Composition (I))

The components shown in the following Table 1 were dissolved in the solvent shown in Table 1 to give a total solid content of 3.5 mass %, and the obtained solution was filtered through a polyethylene filter having a pore size of 0.03 μm to prepare an actinic ray-sensitive or radiation-sensitive resin composition (resist compositions) (I-1) to (I-21).

(Formation of Resist Film (First Film))

A silicon wafer was coated with an organic antireflective film ARC29SR (produced by Nissan Chemical Industries, Ltd.), and baked at 205° C. for 60 seconds to form an antireflection film having a thickness of 95 nm, and the actinic ray-sensitive or radiation sensitive resin composition (I-1) to (I-21) was coated thereon, and baked (PB: Prebake) at 100° C. for 60 seconds to form a resist film (first film) having a film thickness of 80 nm.

(Formation of Resist Pattern)

This resist film was exposed pattern-wise through a halftone mask having an isolated-hole pattern with 500 nm in pitch and 80 nm in mask size (since a negative pattern was formed herein, the portions corresponding to holes were shielded from light) by means of an ArF excimer laser immersion scanner (XT1700i manufactured by ASML, NA: 1.20, C-Quad, outer sigma: 0.900, inner sigma: 0.812, XY deflection). As the immersion liquid, ultrapure water was used. Thereafter, the thus exposed film was heated (PEB: Post Exposure Bake) at 105° C. for 60 seconds. Then, each film thus treated was developed by paddling for 30 seconds with the developer shown in Table 3, and further rinsed by puddling for 30 seconds with the rinsing solution shown in Table 3 (however, no rinsing step was carried out in the case of presenting no description of rinsing solution in the "Pattern Forming Process" section of Table 3). Subsequently thereto, the wafer was made to spin at 2,000 rpm for 30 seconds, and then heated (Post Bake) for 90 seconds at a temperature set forth in the "Bake after development" column of Table 3, thereby obtaining an isolated-hole pattern having a hole size (hole diameter) of 60 nm.

In Comparative Example 1, however, the pattern-wise exposure was carried out through a halftone mask having an isolated-hole pattern with 500 nm in pitch and 80 nm in size of a hole as a portion pervious to light (herein, portions other than portions corresponding to holes were shield from light in order to form a positive pattern), the development was carried out with a 2.38 mass % aqueous solution of tetramethylammonium hydroxide (TMAH), and pure water was used as the rinsing solution, thereby performing pattern formation.

<Method of Forming Pattern Reduced in Hole Size Through Use of Second Film (Step of Making Pattern Finer)>

(Preparation of Composition (II))

The components shown in the following Table 2 was dissolved in the solvent shown in the same table to give a total solid content of 3.5 mass %, and the obtained solution was filtered through a polyethylene filter having a pore size of 0.03 μm. Thus compositions (II-1) to (II-21) were prepared. Incidentally, the composition (II-21) had the same components as the composition (I-21).

(Formation of Second Film: Examples 1 to 21)

The isolated-hole patterns formed in the above manners were coated with the compositions (II-1) to (I-21), respectively, and heated (Post Coating Bake) for 60 seconds at the temperature set forth in the "Bake after coating" column of Table 3, thereby to form a film (second films) having 80 nm in thickness of non-hole portions and 160 nm (80 mu+80 nm) in thickness of hole portions.

(Formation of Pattern Reduced in Hole Size)

In the cases where the words "with exposure" are entered in the "Exposure" column of Table 3, the second film was subjected to open-flame exposure in an exposure amount of 30 mJ/cm$^2$ by means of an ArF excimer laser immersion scanner (XT1700i manufactured by ASML, NA: 1.20, C-Quad, outer sigma: 0.900, inner sigma: 0.812, XY deflection). The immersion liquid used was ultrapure water. Thereafter, 60-second heating at 120° C. was carried out once again.

Next the removing step was carried out by puddling the second films for 30 seconds with the remover shown in Table 3, and further rinsed by puddling for 30 seconds with the rinsing solution shown in Table 3 (however, no rinsing step was carried out in the case of presenting no description of rinsing solution in the "Pattern Forming Process" section of Table 3). Subsequently thereto, the wafer was made to spin at 2,000 rpm for 30 seconds, and then heated (Post Bake) for 90 seconds at a temperature of 120° C., thereby obtaining a pattern reduced in hole size.

(Formation of Second Film: Comparative Example 1)

In Comparative Example 1 adopting a method of forming a positive image through the use of an alkali developer, as shown in Table 3, it was unsuccessful to form (resolve) an isolated-hole pattern 60 nm in hole size (hole diameter). Consequently, formation of a second film for reducing a hole size of the hole pattern was impossible.

(Formation of Second Film: Comparative Example 2)

In Comparative Example 2, a crosslinked-layer forming material (Z-1) was applied to the isolated-hole pattern obtained in the foregoing manner by the use of a spin coating method, and baked at 85° C. for 70 seconds, thereby to form a film which was constituted of the crosslinked-layer forming material and had a thickness of 80 nm in non-hole portions and a thickness of 160 nm (80 nm+80 nm) in hole portions.

Then, 90-second bake at 110° C. (mixing bake) was further carried out, and thereby a crosslinked layer was formed at the interface between the hole pattern and the film constituted of the crosslinked-layer forming material. Thereafter, the non-crosslinked layer was removed in a 60-second removing step using pure water, and 90-second heating at 90° C. (Post Bake) was further carried out, thereby forming the crosslinked layer on the hole pattern. Thus a pattern reduced in hole size (hereafter referred simply as to "reduced pattern", too) was obtained.

TABLE 1

| Composition (I) | Resin (A) | (g) | Acid generator (B) | (g) | Compound (N) or Compound (N') | (g) | Resin (D) | (g) | Acid-increasing agent | (g) | Solvent | mass ratio | Surfactant | (g) |
|---|---|---|---|---|---|---|---|---|---|---|---|---|---|---|
| I-1 | A-1 | 10 | PAG-2 | 0.80 | C-1 | 0.14 | D-1 | 0.6 | None | — | SL-1/SL-5 | 80/20 | W-1 | 0.003 |
| I-2 | A-2 | 10 | PAG-3 | 0.90 | C-2 | 0.14 | D-2 | 2.0 | None | — | SL-1 | 100 | W-2 | 0.003 |
| I-3 | A-3 | 10 | PAG-4 | 0.85 | C-3 | 0.14 | D-3 | 4.0 | None | — | SL-1/SL-5 | 60/40 | W-3 | 0.003 |
| I-4 | A-4 | 10 | PAG-5 | 0.45 | C-4 | 0.45 | D-4 | 4.0 | None | — | SL-1/SL-5 | 80/20 | None | — |
| I-5 | A-5 | 10 | PAG-6 | 0.94 | C-5 | 0.11 | D-5 | 5.0 | None | — | SL-1/SL-2 | 90/10 | W-2 | 0.003 |
| I-6 | A-6 | 10 | PAG-7 | 1.10 | C-6 | 0.30 | D-6 | 1.5 | None | — | SL-1/SL-5/ SL-7 | 92/5/3 | W-1 | 0.003 |
| I-7 | A-7 | 10 | PAG-8 | 1.15 | C-7 | 0.15 | D-7 | 1.1 | None | — | SL-5/SL-6 | 30/70 | None | — |
| I-8 | A-8 | 10 | PAG-2/PAG-3 | 0.40/0.40 | C-3 | 0.16 | D-8 | 1.3 | None | — | SL-1/SL-7 | 95/5 | W-1 | 0.003 |
| I-9 | A-9 | 10 | PAG-1/PAG-9 | 0.20/1.00 | C-3 | 0.15 | D-9 | 1.4 | None | — | SL-1/SL-6/ SL-7 | 75/20/5 | W-5 | 0.003 |
| I-10 | A-10 | 10 | PAG-3/PAG-10 | 0.30/1.00 | C-3 | 0.17 | D-10 | 1.0 | None | — | SL-1/SL-5 | 60/40 | W-4 | 0.003 |
| I-11 | A-11 | 10 | PAG-6/PAG-11 | 0.15/1.00 | C-3 | 0.14 | D-11 | 1.5 | None | — | SL-1/SL-3 | 60/40 | W-1 | 0.003 |
| I-12 | A-12 | 10 | PAG-6/PAG-12 | 0.25/1.00 | C-3 | 0.15 | D-12 | 1.8 | None | — | SL-1/SL-5 | 70/30 | W-5 | 0.003 |
| I-13 | A-13 | 10 | PAG-3 | 0.50 | C-3/C-4 | 0.06/0.25 | D-13 | 2.0 | None | — | SL-1/SL-5 | 70/30 | W-1 | 0.001 |
| I-14 | A-14 | 10 | PAG-4 | 0.78 | C-2 | 0.13 | D-1 | 1.0 | None | — | SL-1/SL-8 | 95/5 | None | — |
| I-15 | A-15 | 10 | PAG-5 | 1.20 | C-2 | 0.15 | D-2 | 1.5 | None | — | SL-1 | 100 | W-1 | 0.003 |
| I-16 | A-16 | 10 | PAG-6 | 1.50 | C-2 | 0.17 | D-3 | 2.0 | None | — | SL-1/SL-5 | 70/30 | W-6 | 0.003 |
| I-17 | A-17 | 10 | PAG-7 | 1.10 | C-2 | 0.14 | D-4 | 2.0 | None | — | SL-1/SL-4 | 80/20 | W-1 | 0.003 |
| I-18 | A-18 | 10 | PAG-13 | 0.88 | C-2 | 0.16 | D-5 | 2.0 | None | — | SL-1/SL-5 | 60/40 | None | — |
| I-19 | A-19 | 10 | PAG-3 | 0.90 | C-2 | 0.15 | D-6 | 1.0 | None | — | SL-1 | 100 | W-3 | 0.003 |
| I-20 | A-20 | 10 | PAG-4 | 0.85 | C-2 | 0.13 | D-7 | 2.0 | None | — | SL-1/SL-5 | 60/40 | W-1 | 0.003 |
| I-21 | A-1/A-2 | 5/5 | PAG-5 | 0.90 | C-2 | 0.14 | D-8 | 2.0 | None | — | SL-1/SL-5 | 70/30 | W-4 | 0.003 |

TABLE 2

| Composition (II) | Compound (A') | (g) | Acid generator (B) | (g) | Compound (N) or Compound (N') | (g) | Resin (D) | (g) | Acid-increasing agent | (g) | Solvent | mass ratio | Surfactant | (g) |
|---|---|---|---|---|---|---|---|---|---|---|---|---|---|---|
| II-1 | A-1 | 10 | PAG-2 | 0.02 | C-1 | 0.01 | D-1 | 0.6 | E-1 | 0.80 | SL-1/SL-5 | 80/20 | W-1 | 0.003 |
| II-2 | A-2 | 10 | None | — | None | — | D-2 | 2.0 | E-2 | 0.90 | SL-1/SL-5 | 70/30 | None | — |
| II-3 | A-3 | 10 | None | — | None | — | D-3 | 4.0 | E-3 | 1.00 | SL-1/SL-5 | 60/40 | W-1 | 0.003 |
| II-4 | A-4 | 10 | None | — | None | — | D-4 | 4.0 | None | — | SL-1 | 100 | W-3 | 0.003 |
| II-5 | A-5 | 10 | None | — | C-2 | 0.08 | D-5 | 5.0 | None | — | SL-1/SL-5 | 60/40 | None | — |
| II-6 | A-6 | 10 | None | — | C-3 | 0.06 | D-6 | 1.5 | None | — | SL-1/SL-4 | 80/20 | W-1 | 0.003 |

TABLE 2-continued

| Composition (II) | Compound (A') | (g) | Acid generator (B) | (g) | Compound (N) or Compound (N') | (g) | Resin (D) | (g) | Acid-increasing agent | (g) | Solvent | mass ratio | Surfactant | (g) |
|---|---|---|---|---|---|---|---|---|---|---|---|---|---|---|
| II-7 | A-10 | 10 | None | — | C-4 | 0.09 | D-7 | 1.1 | None | — | SL-1/SL-5 | 70/30 | W-6 | 0.003 |
| II-8 | A-11 | 10 | None | — | C-5 | 0.08 | None | — | None | — | SL-1 | 100 | W-1 | 0.003 |
| II-9 | A-12 | 10 | PAG-1/PAG-9 | 0.01/0.03 | C-3/C-4 | 0.04/0.10 | D-8 | 1.3 | None | — | SL-1/SL-8 | 95/5 | None | — |
| II-10 | A-13 | 10 | PAG-3/PAG-10 | 0.30/0.80 | C-3/C-4 | 0.01/0.02 | D-9 | 1.4 | None | — | SL-1/SL-5 | 70/30 | W-1 | 0.003 |
| II-11 | A-14 | 10 | PAG-6/PAG-11 | 0.15/0.85 | C-3/C-4 | 0.02/0.04 | D-10 | 1.0 | None | — | SL-1/SL-5 | 70/30 | W-5 | 0.003 |
| II-12 | A-15 | 10 | PAG-6/PAG-12 | 0.25/1.10 | C-3/C-4 | 0.03/0.12 | None | — | None | — | SL-1/SL-3 | 60/40 | None | — |
| II-13 | A-16 | 10 | PAG-8 | 0.50 | C-6 | 0.11 | D-11 | 1.5 | None | — | SL-1/SL-5 | 60/40 | W-4 | 0.003 |
| II-14 | A-17 | 10 | PAG-13 | 0.78 | C-7 | 0.10 | D-12 | 1.8 | None | — | SL-1/SL-6/SL-7 | 75/20/5 | None | — |
| II-15 | A-18 | 10 | PAG-4 | 1.20 | C-6 | 0.05 | D-13 | 2.0 | None | — | SL-1/SL-7 | 95/5 | W-1 | 0.003 |
| II-16 | A-19 | 10 | PAG-5 | 1.50 | None | — | D-1 | 1.0 | None | — | SL-5/SL-6 | 30/70 | None | — |
| II-17 | A-20 | 10 | PAG-6 | 1.10 | None | — | D-2 | 1.5 | None | — | SL-1/SL-5/SL-7 | 92/5/3 | W-1 | 0.003 |
| II-18 | A-7 | 10 | PAG-7 | 0.88 | None | — | D-3 | 2.0 | None | — | SL-1/SL-2 | 90/10 | W-2 | 0.003 |
| II-19 | A-8 | 10 | PAG-3 | 0.90 | None | — | D-4 | 2.0 | None | — | SL-1/SL-5 | 80/20 | None | — |
| II-20 | A-9 | 10 | PAG-2 | 0.85 | None | — | None | — | None | — | SL-1/SL-5 | 60/40 | W-3 | 0.003 |
| II-21 | A-1/A-2 | 5/5 | PAG-5 | 0.90 | C-2 | 0.14 | D-8 | 2.0 | None | — | SL-1/SL-5 | 70/30 | W-4 | 0.003 |

TABLE 3

| Example | Pattern Forming Step<br>Composition (I) | Developer | mass ratio | Rinsing Solution | Mass ratio | Bake after development (° C.) |
|---|---|---|---|---|---|---|
| Example 1 | I-1 | SG-1 | 100 | SR-1 | 100 | 200 |
| Example 2 | I-2 | SG-1/SG-7 | 95/5 | SR-1 | 100 | 200 |
| Example 3 | I-3 | SG-1 | 100 | SR-1 | 100 | 200 |
| Example 4 | I-4 | SG-1 | 100 | SR-1 | 100 | 200 |
| Example 5 | I-5 | SG-1 | 100 | SR-1 | 100 | 200 |
| Example 6 | I-6 | SG-1 | 100 | SR-1 | 100 | 200 |
| Example 7 | I-7 | SG-1/SG-4 | 50/50 | SR-1/SR-4 | 90/10 | 200 |
| Example 8 | I-8 | SG-1 | 100 | SR-1 | 100 | 200 |
| Example 9 | I-9 | SG-1 | 100 | SR-1 | 100 | 200 |
| Example 10 | I-10 | SG-1 | 100 | SR-2 | 100 | 200 |
| Example 11 | I-11 | SG-1 | 100 | SR-1 | 100 | 200 |
| Example 12 | I-12 | SG-1/SG-3 | 90/10 | SR-1 | 100 | 100 |
| Example 13 | I-13 | SG-1 | 100 | SR-1/SR-5 | 90/10 | 100 |
| Example 14 | I-14 | SG-1 | 100 | SR-1 | 100 | 100 |
| Example 15 | I-15 | SG-1 | 100 | SR-1 | 100 | 100 |
| Example 16 | I-16 | SG-2 | 100 | SR-1/SR-3 | 90/10 | 100 |
| Example 17 | I-17 | SG-1 | 100 | — | — | 100 |
| Example 18 | I-18 | SG-1 | 100 | SR-1 | 100 | 100 |
| Example 19 | I-19 | SG-1/SG-7 | 95/5 | SR-1 | 100 | 100 |
| Example 20 | I-20 | SG-1 | 100 | SR-1 | 100 | 100 |
| Example 21 | I-21 | SG-1 | 100 | SR-1 | 100 | 100 |
| Comparative Example 1 | I-1 | 2.38 wt % TMAH aq. | 100 | Pure water | 100 | 100 |
| Comparative Example 2 | I-1 | SG-1 | 100 | SR-1 | 100 | 100 |

| Example | Step of Making Pattern Finer<br>Composition (II) | Crosslinked-layer forming material | Exposure | Bake after coating (° C.) | Remover | Mass ratio | Rinsing Solution | Mass ratio |
|---|---|---|---|---|---|---|---|---|
| Example 1 | II-1 | — | — | 120 | SG-1 | 100 | SR-1 | 100 |
| Example 2 | II-2 | — | — | 130 | SG-1 | 100 | SR-1 | 100 |
| Example 3 | II-3 | — | With Exposure | 120 | SG-1 | 100 | SR-1 | 100 |
| Example 4 | II-4 | — | With Exposure | 110 | SG-1 | 100 | — | — |
| Example 5 | II-5 | — | With Exposure | 100 | SG-1/SG-7 | 95/5 | SR-1 | 100 |
| Example 6 | II-6 | — | — | 110 | SG-1 | 100 | SR-1 | 100 |
| Example 7 | II-7 | — | — | 90 | SG-1/SG-4 | 50/50 | SR-1/SR-4 | 90/10 |
| Example 8 | II-8 | — | With Exposure | 90 | SG-1 | 100 | SR-1 | 100 |
| Example 9 | II-9 | — | With Exposure | 100 | SG-1 | 100 | SR-1 | 100 |
| Example 10 | II-10 | — | — | 100 | SG-1 | 100 | SR-2 | 100 |
| Example 11 | II-11 | — | — | 100 | SG-1 | 100 | — | — |
| Example 12 | II-12 | — | — | 100 | SG-1/SG-3 | 90/10 | SR-1 | 100 |
| Example 13 | II-13 | — | — | 100 | SG-1 | 100 | SR-1/SR-5 | 90/10 |
| Example 14 | II-14 | — | — | 100 | SG-1 | 100 | SR-1 | 100 |

TABLE 3-continued

| | | | | | | | | |
|---|---|---|---|---|---|---|---|---|
| Example 15 | II-15 | — | — | 100 | SG-1/SG-5 | 50/50 | SR-1 | 100 |
| Example 16 | II-16 | — | — | 110 | SG-2 | 100 | SR-1/SR-3 | 90/10 |
| Example 17 | II-17 | — | — | 110 | SG-1/SG-6 | 50/50 | — | — |
| Example 18 | II-18 | — | — | 110 | SG-1 | 100 | SR-1 | 100 |
| Example 19 | II-19 | — | — | 110 | SG-1 | 100 | SR-1 | 100 |
| Example 20 | II-20 | — | — | 110 | SG-1 | 100 | SR-1 | 100 |
| Example 21 | II-21 | — | — | 110 | SG-1 | 100 | SR-1 | 100 |
| Comparative Example 1 | — | Z-1 | — | 110 | No pattern was formed in the pattern forming step | | | |
| Comparative Example 2 | — | Z-1 | — | 110 | Pure Water | 100 | — | — |

(Evaluation of Resist Pattern)

On the reduced patterns thus obtained, evaluations of blob defect and hole-size reduced widths were performed in accordance with the following methods. Results obtained are shown in Table 4.

<Method for Evaluating Blob Defect>

In observation of each reduced pattern, the pixel size and threshold value of defect inspection equipment, 2360 manufactured by KLA-Tencor Corporation, were set at 16 μm and 20, respectively, and measurements were made in a random mode. After detection of development defect extracted from differences made by superposing a comparative image over pixel units, the development defect was observed by means of SEMVISION G3 (manufactured by APPLIED MAATERIALS Inc.). Blob defect having developed in a circular form as shown in FIG. 1 (residues ranging in size from several tens of nm to several μm and being derived from resist components and developer components) were found from among the detected defects, and the number thereof was counted, and further the defect density (the number of defects on wafer/wafer inspection area, unit: the number per $cm^2$) was calculated.

When from 0 per $cm^2$ to lower than 0.1 per $cm^2$ in density of defects observed on the wafer, a reduced pattern was rated as A, when from 0.1 per $cm^2$ to lower than 1 per $cm^2$, a reduced pattern was rated as B, when from 1 per $cm^2$ to 10 per $cm^2$, a reduced pattern was rated as C, and when 10 per $cm^2$ or higher, a reduced pattern was rated as D. Lower defect densities imply the higher blob-defect reduction performance.

<Evaluation of Hole-Size Reduced Width>

The hole size in a pattern formed in the first film and the hole size in a reduced pattern were measured by the use of a Critical Dimension scanning electron microscope (S9380II, manufactured by Hitachi Ltd.), and a difference between these hole sizes was calculated, and termed a hole-size reduced width (nm). Greater difference values imply that the hole-size reducing effects are the higher, and reduction performance is the better.

TABLE 4

| Example | Evaluation Results: Blob Defect | Evaluation Results: Hole-size Reduced Width (nm) |
|---|---|---|
| Example 1 | A | 28 |
| Example 2 | A | 26 |
| Example 3 | A | 31 |
| Example 4 | B | 25 |
| Example 5 | B | 25 |
| Example 6 | B | 24 |
| Example 7 | C | 21 |
| Example 8 | B | 24 |
| Example 9 | C | 21 |

TABLE 4-continued

| Example | Evaluation Results: Blob Defect | Evaluation Results: Hole-size Reduced Width (nm) |
|---|---|---|
| Example 10 | C | 20 |
| Example 11 | C | 22 |
| Example 12 | C | 21 |
| Example 13 | C | 20 |
| Example 14 | C | 20 |
| Example 15 | C | 22 |
| Example 16 | C | 21 |
| Example 17 | C | 21 |
| Example 18 | C | 22 |
| Example 19 | C | 22 |
| Example 20 | C | 20 |
| Example 21 | C | 22 |
| Comparative Example 1 | No pattern was formed in the pattern forming step | |
| Comparative Example 2 | D | 11 |

As is evident from the results shown in Table 4, Examples 1 to 21 allowed improvement in hole-size reduced widths in a state of sufficient reductions in occurrence of blob defect, and these Examples allowed formation of a hole pattern having ultrafine hole diameter (e.g. 40 nm or less).

On the other hand, Comparative Example 1 adopting a positive-image forming method failed even to form an isolated-hole pattern having a hole size of 60 nm In addition, it is evident that Comparative Example 2, though adopting a negative-image forming method using an organic solvent-containing developer in the pattern forming process, utilizing in the process of making the pattern finer the reaction causing loss of water solubility through the progress of crosslinking in the presence of an acid was unsuccessful at sufficiently improving the hole-size reduced width, and a hole pattern having a ultrafine hole diameter (e.g. 40 nm or less) was difficult for Comparative Example 2 to provide.

Examples 1 to 3 using the acid-increasing agent incorporated compositions (II-1) to (II-3), respectively, showed outstanding evaluation results on blob defect and hole-size reduced width.

INDUSTRIAL APPLICABILITY

According to the invention, it becomes possible to provide a pattern forming method which allows formation of a pattern of trenches or holes having ultrafine widths or hole diameters of, say, 40 nm or less in a state of sufficient reduction in occurrence of blob defects, a composition used therein, a method for manufacturing an electronic device, and an electronic device.

This application is based on a Japanese patent application filed on Jun. 12, 2012 (Japanese Patent Application No.

2012-133229), US provisional application filed on Jun. 12, 2012 (U.S. Provisional Application No. 61/658,630), and the contents thereof are incorporated herein by reference.

The invention claimed is:

1. A pattern forming method, comprising:

(i) a step of forming a first film by using an actinic ray-sensitive or radiation-sensitive resin composition (I) containing (A) a resin capable of increasing polarity by an action of an acid to decrease solubility in an organic solvent-containing developer, and (B) a compound capable of generating an acid upon irradiation with an actinic ray or radiation, (ii) a step of exposing the first film, (iii) a step of developing the exposed first film by using an organic solvent-containing developer to form a negative pattern, (iv) a step of forming a second film on the negative pattern by using a composition (II) containing (A') a resin capable of increasing polarity by an action of an acid to decrease solubility in an organic solvent-containing remover, (v) a step of increasing polarity of the resin (A') present in the second film by an action of an acid generated from the compound (B) present in the negative pattern formed in the step (iii), and (vi) a step of removing an area of the second film, in which the area is an area in which the resin (A') has not yet undergone reaction with the acid generated from the compound (B), by using the organic solvent-containing remover, wherein:

the organic solvent-containing developer in the step (iii) contains an organic solvent in an amount of from 90 mass % to 100 mass % based on the total amount of the developer; and the resin (A') has a structure in which a polar group is protected with a group capable of leaving by the action of an acid, and the polar group is a carboxyl group or a phenolic hydroxyl group.

2. The pattern forming method as claimed in claim 1, wherein the resin (A') is the same resin as the resin (A).

3. The pattern forming method as claimed in claim 1, wherein the composition (II) is substantially free of any compound selected from the group consisting of (N) a basic compound or an ammonium salt compound, capable of lowering basicity upon irradiation with an actinic ray or radiation and (N') a basic compound different from the compound (N).

4. The pattern forming method as claimed in claim 1, wherein the composition (II) is substantially free of a compound capable of generating an acid upon irradiation with an actinic ray or radiation.

5. The pattern forming method as claimed in claim 4, wherein the composition (II) is free of a compound capable of generating an acid upon irradiation with an actinic ray or radiation.

6. The pattern forming method as claimed in claim 1, wherein the composition (II) contains a compound capable of decomposing by an action of an acid to produce an acid.

7. The pattern forming method as claimed in claim 1, further comprising:

a step of heating between the step (iii) and the step (iv).

8. The pattern forming method as claimed in claim 1, further comprising:

a step of exposing the second film between the step (iv) and the step (v).

9. The pattern forming method as claimed in claim 1, wherein the step (v) is a step of heating the negative pattern.

10. The pattern forming method as claimed in claim 1, wherein each of the developer used in the step (iii) and the remover used in the step (vi) is at least one kind of an organic solvent selected from the group consisting of a ketone-based solvent, an ester-based solvent, an alcohol-based solvent, an amide-based solvent and an ether-based solvent.

11. The pattern forming method as claimed in claim 1, further comprising:

a step of cleaning by using an organic solvent-containing rinsing solution at least either between the step (iii) and the step (iv), or after the step (vi).

12. The pattern forming method as claimed in claim 1, wherein the organic solvent-containing remover in the step (vi) contains an organic solvent in an amount of from 90 mass % to 100 mass % based on the total amount of the remover.

13. The pattern forming method as claimed in claim 1, wherein when a solubility parameter of the resin (A') is symbolized as SP(A') and a solubility parameter of the resin (A) is symbolized as SP(A), the following expression is satisfied:

$$|SP(A')-SP(A)|\leq 5.$$

14. The pattern forming method as claimed in claim 1, wherein the resin (A') is a non-polymeric resin having an acid-decomposable group.

15. The pattern forming method as claimed in claim 1, wherein the resin (A') contains a repeating unit represented by the following formula (I):

(I)

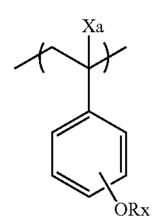

wherein in formula (I),

Xa represents a hydrogen atom, or a linear or branched alkyl group; and

Rx represents a hydrogen atom or a group capable of decomposing and leaving by the action of an acid.

16. A method for manufacturing an electronic device, comprising the pattern forming method as claimed in claim 1.

17. A pattern forming method, comprising:

(i) a step of forming a first film by using an actinic ray-sensitive or radiation-sensitive resin composition (I) containing (A) a resin capable of increasing polarity by an action of an acid to decrease solubility in an organic solvent-containing developer, and (B) a compound capable of generating an acid upon irradiation with an actinic ray or radiation, (ii) a step of exposing the first film, (iii) a step of developing the exposed first film by using an organic solvent-containing developer to form a negative pattern, (iv) a step of forming a second film on the negative pattern by using a composition (II) containing (A') a resin capable of increasing polarity by an action of an acid to decrease solubility in an organic solvent-containing remover, (v) a step of increasing polarity of the resin (A') present in the second film by an action of an acid generated from the compound (B) present in the negative pattern formed in the step (iii), and (vi) a step of removing an area of the second film, in which the area is an area in which the resin (A') has not yet undergone reaction with the acid generated from the compound (B), by using the organic solvent-containing remover, wherein:

the organic solvent-containing developer in the step (iii) contains an organic solvent in an amount of from 90 mass % to 100 mass % based on the total amount of the developer; and the resin (A') has a structure in which a polar group is protected with a group capable of leaving by the action of an acid, and the group capable of leaving by the action of an acid is —C($R_{36}$)($R_{37}$)($R_{38}$), wherein each of $R_{36}$ to $R_{38}$ independently represents an alkyl group, a cycloalkyl group, an aryl group, an aralkyl group or an alkenyl group, and $R_{36}$ and $R_{37}$ may combine with each other to form a ring.

* * * * *